(12) United States Patent
Wu

(10) Patent No.: US 8,742,494 B2
(45) Date of Patent: Jun. 3, 2014

(54) SEMICONDUCTOR DEVICE AND METHOD OF FORMING THE SAME

(76) Inventor: Nan Wu, Tokyo (JP)

(*) Notice: Subject to any disclaimer, the term of this patent is extended or adjusted under 35 U.S.C. 154(b) by 0 days.

(21) Appl. No.: 13/415,432

(22) Filed: Mar. 8, 2012

(65) Prior Publication Data

US 2012/0228702 A1 Sep. 13, 2012

(30) Foreign Application Priority Data

Mar. 9, 2011 (JP) ................. 2011-051604

(51) Int. Cl.
| | | |
|---|---|---|
| H01L 29/15 | (2006.01) | |
| H01L 31/0256 | (2006.01) | |
| H01L 27/108 | (2006.01) | |
| H01L 29/66 | (2006.01) | |
| H01L 21/3205 | (2006.01) | |
| H01L 21/44 | (2006.01) | |

(52) U.S. Cl.
USPC ............ 257/330; 257/76; 257/334; 257/296; 257/E29.262; 438/270; 438/586; 438/589

(58) Field of Classification Search
CPC . H01L 29/7827; H01L 29/78; H01L 29/7813; H01L 29/66666; H01L 29/66734
USPC .............. 257/330, 76, 77, 334, 296, E29.262; 438/270, 586, 589
See application file for complete search history.

(56) References Cited

U.S. PATENT DOCUMENTS

| | | | |
|---|---|---|---|
| 2002/0127810 A1* | 9/2002 | Nakamura | 438/296 |
| 2003/0003651 A1* | 1/2003 | Divakaruni et al. | 438/243 |
| 2003/0038325 A1* | 2/2003 | Sugawara et al. | 257/396 |
| 2003/0068857 A1* | 4/2003 | Shukuri et al. | 438/244 |
| 2003/0146496 A1* | 8/2003 | Nakamura | 257/622 |
| 2003/0160275 A1* | 8/2003 | Nakamura | 257/309 |
| 2004/0079990 A1* | 4/2004 | Schrems et al. | 257/330 |
| 2004/0224476 A1* | 11/2004 | Yamada et al. | 438/400 |
| 2004/0256656 A1* | 12/2004 | Miida | 257/314 |
| 2005/0121713 A1* | 6/2005 | Toshiba et al. | 257/309 |
| 2006/0097314 A1* | 5/2006 | Uchiyama | 257/330 |
| 2007/0034344 A1* | 2/2007 | Reilama et al. | 162/51 |
| 2007/0037344 A1* | 2/2007 | Ema | 438/238 |
| 2008/0054324 A1* | 3/2008 | Luyken et al. | 257/296 |
| 2008/0061342 A1* | 3/2008 | Lee | 257/303 |
| 2008/0150012 A1* | 6/2008 | Thies et al. | 257/329 |
| 2008/0280408 A1* | 11/2008 | Park | 438/253 |
| 2010/0085800 A1* | 4/2010 | Yeom | 365/149 |
| 2010/0193966 A1* | 8/2010 | Kim et al. | 257/774 |
| 2010/0283091 A1* | 11/2010 | Park | 257/296 |
| 2011/0183512 A1* | 7/2011 | Cho et al. | 438/627 |

FOREIGN PATENT DOCUMENTS

| | | |
|---|---|---|
| JP | 2006-339476 | 12/2006 |
| JP | 2007-081095 | 3/2007 |

* cited by examiner

*Primary Examiner* — Ha Tran T Nguyen
*Assistant Examiner* — Thai T Vuong
(74) *Attorney, Agent, or Firm* — Young & Thompson

(57) ABSTRACT

A semiconductor device includes a semiconductor substrate having a groove and an active region adjacent to the groove; a buried gate electrode in the groove; and a capacitor contact including a first portion and a second portion over the first portion. The first portion is greater in horizontal dimension than the second portion. The first portion has a bottom surface that is in contact with an upper surface of the active region.

20 Claims, 109 Drawing Sheets

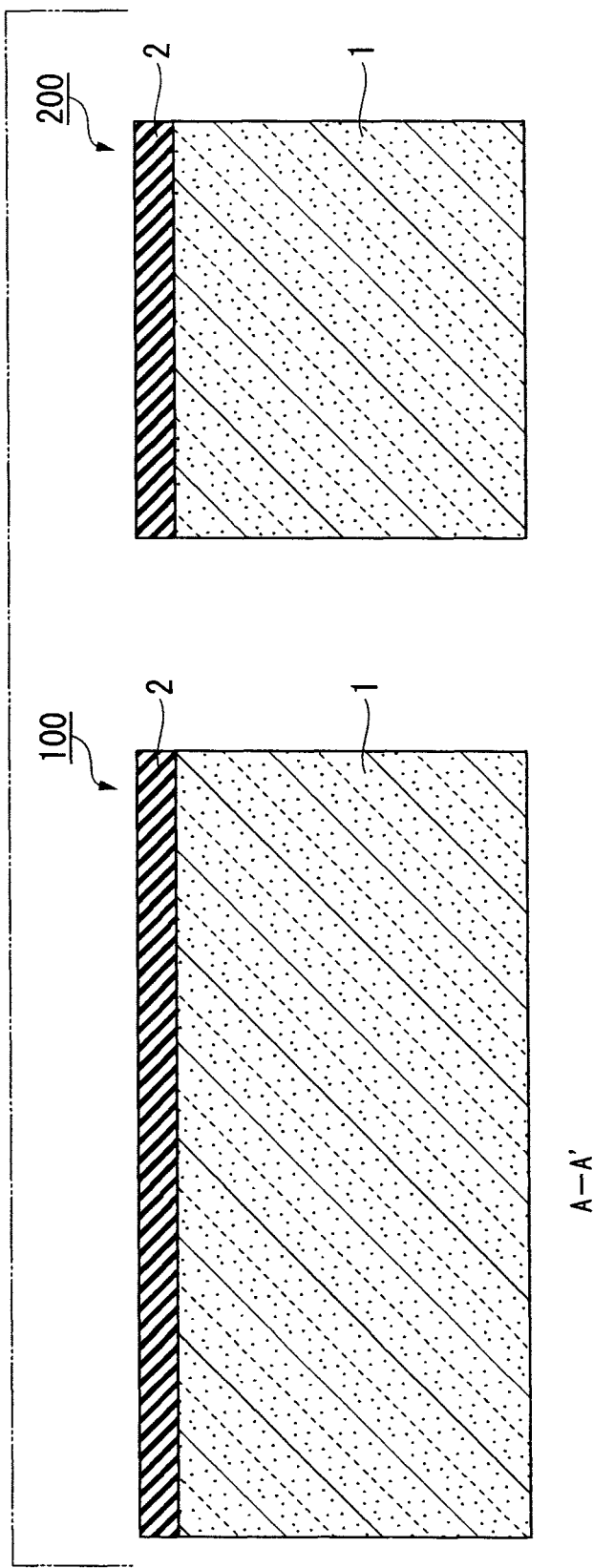

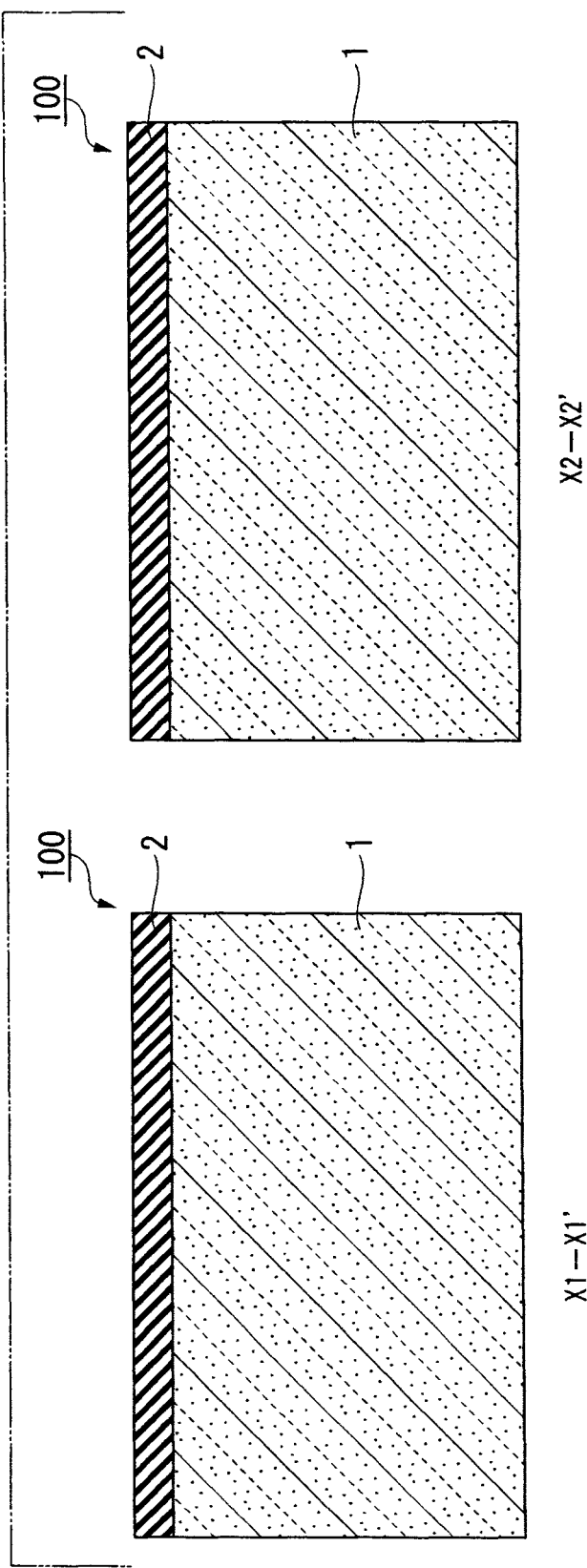

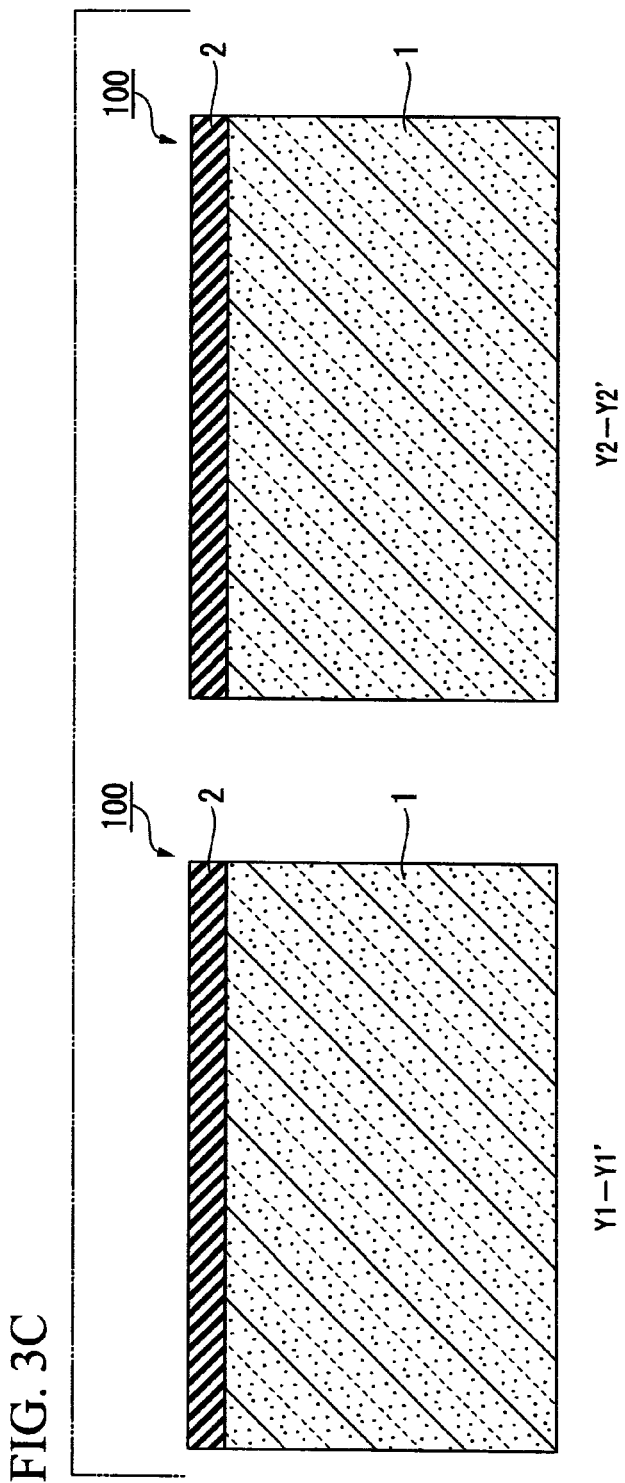

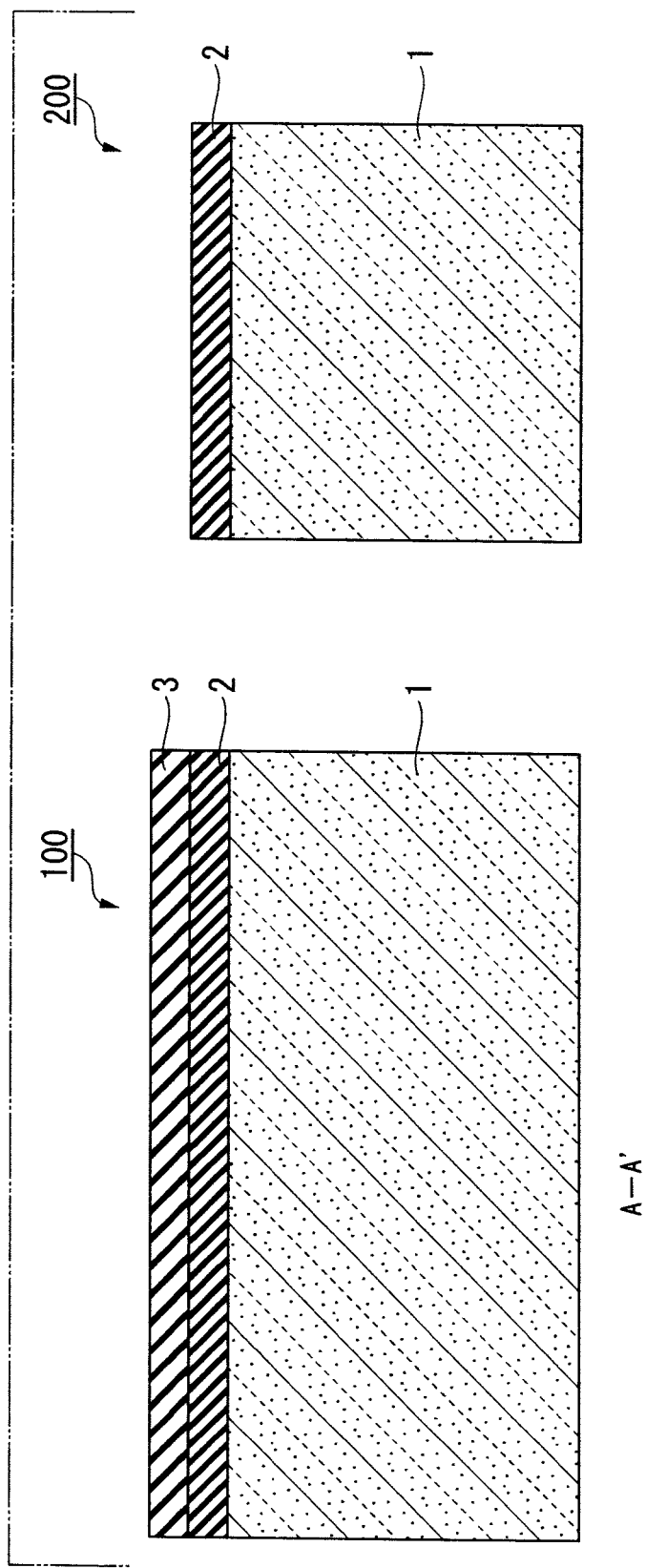

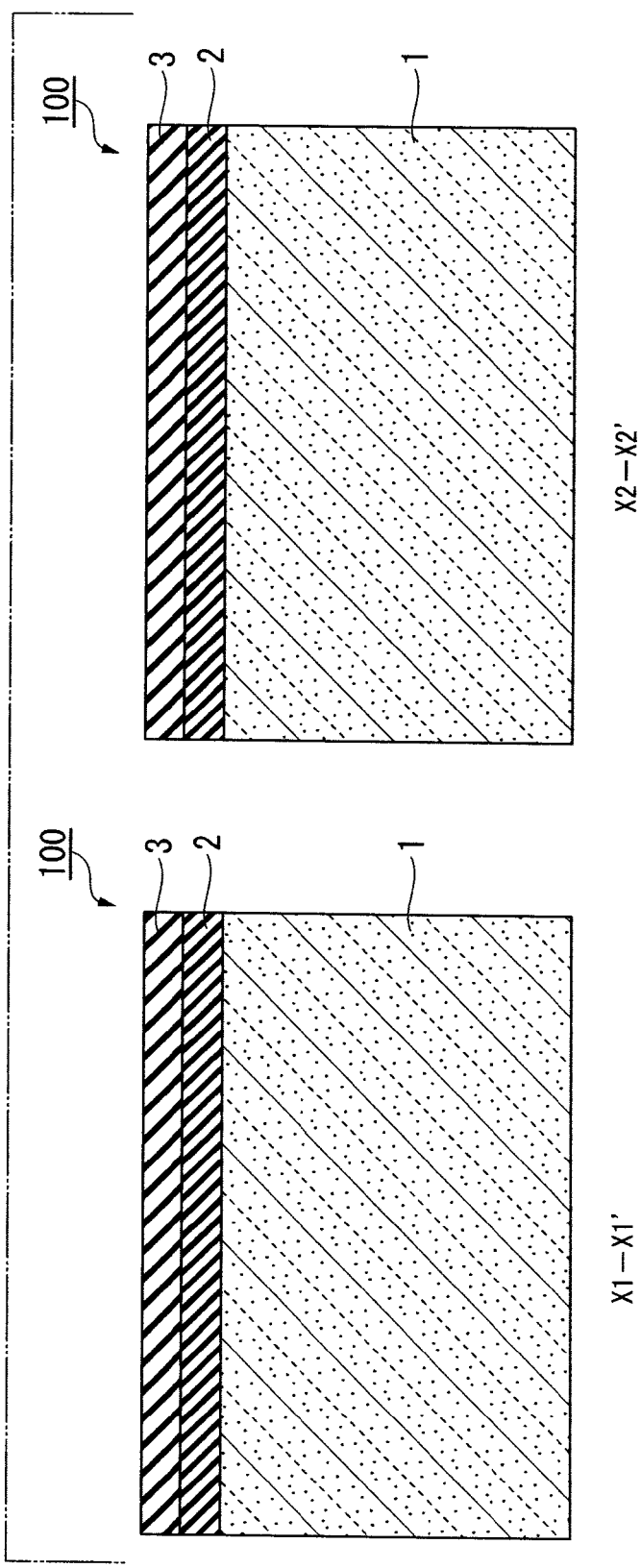

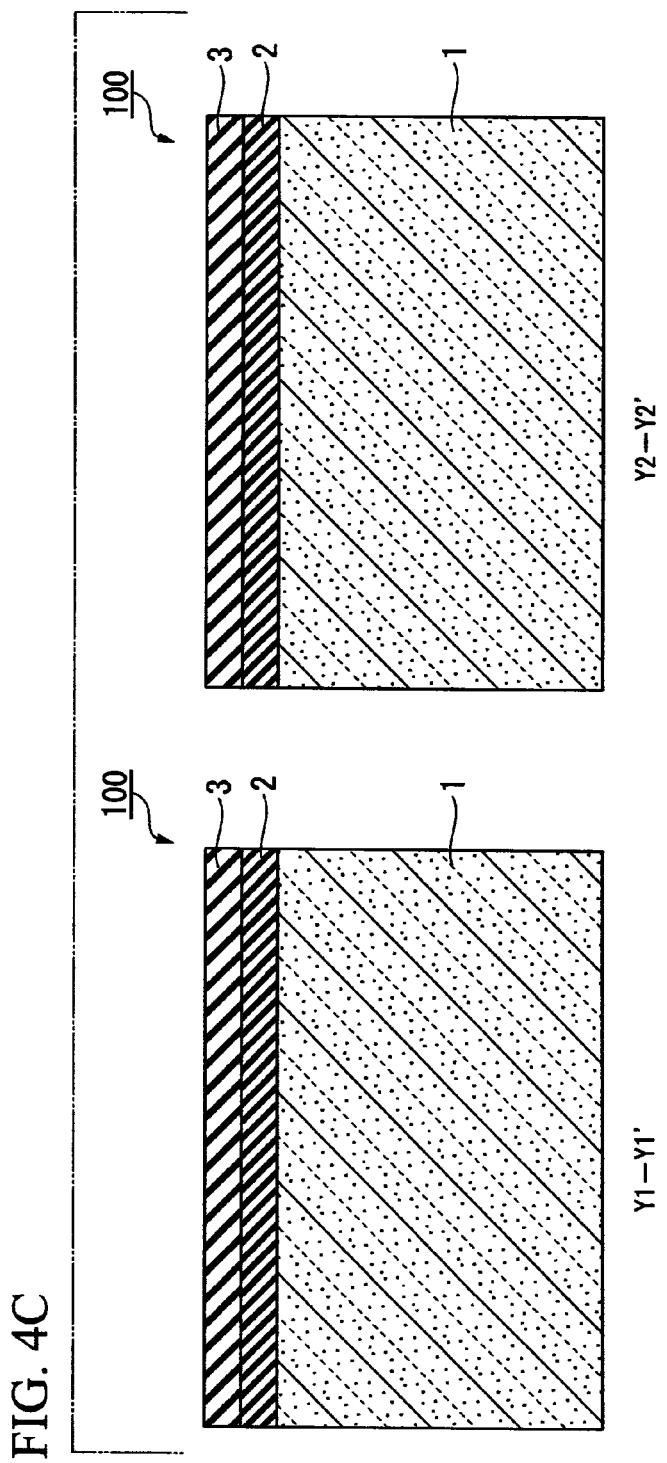

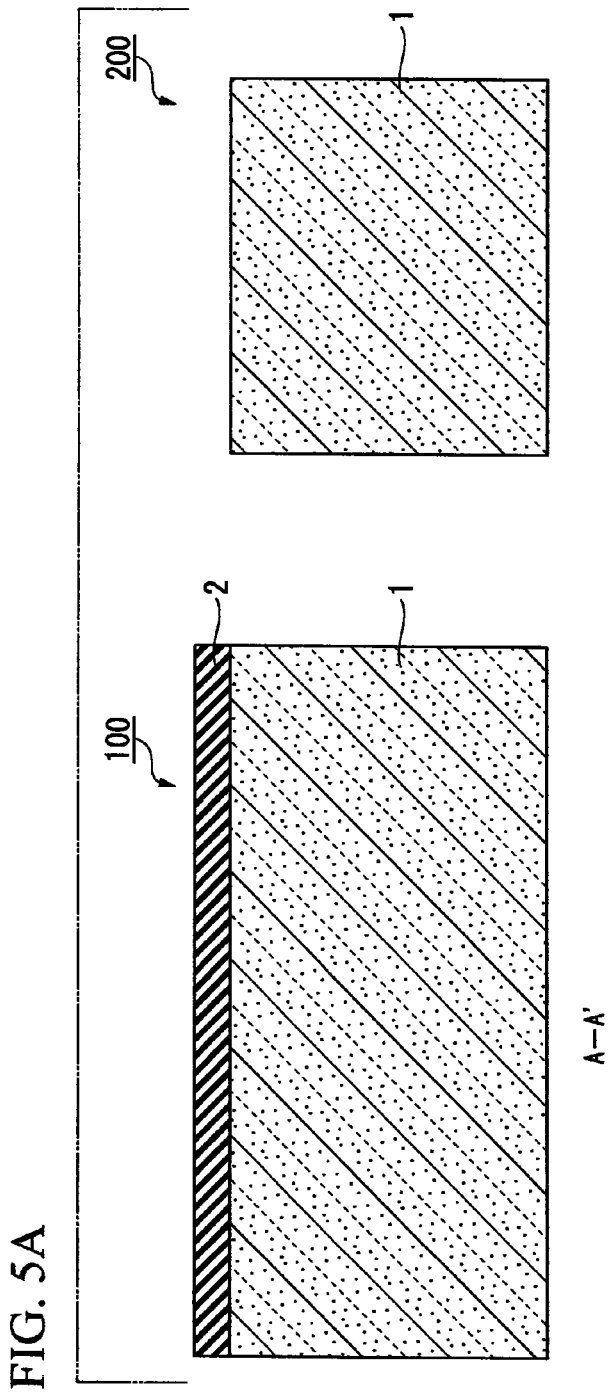

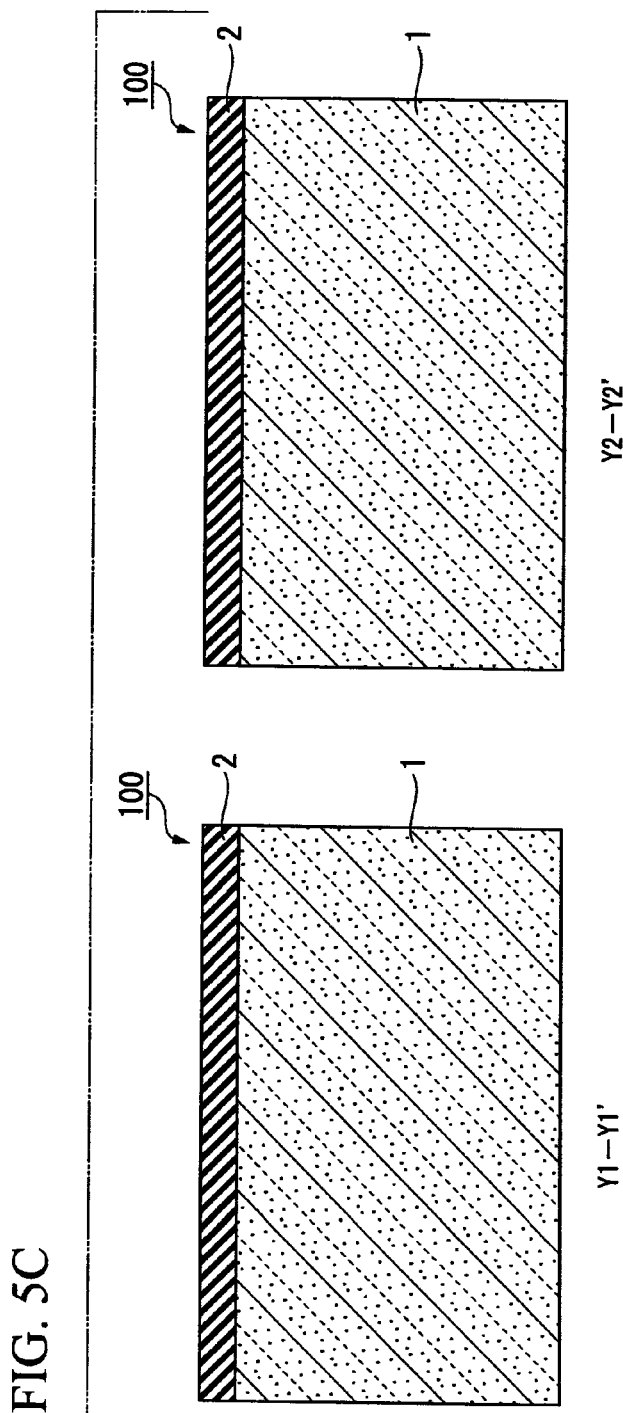

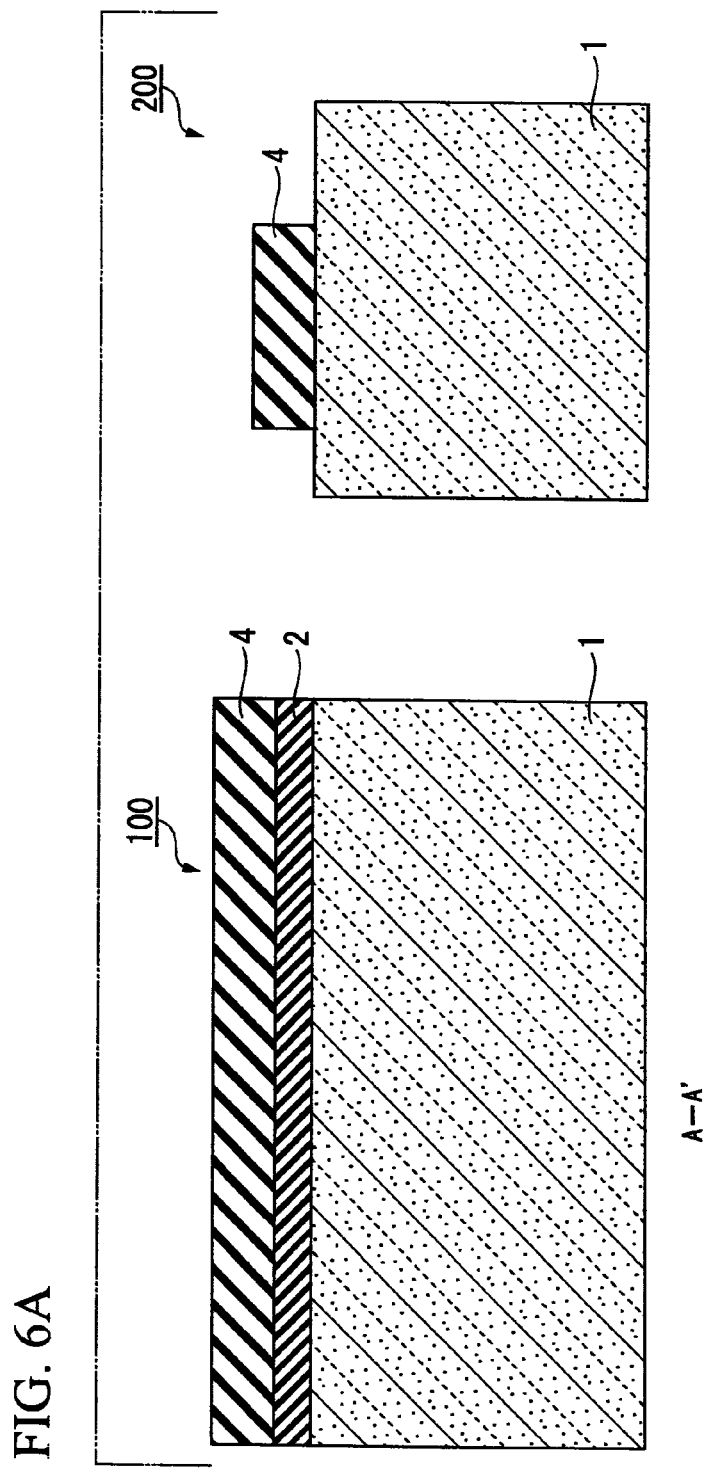

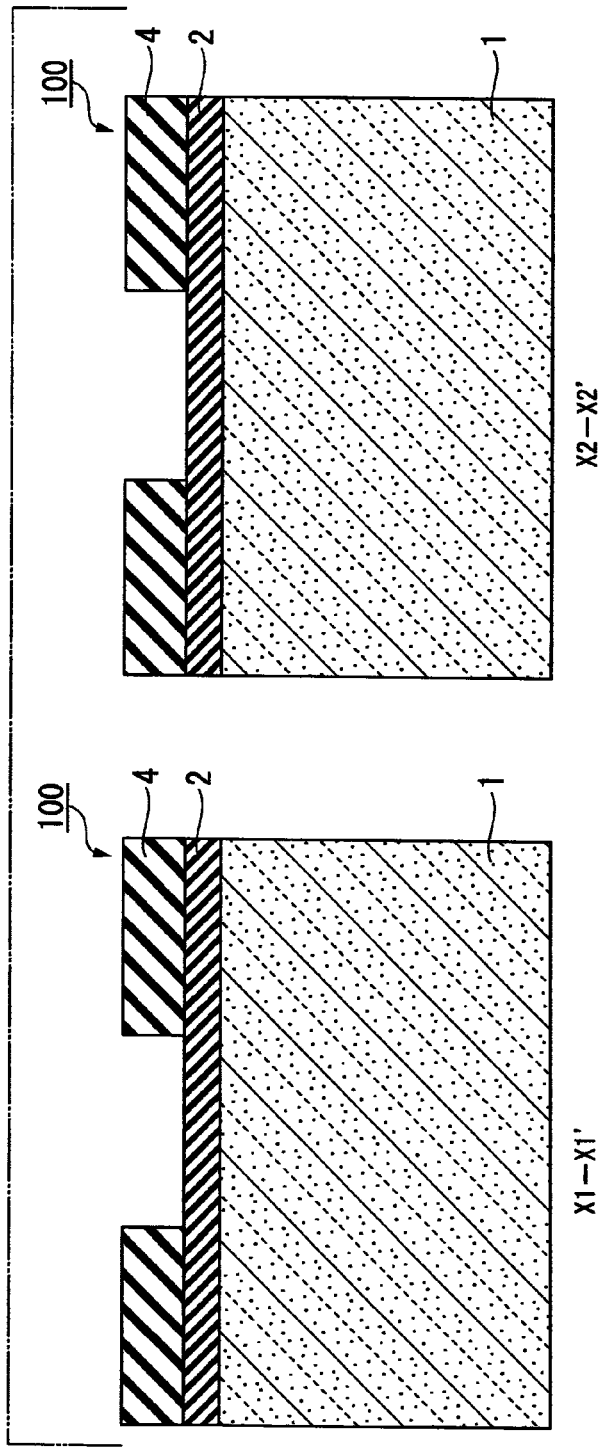

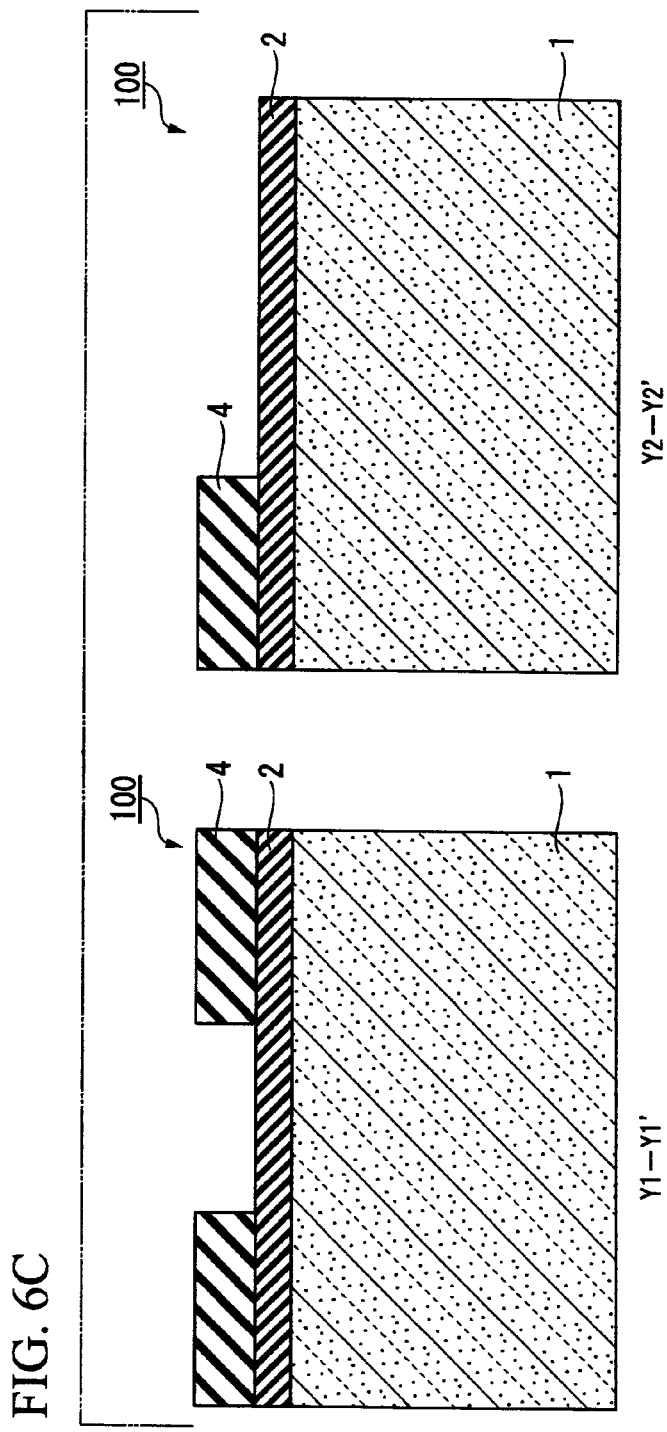

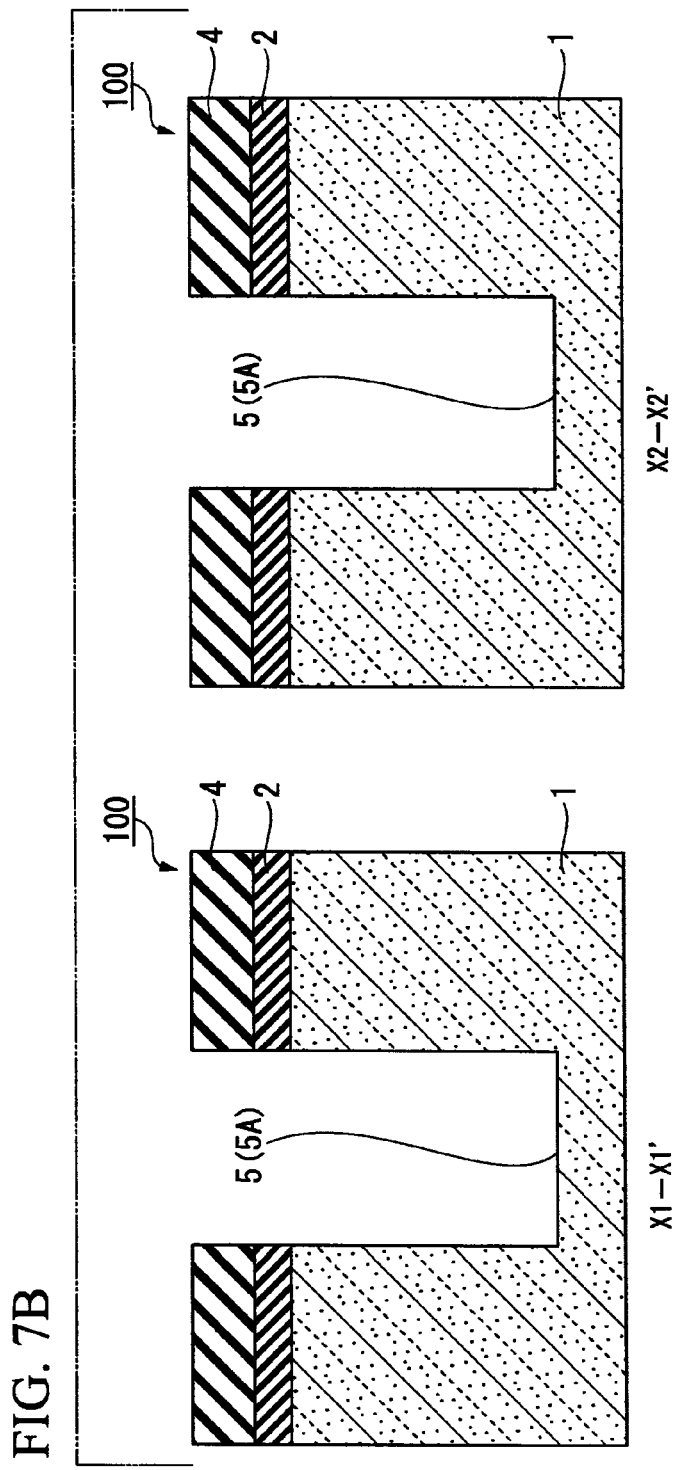

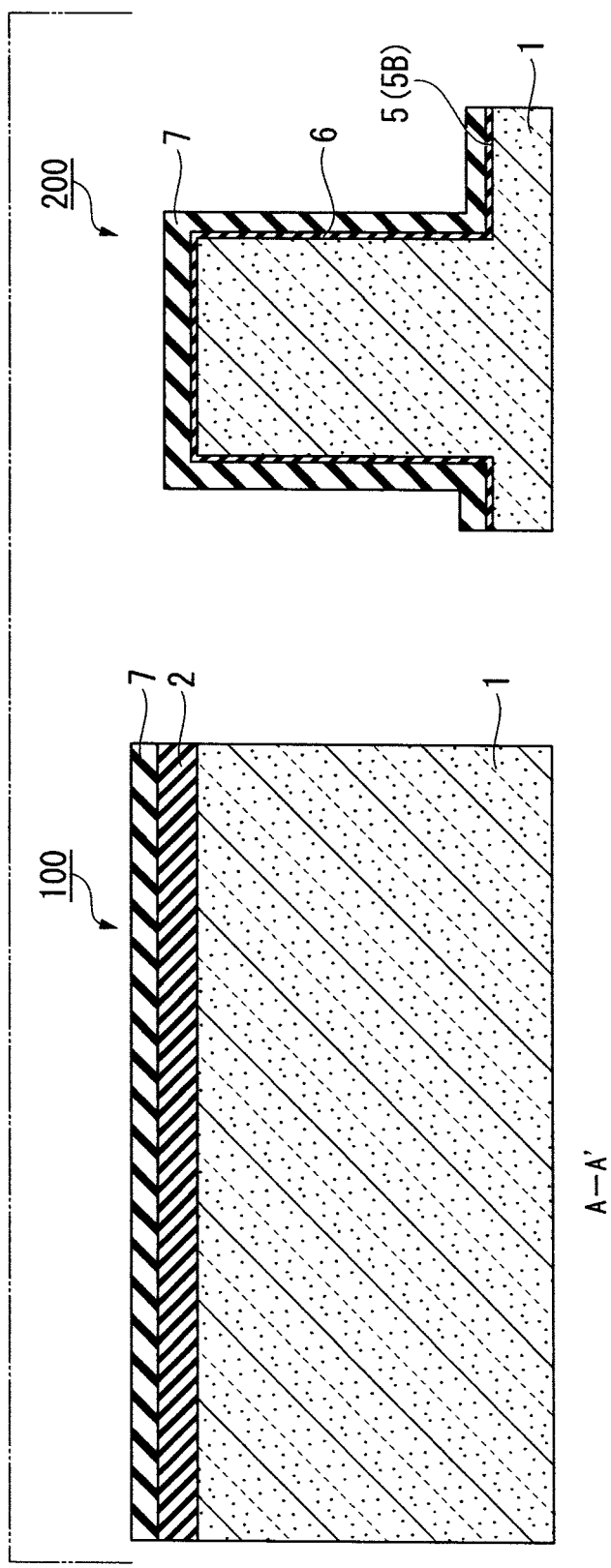

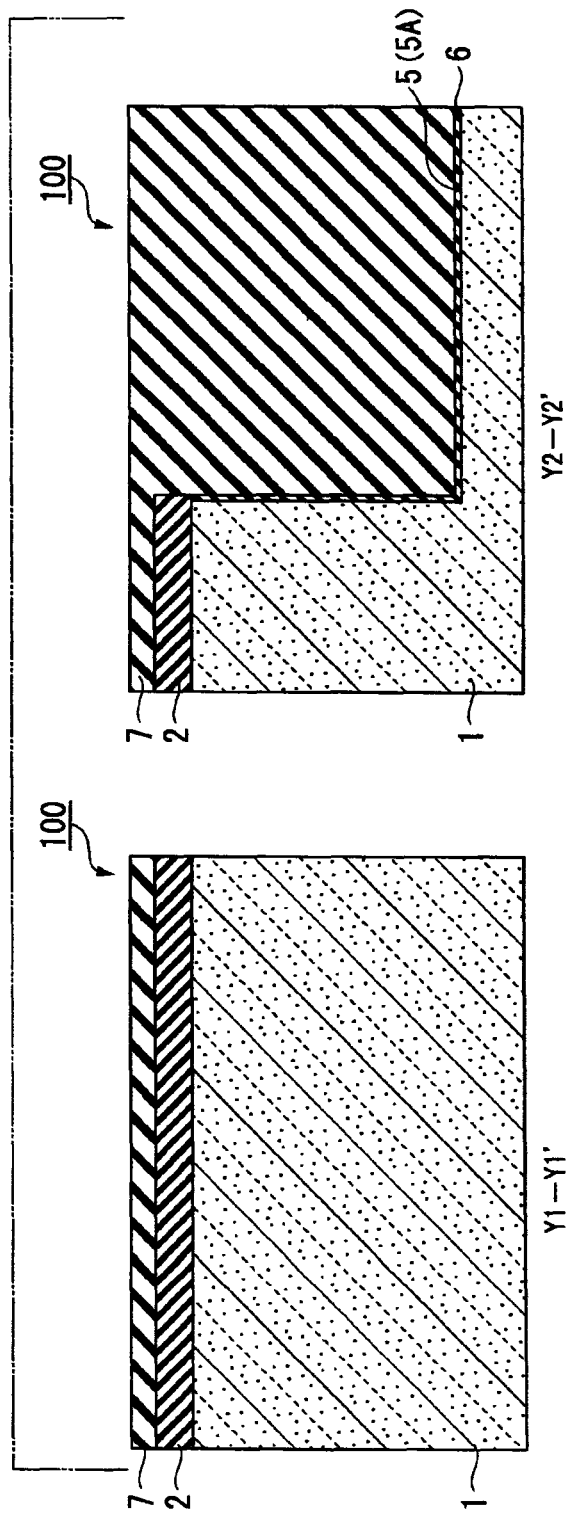

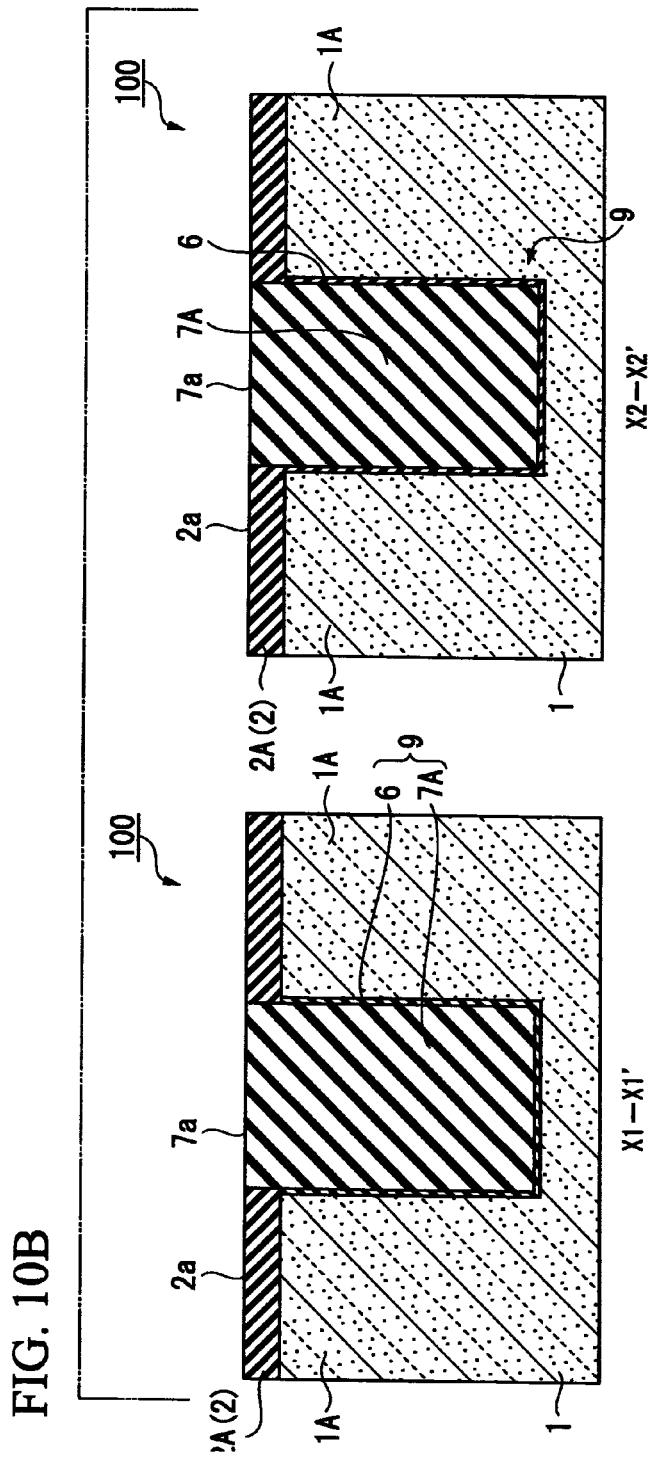

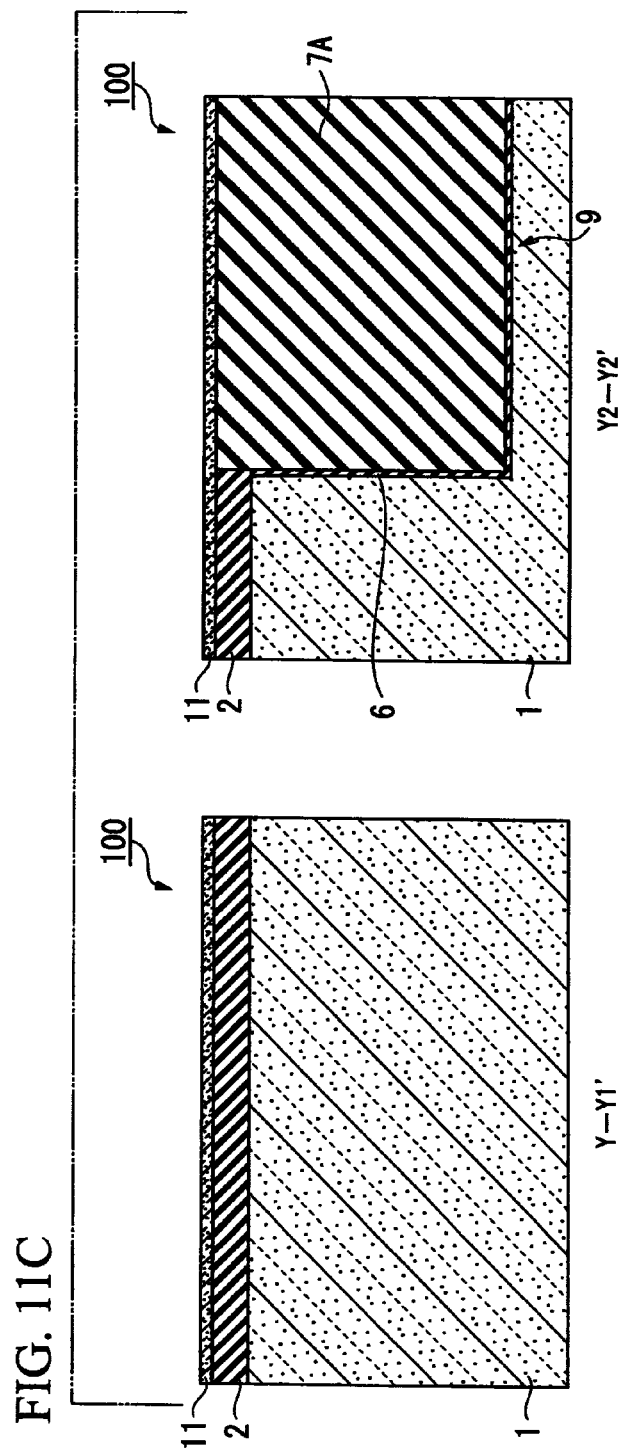

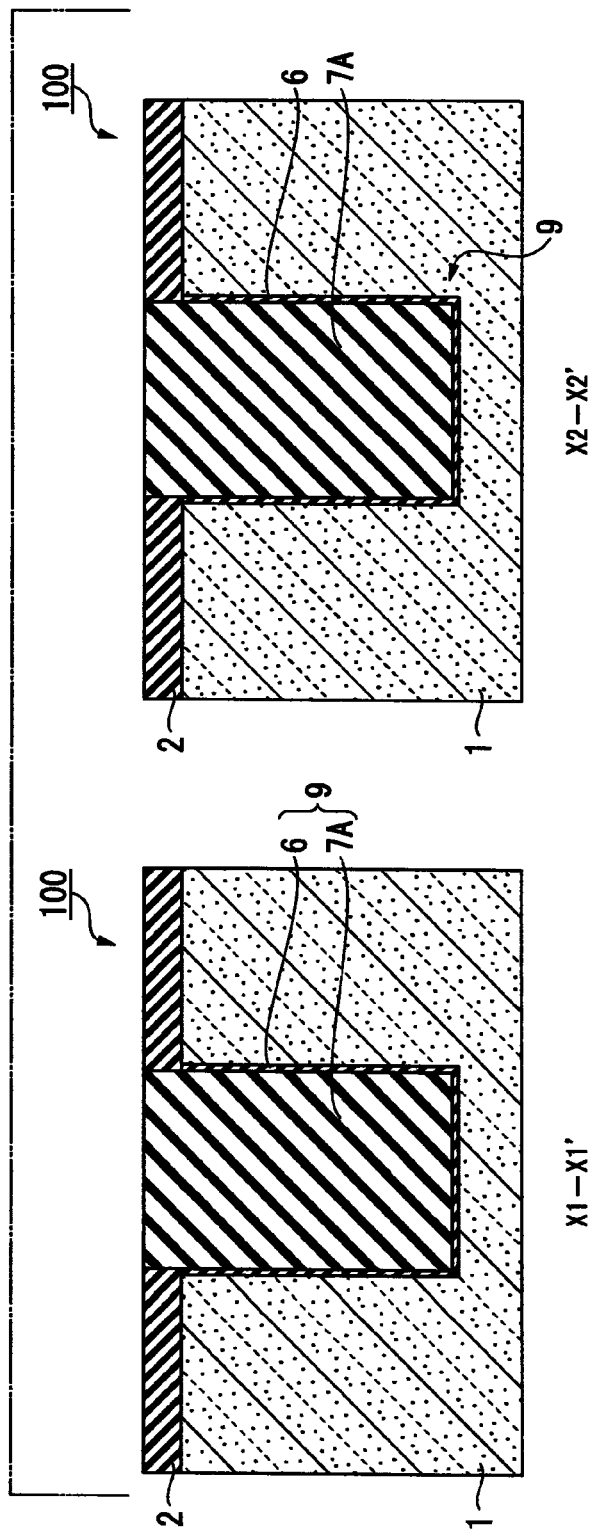

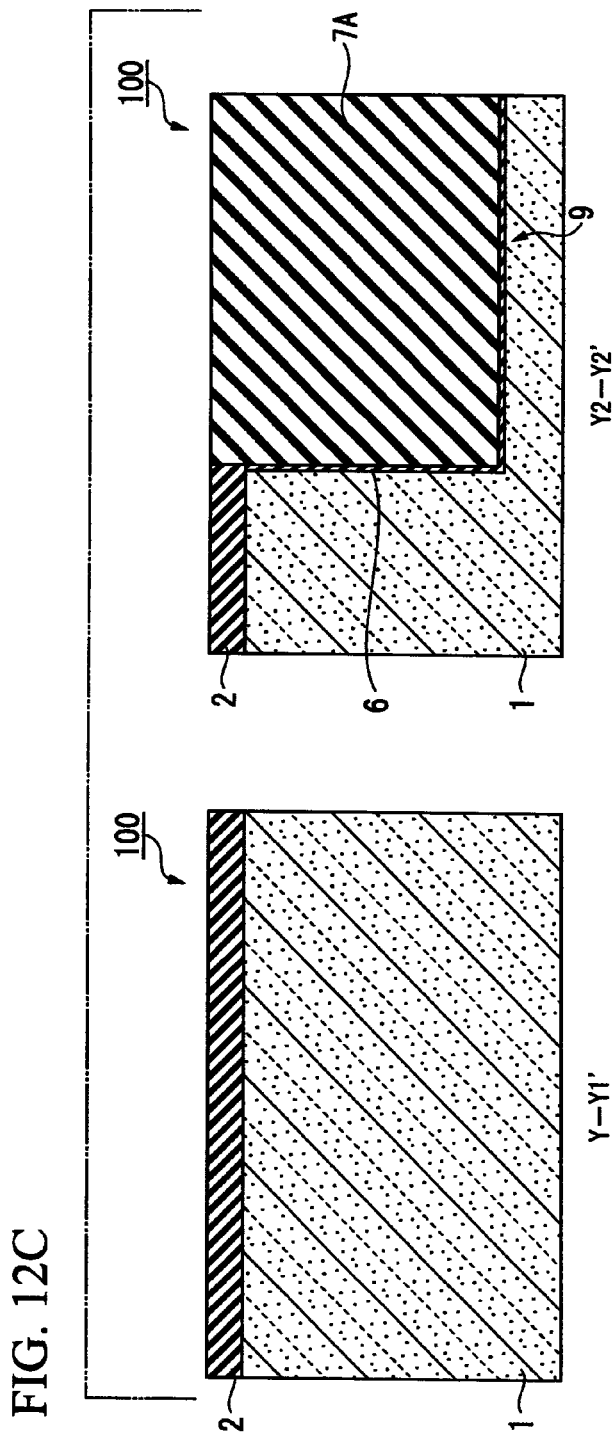

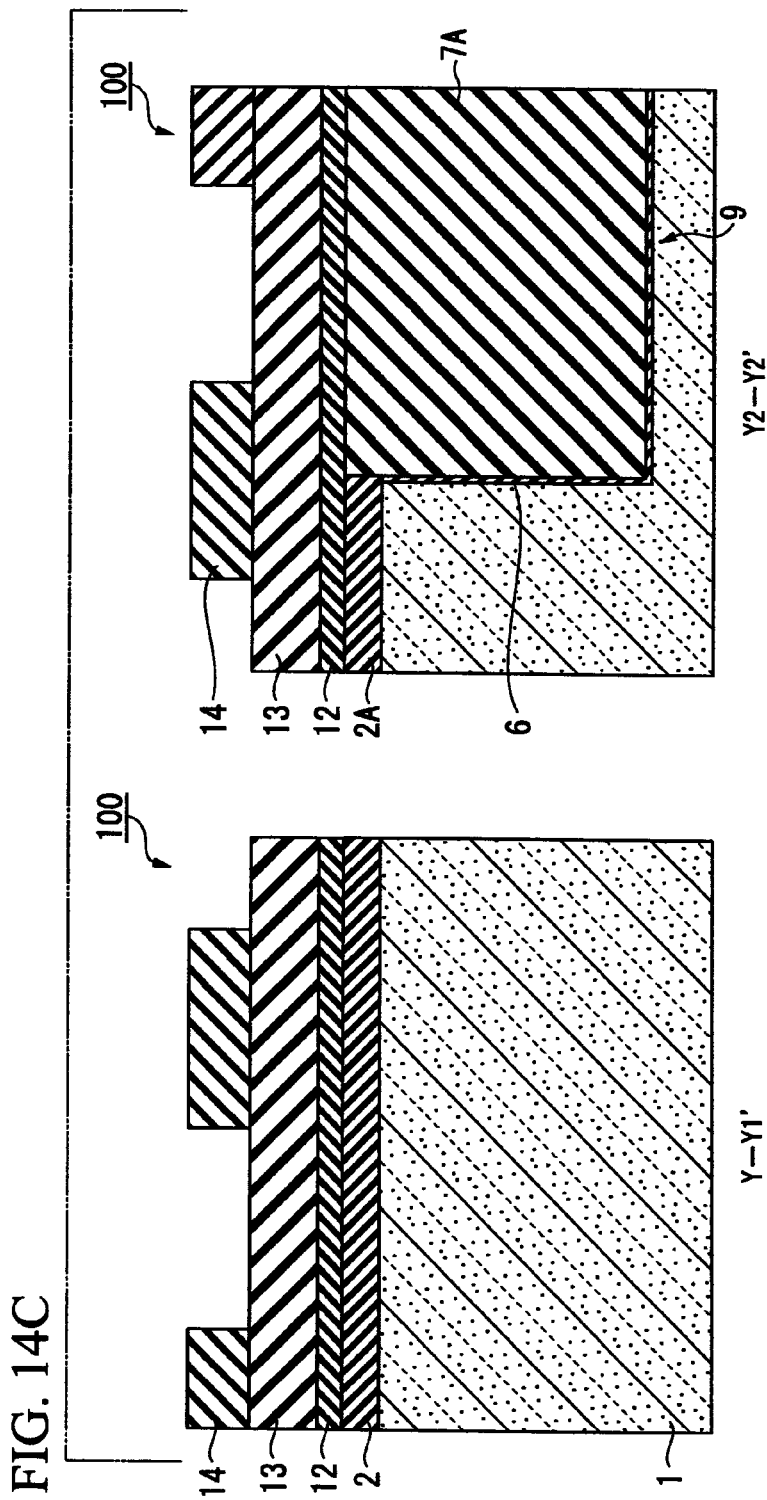

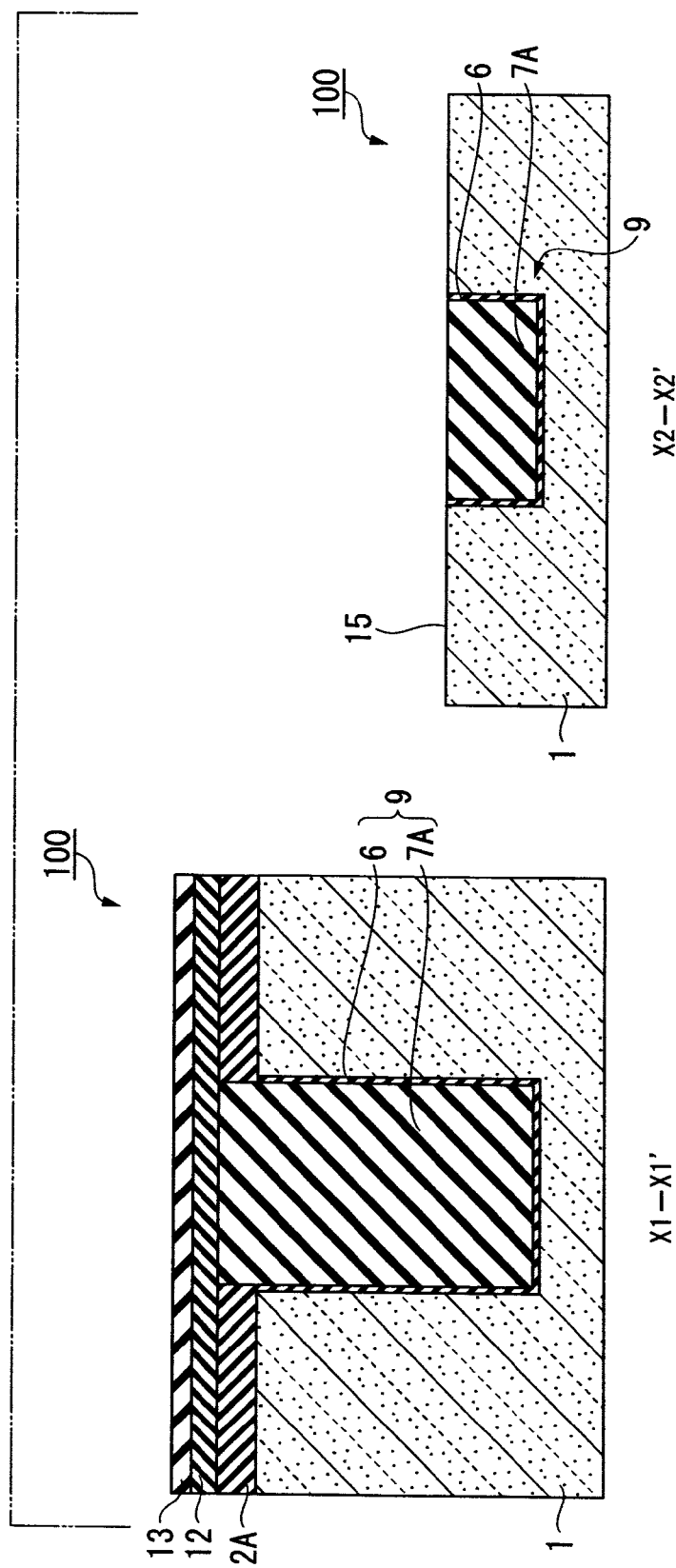

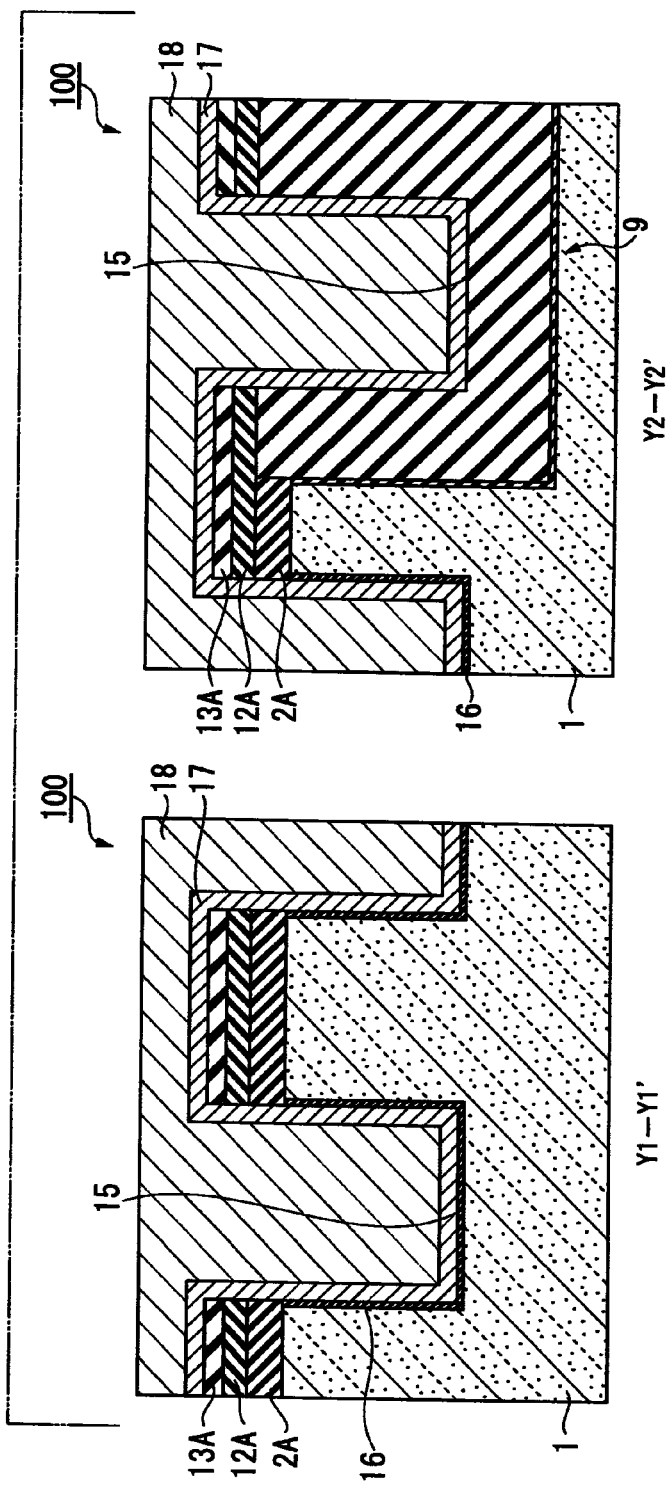

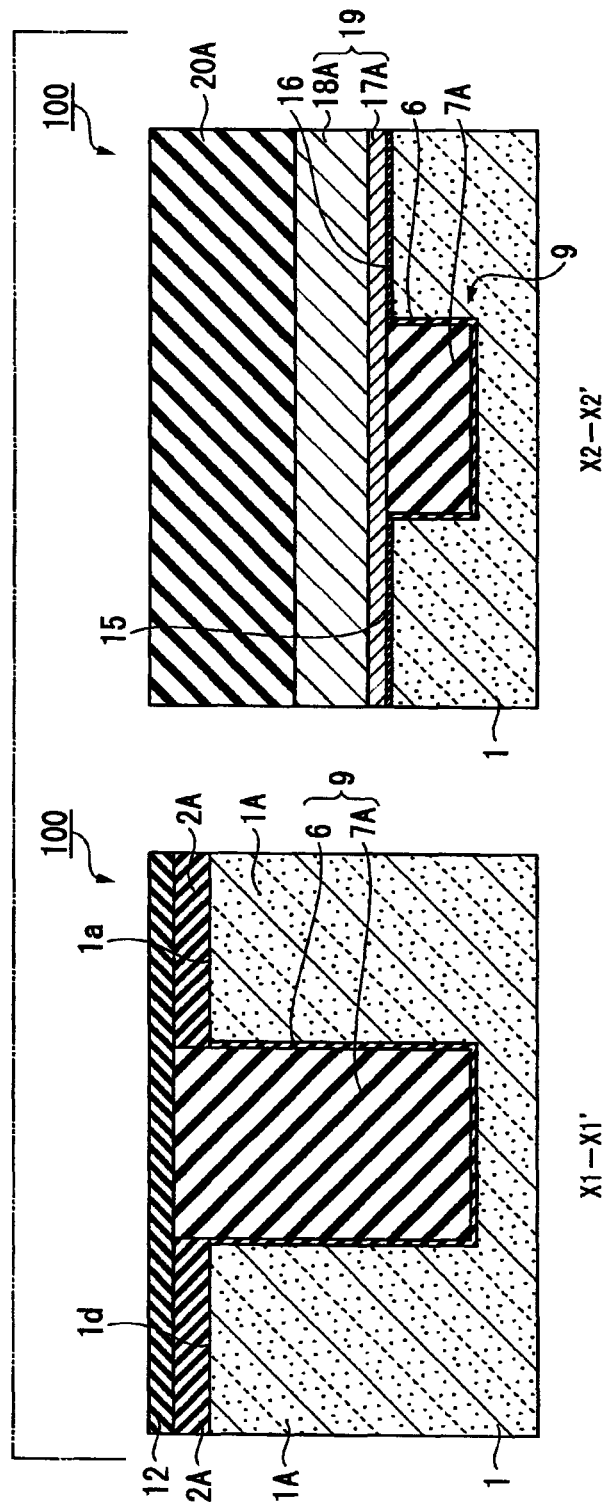

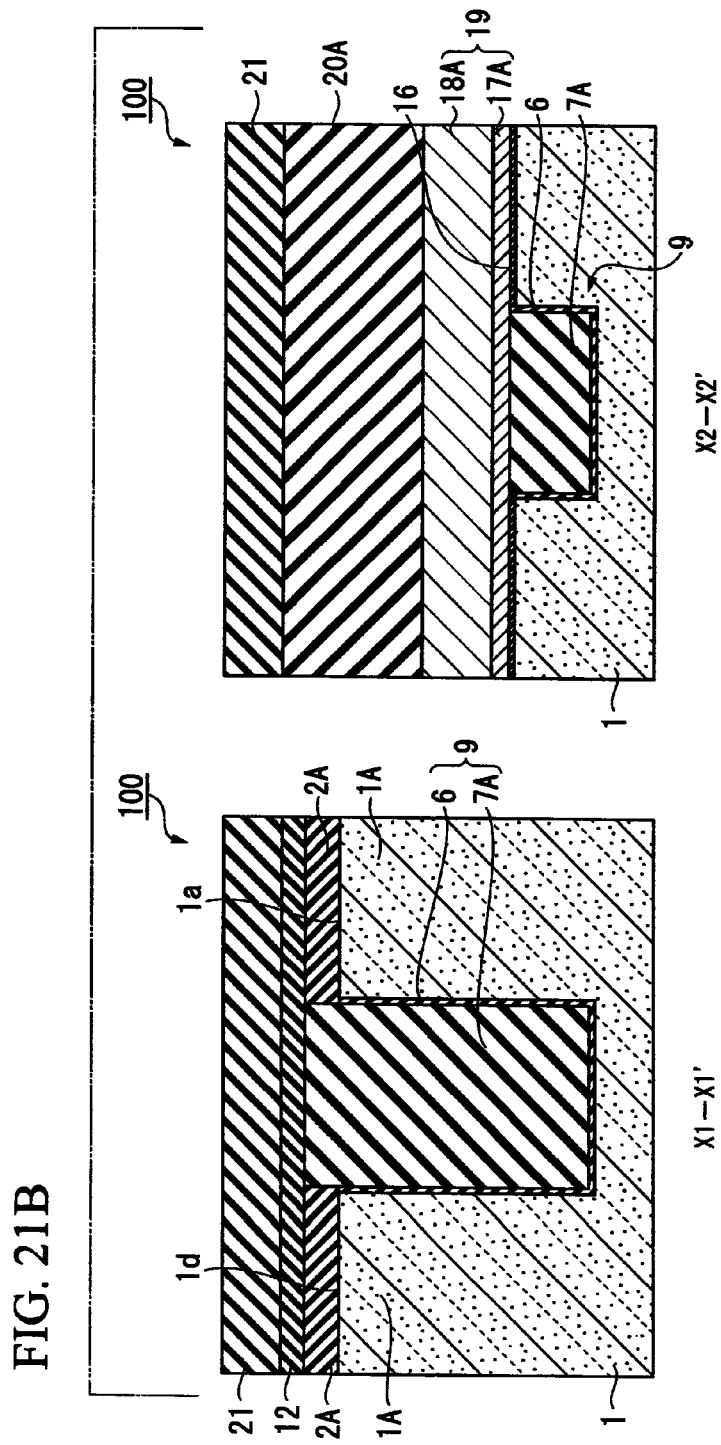

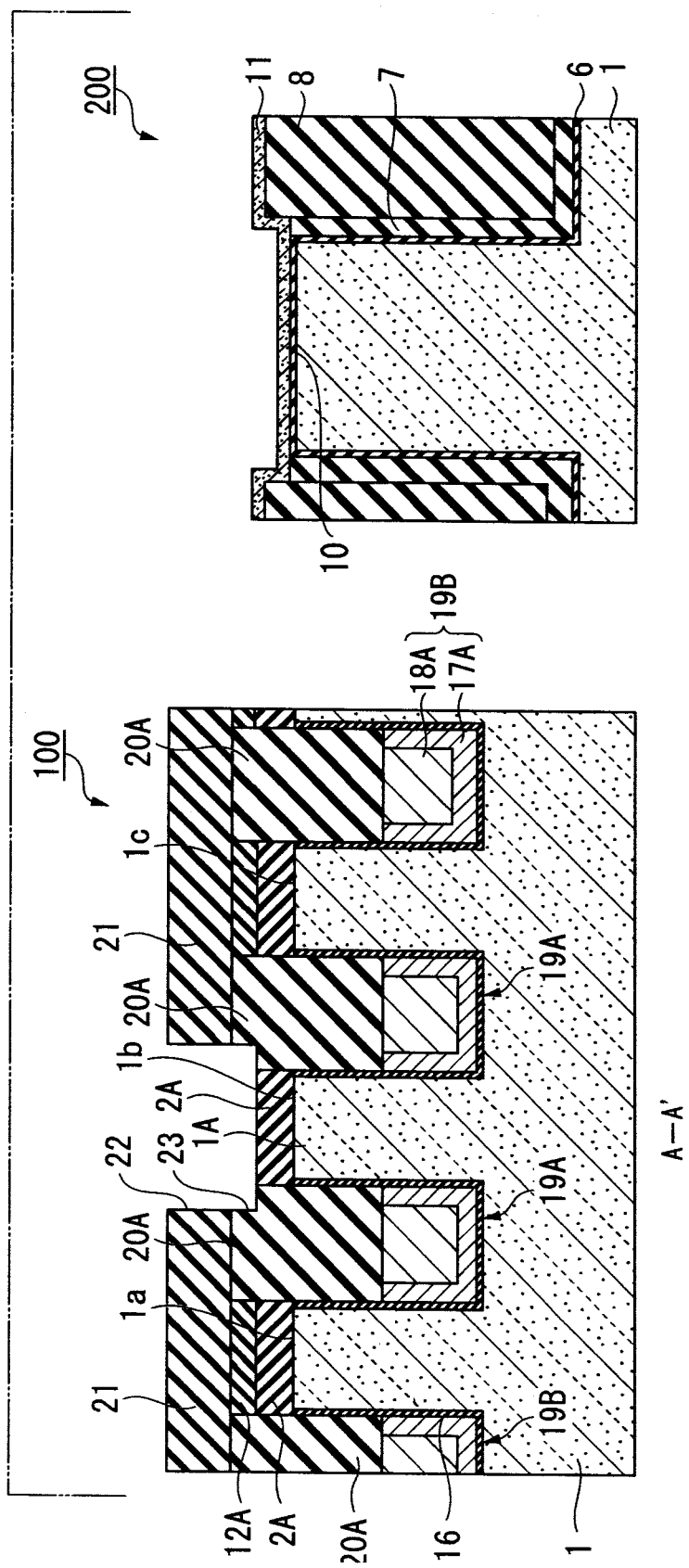

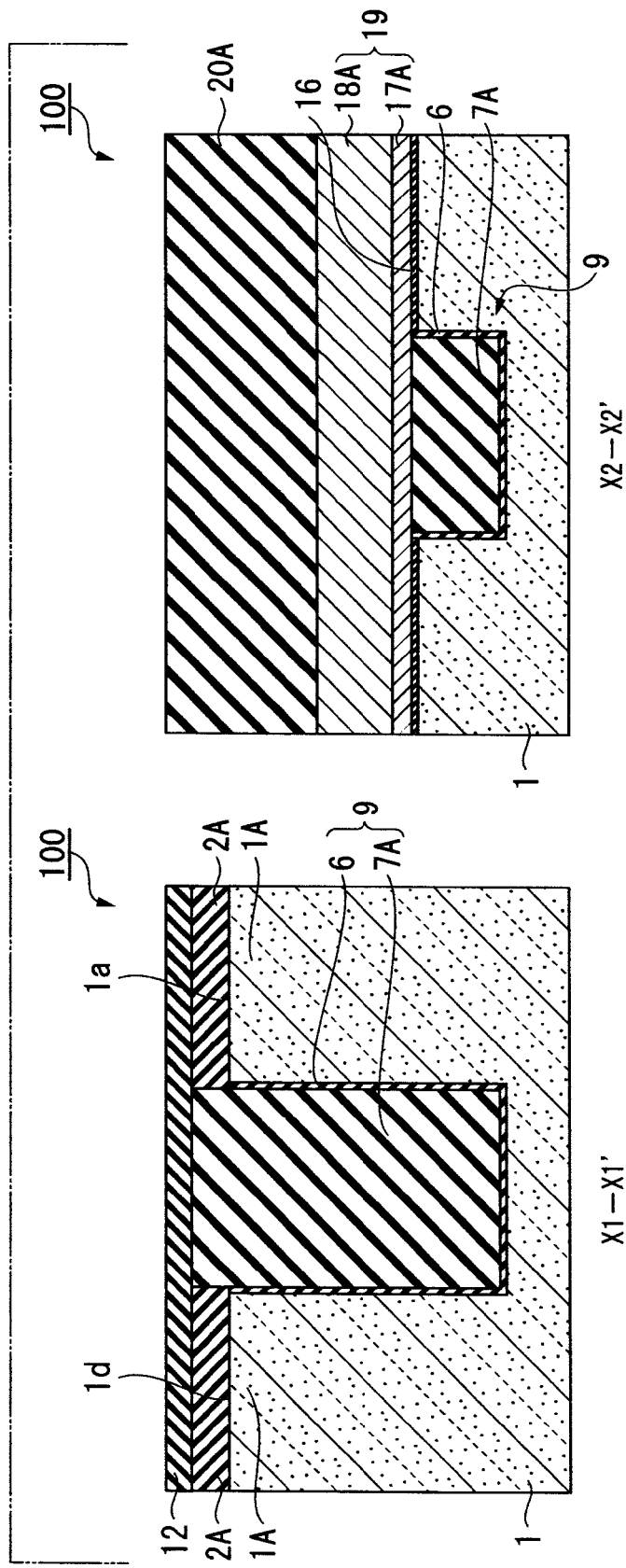

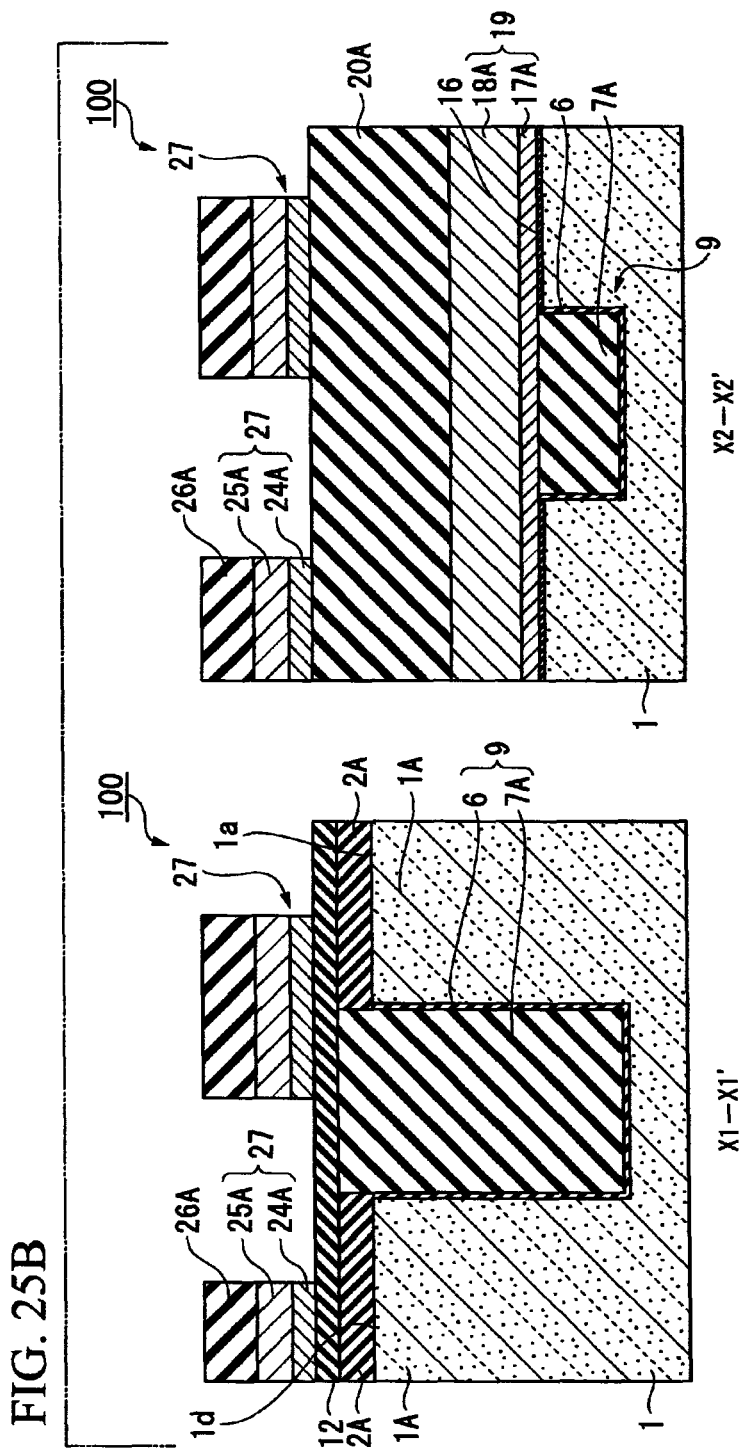

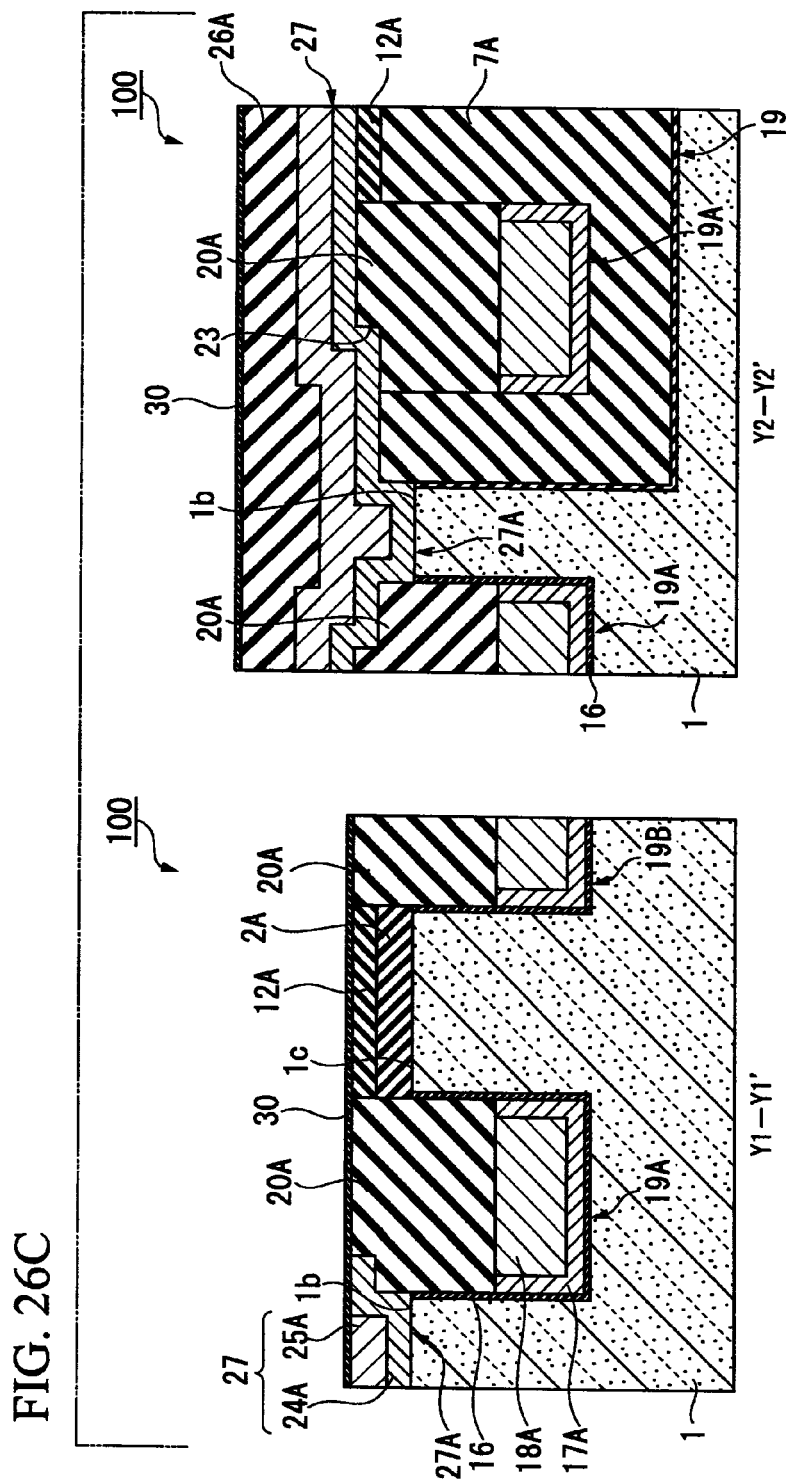

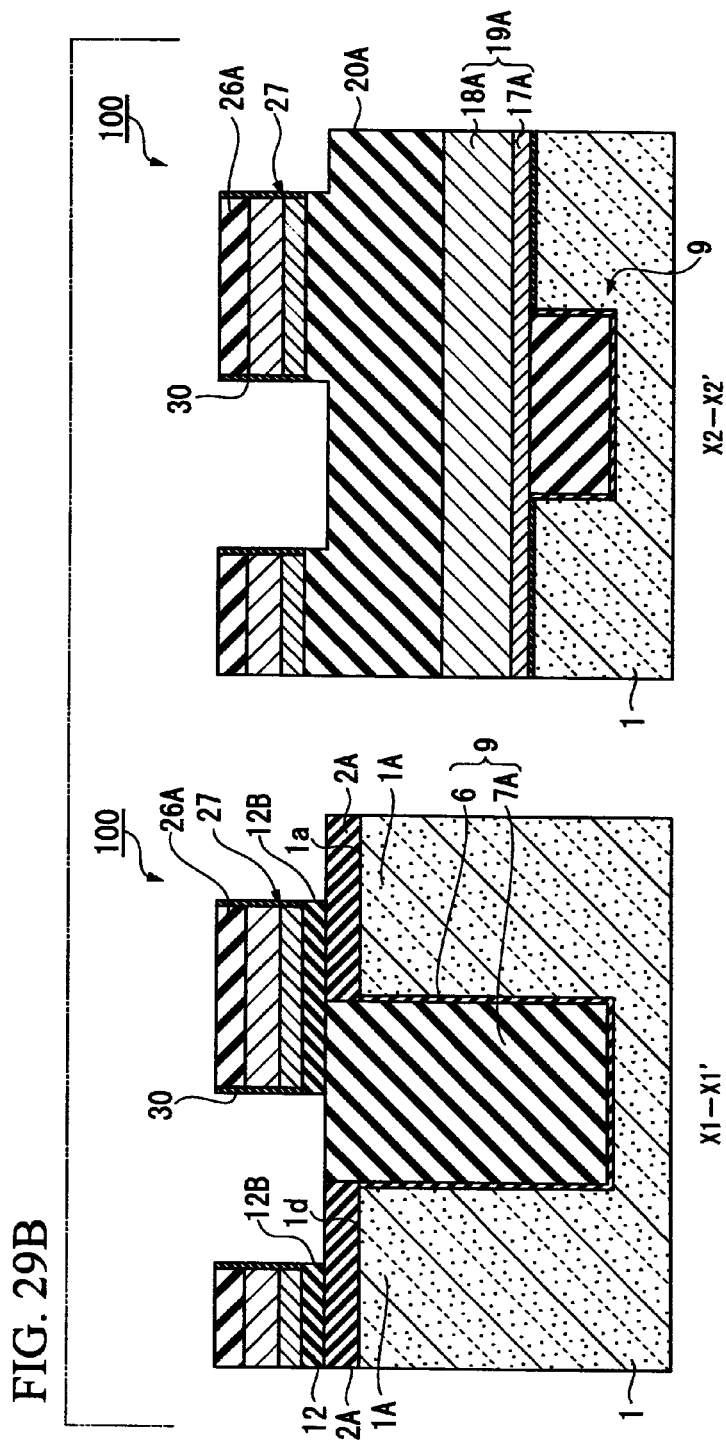

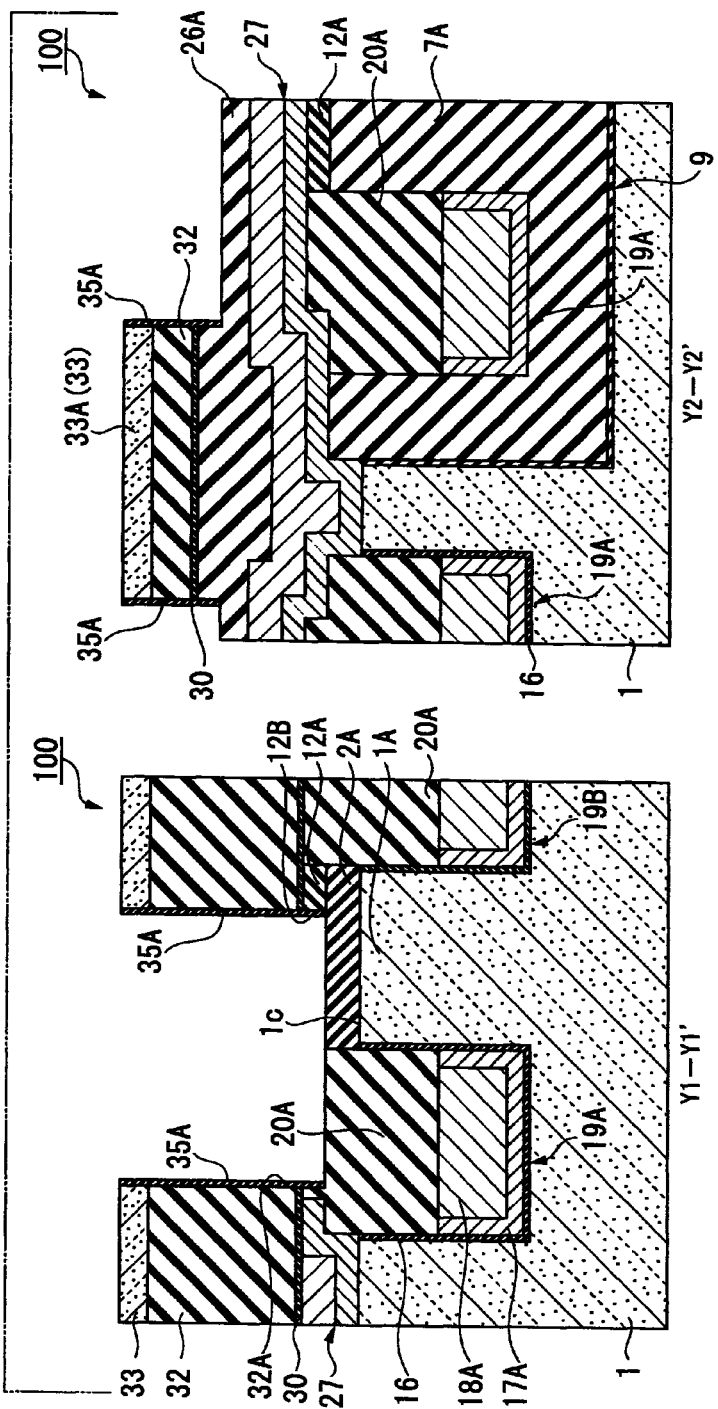

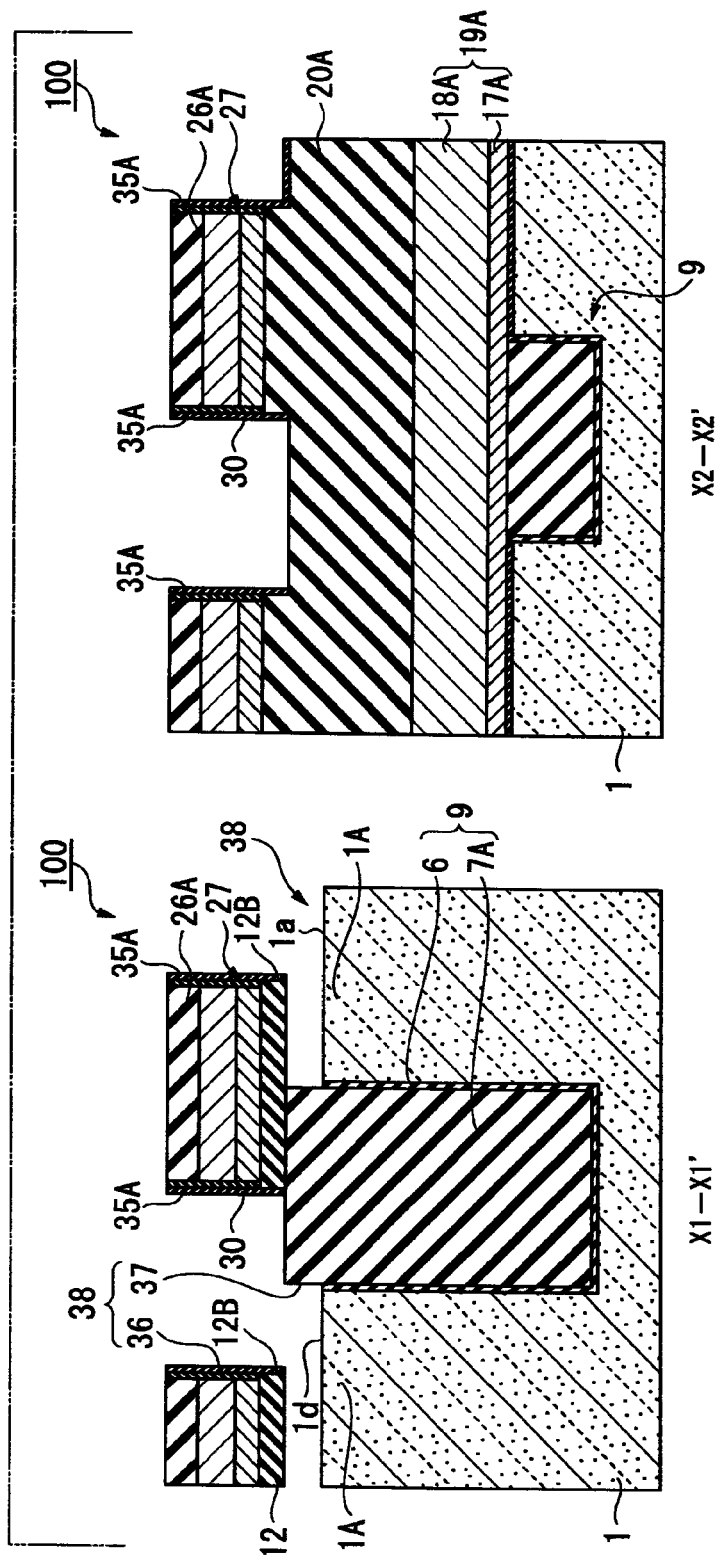

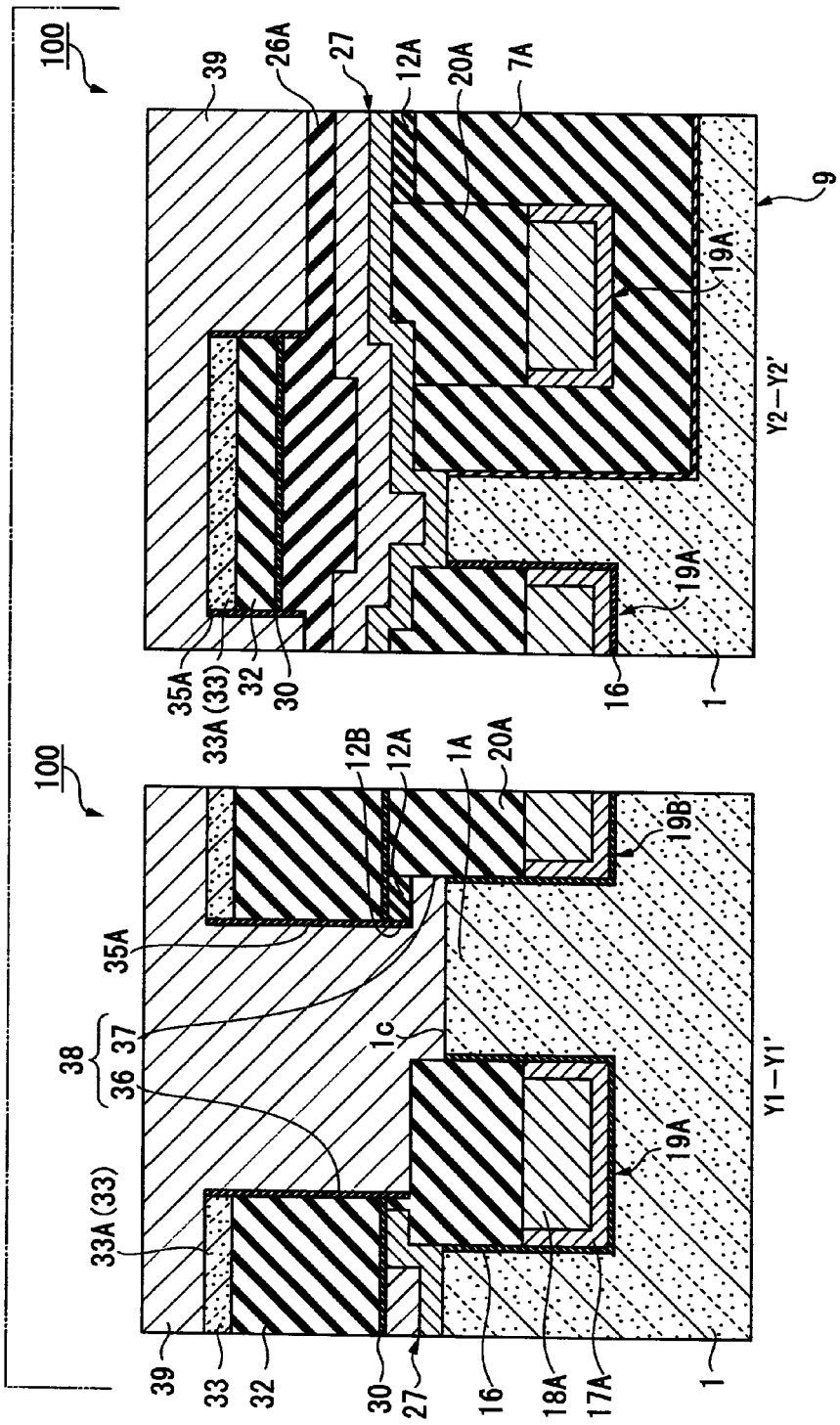

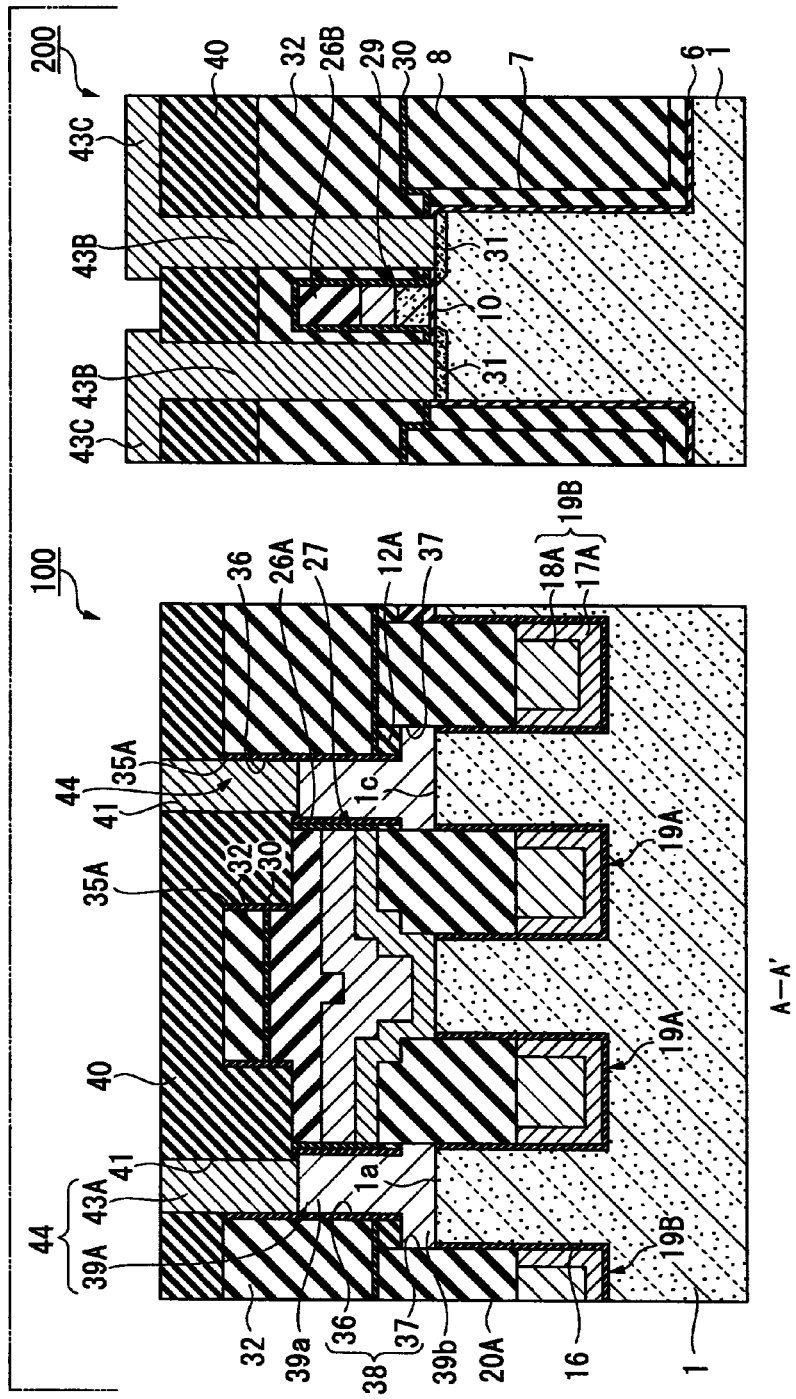

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2011-051604, filed Mar. 9, 2011, the content of which is incorporated herein by reference.

2. Description of the Related Art

Accompanying the nanoscaling of semiconductor devices, in planar-structured transistors using a substrate surface as a channel, it has become difficult to suppress the short-channel effect and to achieve the desired transistor characteristics. The trench-gate type of transistor disclosed in Japanese Patent Application Publications Nos. JPA 2006-339476 and JPA 2007-081095 has come into use to avoid this phenomenon.

In the trench-gate type of transistor noted in Japanese Patent Application Publications Nos. JPA 2006-339476 and JPA 2007-081095, the surface of a trench formed on the inside of the semiconductor substrate is used as a channel. Therefore, because the reduction in the plan-view dimension is compensated for by an increase of the dimension in the depth direction of the trench, it is possible to suppress the short-channel effect.

However, in the trench-gate type of the transistor noted in Japanese Patent Application Publications Nos. JPA 2006-339476 and JPA 2007-081095, the constitution is such that the gate electrode protrudes upward above the surface of the semiconductor substrate, and there is the problem of a deterioration in transistor characteristics caused by offset in the alignment with respect to the trench in the gate electrode process step. In particular when using the gate electrode as a word line, in a DRAM (dynamic random-access memory) constituted to use bit lines arranged so as to intersect with the word lines, the contact plugs connecting the semiconductor substrate to the uppermost layer interconnects must be formed between each of the word lines, which are formed at the minimum process dimension, and the difficulty in forming these contact plugs is a great barrier to the nanoscaling of a DRAM.

Given this, for the purpose of facilitating the forming of the above-noted contact plugs, investigation has been done regarding a buried-gate type of transistor that is completely buried within a trench, without the gate electrode protruding above the semiconductor substrate surface. In a buried-gate transistor, because the word lines are buried within the semiconductor substrate, only the bit lines are the only interconnects of the memory cells that are positioned above the semiconductor substrate surface, thereby having the benefit of reducing the difficulty of processing in the memory cell formation process. A buried-gate transistor is constituted to minimally include a gate electrode (word line) formed to be buried inside a trench formed in the semiconductor substrate, a cap insulating film that protects the upper surface of the gate electrode inside the trench and that has an upper surface that is substantially the same as the surface of the semiconductor substrate, and a bit line is formed above, with an intervening interlayer insulating film that covers the semiconductor substrate surface.

SUMMARY

In one embodiment, a semiconductor device may include, but is not limited to, a semiconductor substrate having a groove and an active region adjacent to the groove; a buried gate electrode in the groove; and a capacitor contact (storage node contact) including a first portion and a second portion over the first portion. The first portion is greater in horizontal dimension than the second portion. The first portion has a bottom surface that is in contact with an upper surface of the active region.

In another embodiment, a semiconductor device may include, but is not limited to, a semiconductor substrate having isolation regions and active regions defined by the isolation regions, the semiconductor substrate having grooves, each of the grooves extending over the isolation region and the active region adjacent to the isolation region; gate electrodes on bottoms of the grooves; cap insulators burying the grooves, the cap insulators being disposed over the gate electrodes; an insulator over the semiconductor substrate; bit lines over the insulator; and capacitor contacts which penetrate the insulator, each of the capacitor contacts comprising: a pillar portion extending vertically from a surface of the semiconductor substrate and a horizontally expanding portion which extends in a horizontal direction parallel to the surface of the semiconductor substrate. The horizontally expanding portion has a bottom surface that is in contact directly with the entire of an upper surface of the active region. The upper surface of the active region is defined by the isolation region and the cap insulator.

In still another embodiment, a semiconductor device may include, but is not limited to, a semiconductor substrate having an isolation region, an active region and the groove, the groove extending over the isolation region and the active region; an isolation region in the semiconductor substrate; a buried gate electrode in the groove; a cap insulator in the groove and over the buried gate electrode; and a capacitor contact including a first portion and a second portion over the first portion. The first portion is greater in horizontal dimension than the second portion. The first portion has a bottom surface that is in contact with an upper surface of the active region. The upper surface of the active region is defined by the isolation region and the cap insulator. The groove extends over the isolation region and the active region.

BRIEF DESCRIPTION OF THE DRAWINGS

The above features and advantages of the present invention will be more apparent from the following description of certain preferred embodiments taken in conjunction with the accompanying drawings, in which:

FIG. 3A is a fragmentary cross sectional elevation view of a step involved in a method of forming the semiconductor device of FIGS. 1 and 2, illustrating the memory cell area 100, taken along an A-A' line of FIG. 1 and the peripheral area 200;

FIG. 3B is a fragmentary cross sectional elevation view of the same step as in FIG. 3A, involved in the method of forming the semiconductor device of FIGS. 1 and 2, illustrating the memory cell area 100, taken along an X1-X1' line of FIG. 1 and taken along an X2-X2' line of FIG. 1;

FIG. 3C is a fragmentary cross sectional elevation view of the same step as in FIGS. 3A and 3B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 4A is a fragmentary cross sectional elevation view of a step subsequent to the step of FIGS. 3A, 3B and 3C, involved in the method of forming the semiconductor device of FIGS. 1 and 2, illustrating the memory cell area 100, taken along an A-A' line of FIG. 1 and the peripheral area 200;

FIG. 4B is a fragmentary cross sectional elevation view of the same step as in FIG. 4A, involved in the method of forming the semiconductor device of FIGS. 1 and 2, illustrating the memory cell area 100, taken along an X1-X1' line of FIG. 1 and taken along an X2-X2' line of FIG. 1;

FIG. 4C is a fragmentary cross sectional elevation view of the same step as in FIGS. 4A and 4B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 5A is a fragmentary cross sectional elevation view of a step subsequent to the step of FIGS. 4A, 4B and 4C, involved in the method of forming the semiconductor device of FIGS. 1 and 2, illustrating the memory cell area 100, taken along an A-A' line of FIG. 1 and the peripheral area 200;

FIG. 5C is a fragmentary cross sectional elevation view of the same step as in FIGS. 5A and 5B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 6A is a fragmentary cross sectional elevation view of a step subsequent to the step of FIGS. 5A, 5B and 5C, involved in the method of forming the semiconductor device of FIGS. 1 and 2, illustrating the memory cell area 100, taken along an A-A' line of FIG. 1 and the peripheral area 200;

FIG. 6B is a fragmentary cross sectional elevation view of the same step as in FIG. 6A, involved in the method of forming the semiconductor device of FIGS. 1 and 2, illustrating the memory cell area 100, taken along an X1-X1' line of FIG. 1 and taken along an X2-X2' line of FIG. 1;

FIG. 6C is a fragmentary cross sectional elevation view of the same step as in FIGS. 6A and 6B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 7B is a fragmentary cross sectional elevation view of the same step as in FIG. 7A, involved in the method of forming the semiconductor device of FIGS. 1 and 2, illustrating the memory cell area 100, taken along an X1-X1' line of FIG. 1 and taken along an X2-X2' line of FIG. 1;

FIG. 8A is a fragmentary cross sectional elevation view of a step subsequent to the step of FIGS. 7A, 7B and 7C, involved in the method of forming the semiconductor device of FIGS. 1 and 2, illustrating the memory cell area 100, taken along an A-A' line of FIG. 1 and the peripheral area 200;

FIG. 8C is a fragmentary cross sectional elevation view of the same step as in FIGS. 8A and 8B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 10B is a fragmentary cross sectional elevation view of the same step as in FIG. 10A, involved in the method of forming the semiconductor device of FIGS. 1 and 2, illustrating the memory cell area 100, taken along an X1-X1' line of FIG. 1 and taken along an X2-X2' line of FIG. 1;

FIG. 11C is a fragmentary cross sectional elevation view of the same step as in FIGS. 11A and 11B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 12B is a fragmentary cross sectional elevation view of the same step as in FIG. 12A, involved in the method of forming the semiconductor device of FIGS. 1 and 2, illustrating the memory cell area 100, taken along an X1-X1' line of FIG. 1 and taken along an X2-X2' line of FIG. 1;

FIG. 12C is a fragmentary cross sectional elevation view of the same step as in FIGS. 12A and 12B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 14C is a fragmentary cross sectional elevation view of the same step as in FIGS. 14A and 14B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 15B is a fragmentary cross sectional elevation view of the same step as in FIG. 15A, involved in the method of forming the semiconductor device of FIGS. 1 and 2, illustrating the memory cell area 100, taken along an X1-X1' line of FIG. 1 and taken along an X2-X2' line of FIG. 1;

FIG. 16C is a fragmentary cross sectional elevation view of the same step as in FIGS. 16A and 16B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 20B is a fragmentary cross sectional elevation view of the same step as in FIG. 20A, involved in the method of forming the semiconductor device of FIGS. 1 and 2, illustrating the memory cell area 100, taken along an X1-X1' line of FIG. 1 and taken along an X2-X2' line of FIG. 1;

FIG. 21B is a fragmentary cross sectional elevation view of the same step as in FIG. 21A, involved in the method of forming the semiconductor device of FIGS. 1 and 2, illustrating the memory cell area 100, taken along an X1-X1' line of FIG. 1 and taken along an X2-X2' line of FIG. 1;

FIG. 22A is a fragmentary cross sectional elevation view of a step subsequent to the step of FIGS. 21A, 21B and 21C, involved in the method of forming the semiconductor device of FIGS. 1 and 2, illustrating the memory cell area 100, taken along an A-A' line of FIG. 1 and the peripheral area 200;

FIG. 23B is a fragmentary cross sectional elevation view of the same step as in FIG. 23A, involved in the method of forming the semiconductor device of FIGS. 1 and 2, illustrating the memory cell area 100, taken along an X1-X1' line of FIG. 1 and taken along an X2-X2' line of FIG. 1;

FIG. 25B is a fragmentary cross sectional elevation view of the same step as in FIG. 25A, involved in the method of forming the semiconductor device of FIGS. 1 and 2, illustrating the memory cell area 100, taken along an X1-X1' line of FIG. 1 and taken along an X2-X2' line of FIG. 1;

FIG. 26C is a fragmentary cross sectional elevation view of the same step as in FIGS. 26A and 26B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 29B is a fragmentary cross sectional elevation view of the same step as in FIG. 29A, involved in the method of forming the semiconductor device of FIGS. 1 and 2, illustrating the memory cell area 100, taken along an X1-X1' line of FIG. 1 and taken along an X2-X2' line of FIG. 1;

FIG. 31C is a fragmentary cross sectional elevation view of the same step as in FIGS. 31A and 31B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 32B is a fragmentary cross sectional elevation view of the same step as in FIG. 32A, involved in the method of forming the semiconductor device of FIGS. 1 and 2, illustrating the memory cell area 100, taken along an X1-X1' line of FIG. 1 and taken along an X2-X2' line of FIG. 1;

FIG. 33C is a fragmentary cross sectional elevation view of the same step as in FIGS. 33A and 33B, involved in the method of forming the semiconductor device of FIGS. 1 and 2, illustrating the memory cell area 100, taken along a Y1-Y1' line of FIG. 1 and taken along a Y2-Y2' line of FIG. 1;

FIG. 37A is a fragmentary cross sectional elevation view of a step subsequent to the step of FIG. 36A, involved in the method of forming the semiconductor device of FIGS. 1 and 2, illustrating the memory cell area 100, taken along an A-A' line of FIG. 1 and the peripheral area 200;

DETAILED DESCRIPTION OF THE PREFERRED EMBODIMENTS

Before describing the present invention, the related art will be explained in detail with reference to FIG. 45, in order to facilitate the understanding of the present invention.

Figure 45:
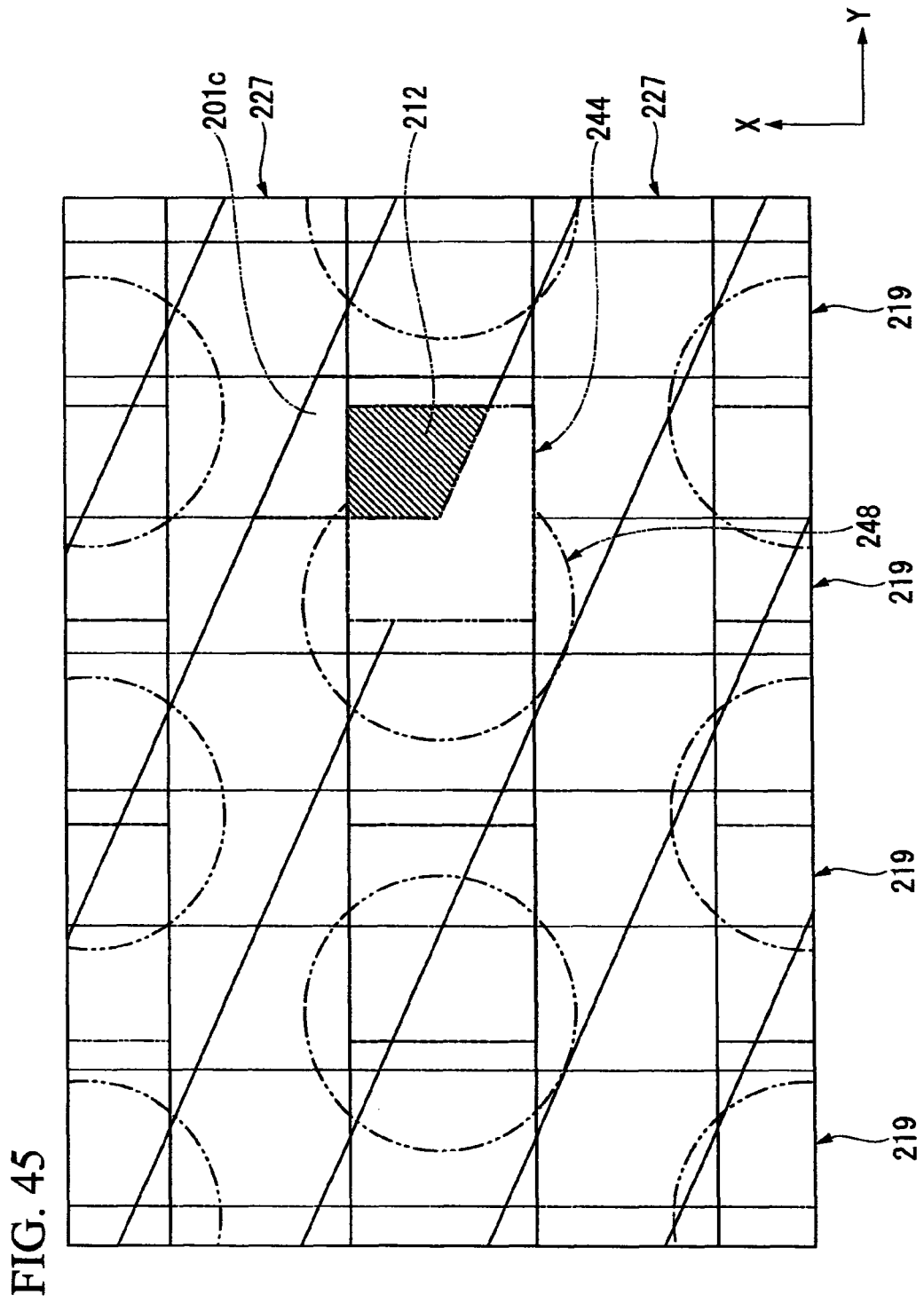
FIG. 45 is a fragmentary plan view of memory cell area 100 of a semiconductor device in accordance with related art.

As shown in FIG. 45, a vertical capacitor 248 that is of cylindrical shape or the like is provided above a conventional buried-gate transistor, and a capacitor contact 244 provided so as to pass through an interlayer insulating film that covers the semiconductor substrate surface connects the source region 201c of the transistor and the capacitor 248.

However, with the nanoscaling of DRAMs, the spacing between the buried-gate transistors 219 and the bits 227 has become small, and because the surface area of the contact region 212 between the bottom surface of the capacitor contact 244 and the active region 201c of the semiconductor substrate surface becomes very small, there was the problem of difficulty in forming a low-resistance connection between the capacitor contact 244 and the active region 201c of the semiconductor substrate surface.

Also, as shown in FIG. 45, because the position is such that there is a partial overlap between the capacitor contact 244 and the buried-gate electrode 219 when seen in plan view, if excessive etching is done to that is deeper than the semiconductor substrate surface when forming the contact hole of the capacitor contact 244, the cap insulating film of the buried gate electrode 219 provided below the capacitor contact pattern is etched, and there is a risk of shorting between the capacitor contact 244 and the buried gate electrode 219.

Additionally, in order to reduce the production cost, it is necessary to form the buried-gate transistor of the memory cell region 100 and a peripheral circuit transistor in the peripheral circuit region 200 simultaneously.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a groove and an active region adjacent to the groove; a buried gate electrode in the groove; a cap insulator in the groove and over the buried gate electrode; and a capacitor contact (storage node contact) including a first portion and a second portion over the first portion. The first portion is greater in horizontal dimension than the second portion. The first portion has a bottom surface that is in contact with an upper surface of the active region.

In some cases, the bottom surface is in contact directly with the entire of the upper surface of the active region.

In some cases, the first portion may include, but is not limited to, a horizontally expanded portion and the second portion comprises a pillar portion which extends vertically from the horizontally expanded portion.

In some cases, the first portion may include, but is not limited to, a horizontally expanded portion and the second portion comprises a pillar portion which extends vertically from the horizontally expanded portion.

In some cases, the semiconductor device may include, but is not limited to, an isolation region in the semiconductor substrate. The isolation region and the cap insulator define the upper surface of the active region that is in contact with the bottom surface of the first portion. The groove extends over the isolation region and the active region.

In some cases, the semiconductor device may include, but is not limited to, a first insulator over the substrate; and a first bit line over the first insulator.

In some cases, the pillar portion has a bottom portion which partially overlaps an upper portion of the horizontally expanded portion in plan view.

In some cases, the semiconductor device may include, but is not limited to, a first bit line over the substrate; and a cover insulator which covers the first bit line. The capacitor contact has an upper surface which is lower than an upper surface of the cover insulator.

In some cases, the semiconductor device may include, but is not limited to, an insulating film of a same material, which covers all surfaces of the capacitor contact, except for the upper surface of the pillar portion and the bottom surface of the horizontally expanded portion.

In some cases, the semiconductor device may include, but is not limited to, an isolation region in the semiconductor substrate, the isolation region defining the active region, and the groove extending over the isolation region and the active region; a first bit line over the substrate; a cover insulator which covers the first bit line; and a first insulating film which covers all surfaces of the capacitor contact, except for the upper surface of the pillar portion and the bottom surface of the horizontally expanded portion. The isolation region, the cover insulator and the first insulating film are made of a same insulating material.

In some cases, the semiconductor device may include, but is not limited to, a second insulating film of the same insulating material, which covers upper, side and bottom surfaces of the first bit line.

In some cases, the same insulating material is silicon nitride.

In some cases, the capacitor contact plug may include, but is not limited to, a one-piece doped polysilicon film.

In some cases, the pillar portion has a rectangle shape in horizontal cross section.

In some cases, the pillar portion has a lower portion which partially penetrates the insulator.

In some cases, the horizontally expanded portion is disposed between the active region and the insulator.

In some cases, the horizontally expanded portion has an upper surface that is substantially the same level as an upper surface of the isolation region.

In some cases, the horizontally expanded portion has a thickness that is substantially the same as a height of an upper surface of the isolation region from an upper surface of the semiconductor substrate.

In another embodiment, a semiconductor device may include, but is not limited to, a semiconductor substrate having isolation regions and active regions defined by the isolation regions, the semiconductor substrate having grooves, each of the grooves extending over the isolation region and the active region adjacent to the isolation region; gate electrodes on bottoms of the grooves; cap insulators burying the grooves, the cap insulators being disposed over the gate electrodes; an insulator over the semiconductor substrate; bit lines over the insulator; and capacitor contacts which penetrate the insulator, each of the capacitor contacts comprising: a pillar portion extending vertically from a surface of the semiconductor substrate and a horizontally expanding portion which extends in a horizontal direction parallel to the surface of the semiconductor substrate. The horizontally expanding portion has a bottom surface that is in contact directly with the entire of an upper surface of the active region. The upper surface of the active region is defined by the isolation region and the cap insulator.

In still another embodiment, a semiconductor device may include, but is not limited to, a semiconductor substrate having an isolation region, an active region and the groove, the groove extending over the isolation region and the active region; an isolation region in the semiconductor substrate; a buried gate electrode in the groove; a cap insulator in the groove and over the buried gate electrode; and a capacitor contact including a first portion and a second portion over the first portion. The first portion is greater in horizontal dimension than the second portion. The first portion has a bottom surface that is in contact with an upper surface of the active region. The upper surface of the active region is defined by the isolation region and the cap insulator. The groove extends over the isolation region and the active region.

In the present embodiment, the description is for the case of applying the present invention to a DRAM (dynamic random-access memory) as, for example, a semiconductor device. There are cases, in which the drawings used in the descriptions to follow show characteristic parts enlarged as a convenience in order to easily understand the features, and the dimensional ratios and the like of constituent elements are not necessarily the same as in actuality. Also the material, dimensions, and the like given as examples in the description to follow are examples, and the present invention is not necessarily restricted thereto, but rather can be subjected to various changes, within the scope of the essence of the present invention.

First, the constitution of a DRAM (semiconductor device) that is an embodiment that applies the present invention will be described. The DRAM of the present embodiment is constituted by the memory cell region 100 shown in FIG. 1 and a peripheral circuit region 200 that is not shown.

Figure 1:
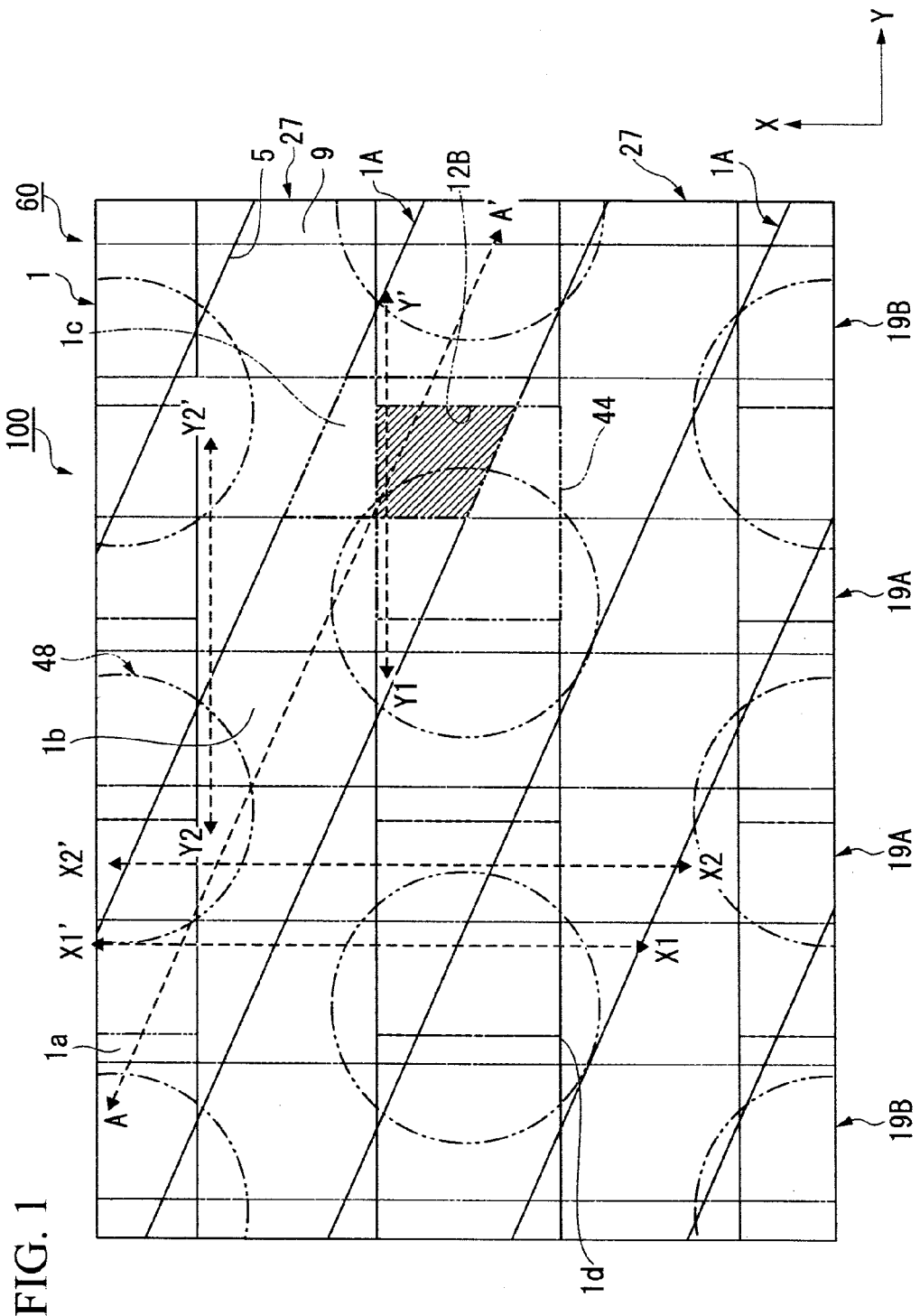
FIG. 1 is a fragmentary plan view of memory cell area 100 of a semiconductor device in accordance with one or more embodiments of the present invention.

As shown in FIG. 1, in the memory cell region 100 of the DRAM (semiconductor device) 60 of the present embodiment, a plurality of active regions 1A surrounded and partitioned by an element separation region made of an STI element separation film 9 provided by burying a buried silicon nitride film (buried insulating film) in an STI trench (element separation trench) 5 formed in the silicon substrate (semiconductor substrate) 1, these being formed in a prescribed direction and with a prescribed spacing. Buried gate electrodes 19A that will become word lines and buried interconnects 19B for element separation are buried and formed so as to extend in a prescribed direction (the X direction in FIG. 1) and be spaced with the prescribed spacing, so as to pass vertically across active regions 1A. Additionally, a plurality of bit lines 27 are disposed in a direction that is perpendicular to the direction of extension of the buried gate electrodes 19A and the buried interconnects 19B (the X direction shown in FIG. 1), and at a prescribed spacing. Memory cells are formed at the regions of intersection between the buried gate electrodes 19A and the active regions 1A.

Although the buried gate electrodes (word lines) 19A and the buried interconnects 19B have the same structure, they have different functions. In contrast to the buried gate electrodes 19A that function as the gate electrodes of the memory cell, the buried interconnects 19B for element separation are provided for separating between adjacent transistors by application of a prescribed electrical potential. That is, by maintaining the element separation buried interconnects 19B at a prescribed electrical potential, separation between adjacent transistors on one and the same active region 1A is done with the parasitic transistors in the off state.

Also, a plurality of memory cells are formed over the entire memory cell region 100, and a capacitor 48 is provided for each of the memory cells. The capacitors 48, as shown in FIG. 1, are disposed at a prescribed spacing within the memory cell region 100 so that they do not overlap each other.

The DRAM 60 of the present embodiment, as shown in FIG. 1, has a $6F^2$ cell arrangement (where F is the minimum process dimension).

Next, the memory cell region 100 constituting the DRAM 60 of the present embodiment will be described.

The memory cell region 100 constituting the DRAM 60 of the present embodiment has formed therein a plurality of memory cells such as described above. As shown in the left-side drawing in FIG. 2, the memory cell of the present embodiment has a laminated structure formed by buried-gate transistor, a capacitor 48, and an interconnect layer 50, in which the word line 19A is completed buried inside the semiconductor substrate.

Figure 2:
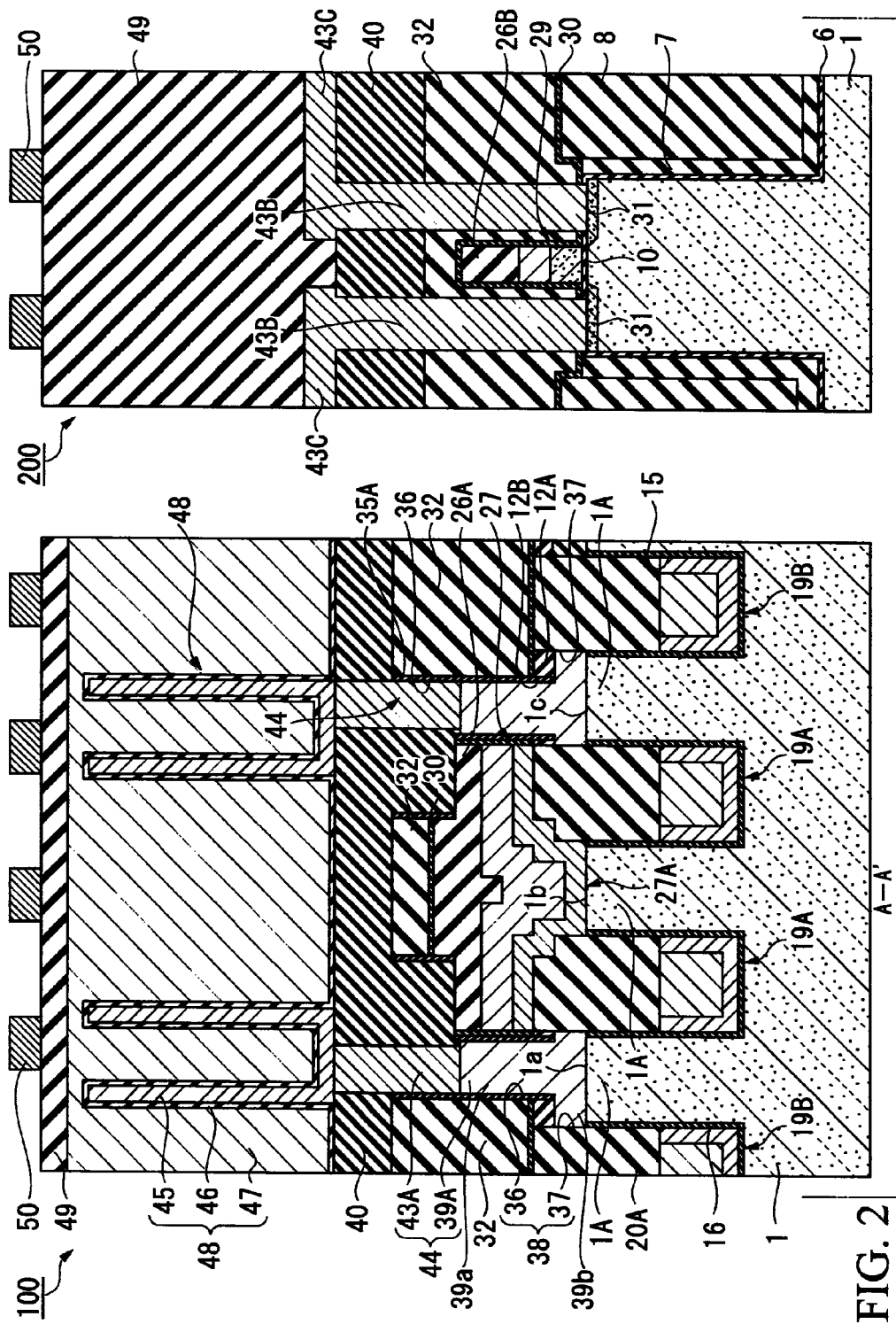
FIG. 2 is a fragmentary cross sectional elevation view of the memory cell area 100 of the semiconductor device, taken along an A-A' line of FIG. 1 and of a transistor in a peripheral area 200 of the semiconductor device.

The buried-gate transistor, as shown in FIG. 2, is generally constituted by a silicon substrate (semiconductor substrate) 1, the surface of which is made of silicon, an active region 1A formed by partitioning by an element separation region constituted from an STI element separation film 9 shown in FIG. 1, a buried gate electrode 19A and buried interconnect 19B that are buried, with an intervening gate insulating film 16, in the bottom part of the WL trench (gate electrode trench) 15 formed across the element separation region and the active region 1A, a cap insulating film 20A that protects the upper surfaces of the buried gate electrode 19A and the buried interconnect 19B in the inside of the WL trench 15, a bit contact 27A and bit line 27 that connect to a surface of the active region 1A between a pair of buried gate electrodes 19A, a first interlayer insulating film 32 and a second interlayer insulating film 40 provided over the silicon substrate 1, and a capacitor contact plug 44 provided so as to pass through first and second interlayer insulating films 32, 40.

Also, the buried-gate transistor is provided with a non-illustrated impurity diffusion layer that is formed by implanting ions into each active region 1A between the buried gate electrode 19A and the buried interconnect 19B, the impurity diffusion layer and the above-noted capacitor contact plug 44 being connected.

In the DRAM 60 of the present embodiment, the capacitor contact plug 44 is a laminated structure (hybrid plug) in which a first capacitor contact plug (capacitor contact) 39A and a second capacitor contact plug 43A are laminated from the silicon substrate 1 side.

The first capacitor contact plug 39A is constituted by a doped polysilicon film. The second capacitor contact plug 43A is constituted by a metal film that is made of, for example, a cobalt silicide layer (silicide layer), a tungsten nitride layer, and a tungsten layer.

In this case, in the DRAM 60 of the present embodiment, as shown in the left-side drawing in FIG. 2, the first capacitor contact plug 39A has a pillar-shaped part 39a extending in a direction that is perpendicular to the surface of the silicon substrate 1, and a planar-shaped part 39b provided below the pillar-shaped part 39a and extending in a direction that is perpendicular with the direction of extension of the pillar-shaped part 39a (a direction in parallel with the surface of the silicon substrate 1). The bottom surface of the planar-shaped part 39b and the surface of the capacitor contact contacting region 1a (or 1c) of the active region 1A partitioned by the element separation region and the cap insulating film 20A are provided so as to make contact over the entire surface area.

Therefore, as shown in FIG. 1, because the bit line 27 when seen in plan view is disposed so as to overlap with the capacitor contact contacting regions 1a and 1c of the active region 1A, although only a part of the capacitor contact contacting regions 1a and 1c is exposed from between the bit lines 27, 27, it is possible to cause contact and connection between the entire surface of the bottom surface of the planar-shaped part 39b of the capacitor contact plug 44 and the entire surface of the capacitor contact contacting region 1a or 1c of the active region 1A. Also, as shown in FIG. 1, the capacitor contact contacting region 1a and 1c are the surfaces of the active region 1A partitioned by the element separation region made of the STI element separation film 9, which are the surfaces of the active region 1A partitioned by the buried gate electrode 19A and the buried interconnect 19B. An impurity diffusion layer that will become the drain is provided in the vicinity of the surfaces of the active region 1A that will become the capacitor contact contacting regions 1a and 1c.

Except for the upper surface of the pillar-shaped part 39a and the bottom surface of the planar-shaped part 39b, all of the surface of the first capacitor contact plug 39A is covered by an insulating film made of a silicon nitride film. Additionally, the upper surface of the first contact plug 39A (that is, the upper surface of the pillar-shaped part 39a) is provided so as to be at a position that is lower than the upper surface of a cover insulating film 26A provide over the bit line 27.

The pillar-shaped part 39a has a cross-sectional shape that is rectangular when seen in plan view (refer to the shape of the reference numeral 44 shown in FIG. 1). At least one part of the bottom end side of the pillar-shaped part 39a is provided so as to pass through a silicon nitride guard film (insulating film) 12A.

The planar-shaped part 39b is provide between the capacitor contact contacting region 1a or 1c of the active region 1A and the silicon nitride guard film 12A. The cross-sectional shape of the planar-shaped part 39b when seen in plan view, as shown in FIG. 1, is the same as the shape of the capacitor contact contacting region 1c of the active region 1A partitioned by the element separation region and cap insulating film 20A formed by the STI element separation film 9 (that is, substantially a parallelogram).

The upper surface of the planar-shaped part 39b and the upper surface of the buried silicon nitride film (buried insulating film) 7A are substantially at the same height. That is, the thickness of the planar-shaped part 39b is substantially the same as the height of the upper surface of the buried silicon nitride film 7A from the surface of the silicon substrate 1.

The pillar-shaped part 39a and the planar-shaped part 39b of the first capacitor contact plug 39A, as shown in FIG. 1, provided so that, when seen in plan view, the bottom surface of the pillar-shaped part 39a and the upper surface of the planar-shaped part 39b partially overlap (refer to the reference numerals 12B indicating the overlapping portion in FIG. 1).

The buried-gate transistor is provided with a capacitor 48 over the second interlayer insulating film 40 that covers the bit line 27. The active region 1A in which the impurity diffusion layer of the buried-gate transistor is formed and the capacitor 48 are connected via the capacitor contact plug 44. The capacitor 48 in this case is constituted by a capacitor lower electrode, a capacitor insulating film 46, and an upper electrode 47.

Although in the present embodiment, one example of the capacitor 48 is described, this being a crown-type capacitor, using the inner wall and outer wall of the capacitor lower electrode 45 as the electrodes, this is not a restriction and, for example, a change is possible to a cylinder type that uses only the inner wall of the lower electrode as an electrode.

The interconnect layer 50 is provided on the capacitor 48, with an intervening third interlayer insulating film 49.

Although in the present embodiment one example of the interconnect layer 50 is described, this being the case in which the interconnect layer 50 is a single-layer interconnect structure, this is not a restriction and, for example, a change is possible to a multilayer interconnect structure of a plurality of interconnect layers and interlayer insulating films.

The peripheral circuit region 200 of the DRAM 60 of the present embodiment, as shown the right-side drawing in FIG. 2, has a peripheral circuit transistor that minimally has a peripheral gate electrode 29 provided on the silicon substrate 1 with an intervening peripheral gate insulating film 10, and a first interlayer insulating film 32 that covers the peripheral gate electrode 29.

In the DRAM 60 of the present embodiment, as shown at in the left-side and right-side drawings in FIG. 2, the third interlayer insulating film 49 is provided over the silicon substrate 1, passing over the memory cell region 100 and the peripheral circuit region 200. The interconnect layer 50 is provided on both the memory cell region 100 and the peripheral circuit region 200 over the third interlayer insulating film 49. That is, the interconnect layers 50 of the memory cell region 100 and the peripheral circuit region 200 are provided on the same level (at the same interconnect height). The interconnect layers 50 of the memory cell region 100 and the peripheral circuit region 200 are constituted by the same material.

As described above, according to the DRAM (semiconductor device) 60 of the present embodiment, as shown in the left-side drawing in FIG. 2, the first capacitor contact plug 39A of the capacitor contact plug 44 has a pillar-shaped part 39a extending in a direction that is perpendicular to the surface of the silicon substrate 1 and a planar-shaped part 39b that is provided below this pillar-shaped port 39a and that extends in a direction that is perpendicular to the direction of extension of the pillar-shaped part 39a, the bottom surface of the planar-shaped part 39b and the surface of the capacitor contact contacting region 1a (or 1c) of the active region 1A that is partitioned by the element separation region and the cap insulating film 20A being in contact and connected over the entire surface. For this reason, it is possible to establish the maximum contact surface area, and make a low-resistance connection between the capacitor contact plug 44 and the active region 1A. By doing this, it is possible to reliably transmit the amount of electrical charge and amount of signal stored in the capacitor, enabling an improvement in the connection reliability in the DRAM 60.

In the DRAM 60 of the present embodiment, as shown in the left-side drawing in FIG. 2, a silicon nitride guard film (second insulating film) 12A made of a silicon nitride film is provided over the capacitor contact contacting regions 1a, 1c. The upper surface of the silicon nitride guard film 12A has substantially the same height as the upper surface of the cap insulating film 20A. The silicon nitride guard film 12A is provided with an aperture 21B that passes through the upper-side region 36 and the lower-side region 37 of the capacitor contact hole 38. The first capacitor contact plug 39A, which is made of a doped polysilicon film, is integrally formed so as to fill all of the lower-side region 37 and one part of the upper-side region 36, via the aperture 12B. Therefore, as shown in the left-side drawing in FIG. 2, although in the first capacitor contact plug 39A the lower-side region 37 that connects to the capacitor contact contacting regions 1a, 1c and the upper-side region 36 that is a space on the inside of the side wall 35A have different shapes, there is no part in the first capacitor contact plug 39A itself that has a high resistance.

Additionally, the upper surface of the buried silicon nitride film 7A of the STI element separation film 9 (not shown in the left-side drawing in FIG. 2) and the upper surface of the cap insulating film 20A are both constituted so as to be at positions that are higher than the surface of the active region 1A of the silicon substrate 1. By doing this, the side surface of the lower-side region 37 of the capacitor contact hole 38 is covered by the buried silicon nitride film 7A and the cap insulating film 20A, and the upper surface is constituted so as to be covered by the silicon nitride guard film 12A. The inside of the upper-side region 36 of the capacitor contact hole 38 is covered by the side wall 35A. The buried silicon nitride film 7A, the cap insulating film 20A, the insulating film 12A, and the side wall 35A are all made of silicon nitride films. Therefore, all of the insides of the upper-side region 36 and lower-side region 37 of the capacitor contact hole 38 are constituted so as to be covered by a silicon nitride film. That is, with the exception of the upper surface and bottom surface of the first capacitor contact plug 39A, all the surfaces are covered by the same type of insulating material. By doing this, because the capacitor contact plug 44, the buried gate electrode 19A, the buried interconnect 19B, and the bit line 27 are reliably insulated, there is no risks of these making mutual contact and shorting.

The upper surface of the polysilicon layer 39A is provided so as to be at a position that is lower than the upper surface of the cover insulating film 26A provided above the bit line 27. By doing this, there is no risks of adjacent polysilicon layers 39A making mutual contact and shorting.

Additionally, in the DRAM 60 in the present embodiment, the constitution is such that periphery of the bit line 27 other than the location at which the bit contact 27A is provided is covered by a silicon nitride film. Therefore, because, as shown in FIG. 1, the bottom surface of the capacitor contact plug 44 (first capacitor contact plug 39A) and the surface of the capacitor contact contacting region 1a or 1c make overall contact, even if one part of the first capacitor contact plug 39A is buried below the bit line 27, because the entire periphery of the bit line 27 is protected by a silicon nitride film, there is no risks of the capacitor contact plug 44 and the bit line 27 making mutual contact and shorting.

Next, a method for manufacturing the DRAM (semiconductor device) 60 having the above-noted constitution will be described, making references to FIG. 3A to FIG. 38A, FIG. 3B to FIG. 35B, and FIG. 3C to FIG. 35C. In this case, FIG. 3A to FIG. 38A are drawings for the purpose of describing the method for manufacturing the DRAM of the present embodiment, the left-side drawings thereof being cross-sections along the line A-A' shown in FIG. 1 (that is, cross-sections above the active region, in the direction of extension of the active region), and the right-side drawings thereof being cross-sections of the peripheral circuit region 200.

FIG. 3B to FIG. 35B are drawings for the purpose of describing the method for manufacturing the DRAM of the present embodiment, the left-side drawings thereof being cross-sections along the line X1-X1' shown in FIG. 1 (that is, cross-sections between the gate electrode 19A and the buried interconnect 19B, in the direction of extension of the buried gate electrode 19A), and the right-side drawings thereof being cross-sections along the line X2-X2' shown in FIG. 1 (that is, cross-sections above the gate electrode 19A, in the direction of extension of the buried gate electrode 19A).

Additionally, FIG. 3C to FIG. 35C are drawings for the purpose of describing the method for manufacturing the DRAM of the present embodiment, the left-side drawings thereof being cross-sections along the line Y1-Y1' shown in FIG. 1 (that is, cross-sections of the bit lines 27, in the direction of extension of the bit line 27), and the right-side drawings thereof being cross-sections along the line Y2-Y2' (that is, cross-sections above the bit line 27, in the direction of extension of the bit line 27).

The method for manufacturing the DRAM (semiconductor device) 60 of the present embodiment is generally constituted so as to include a step of forming a first insulating film on a surface of the semiconductor substrate of the memory cell region 100; a step of forming a trench for element separation in the semiconductor substrate, using the first insulating film as a mask, and then burying the buried insulating film and forming the element separation region; a step of forming a second insulating film on a surfaces of the element separation region and the active region; a step of forming a gate electrode trench across the element separation region and the active region of the semiconductor substrate that is partitioned by the element separation region, and then forming a buried gate electrode in the bottom part of the gate electrode trench and forming the cap insulating film at the top part of the gate electrode trench; a step of forming the bit contact and the bit line on the upper surface of the active region; a step of forming an insulating film on the semiconductor substrate; and a step of forming the capacitor contact so as to pass through the insulating film.

The various process steps will be described below.

(First Insulation Film Formation Process Step)

As shown in FIG. 3A, FIG. 3B, and FIG. 3C, a sacrificial silicon oxide film (first insulating film) 2 made of silicon oxide ($SiO_2$) (first insulating material) is first formed across the memory cell region 100 and the peripheral circuit region 200 on the surface of, for example, a p-type silicon substrate (semiconductor substrate) 1. The thickness of the sacrificial silicon oxide film 2 is, for example, approximately 20 nm. The sacrificial silicon oxide film 2 is removed as a sacrificial layer for the purpose of expanding the contact surface area between the capacitor contact and the active region of the silicon substrate 1 in the step of forming the capacitor contact, to be described later.

Figure 5B:
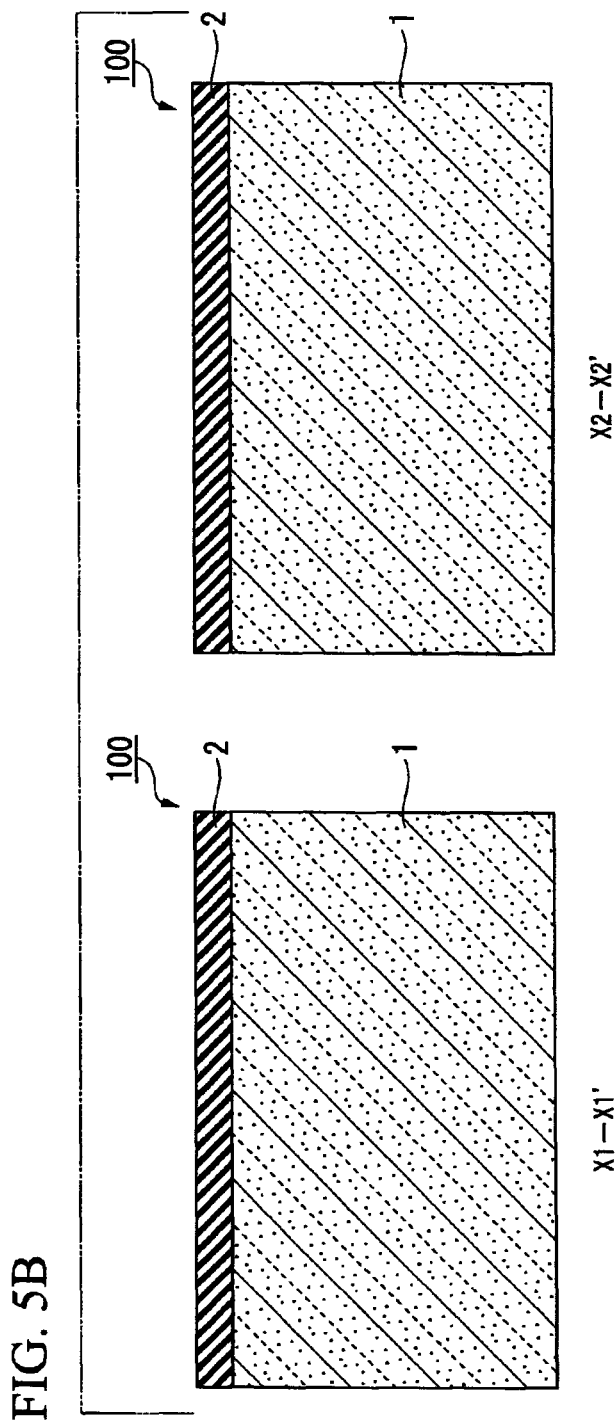
FIG. 5B is a fragmentary cross sectional elevation view of the same step as in FIG. 5A, involved in the method of forming the semiconductor device of FIGS. 1 and 2, illustrating the memory cell area 100, taken along an X1-X1' line of FIG. 1 and taken along an X2-X2' line of FIG. 1.

Next, as shown in FIG. 4A, FIG. 4B, and FIG. 4C, a photoresist pattern 3 covering the memory cell region 100 is formed by lithography. Next as shown in FIG. 5A, FIG. 5B, and FIG. 5C, after removing the sacrificial silicon oxide film 2 of the peripheral circuit region 200 using the photoresist pattern 3 as a mask, the photoresist pattern 3 is removed. By doing this, as shown in the right-side drawing in FIG. 5A, the surface of the silicon substrate 1 in the peripheral circuit region 200 is exposed.

(Element Separation Region Formation Process Step)

Next, an element separation region for the purpose of separating the active region 1A is formed on the surface of the silicon substrate 1. For the forming of the element separation region, first plasma CVD is used to form an amorphous carbon film over the entire surface of the memory cell region 100 and the peripheral circuit region 200. Next, as shown in FIG. 6A to FIG. 6C, in the memory cell region 100 lithography and dry etching are used to form a mask pattern of an amorphous carbon film 4 covering the active region 1A. As shown in the right-side drawing in FIG. 6A, in the peripheral circuit region 200, the surface of the silicon substrate 1 that will become an STI element separation region is exposed.

In the description of the method for manufacturing the DRAM 60 of the present embodiment, unless otherwise specifically noted, the dry etching means anisotropic dry etching.

Figure 7A:
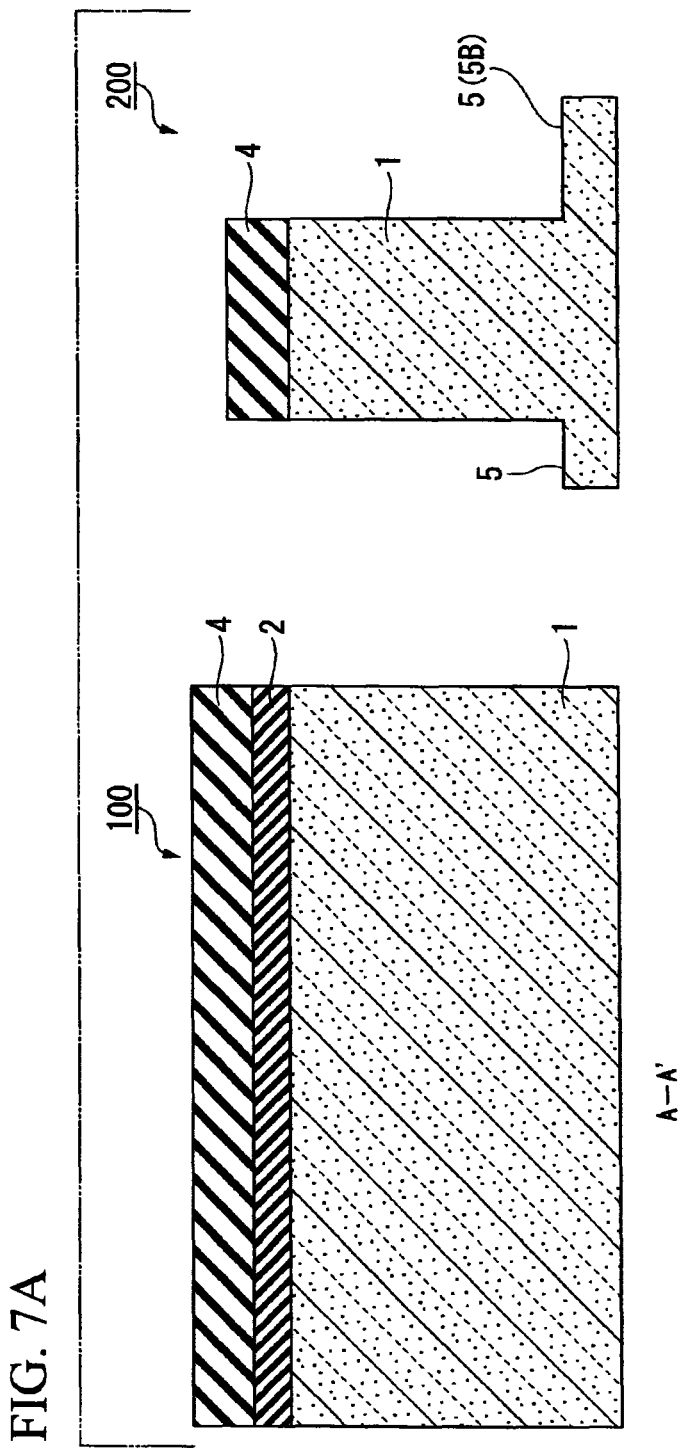
FIG. 7A is a fragmentary cross sectional elevation view of a step subsequent to the step of FIGS. 6A, 6B and 6C, involved in the method of forming the semiconductor device of FIGS. 1 and 2, illustrating the memory cell area 100, taken along an A-A' line of FIG. 1 and the peripheral area 200.
Figure 7C:
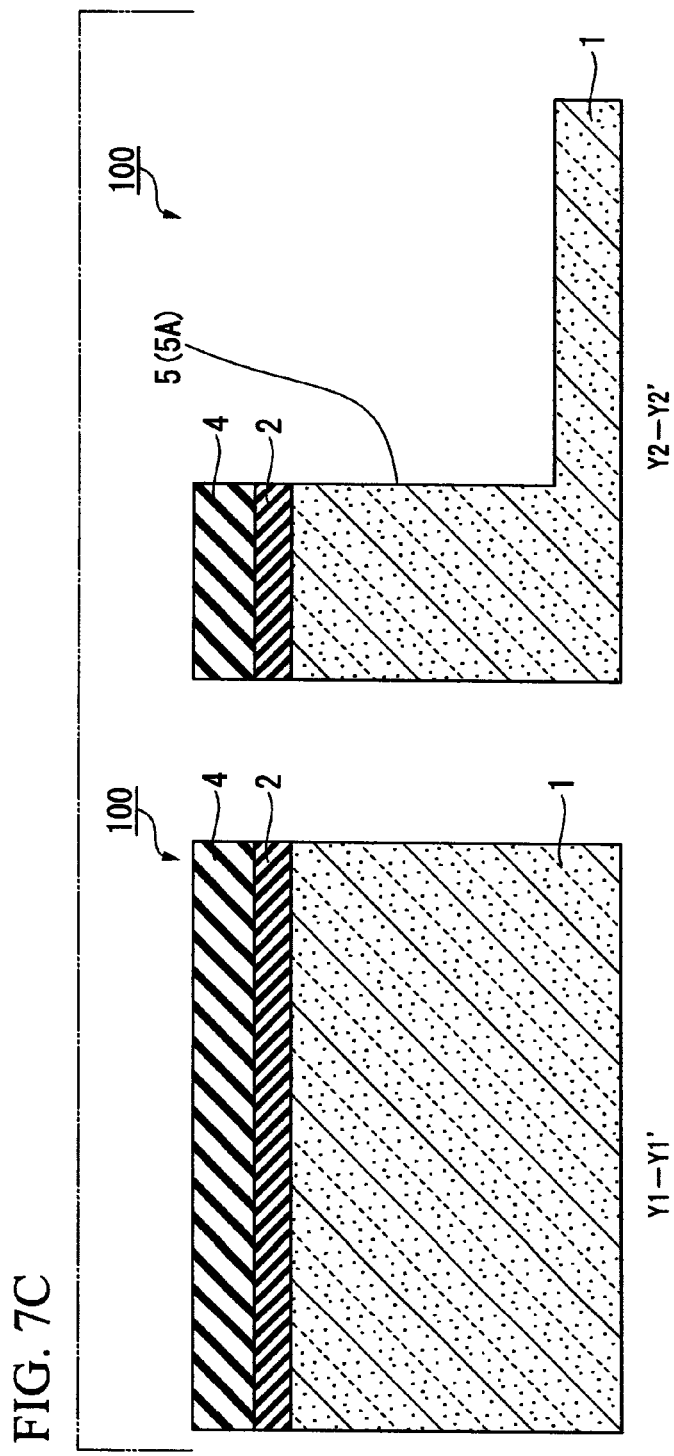
FIG. 7C is a fragmentary cross sectional elevation view of the same step as in FIGS. 7A and 7B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 7A, FIG. 7B, and FIG. 7C, using the amorphous carbon film 4 mask pattern, the silicon substrate 1 is etched, for example, approximately 250 nm, so as to form an STI trench (trench for element separation). In this case, as shown in the right-side drawing in FIG. 7A, in the peripheral circuit region 200 the surface of the silicon substrate 1 is directly etched by the mask pattern of the amorphous carbon film 4. In contrast, as shown in FIG. 7B and FIG. 7C, in the memory cell region 100, because there is an interposed sacrificial silicon oxide film 2 on the surface of the silicon substrate 1, the amorphous carbon film 4 mask pattern is transferred to the sacrificial silicon oxide film 2, and the STI trench 5A (5) is formed by the mask pattern that is transferred to the sacrificial silicon oxide film 2. Therefore, although the STI trench 5A of the memory cell region 100 and the STI trench 5B (5) of the peripheral circuit region 200 are formed simultaneously, the STI trench 5B of the peripheral circuit region 200 is formed to be approximately 30 nm deeper than the STI trench 5A of the memory cell region 100.

Figure 8B:
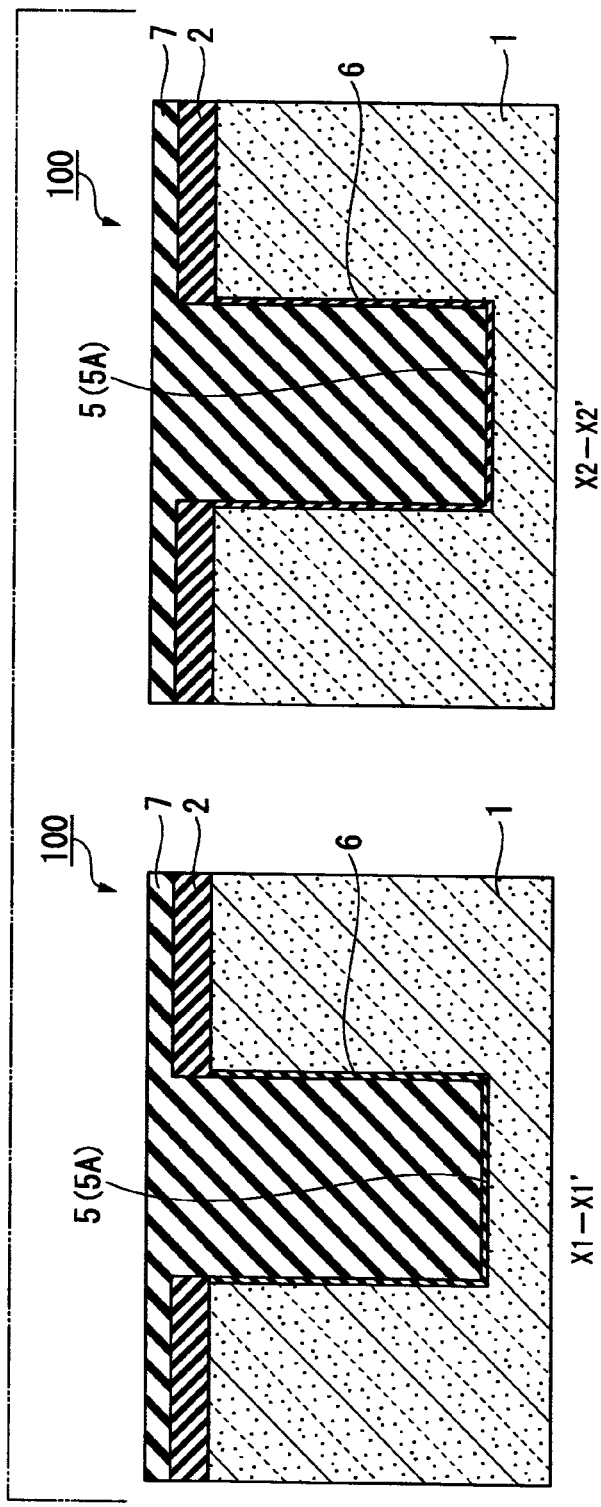
FIG. 8B is a fragmentary cross sectional elevation view of the same step as in FIG. 8A, involved in the method of forming the semiconductor device of FIGS. 1 and 2, illustrating the memory cell area 100, taken along an X1-X1' line of FIG. 1 and taken along an X2-X2' line of FIG. 1.
Figure 9A:
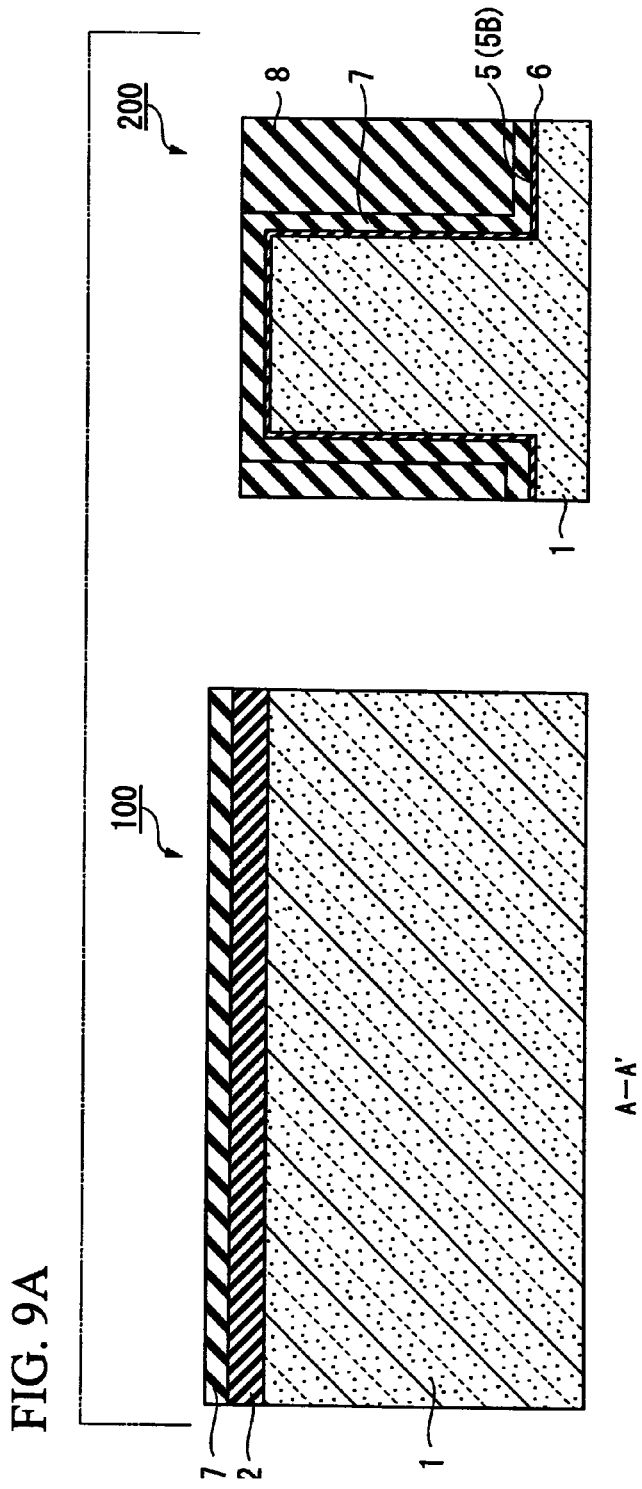
FIG. 9A is a fragmentary cross sectional elevation view of a step subsequent to the step of FIGS. 8A, 8B and 8C, involved in the method of forming the semiconductor device of FIGS. 1 and 2, illustrating the memory cell area 100, taken along an A-A' line of FIG. 1 and the peripheral area 200.

Next, as shown in FIG. 8A, FIG. 8B, and FIG. 8C, the amorphous carbon film 4 mask pattern is removed. Next, a silicon oxide liner film 6 having a thickness, for example, of approximately 2 nm is formed by thermal oxidation on the surface of the silicon substrate that is exposed from the STI trenches 5 (5A, 5B).

Next, CVD is used to form a silicon nitride film 7 on the silicon substrate 1 across the memory cell region 100 and the peripheral circuit region 200, the thickness of the silicon nitride film 7 being set to a thickness that will bury the STI trench 5A of the memory cell region 100. For example, in the case in which the width of the STI trench 5A of the memory cell region 100 is 40 nm, the thickness thereof is made greater than 20 nm, and preferably 30 nm (1.5 times the half of the width). As shown in the right-side drawing in FIG. 8A, in the peripheral circuit region 200, because the width of the STI trench 5B is great, in a silicon nitride film 7 that is set to have a thickness that buries the STI trench 5A of the memory cell region 100, the STI trench 5B has not been completely buried so as to remain.

Next, HDP-CVD, for example, is used to form a silicon oxide film over the entire surface, so as to bury the STI trench 5B remaining in the peripheral circuit region 200. Next, planarization is done by CMP and, as shown in the right-side drawing in FIG. 9A, a buried silicon oxide film 8 is formed on the peripheral circuit region 200. By doing this, the STI element separation film of the peripheral circuit region 200 is formed as a three-layer film of the silicon oxide liner film 6, the silicon nitride film 7, and the buried silicon oxide film 8. Because FIG. 9B and FIG. 9C would be the same, respectively, as FIG. 8B and FIG. 8C, they are neither shown nor described herein.

Figure 10A:
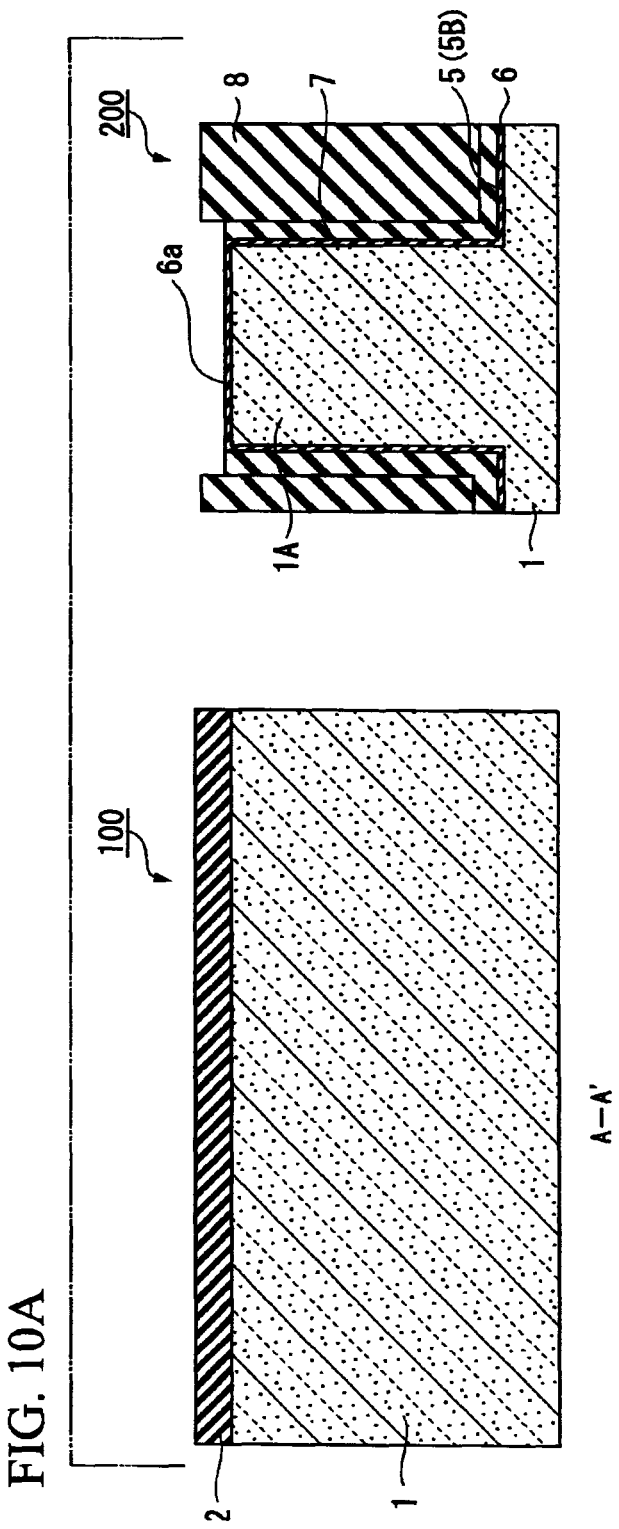
FIG. 10A is a fragmentary cross sectional elevation view of a step subsequent to the step of FIG. 9A, involved in the method of forming the semiconductor device of FIGS. 1 and 2, illustrating the memory cell area 100, taken along an A-A' line of FIG. 1 and the peripheral area 200.
Figure 10C:
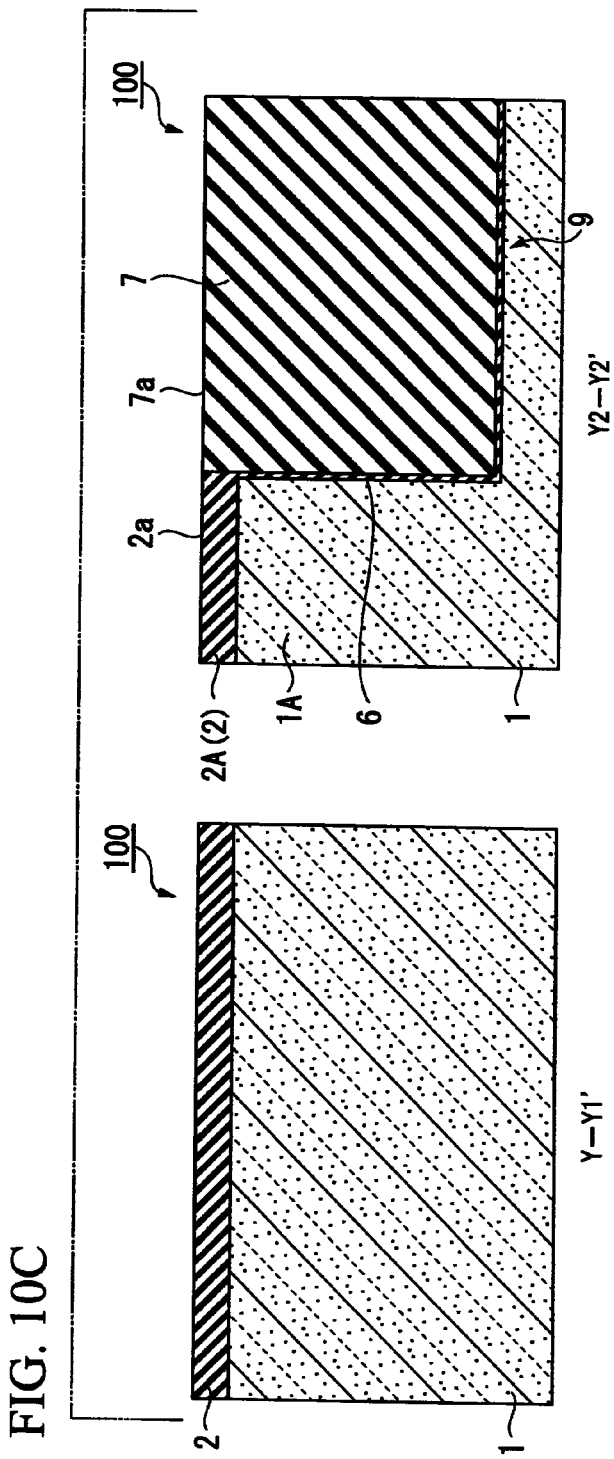
FIG. 10C is a fragmentary cross sectional elevation view of the same step as in FIGS. 10A and 10B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIGS. 10A, 10B, and 10C, the part of the silicon nitride film 7 exposed at the surface of the silicon substrate 1 is selectively removed by wet etching, using hot phosphoric acid. By doing this, a buried silicon nitride film (buried insulating film) 7A is formed within the STI trench 5A of the memory cell region 100. In this case, when performing wet etching using hot phosphoric acid, in the memory cell region 100, etching is done so that the upper surface 2a of the sacrificial silicon oxide film 2 and the upper surface 7a of the buried silicon nitride film 7A are at substantially the same height, as shown in FIG. 10B and FIG. 10C. The term substantially the same as used herein includes the upper surface 7a of the buried silicon nitride film 7A being up to 5 nm lower than the upper surface 2a of the sacrificial silicon oxide film 2. The temperature of the hot phosphoric acid in this wet etching is, for example in the range of approximately 140 to 160° C. In this range, it is possible to make the etching rate low, in the range of 0.5 to 3 nm/minute, thereby enabling high-precision etching, so that etching control to achieve the above-noted substantially same height is easy.

In this manner, by burying the STI trench 5A in the memory cell region 100 with the buried silicon nitride film 7A, an STI element separation film 9 constituting an element separation region is formed. Also, as shown in FIG. 1, FIG. 10B, and FIG. 10C, the active region 1A of the silicon substrate 1 is partitioned and formed by this element separation region. In this case, because the STI trench 5A is formed by the mask pattern transferred to the sacrificial silicon oxide film 2 in the memory cell region 100, the sacrificial silicon oxide film 2 (2A) exists only on the upper surface of the active region 1A. Also, as shown in FIGS. 10B and 10C, the STI element separation film 9 is formed as two layers, the silicon oxide liner film 6 and the buried silicon oxide film 7A.

As shown in the right-side drawing in FIG. 10A, the silicon nitride film on the surface of the active region 1A is removed in the peripheral circuit region 200, thereby exposing the upper surface 6a of the silicon oxide liner film 6 formed to cover inner wall of the STI trench 5.

Next, after forming STI element separation films in each of the memory cell region 100 and the peripheral circuit region 200, ion implantation is performed to form a p-well and an n-well in prescribed regions in the memory cell region 100, and ion implantation is done for channel doping of the peripheral circuit transistor in the peripheral circuit region 200.

(Peripheral Circuit 200 Protective Film Formation Process Step)

Next, before forming a buried gate electrode in the memory cell region 100, a protective film is formed in the peripheral circuit region 200. This protective film is provided for the purpose of protecting the active region 1A in the peripheral circuit region 200 from the process step of forming the buried gate electrode in the memory cell region 100 up to the process step of forming the bit contact and bit line.

Figure 11A:
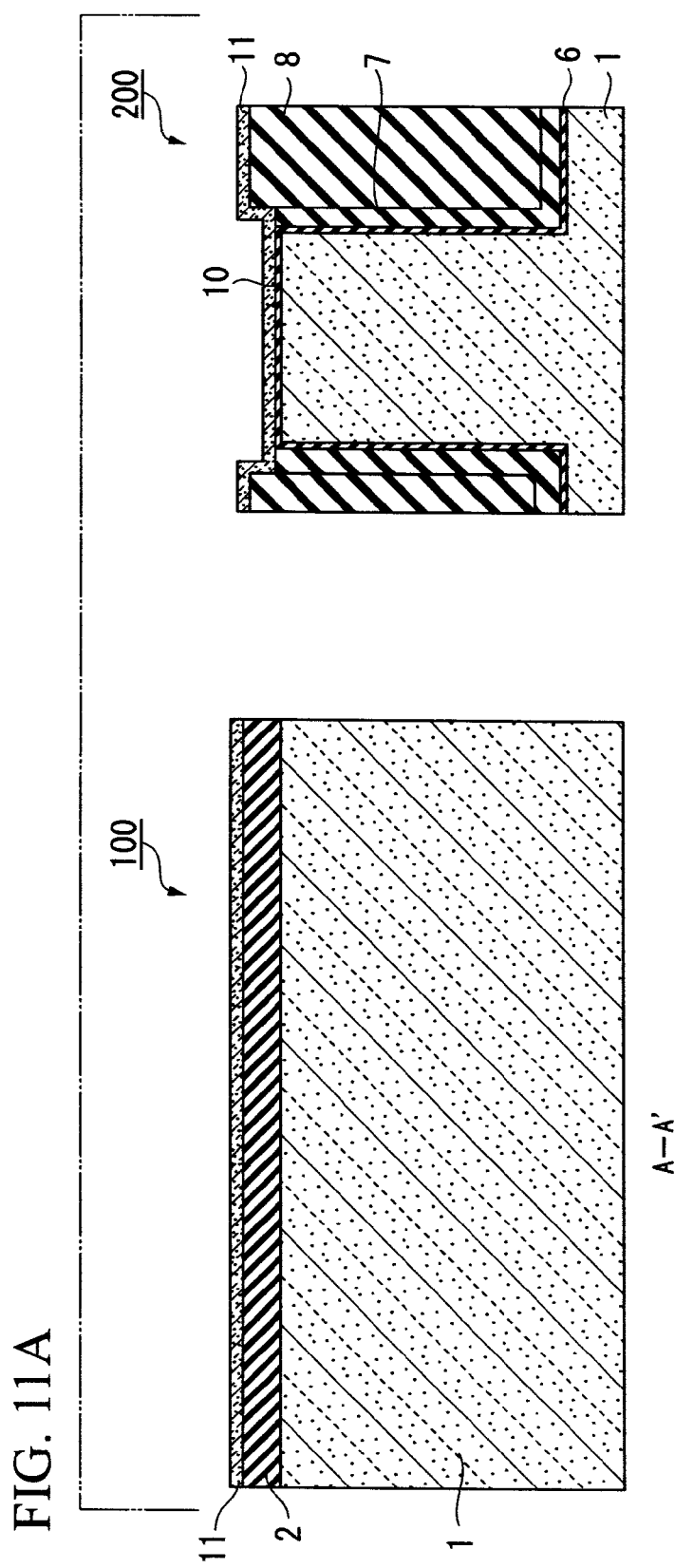
FIG. 11A is a fragmentary cross sectional elevation view of a step subsequent to the step of FIGS. 10A, 10B and 10C, involved in the method of forming the semiconductor device of FIGS. 1 and 2, illustrating the memory cell area 100, taken along an A-A' line of FIG. 1 and the peripheral area 200.

Specifically, first as shown in the right-side drawing in FIG. 10A, after first removing the upper surface 6a of the silicon oxide film 6 exposed at the surface of the active region 1A in the peripheral circuit region 200, a silicon oxide film is again deposited onto the active region 1A, forming a peripheral gate insulating film 10 (refer to the right-side drawing in FIG. 11A).

Figure 11B:
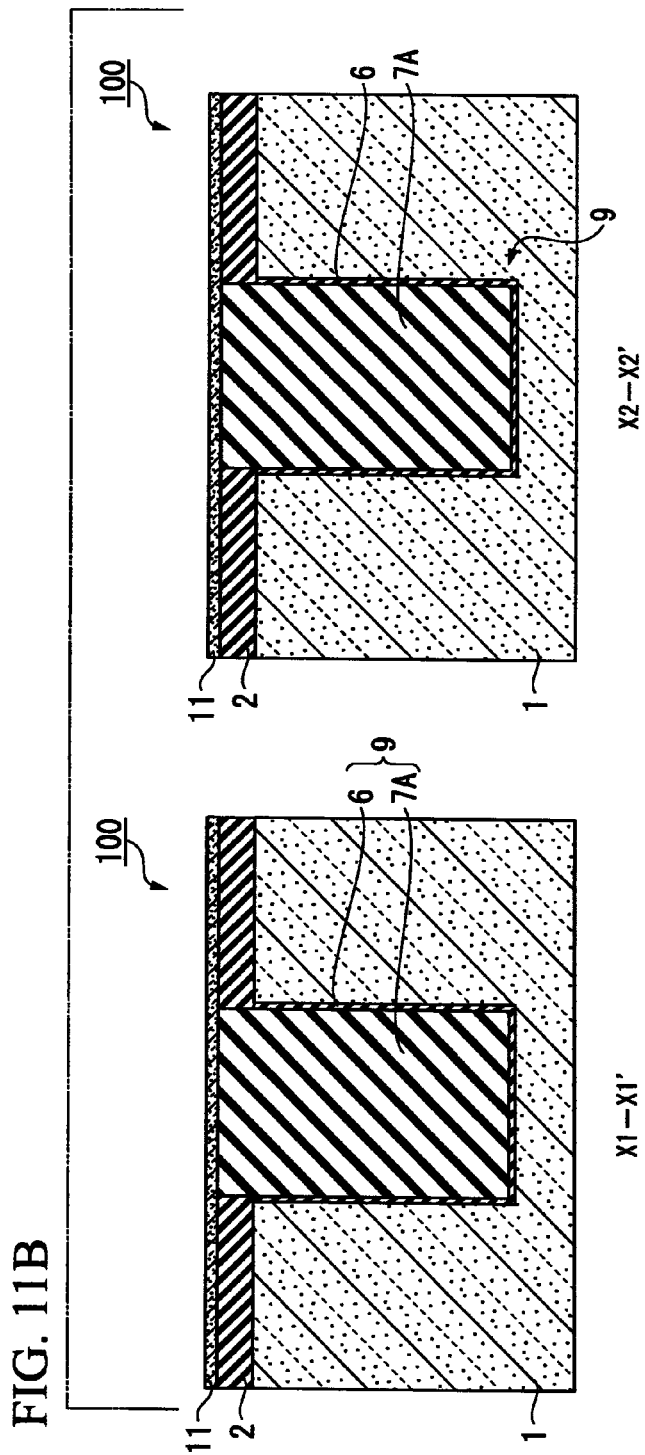
FIG. 11B is a fragmentary cross sectional elevation view of the same step as in FIG. 11A, involved in the method of forming the semiconductor device of FIGS. 1 and 2, illustrating the memory cell area 100, taken along an X1-X1' line of FIG. 1 and taken along an X2-X2' line of FIG. 1.
Figure 12A:
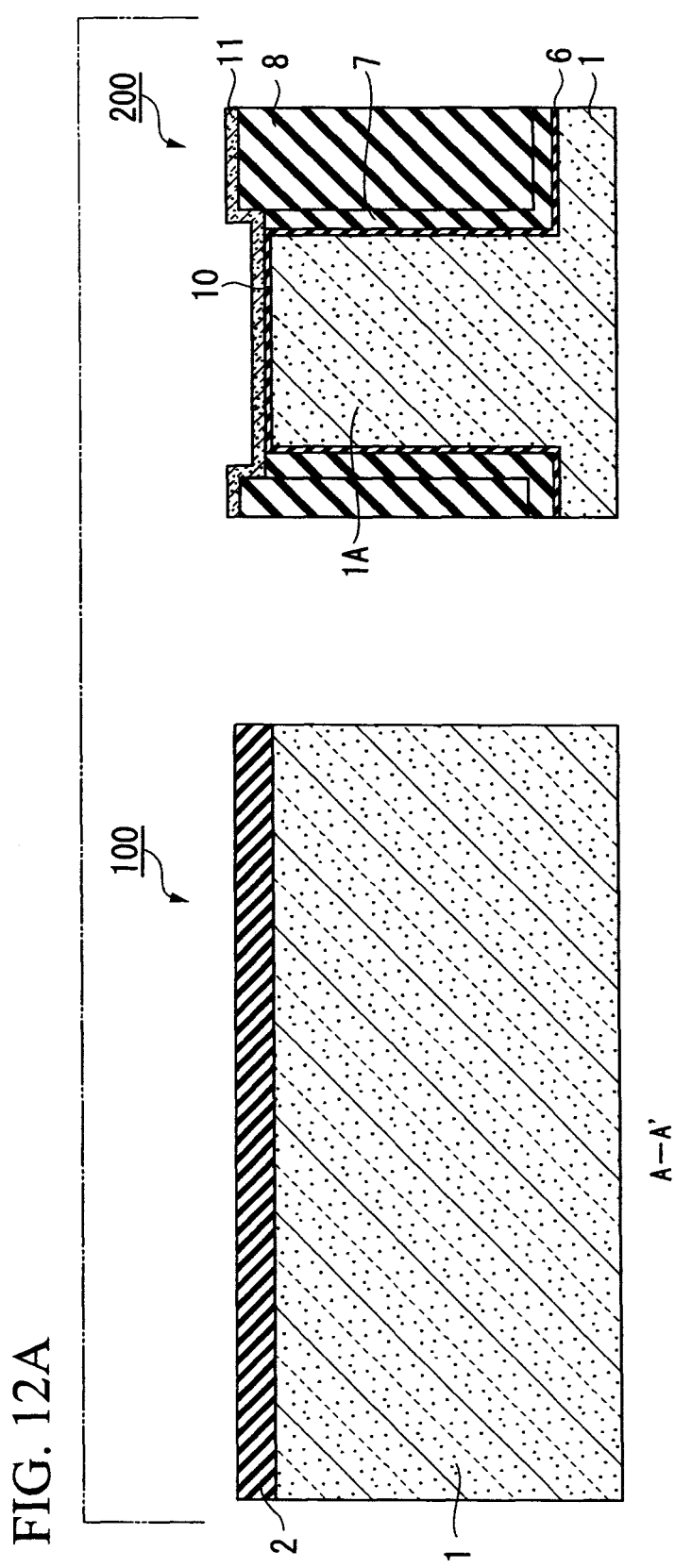
FIG. 12A is a fragmentary cross sectional elevation view of a step subsequent to the step of FIGS. 11A, 11B and 11C, involved in the method of forming the semiconductor device of FIGS. 1 and 2, illustrating the memory cell area 100, taken along an A-A' line of FIG. 1 and the peripheral area 200.

Next, as shown in FIG. 11A, FIG. 11B, and FIG. 11C, CVD is used to form a first silicon film 11 made of amorphous silicon having a thickness of approximately 20 nm over the entire surface of the memory cell region 100 and the peripheral circuit region 200. Next, lithography is used to form a photoresist pattern (not shown) covering only the peripheral circuit region 200, and the first silicon film 11 of the memory cell region 100 exposed from this photoresist pattern is removed by dry etching. In this case, when performing dry etching of the silicon film 11 of the memory cell region 100, the sacrificial silicon oxide film 2 and the buried silicon nitride film 7A are selectively removed (refer to the left-side drawing in FIG. 12A, and to FIG. 12B and FIG. 12C). Next, ion implantation is done with respect to the memory cell region 100 for well formation and formation of an LDD on the surface of the silicon substrate 1. After that, by removing the photoresist pattern provided on the peripheral circuit region 200, the first silicon film (protective film) 11 is provided only in the peripheral circuit region 200, as shown in the right-side drawing in FIG. 12A.

(Second Insulating Film Formation Process Step)

Figure 13A:
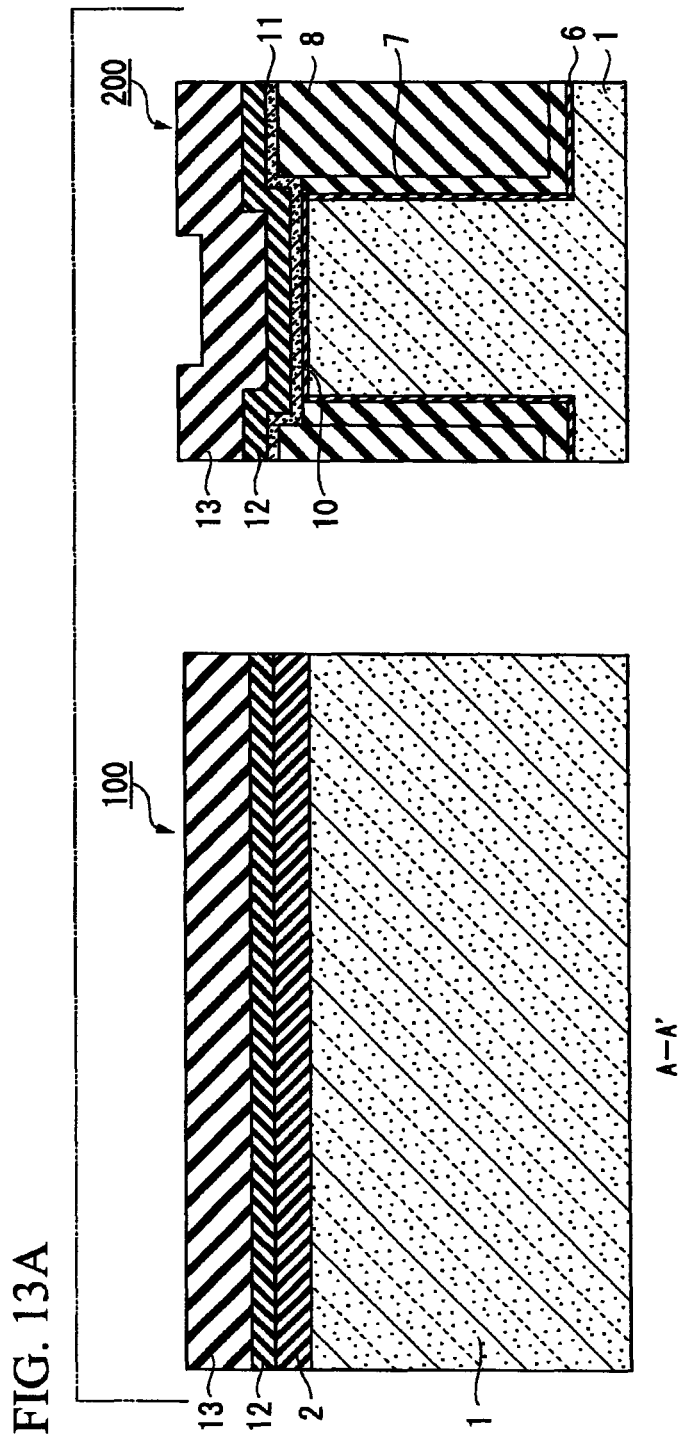
FIG. 13A is a fragmentary cross sectional elevation view of a step subsequent to the step of FIGS. 12A, 12B and 12C, involved in the method of forming the semiconductor device of FIGS. 1 and 2, illustrating the memory cell area 100, taken along an A-A' line of FIG. 1 and the peripheral area 200.
Figure 13B:
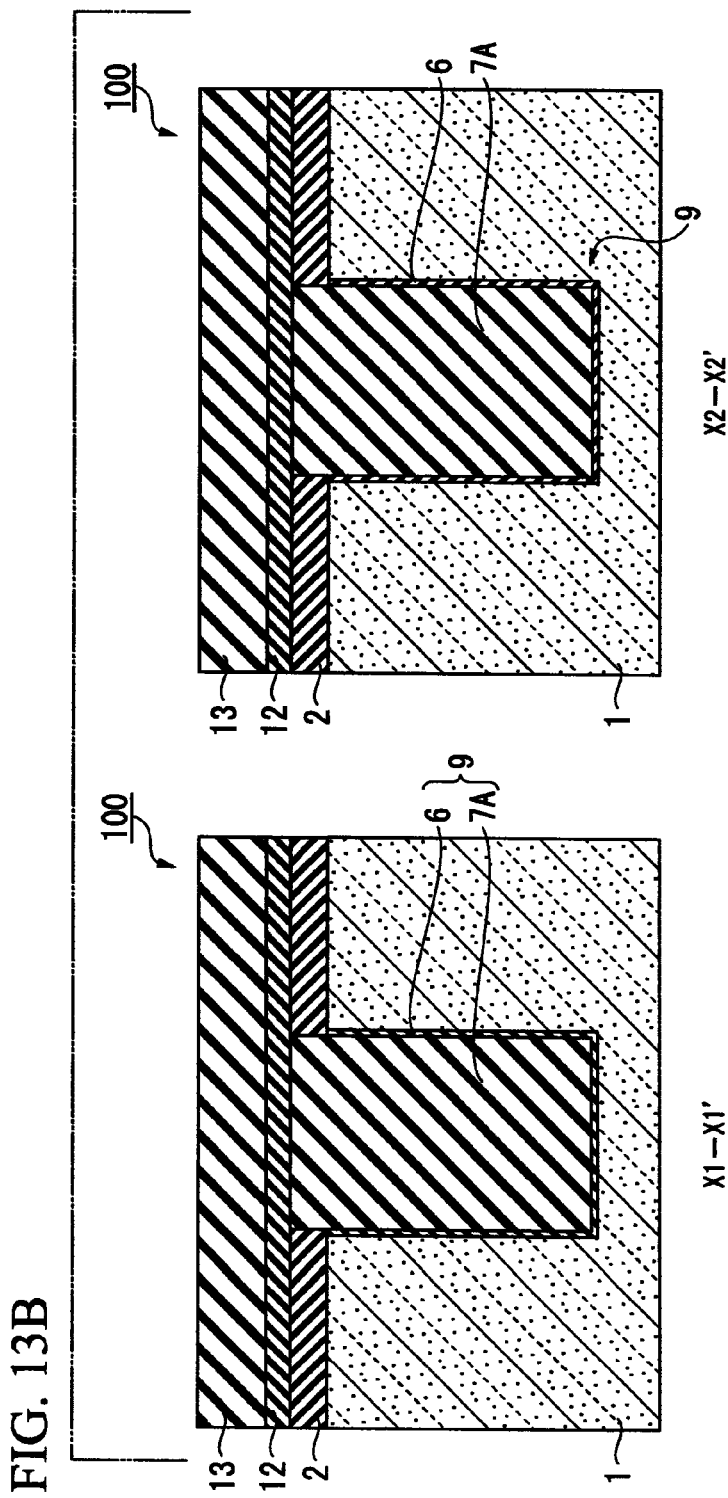
FIG. 13B is a fragmentary cross sectional elevation view of the same step as in FIG. 13A, involved in the method of forming the semiconductor device of FIGS. 1 and 2, illustrating the memory cell area 100, taken along an X1-X1' line of FIG. 1 and taken along an X2-X2' line of FIG. 1.
Figure 13C:
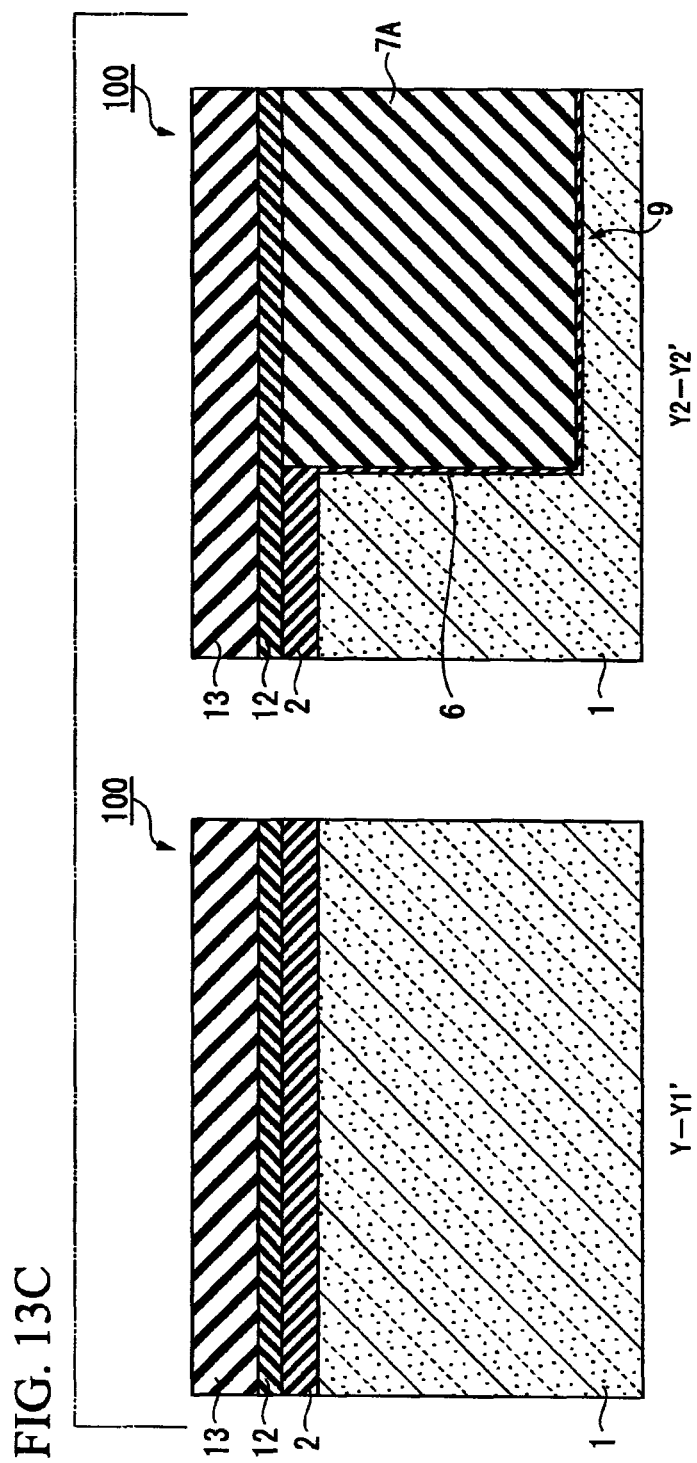
FIG. 13C is a fragmentary cross sectional elevation view of the same step as in FIGS. 13A and 13B, involved in the method of forming the semiconductor device of FIGS. 1 and 2, illustrating the memory cell area 100, taken along a Y1-Y1' line of FIG. 1 and taken along a Y2-Y2' line of FIG. 1.
Figure 14A:
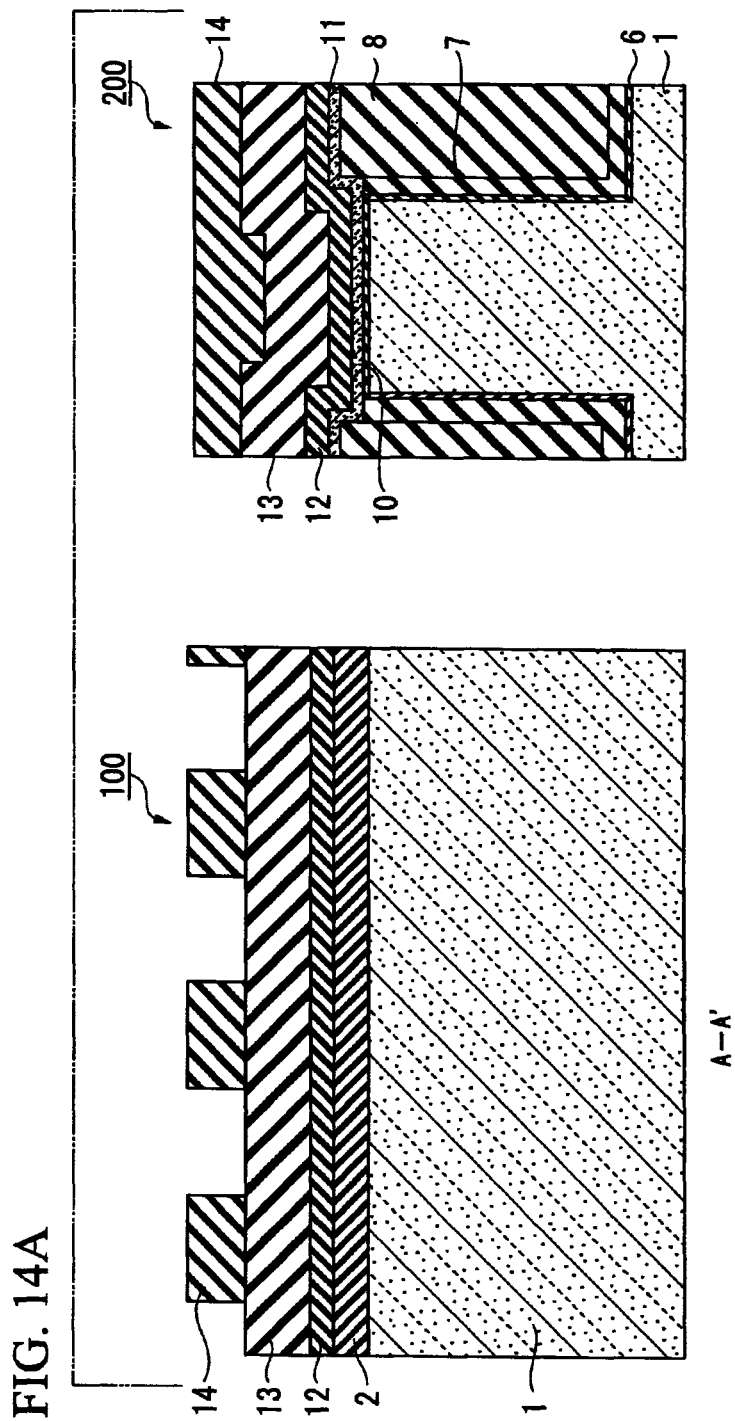
FIG. 14A is a fragmentary cross sectional elevation view of a step subsequent to the step of FIGS. 13A, 13B and 13C, involved in the method of forming the semiconductor device of FIGS. 1 and 2, illustrating the memory cell area 100, taken along an A-A' line of FIG. 1 and the peripheral area 200.
Figure 14B:
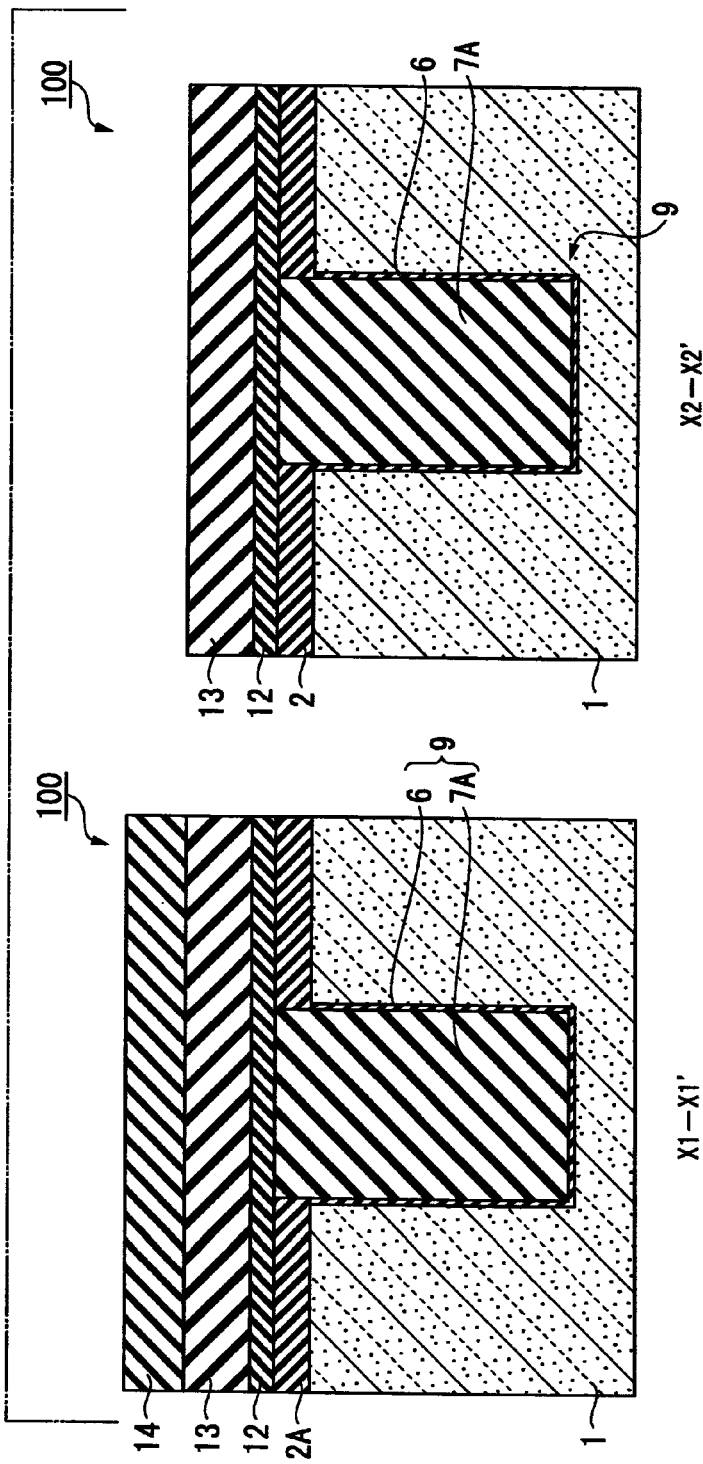
FIG. 14B is a fragmentary cross sectional elevation view of the same step as in FIG. 14A, involved in the method of forming the semiconductor device of FIGS. 1 and 2, illustrating the memory cell area 100, taken along an X1-X1' line of FIG. 1 and taken along an X2-X2' line of FIG. 1.

Next, as shown in FIG. 13A, FIG. 13B, and FIG. 13C, a silicon nitride film (second insulating film) 12 made of silicon nitride (second insulating material) is formed on the surface of the silicon substrate 1 (that is, the surfaces of the element separation region and the active regions) across the memory cell region 100 and the peripheral circuit region 200.

The silicon nitride film 12 is formed by CVD so as to have a thickness of approximately 20 nm. When removing the sacrificial silicon oxide film 2 in a process step to be described later, this silicon nitride film 12 serves as an etching stopper on the upper surface of the sacrificial silicon oxide film 2 as the silicon nitride guard film 12A. Next, CVD for example is used to form a hard silicon oxide film 13 made of a silicon oxide film having a thickness of approximately 70 nm over the silicon nitride film 12. This hard silicon oxide film 13 is used as a hard etching mask when forming the trenches for word lines.

(Buried Gate Electrode Formation Process Step)

Next, the buried gate electrode (word line) is formed. In the formation of the buried gate electrode, as shown in the left-side drawing in FIG. 14A and in FIG. 14B and FIG. 14C, a photoresist mask 14 for the purpose of forming a WL trench (gate electrode trench) that becomes the trench for word line burying is first formed in the memory cell region 100 using lithography. As shown in the right-side drawing in FIG. 14A, the peripheral circuit region 200 is covered by the photoresist mask 14.

Figure 15A:
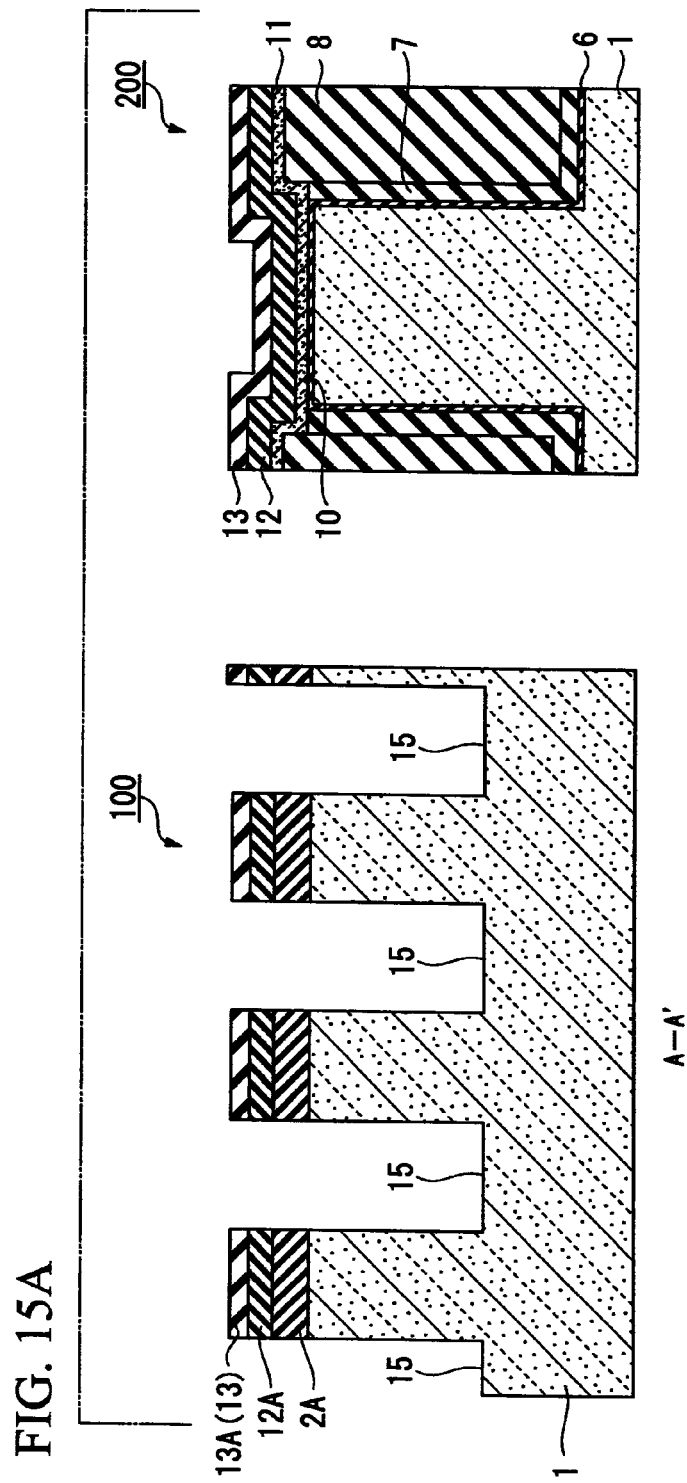
FIG. 15A is a fragmentary cross sectional elevation view of a step subsequent to the step of FIGS. 14A, 14B and 14C, involved in the method of forming the semiconductor device of FIGS. 1 and 2, illustrating the memory cell area 100, taken along an A-A' line of FIG. 1 and the peripheral area 200.
Figure 15C:
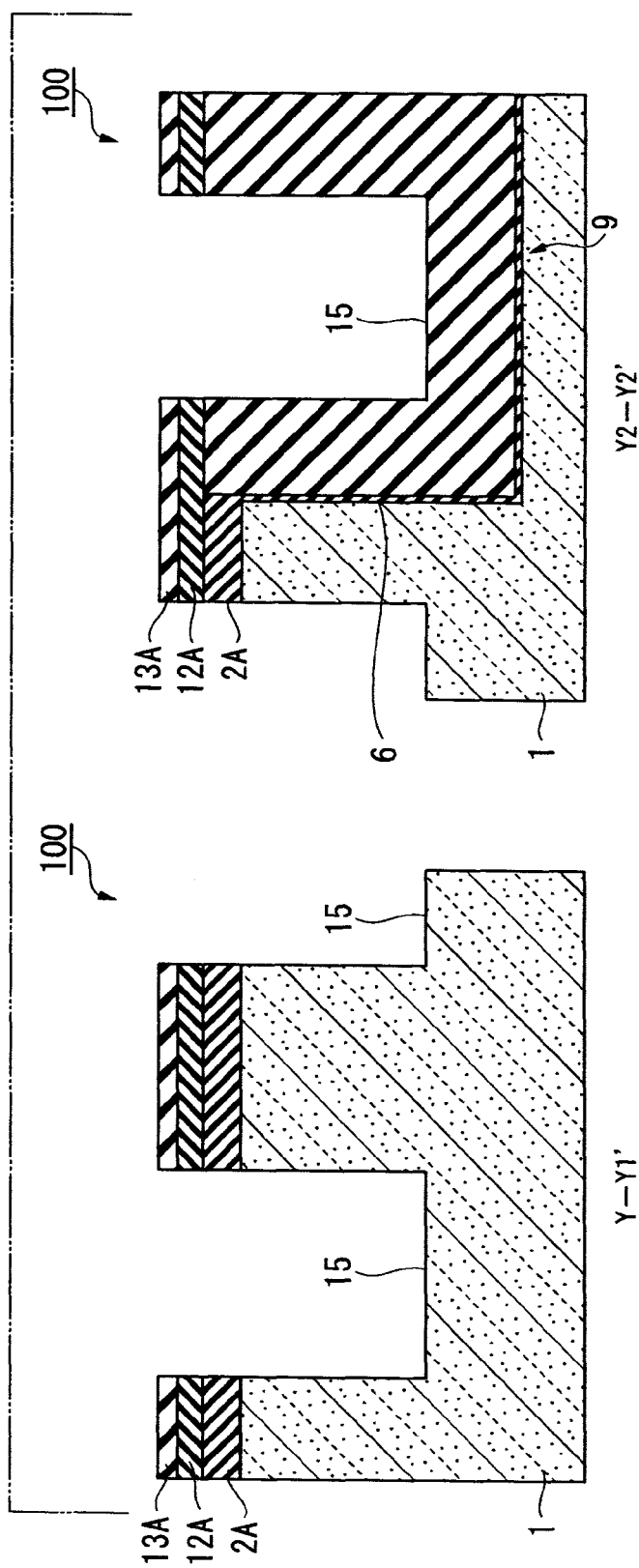
FIG. 15C is a fragmentary cross sectional elevation view of the same step as in FIGS. 15A and 15B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 15A, FIG. 15B, and FIG. 15C, the photoresist mask 14 is used to dry etch the hard silicon oxide film 13. Next, after removing the photoresist mask 14, using the hard silicon oxide film 13A (13) onto which the pattern is transferred as a mask, the silicon nitride guard film 12, the sacrificial silicon oxide film 2, and the silicon substrate 1 are successively etched, after which these are used as a mask to form the WL trench (gate electrode trench) 15. In this case, the depth of the WL trench 15 is, for example, approximately 200 nm from the surface of the silicon substrate 1. Also, the WL trench 15 is formed so as to be a linearly shaped pattern, extending in a prescribed direction that is perpendicular to the active region 1A (for example, the X direction in FIG. 1). In the present embodiment, the width of the WL trench 15 in the Y direction is 50 nm.

In the case of dry etching the hard silicon oxide film 13, a second hard mask made of a different material may be provided between the hard silicon oxide film 13 and the photoresist mask 14. In this case, the pattern of the photoresist mask 14 is transferred to the second hard mask, after which this second hard mask is used to etch the hard silicon oxide film 13.

Figure 16A:
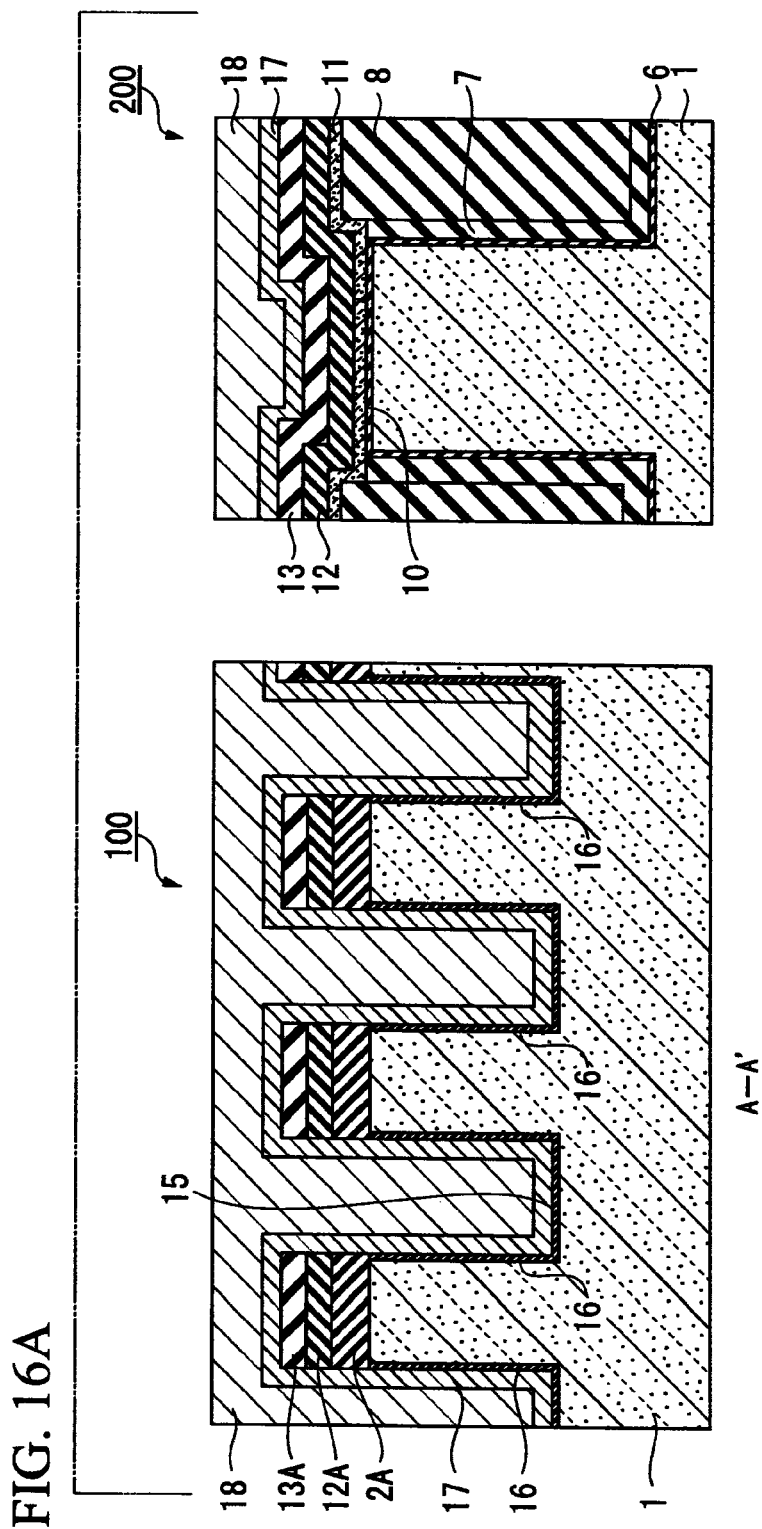
FIG. 16A is a fragmentary cross sectional elevation view of a step subsequent to the step of FIGS. 15A, 15B and 15C, involved in the method of forming the semiconductor device of FIGS. 1 and 2, illustrating the memory cell area 100, taken along an A-A' line of FIG. 1 and the peripheral area 200.
Figure 16B:
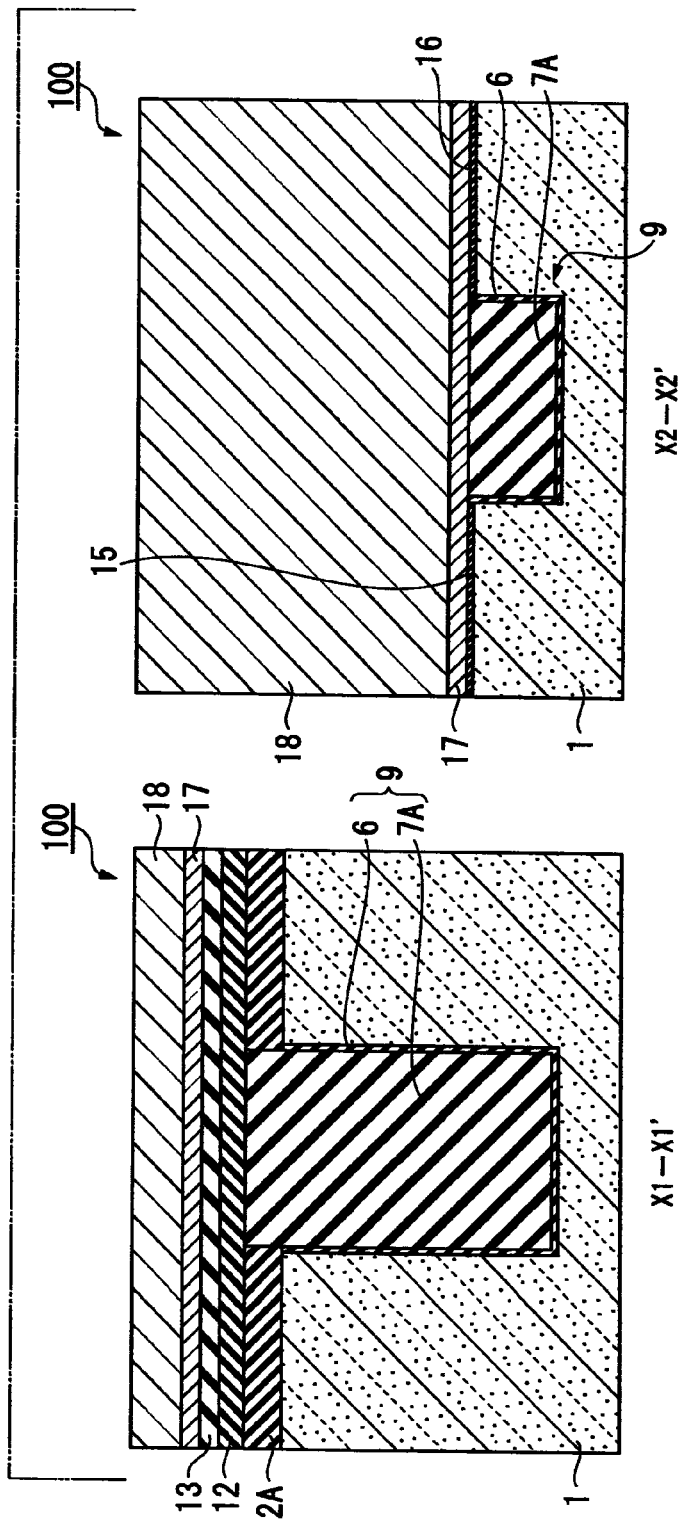
FIG. 16B is a fragmentary cross sectional elevation view of the same step as in FIG. 16A, involved in the method of forming the semiconductor device of FIGS. 1 and 2, illustrating the memory cell area 100, taken along an X1-X1' line of FIG. 1 and taken along an X2-X2' line of FIG. 1.

Next, as shown in FIG. 16A, FIG. 16B, and FIG. 16C, a gate electrode insulating film 16 made of a silicon oxide film having a thickness of approximately 4 nm is formed on the surface of the silicon substrate 1 exposed inside the WL trench 15, using thermal oxidation. Next, CVD is used to form a titanium nitride film 17 having a thickness of approximately 5 nm so that the WL trench 15 is not buried. Additionally, a tungsten film 18 having a thickness of approximately 40 nm is formed over the entire surface of the memory cell region 100 and the peripheral circuit region 200, so as to bury the inside of the WL trench 15 and to planarize the surface of the substrate. As described above, because the width of the WL trench 15 in the Y direction is made to be 50 nm, the width in the Y direction of the space remaining within the WL trench 15 at the stage at which the titanium nitride film 17 of 5 nm is formed is 40 nm. Therefore, if a tungsten film 18 having a thickness of approximately 40 nm is formed over the entire surface in this condition, the remaining space is completely buried by the tungsten film.

Figure 17A:
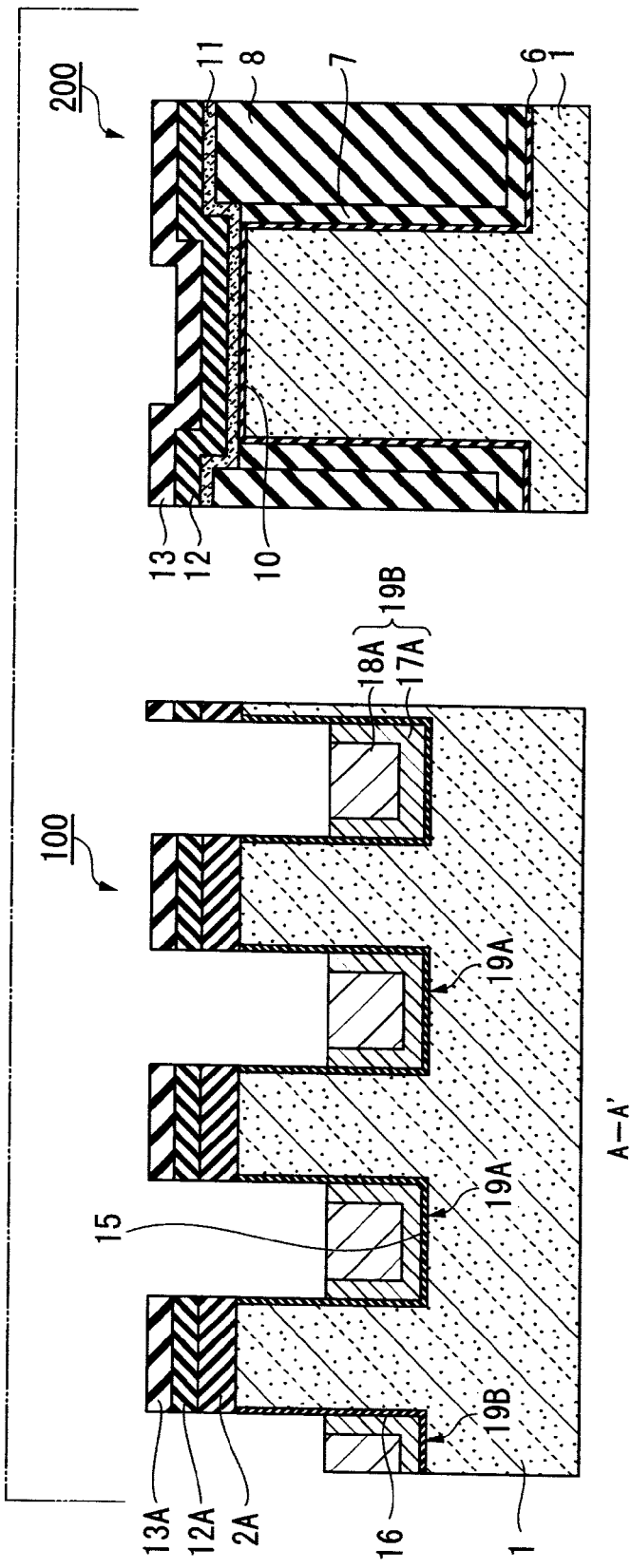
FIG. 17A is a fragmentary cross sectional elevation view of a step subsequent to the step of FIGS. 16A, 16B and 16C, involved in the method of forming the semiconductor device of FIGS. 1 and 2, illustrating the memory cell area 100, taken along an A-A' line of FIG. 1 and the peripheral area 200.
Figure 17B:
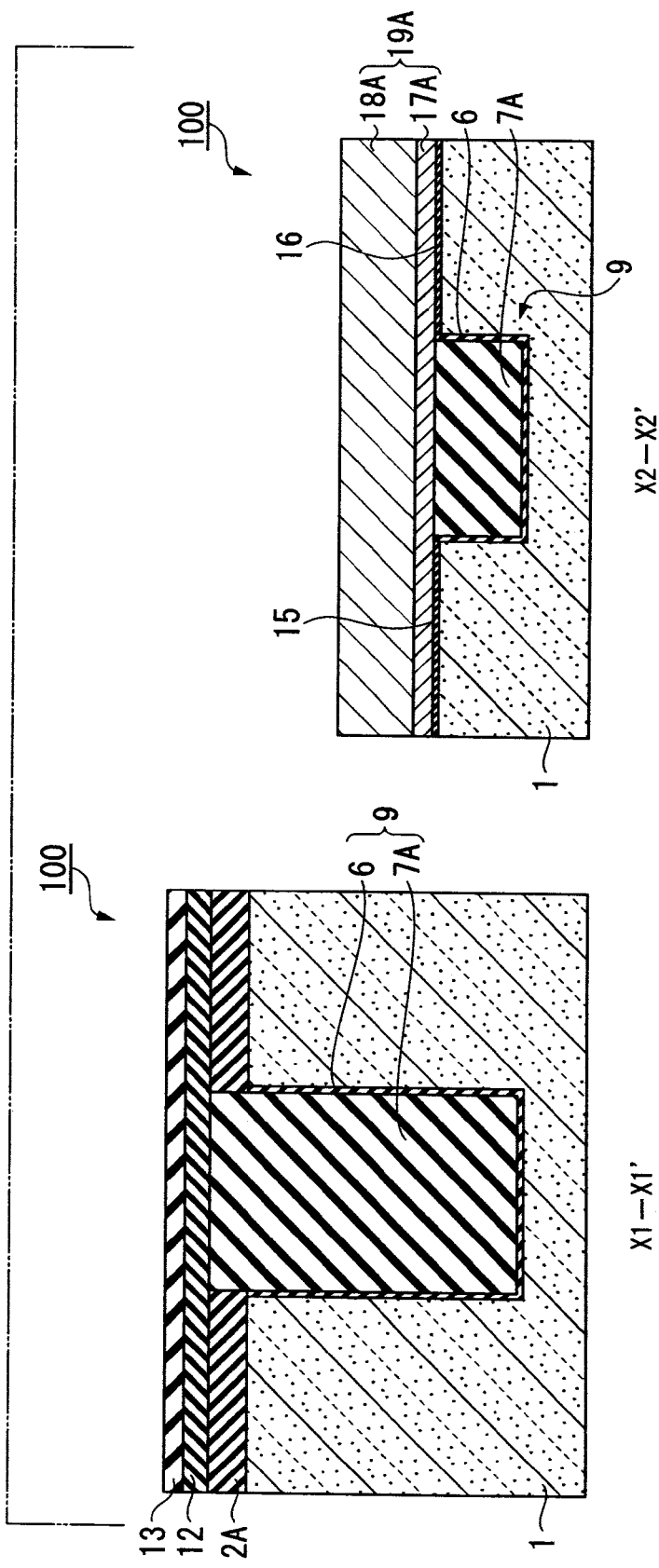
FIG. 17B is a fragmentary cross sectional elevation view of the same step as in FIG. 17A, involved in the method of forming the semiconductor device of FIGS. 1 and 2, illustrating the memory cell area 100, taken along an X1-X1' line of FIG. 1 and taken along an X2-X2' line of FIG. 1.
Figure 17C:
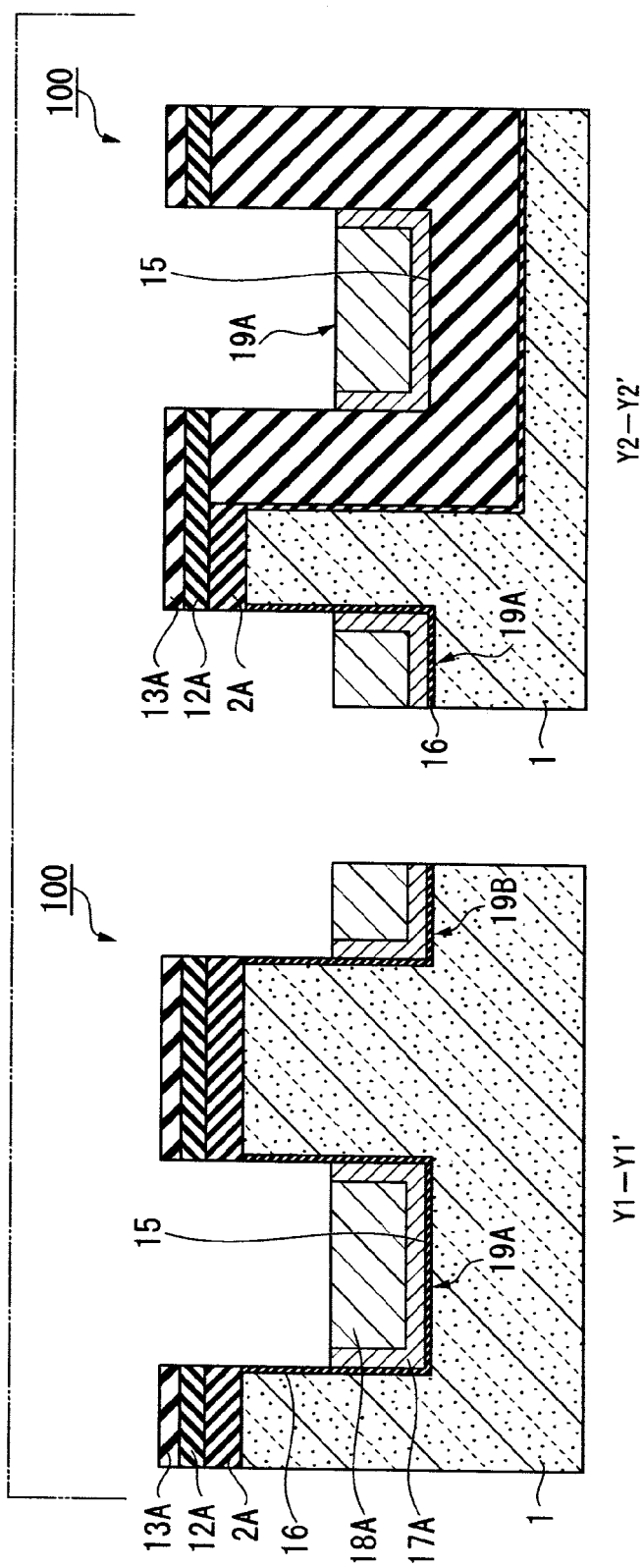
FIG. 17C is a fragmentary cross sectional elevation view of the same step as in FIGS. 17A and 17B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 17A, FIG. 17B, and FIG. 17C, the tungsten film 18 and the titanium nitride film 17 are etched back using dry etching so that the upper surface thereof is at a position that is 130 nm lower than the upper surface of the semiconductor substrate. In this manner, the buried gate electrode (word line) 19A and the buried interconnect 19B that are buried at the bottom part of the WL trench 15 are formed. In this case, because chlorine plasma is used for dry etching of the metallic material, inside the WL trench 15, the silicon oxide film (gate insulating film 16) exposed at the side wall above the upper surface of the buried gate electrode 19A is almost not etched at all and can be left to remain. In a subsequent process step in which the sacrificial silicon oxide film (first insulating film) 2A is selectively removed by wet etching using DHF, part of the upper surface is exposed and is etched. However, the thickness of the gate insulating film 16 is a thin 4 nm and also is constituted so as to be slit-shaped, sandwiched between the cap insulating film 20A made of a silicon nitride film and the semiconductor substrate in the active region, this is only a small amount of etching, and is not a problem. Although it is not a problem, in order to further suppress the etching of the gate insulating film 16, the silicon oxide film exposed at the side will within the WL trench 15 may be removed at the stage of forming the gate electrode 19A, thereby forming a new silicon nitride film on the surface of the silicon substrate exposed at the side wall. The formation of the new silicon nitride film can be done by forming a silicon nitride film having a thickness of 4 nm over the entire surface and then etching back the entire surface. If such a constitution is adopted, because a silicon oxide film is not in contact with any part of the sacrificial oxide film 2A at the stage of removing the sacrificial oxide film 2A by etching, it is possible to reliably form the capacitor contact plug in the present embodiment.

(Cap Insulating Film Formation Process Step)

Figure 18A:
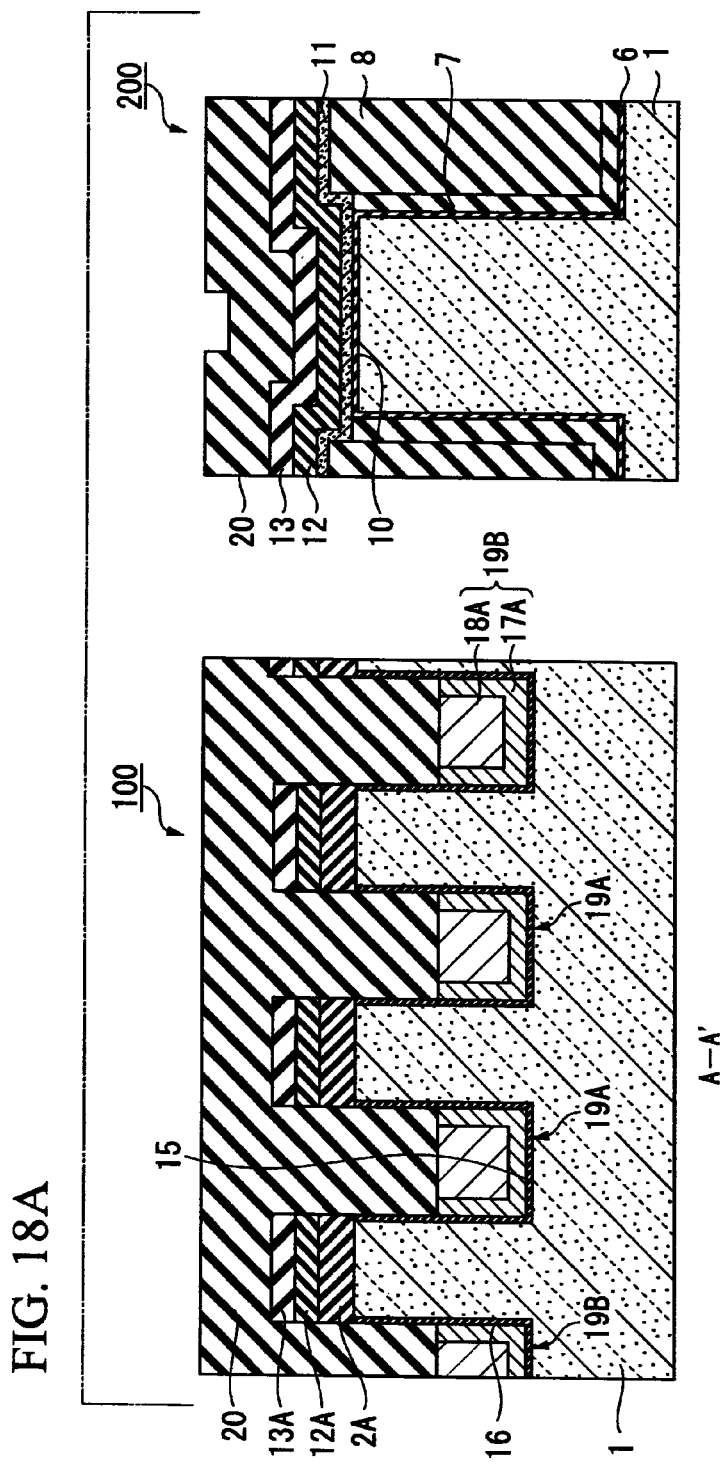
FIG. 18A is a fragmentary cross sectional elevation view of a step subsequent to the step of FIGS. 17A, 17B and 17C, involved in the method of forming the semiconductor device of FIGS. 1 and 2, illustrating the memory cell area 100, taken along an A-A' line of FIG. 1 and the peripheral area 200.
Figure 18B:
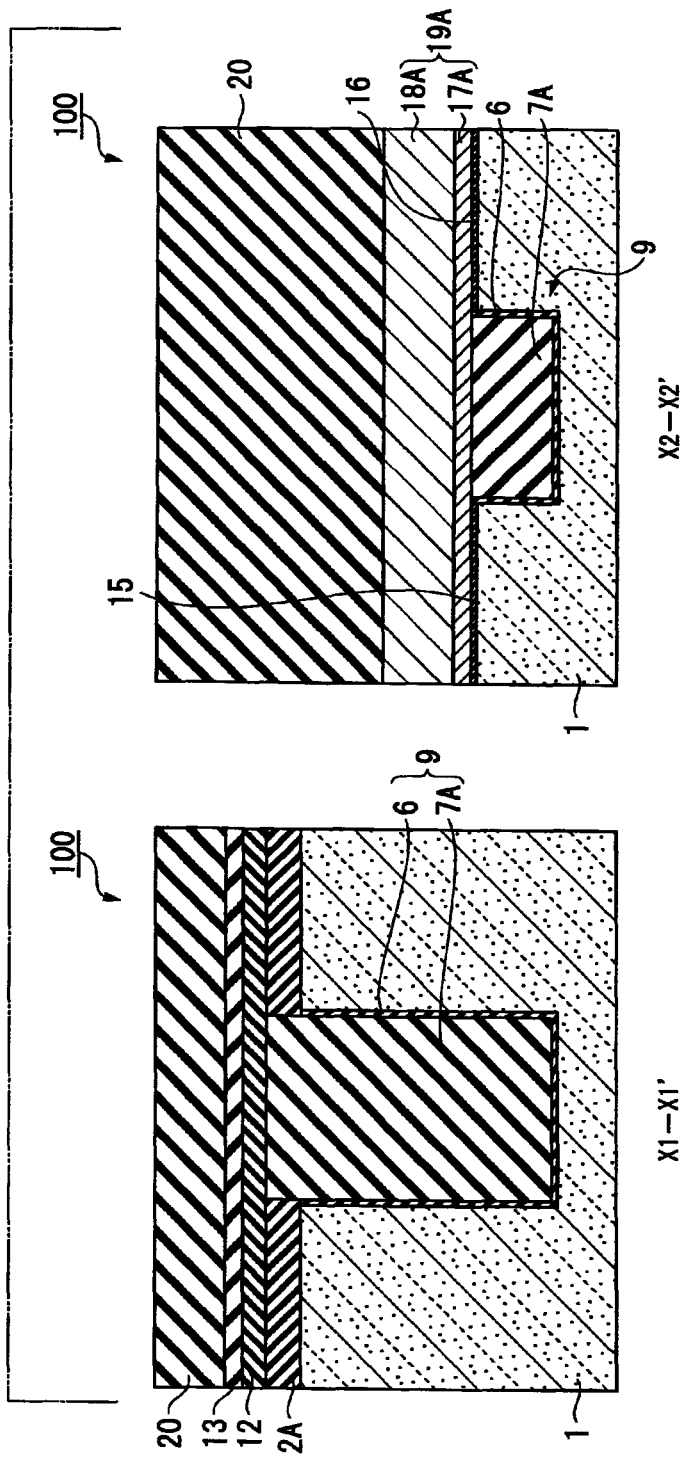
FIG. 18B is a fragmentary cross sectional elevation view of the same step as in FIG. 18A, involved in the method of forming the semiconductor device of FIGS. 1 and 2, illustrating the memory cell area 100, taken along an X1-X1' line of FIG. 1 and taken along an X2-X2' line of FIG. 1.
Figure 18C:
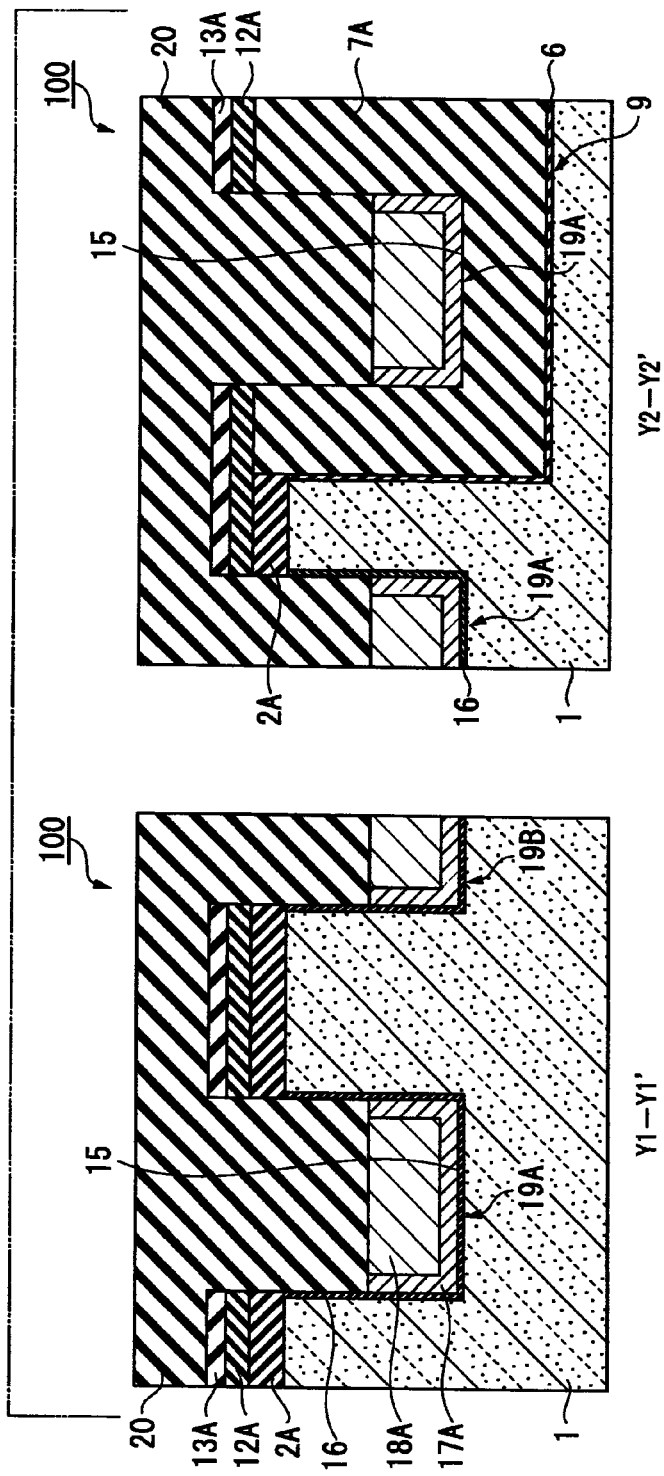
FIG. 18C is a fragmentary cross sectional elevation view of the same step as in FIGS. 18A and 18B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, a cap insulating film is formed on the top part of the WL trench 15 (that is, the top part of the buried gate electrode 19A and the buried interconnect 19B). The formation of the cap insulating film is done by first using CVD to form a silicon nitride film 20 having a thickness of approximately 40 nm so as to bury the WL trench 15, as shown in FIG. 18A, FIG. 18B, and FIG. 18C.

Figure 19A:
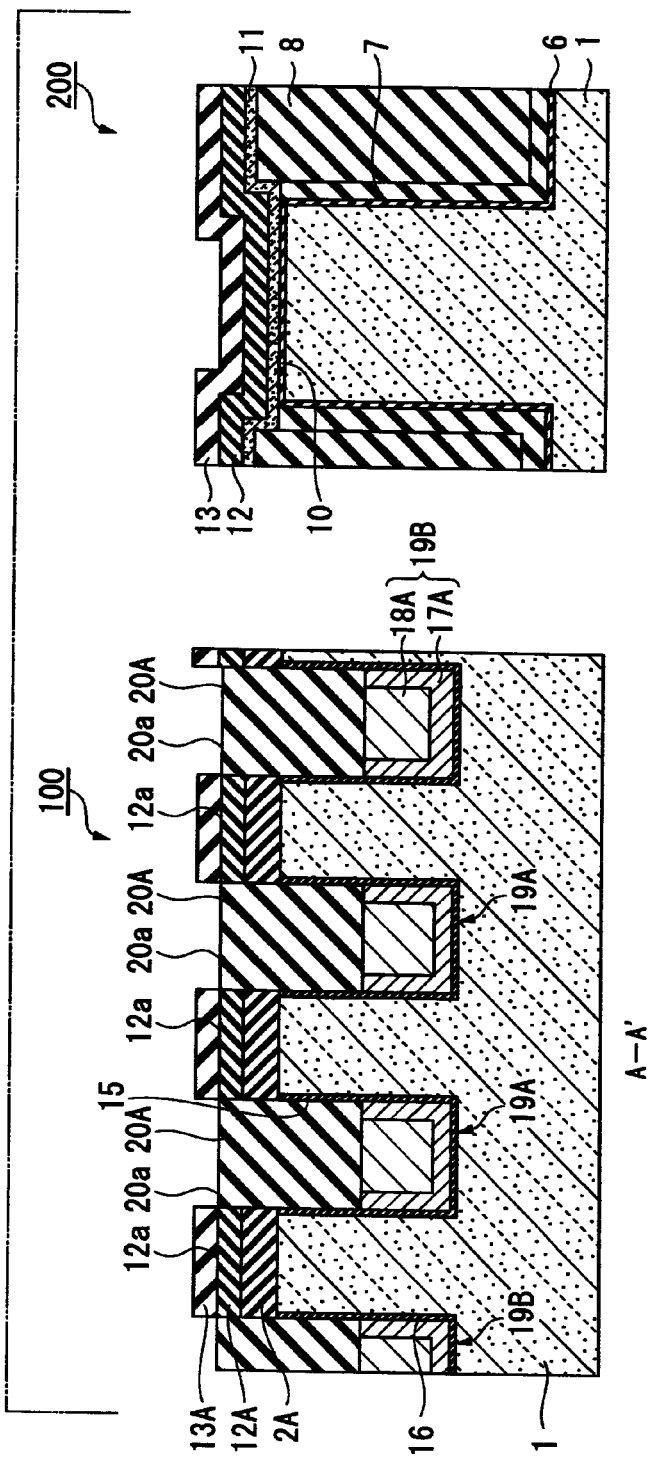
FIG. 19A is a fragmentary cross sectional elevation view of a step subsequent to the step of FIGS. 18A, 18B and 18C, involved in the method of forming the semiconductor device of FIGS. 1 and 2, illustrating the memory cell area 100, taken along an A-A' line of FIG. 1 and the peripheral area 200.
Figure 19B:
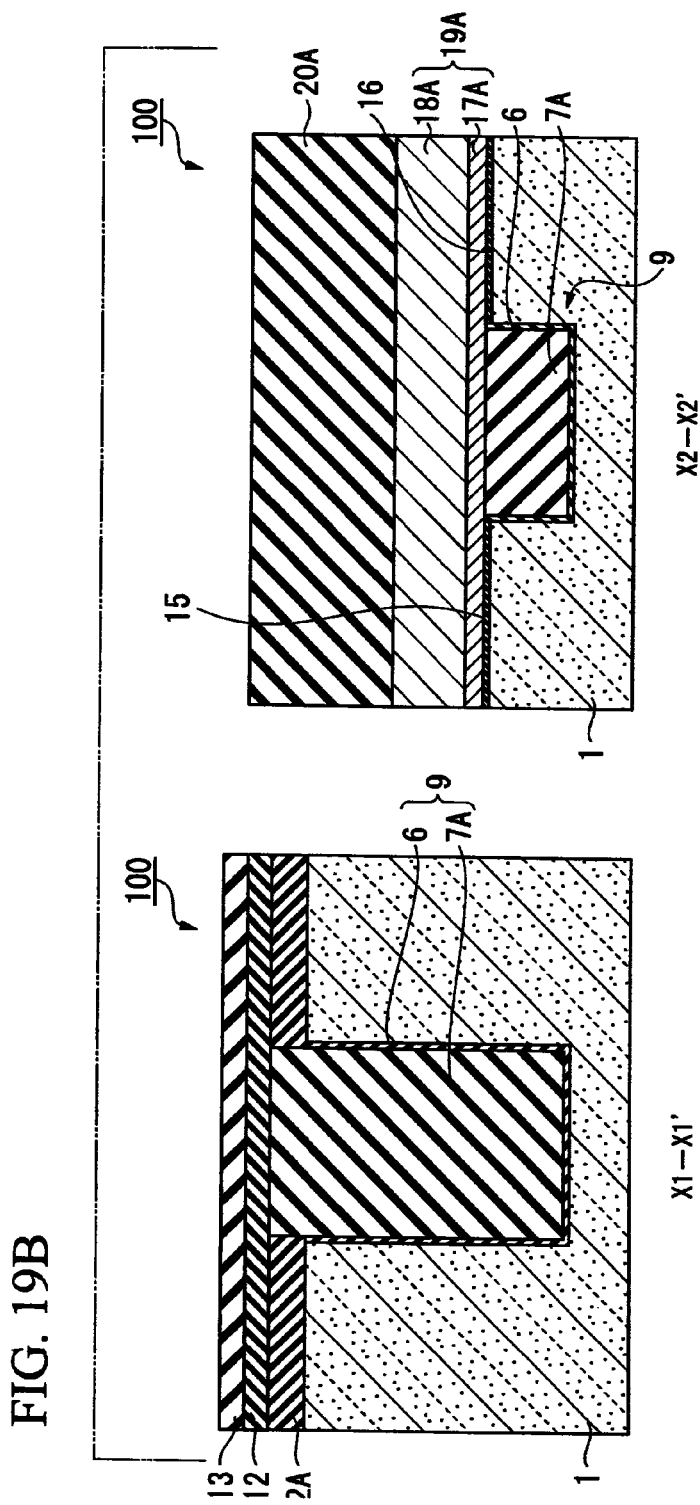
FIG. 19B is a fragmentary cross sectional elevation view of the same step as in FIG. 19A, involved in the method of forming the semiconductor device of FIGS. 1 and 2, illustrating the memory cell area 100, taken along an X1-X1' line of FIG. 1 and taken along an X2-X2' line of FIG. 1.
Figure 19C:
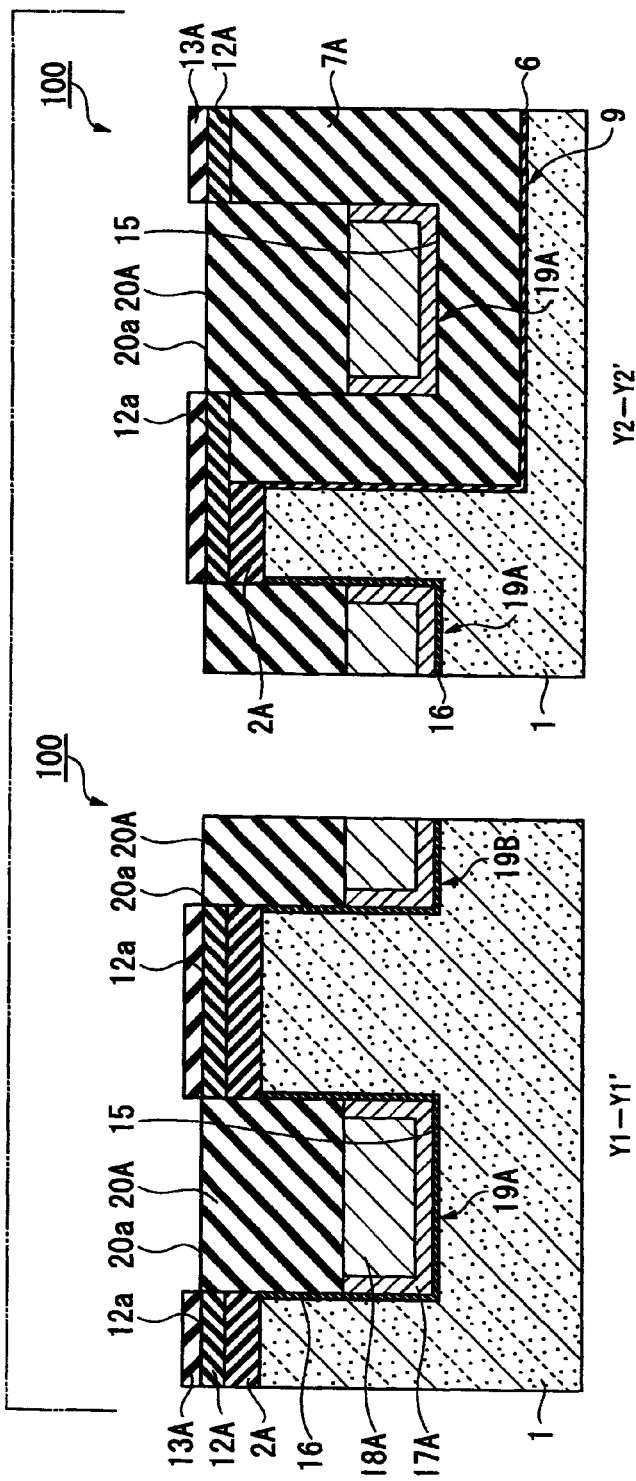
FIG. 19C is a fragmentary cross sectional elevation view of the same step as in FIGS. 19A and 19B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 19A, FIG. 19B, and FIG. 19C, the silicon nitride film 20 is selectively etched back so as to bury the WL trench 15 and to form a cap insulating film 20A made of silicon nitride for the purpose of protecting the upper surface of the buried gate electrode 19A and the buried interconnect 19B.

In this case, the etching back processing of the silicon nitride film 20 is performed so that, in the memory cell region 100, upper surface 12a of the silicon nitride guard film 12A formed above the active region 1A and the upper surface 20a of the cap insulating film 20A are substantially the same height. The term substantially the same height as used herein includes the upper surface 20a of the cap insulating film 20 being up to 5 nm lower than the upper surface 12a of the silicon nitride guard film 12A.

The etching back processing of the silicon nitride film 20 is performed by wet etching using hot phosphoric acid. The temperature of the hot phosphoric acid in this wet etching is done within the range between approximately 140 to 160° C., in the same manner as in the formation of the above-described STI element separation film 9.

Figure 20A:
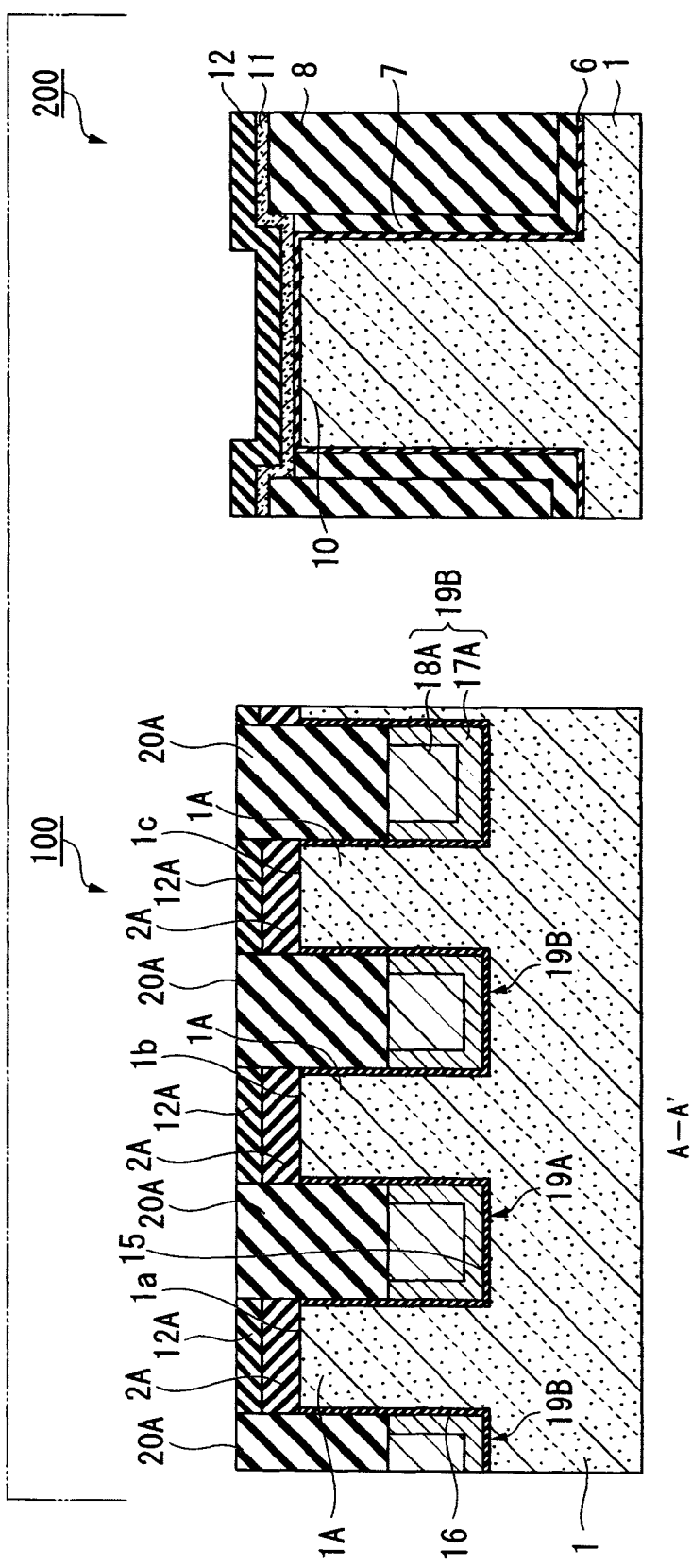
FIG. 20A is a fragmentary cross sectional elevation view of a step subsequent to the step of FIGS. 19A, 19B and 19C, involved in the method of forming the semiconductor device of FIGS. 1 and 2, illustrating the memory cell area 100, taken along an A-A' line of FIG. 1 and the peripheral area 200.
Figure 20C:
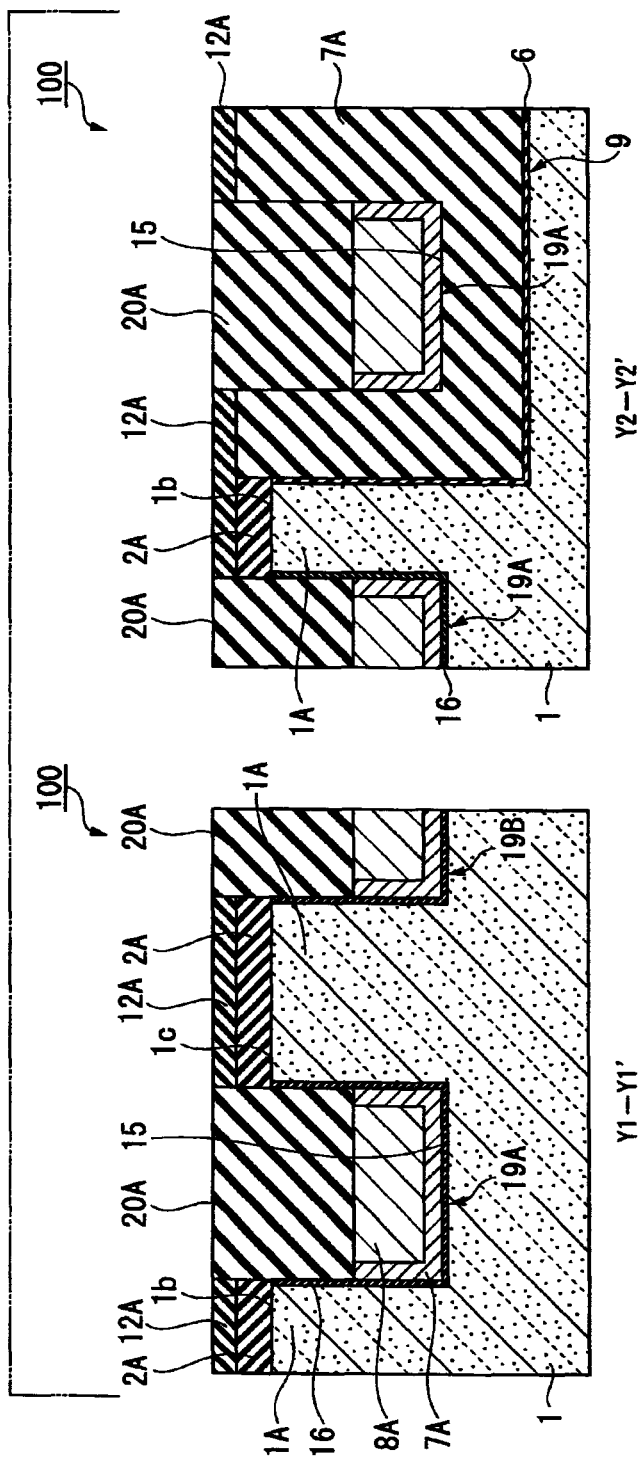
FIG. 20C is a fragmentary cross sectional elevation view of the same step as in FIGS. 20A and 20B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 20A, FIG. 20B, and FIG. 20C, hard silicon oxide film 13 and the hard silicon oxide film 13A onto which the pattern is transferred remaining in the memory cell region 100 and the peripheral circuit region 200 are removed by wet etching using a solution containing hydrofluoric acid (DHF).

At this stage, as shown in the left-side drawing in FIG. 20A (that is, the cross-section above the active region in the direction of extension of the active region), the sacrificial silicon oxide film 2A that covers the surfaces of each region of the bit contact contacting region 1b, and the capacitor contact contacting regions 1a, 1c, which are surface regions in the active region 1A, are all in contact at both sides with the silicon nitride film that constitutes the cap insulating film 20A that buries the WL trench 15. The upper surface of each sacrificial silicon oxide film 2A is in contact with the silicon nitride guard film 12A and the lower surface thereof is in contact with the silicon substrate (each of the contacting regions 1a, 1b, and 1c of the active region 1A).

As shown in the left-side drawing in FIG. 20B (that is, the cross-section between the gate electrode 19A and the buried interconnect 19B in the direction of extension of the buried gate electrode 19A), the side surface opposite in the X direction shown in FIG. 1 of the sacrificial silicon oxide film 2A that covers each region surface of the capacitor contact contacting region 1a and 1d (refer to FIG. 1) is in contact with a buried silicon nitride film 7A that constitutes the STI element separation film 9. The upper surface of each sacrificial silicon oxide films 2A is in contact with the silicon nitride guard film 12A and the lower surface thereof in contact with the silicon substrate (each of the contacting regions 1a, 1d of the active region 1A).

Additionally, as shown in the left-side drawing in FIG. 20C (that is, the cross-section between the bit lines 27 in the direction of extension of the bit lines 27 as shown in FIG. 1), the side surfaces opposing in the Y direction of the sacrificial silicon oxide films 2A that cover each of the surfaces of the regions of the bit contact contacting region 1b and the capacitor contact contacting region 1d are both in contact with a silicon nitride film that constitutes the cap insulating film 20A that buries the WL trench 15. The upper surface of all of the sacrificial silicon oxide films 2A is in contact with the silicon nitride guard film 12A, and the lower surface thereof is in contact with the silicon substrate (each of the contacting regions 1b, 1c of the active region 1A).

Additionally, as shown in the right-side drawing in FIG. 20C (that is, the cross-section above the bit line 27 in the direction of extension of the bit line 27 as shown in FIG. 1), one of the side surfaces opposing in the Y direction of the sacrificial silicon oxide films 2A that cover the surface of the bit contact contacting region 1b is in contact with the silicon nitride film that constitutes the cap insulating film 20A that buries the WL trench 15, and the other is in contact with the buried silicon nitride film 7A that constitutes the STI element separation film 9 before contacting the cap insulating film 20A. The upper surface of each of the sacrificial silicon oxide films 2A is in contact with the silicon nitride guard film 12A, and the lower surface thereof is in contact with the silicon substrate (the contacting region 1b of the active region 1A).

In this manner, all of the side surfaces and the upper surface of all of the sacrificial silicon oxide films 2A over the active region 1A are surrounded by a silicon nitride film, and the lower surfaces there are surrounded by the silicon substrate.

(Bit Contact and Bit Line Formation Process Step)

Figure 21A:
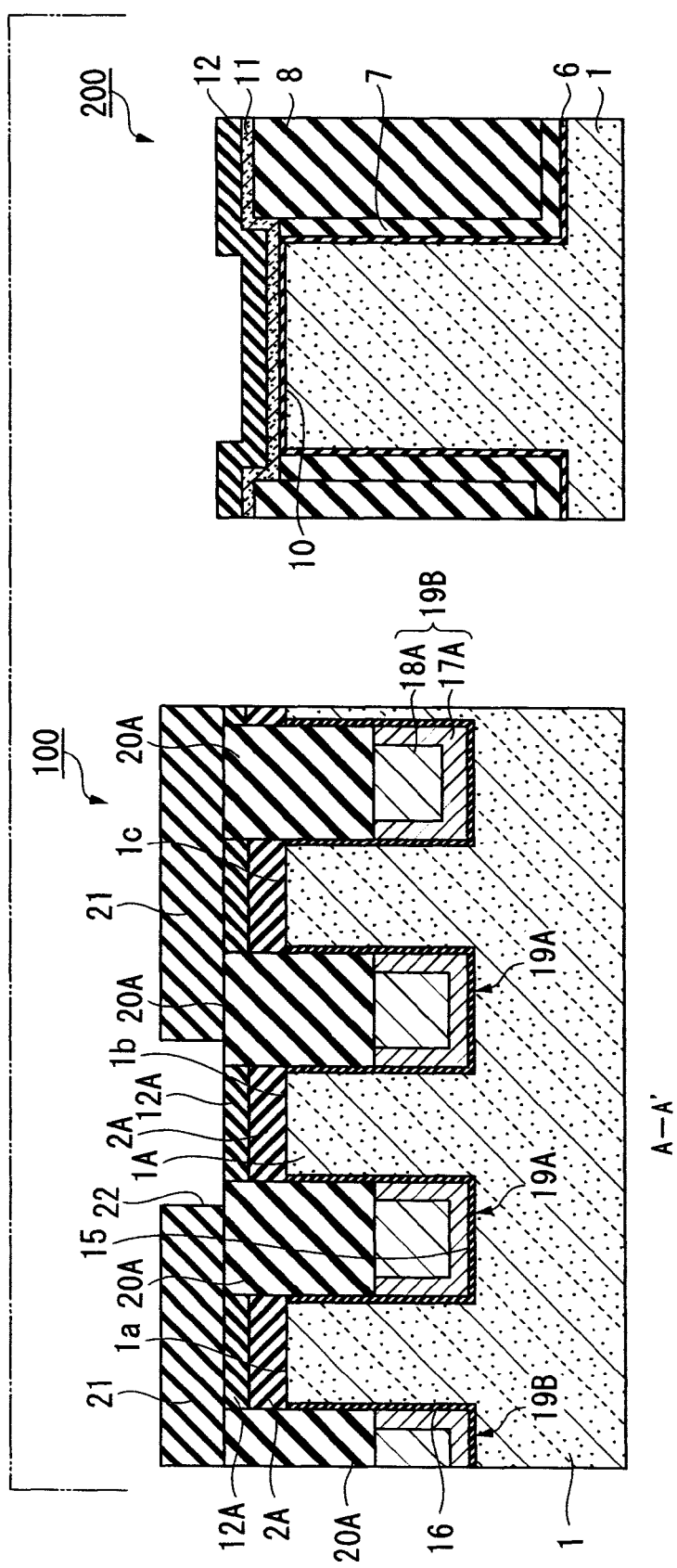
FIG. 21A is a fragmentary cross sectional elevation view of a step subsequent to the step of FIGS. 20A, 20B and 20C, involved in the method of forming the semiconductor device of FIGS. 1 and 2, illustrating the memory cell area 100, taken along an A-A' line of FIG. 1 and the peripheral area 200.
Figure 21C:
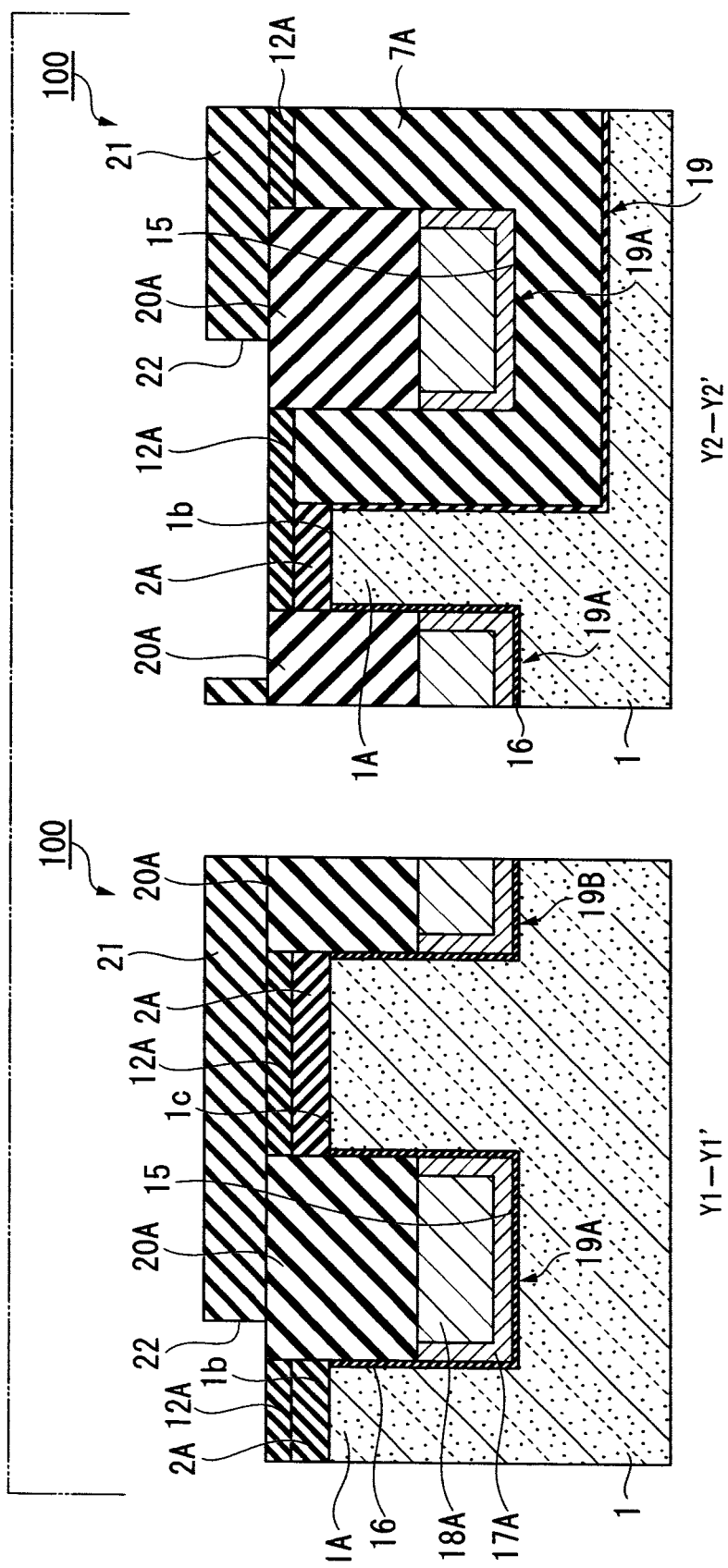
FIG. 21C is a fragmentary cross sectional elevation view of the same step as in FIGS. 21A and 21B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, in the memory cell region 100 a bit contact and a bit line are simultaneously formed. Specifically, for example, as shown in FIG. 21A, FIG. 21B, and FIG. 21C, lithography is used to form a photoresist 21 that exposes the bit contact aperture part in the memory cell region 100 and the peripheral circuit region 200. In the aperture pattern 22 of the photoresist 21 for the purpose of forming the bit contact aperture parts, the bit contact aperture part is wider than the Y-direction width of the silicon nitride guard film 12A, and is formed so that both end parts thereof are position over the WL trench 15. The aperture pattern 22 of the photoresist 21 is formed as a linear pattern in the X direction in FIG. 1, and so as to include a plurality of bit contact aperture parts at once. By batch formation of the bit contact aperture parts as a linear pattern in this manner, it is possible to avoid difficulty in lithography in comparison with the case of forming the hole patterns with individual independent bit contacts.

Figure 22B:
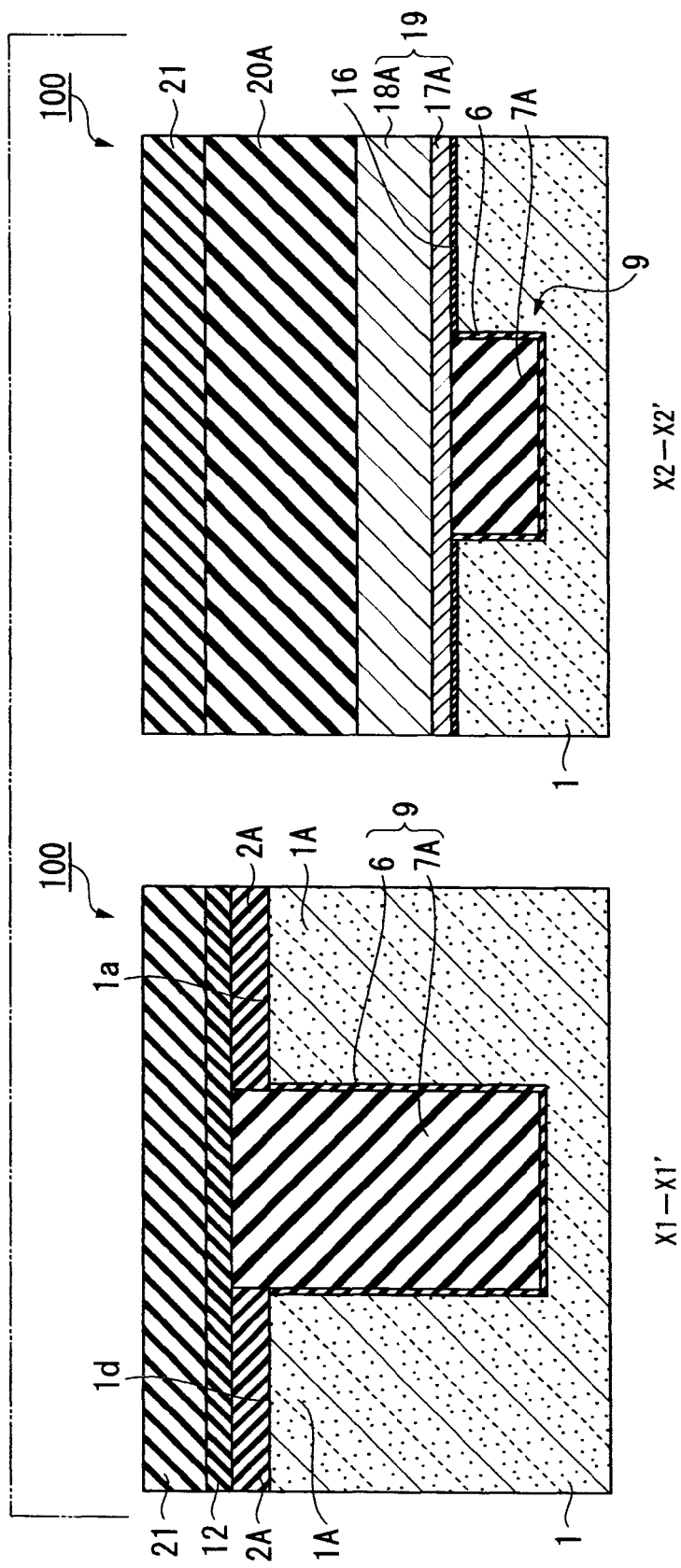
FIG. 22B is a fragmentary cross sectional elevation view of the same step as in FIG. 22A, involved in the method of forming the semiconductor device of FIGS. 1 and 2, illustrating the memory cell area 100, taken along an X1-X1' line of FIG. 1 and taken along an X2-X2' line of FIG. 1.
Figure 22C:
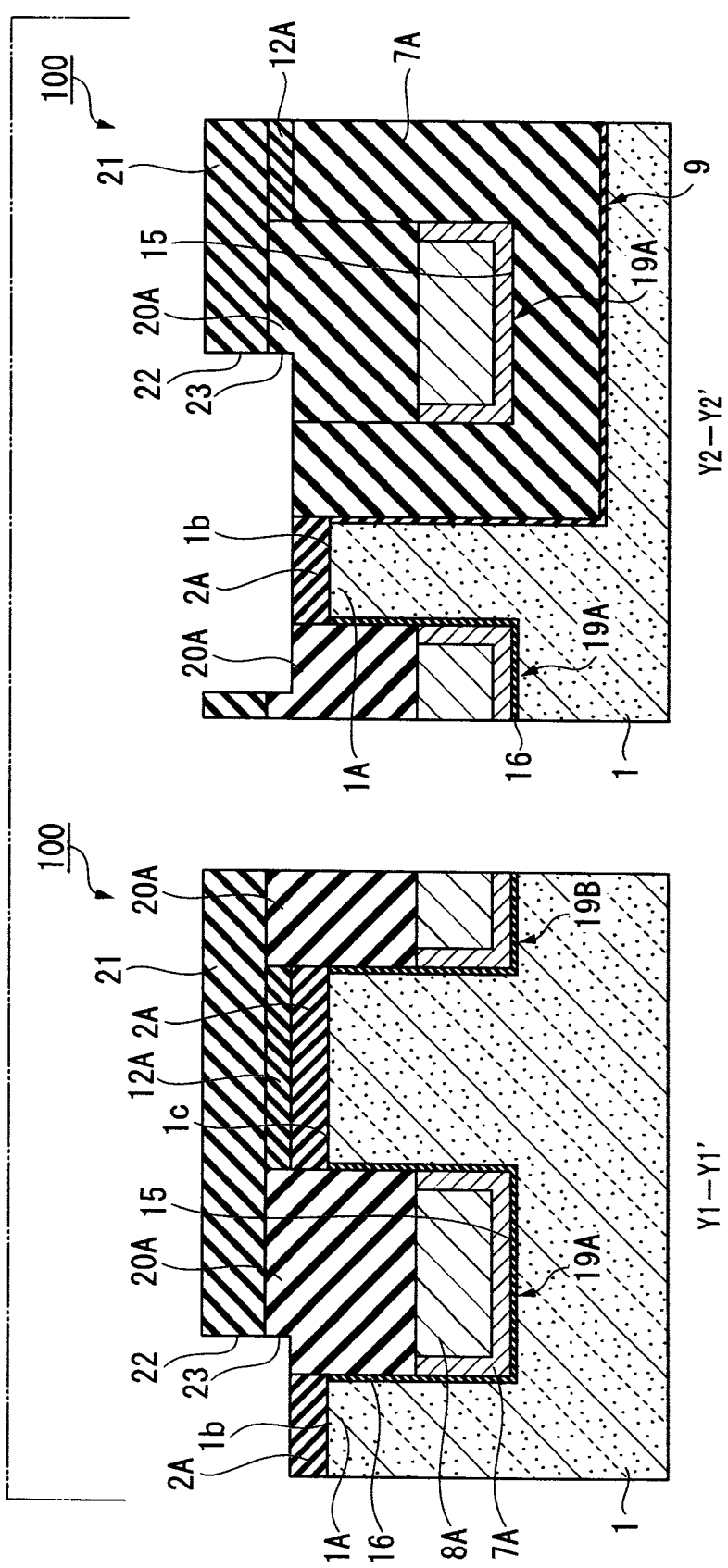
FIG. 22C is a fragmentary cross sectional elevation view of the same step as in FIGS. 22A and 22B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in the left-side drawing in FIG. 22A and in FIG. 22B and FIG. 22C, within the memory cell region 100, the silicon nitride guard film 12A and part of the cap insulating film 20A exposed from the aperture pattern 22 of the photoresist 21 are removed by dry etching and transferred as the bit contact aperture pattern 23, the upper surface of the sacrificial silicon oxide film 2A over the bit contact contacting region 1b being exposed from this bit contact aperture pattern 23.

Simultaneously with this, as shown in the right-side drawing in FIG. 22A, the silicon nitride film 12 at the peripheral circuit region 200 is removed, exposing the surface of the silicon film 11.

Figure 23A:
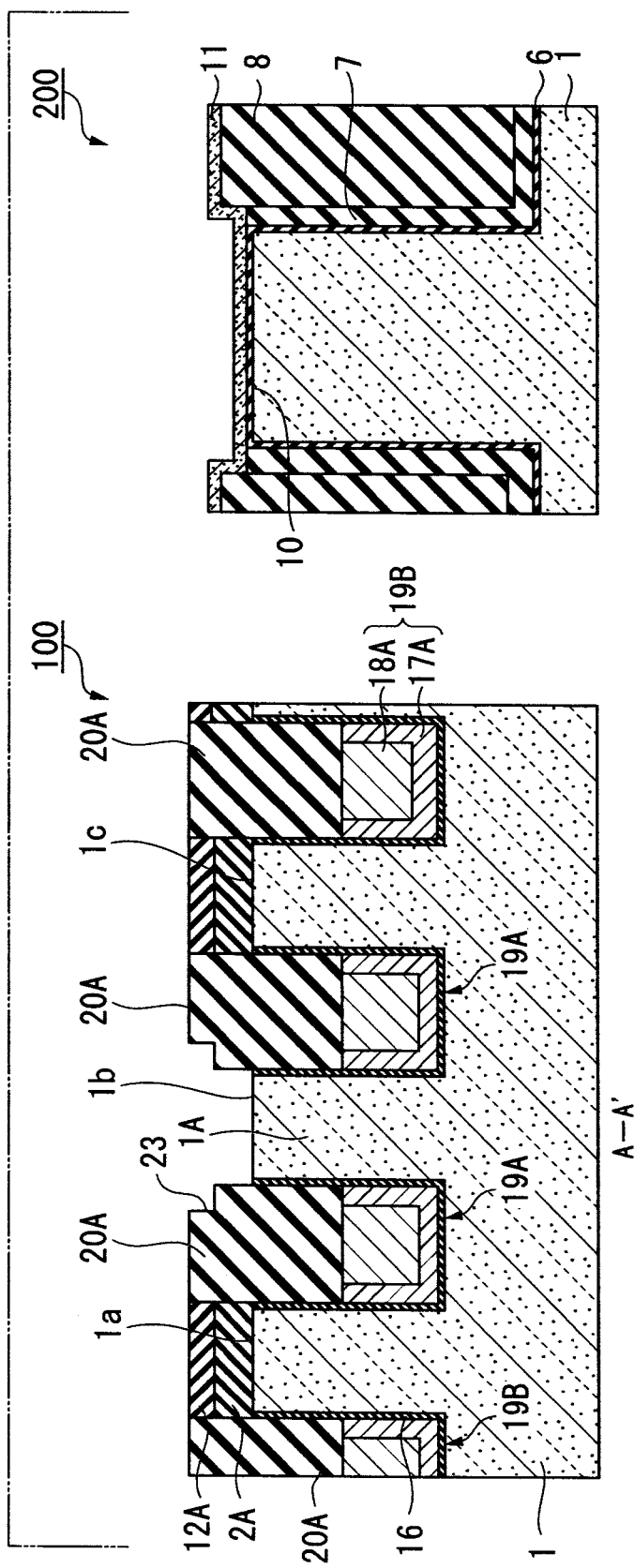
FIG. 23A is a fragmentary cross sectional elevation view of a step subsequent to the step of FIGS. 22A, 22B and 22C, involved in the method of forming the semiconductor device of FIGS. 1 and 2, illustrating the memory cell area 100, taken along an A-A' line of FIG. 1 and the peripheral area 200.
Figure 23C:
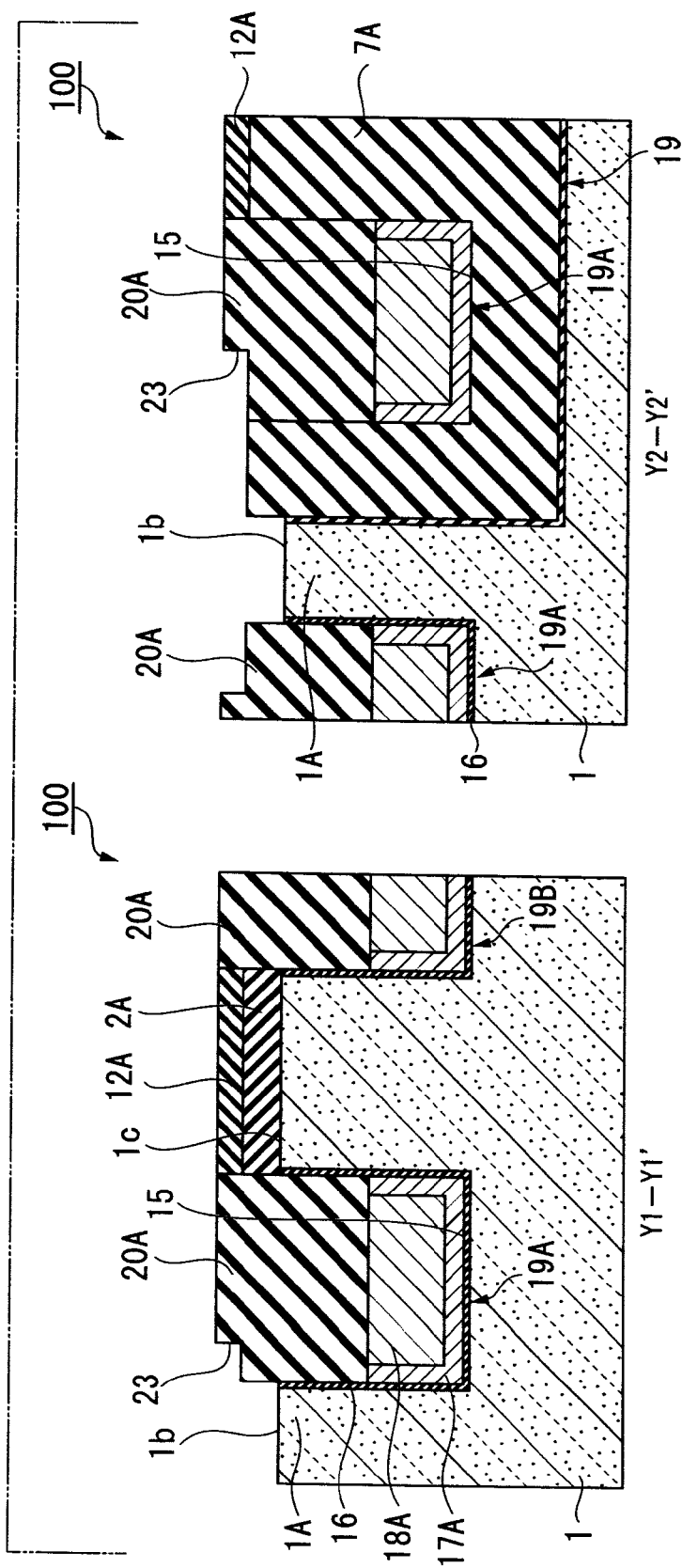
FIG. 23C is a fragmentary cross sectional elevation view of the same step as in FIGS. 23A and 23B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 23A, FIG. 23B, and FIG. 23C, after the photoresist 21 is removed, the sacrificial silicon oxide film 2A over the bit contact contacting region 1b exposed at its upper surface from the bit contact aperture pattern 23 is selectively removed. By doing this, the bit contact contacting region 1b (that is, the silicon substrate surface) is exposed, and the contact aperture parts are formed. In this case, wet etching using a solution containing hydrogen fluoride (HF) is used in the selective removal of the sacrificial silicon oxide film 2A.

In this manner, because of the sacrificial silicon oxide film 2A that was used as a part of the mask when forming the STI trench 5 and the WL trench 15 over the bit contact contacting region 1b only is selectively removed, even if offset occurs in the positioning of the aperture pattern 22 at the stage of lithography for forming the aperture pattern 22 of the photoresist 21, the bit contact aperture parts can be formed with self-alignment in the contact parts of the silicon substrate (that is, the bit contact contacting region 1b).

Figure 24A:
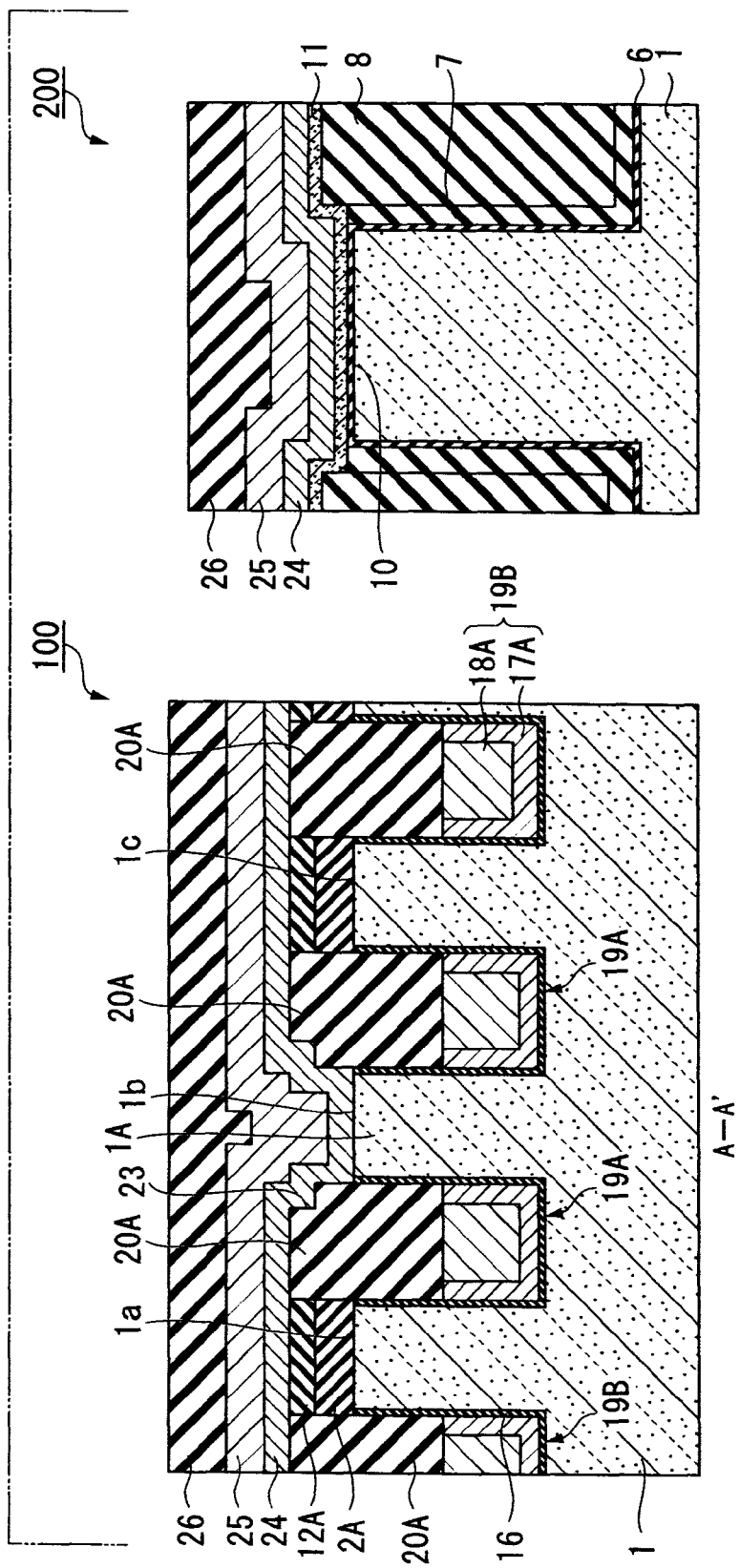
FIG. 24A is a fragmentary cross sectional elevation view of a step subsequent to the step of FIGS. 23A, 23B and 23C, involved in the method of forming the semiconductor device of FIGS. 1 and 2, illustrating the memory cell area 100, taken along an A-A' line of FIG. 1 and the peripheral area 200.
Figure 24B:
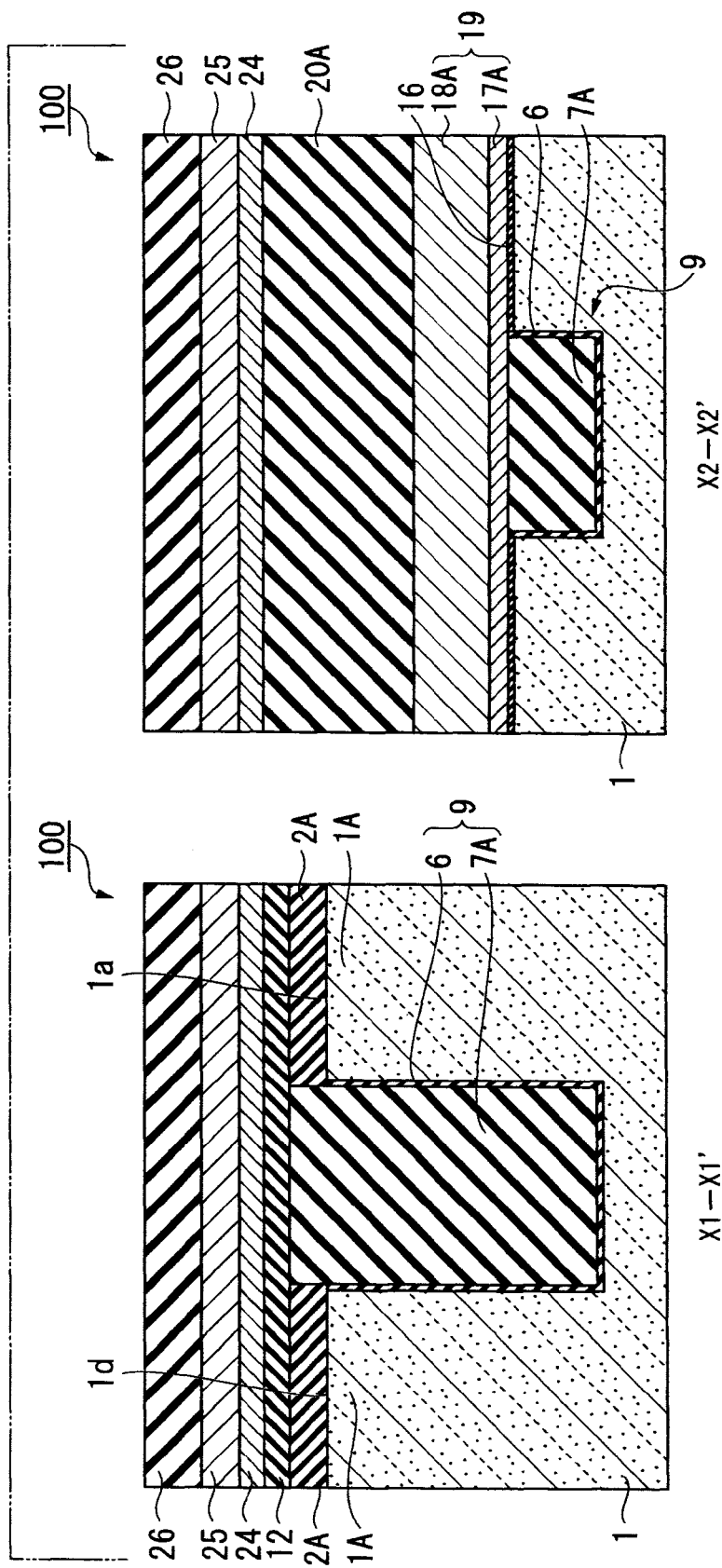
FIG. 24B is a fragmentary cross sectional elevation view of the same step as in FIG. 24A, involved in the method of forming the semiconductor device of FIGS. 1 and 2, illustrating the memory cell area 100, taken along an X1-X1' line of FIG. 1 and taken along an X2-X2' line of FIG. 1.
Figure 24C:
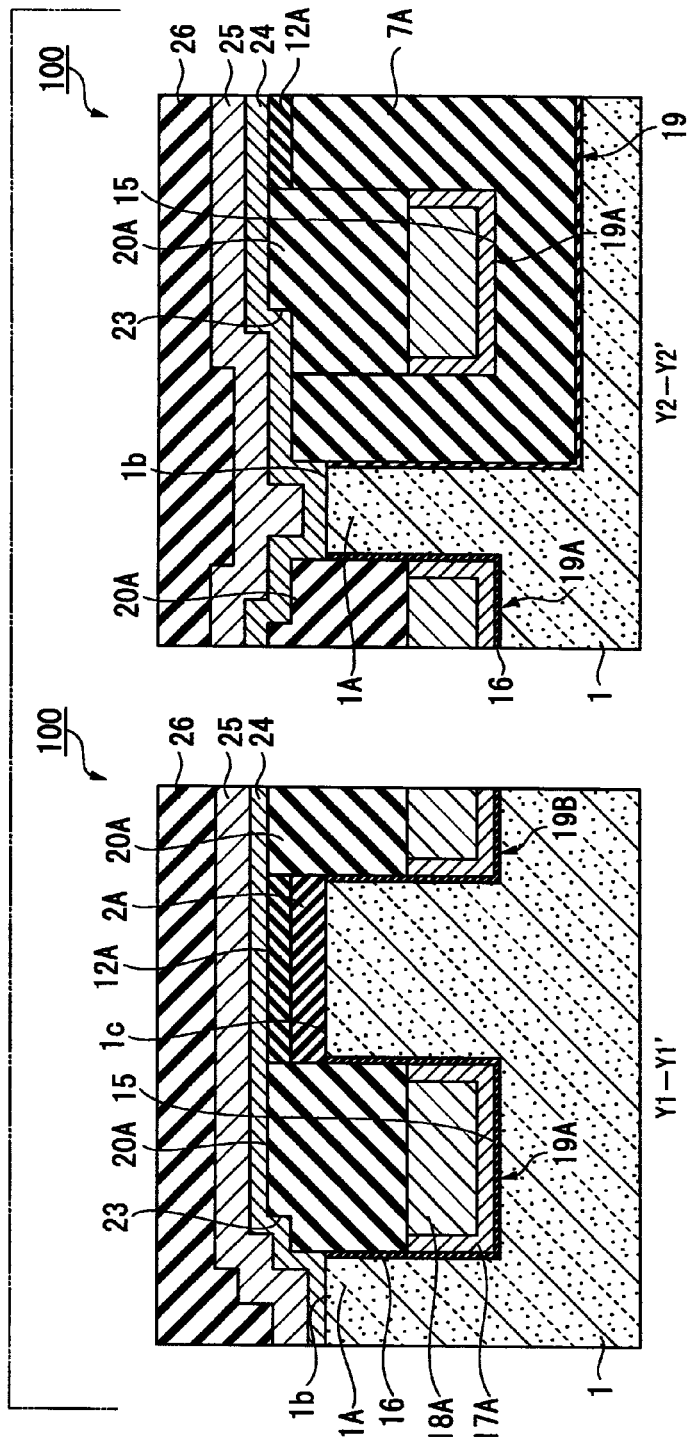
FIG. 24C is a fragmentary cross sectional elevation view of the same step as in FIGS. 24A and 24B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 24A, FIG. 24B, FIG. 24C, a second silicon film 24 made of a silicon film having a thickness of approximately 30 nm, a gate metal film 25 made of a metal film having a thickness of approximately 40 nm, and a silicon nitride cover film (cover insulating film) 26 made of a silicon nitride film having a thickness of approximately 50 nm are successively formed over the entire surface across the memory cell region 100 and the peripheral circuit region 200, using CVD. The bit contact aperture parts over the bit contact contacting region 1b is buried by the second silicon film 24 and the gate metal film 25. The metal film that constitutes the gate metal film 25 is constituted as a laminated film of a tungsten film having a thickness of approximately 35 nm over a tungsten nitride film having a thickness of approximately 5 nm.

Figure 25A:
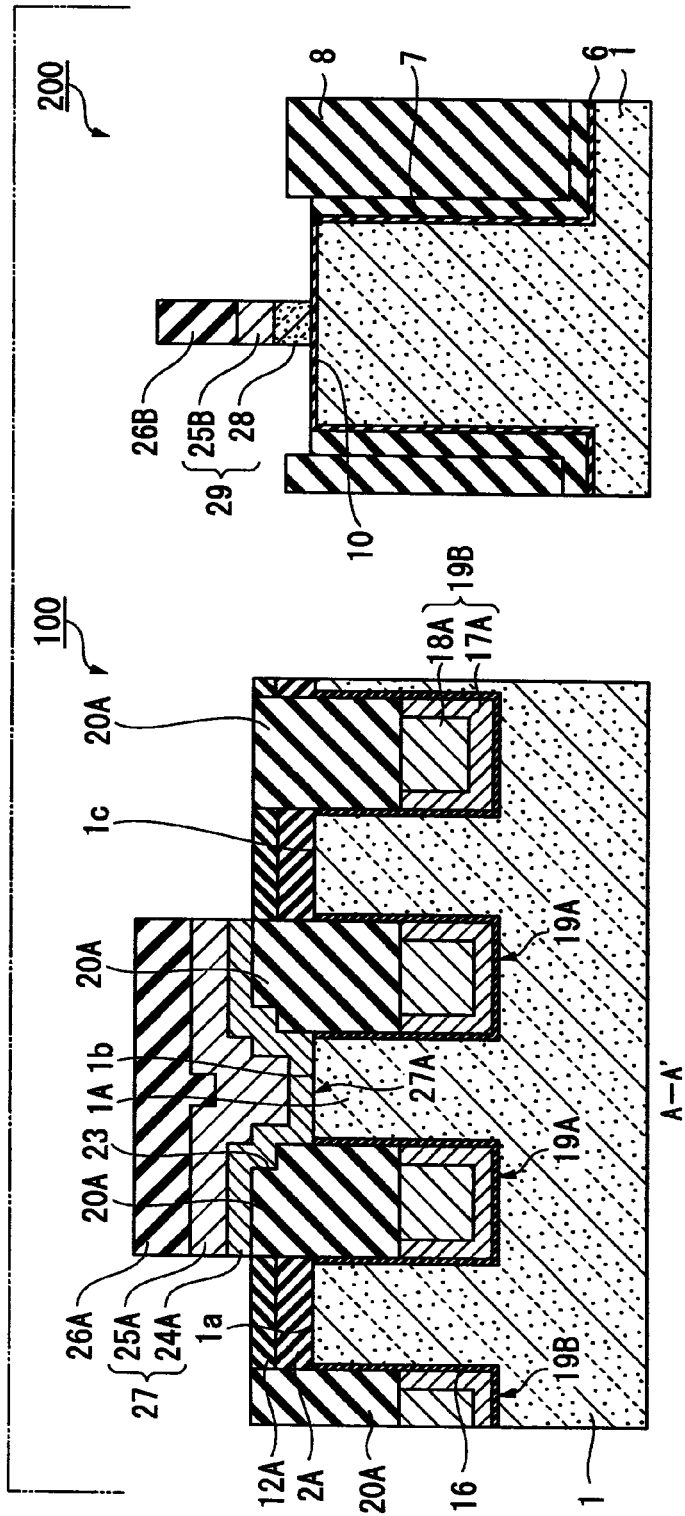
FIG. 25A is a fragmentary cross sectional elevation view of a step subsequent to the step of FIGS. 24A, 24B and 24C, involved in the method of forming the semiconductor device of FIGS. 1 and 2, illustrating the memory cell area 100, taken along an A-A' line of FIG. 1 and the peripheral area 200.
Figure 25C:
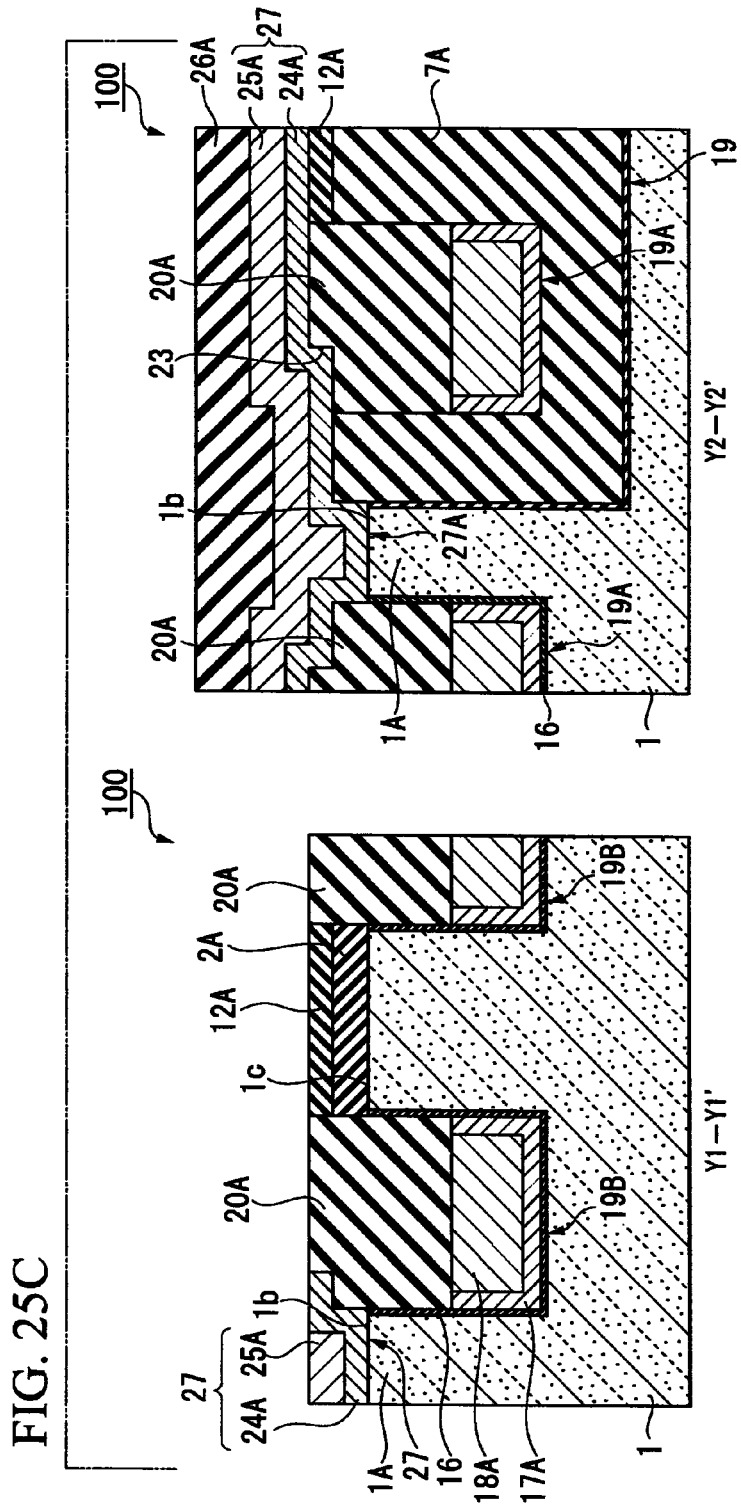
FIG. 25C is a fragmentary cross sectional elevation view of the same step as in FIGS. 25A and 25B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 25A, FIG. 25B, and FIG. 25C, lithography and dry etching are used to successively etch the silicon nitride cover film 26, the gate metal film 25, and the second silicon film 24, to form simultaneously a bit contact 27A and bit line 27 in the memory cell region 100 and a peripheral gate electrode (gate electrode) 29 that will become the gate electrode of a transistor for the peripheral circuit in the peripheral circuit region 200. The first silicon film 11 and second silicon film 24 that had been formed in the peripheral circuit region 200 are integrated and become the silicon film 28.

(Insulating Film Formation Process Step)

Figure 26A:
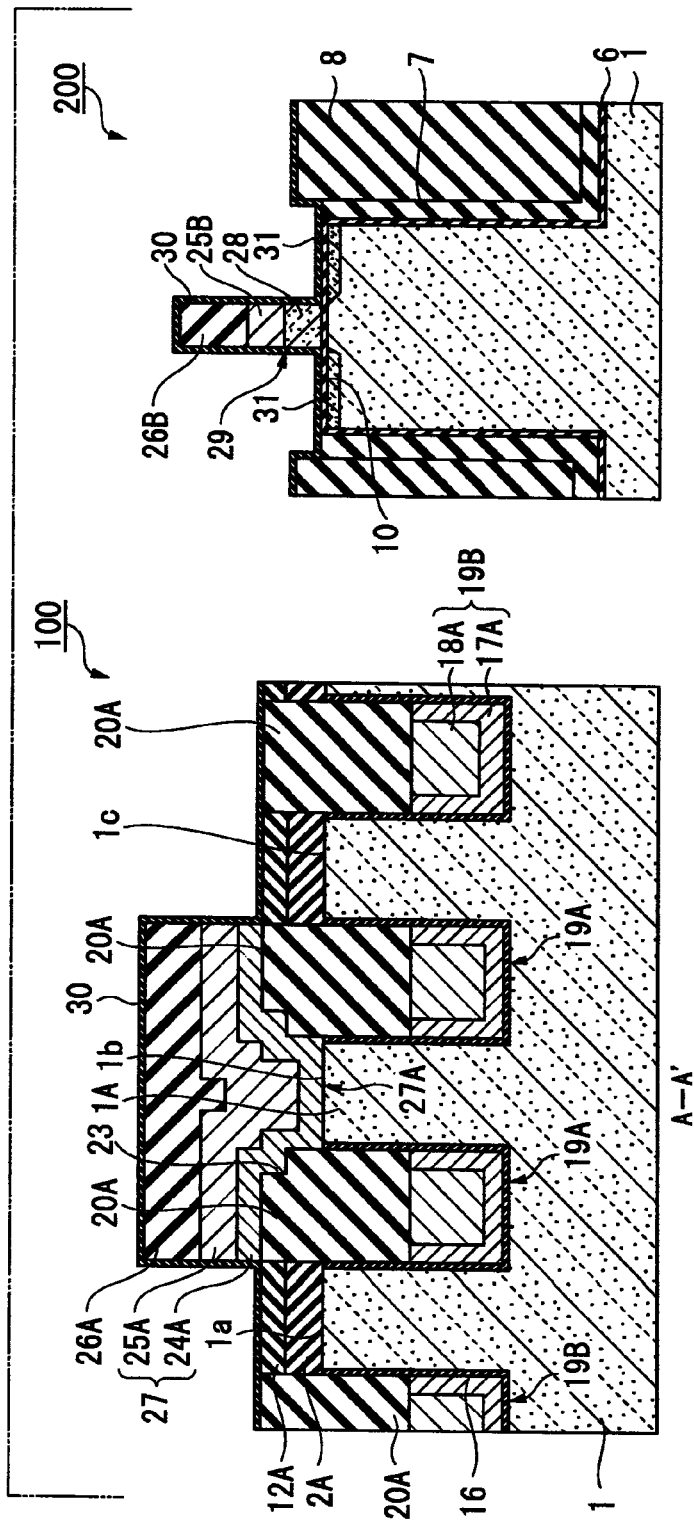
FIG. 26A is a fragmentary cross sectional elevation view of a step subsequent to the step of FIGS. 25A, 25B and 25C, involved in the method of forming the semiconductor device of FIGS. 1 and 2, illustrating the memory cell area 100, taken along an A-A' line of FIG. 1 and the peripheral area 200.
Figure 26B:
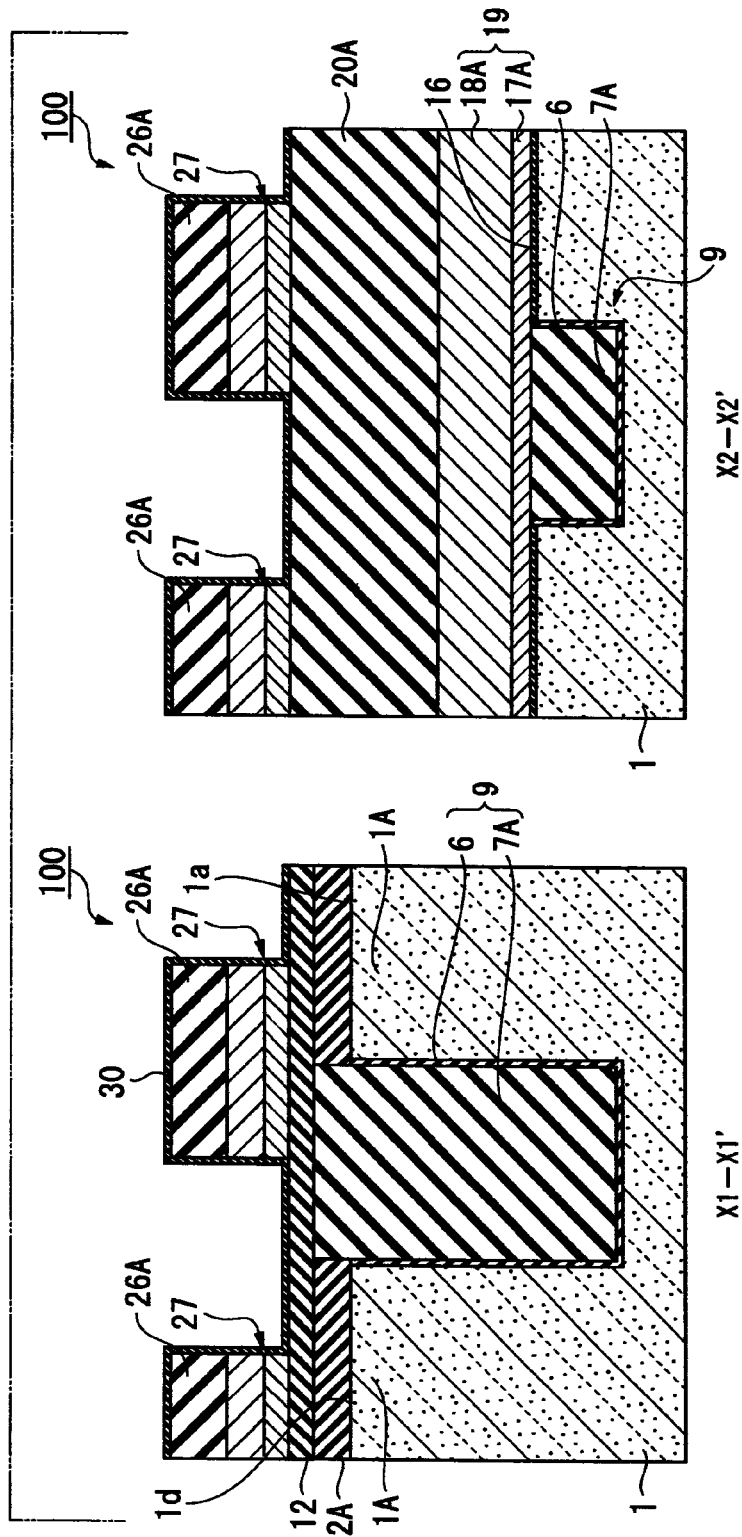
FIG. 26B is a fragmentary cross sectional elevation view of the same step as in FIG. 26A, involved in the method of forming the semiconductor device of FIGS. 1 and 2, illustrating the memory cell area 100, taken along an X1-X1' line of FIG. 1 and taken along an X2-X2' line of FIG. 1.

Next, an insulating layer is formed over the silicon substrate. The formation of the insulating layer, as shown in FIG. 26A, FIG. 26B, and FIG. 26C is done by first forming a first silicon nitride linear film 30 over the entire surface of the memory cell region 100 and the peripheral circuit region 200 so as to cover the silicon film 28 and the gate metal film 25B exposed at the side wall of the bit line 27 and the peripheral gate electrode 29. Specifically, ALD is used to form to a thickness of approximately 5 nm.

After the above, as shown in the right-side drawing in FIG. 26A, in the peripheral circuit region 200 impurity ions are implanted, using the peripheral gate electrode 29 as a mask. By doing this, the impurity diffusion layers 31, 31 that become the source region and the drain region of the transistor for the peripheral circuit are formed.

Figure 27A:
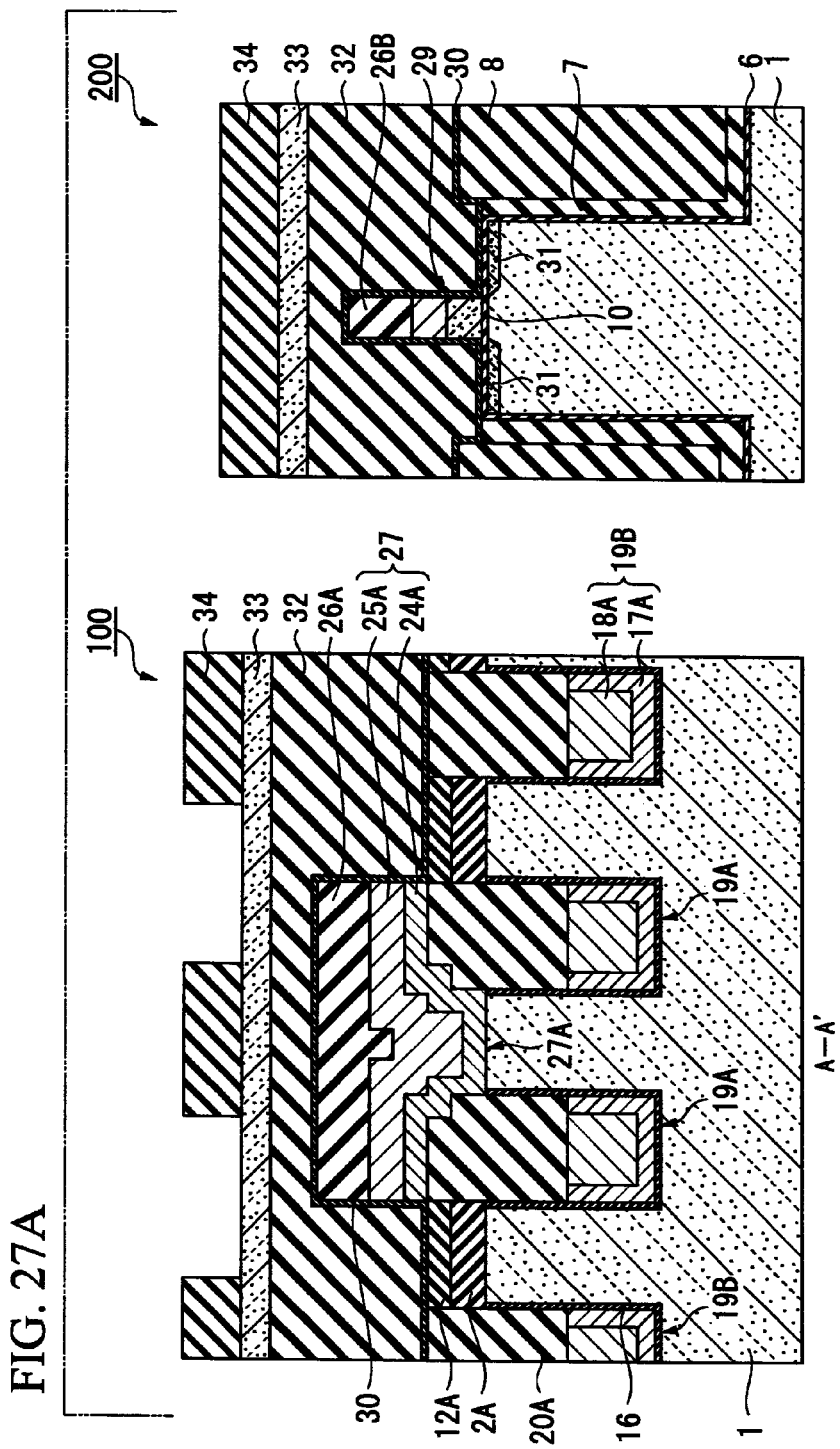
FIG. 27A is a fragmentary cross sectional elevation view of a step subsequent to the step of FIGS. 26A, 26B and 26C, involved in the method of forming the semiconductor device of FIGS. 1 and 2, illustrating the memory cell area 100, taken along an A-A' line of FIG. 1 and the peripheral area 200.
Figure 27B:
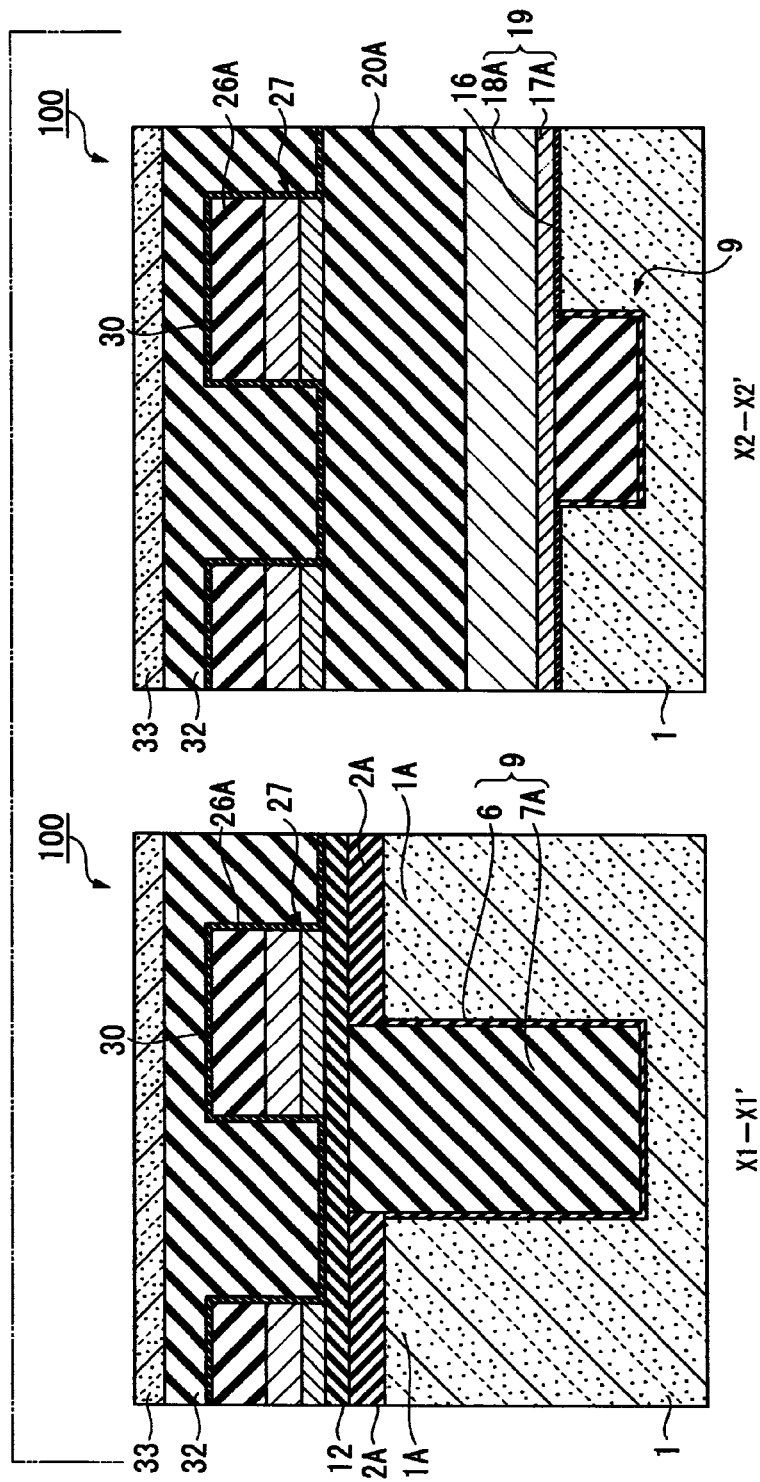
FIG. 27B is a fragmentary cross sectional elevation view of the same step as in FIG. 27A, involved in the method of forming the semiconductor device of FIGS. 1 and 2, illustrating the memory cell area 100, taken along an X1-X1' line of FIG. 1 and taken along an X2-X2' line of FIG. 1.
Figure 27C:
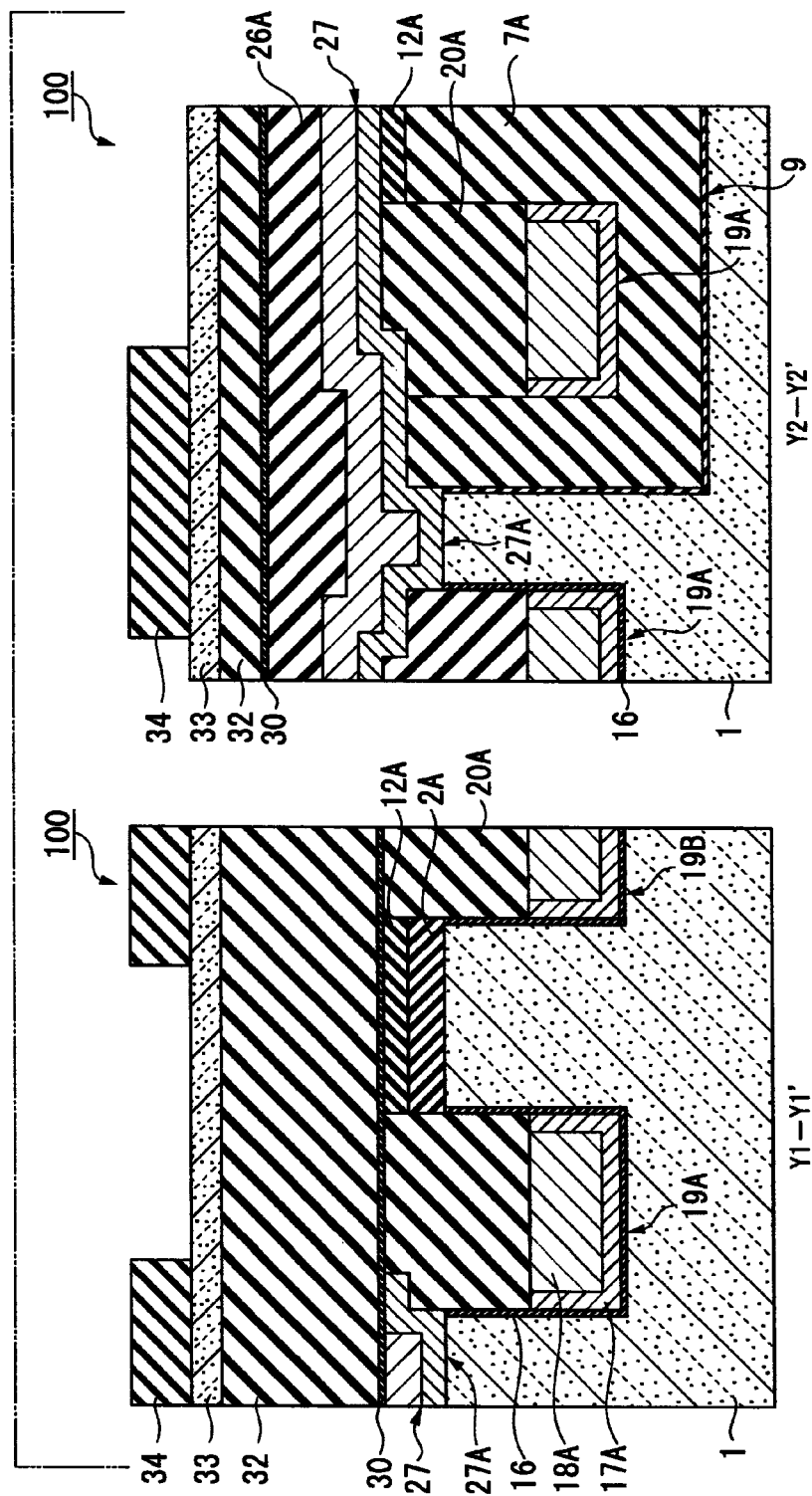
FIG. 27C is a fragmentary cross sectional elevation view of the same step as in FIGS. 27A and 27B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 27A, FIG. 27B, and FIG. 27C, a first interlayer insulating film 32 is formed so as to cover the bit line 27 in the memory cell region 100 and the peripheral gate electrode 29 in the peripheral circuit region 200. A silicon oxide film formed by the SOG (spin-on-glass) method or CVD is used as the first interlayer insulating film 32. Next, a silicon film 33 that becomes a hard mask is formed over the first interlayer insulating film 32. Additionally, an aperture pattern 34 of photoresist for the purpose of forming capacitor contacts is formed by lithography on the silicon film 33.

In this case, the aperture pattern 34 for forming the capacitor contacts is batch formed as a linear pattern extending in the X direction of FIG. 1. Therefore, as shown in FIG. 27B, in the region of the aperture pattern 34 for forming the capacitor contacts, the entire surface of the silicon film 33 is exposed.

(Capacitor Contact Formation Process Step)

Next, the capacitor contacts are formed. In this case, in the method for manufacturing the DRAM 60 of the present embodiment, the step of forming the capacitor contacts is generally constituted to have a step of forming a capacitor contact hole and a step of filling the capacitor contact hole with a conductor.

A feature of the step of forming the capacitor contact hole is that it has a step of forming a through hole so as to pass through the insulating film, a step of removing the second insulating film exposed from the bottom surface of the through hole and forming an aperture part that exposes at least one part of the upper surface of the first insulating film, a step of forming a covering film made of a second insulating material, across the though hole side surface and aperture part side surface and bottom surface, and a step of removing the covering film of the bottom surface of the aperture part and selectively removing the first insulating film from the aperture part.

(Capacitor Contact Hole Formation Process Step)

Figure 28A:
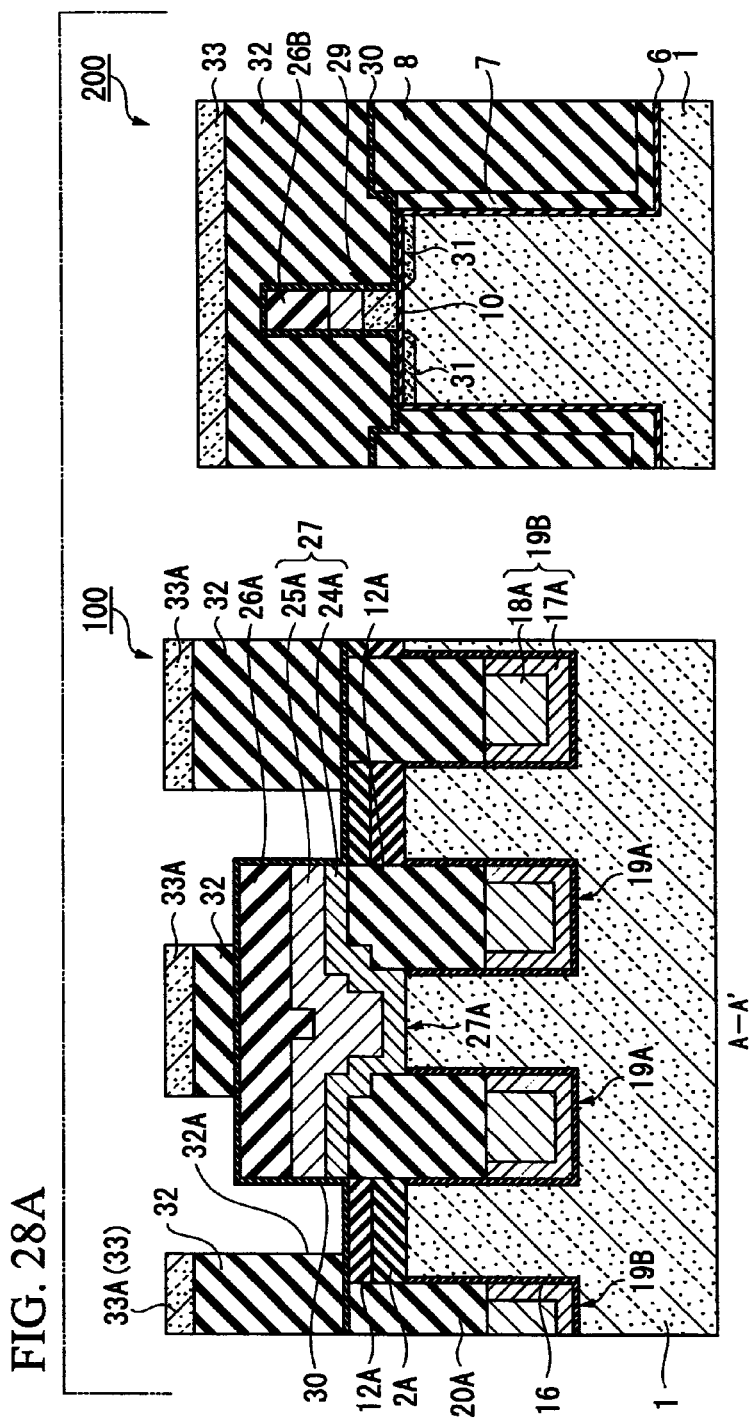
FIG. 28A is a fragmentary cross sectional elevation view of a step subsequent to the step of FIGS. 27A, 27B and 27C, involved in the method of forming the semiconductor device of FIGS. 1 and 2, illustrating the memory cell area 100, taken along an A-A' line of FIG. 1 and the peripheral area 200.
Figure 28B:
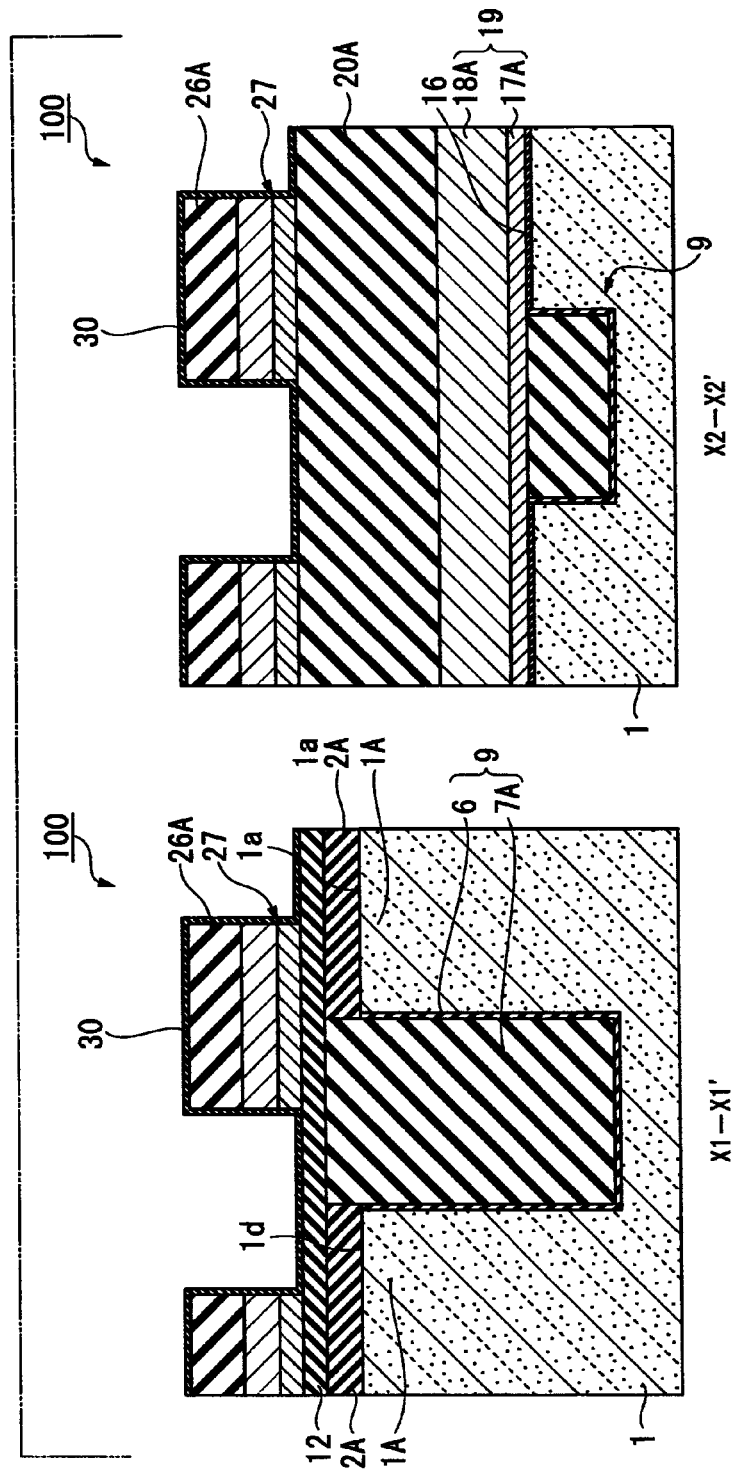
FIG. 28B is a fragmentary cross sectional elevation view of the same step as in FIG. 28A, involved in the method of forming the semiconductor device of FIGS. 1 and 2, illustrating the memory cell area 100, taken along an X1-X1' line of FIG. 1 and taken along an X2-X2' line of FIG. 1.
Figure 28C:
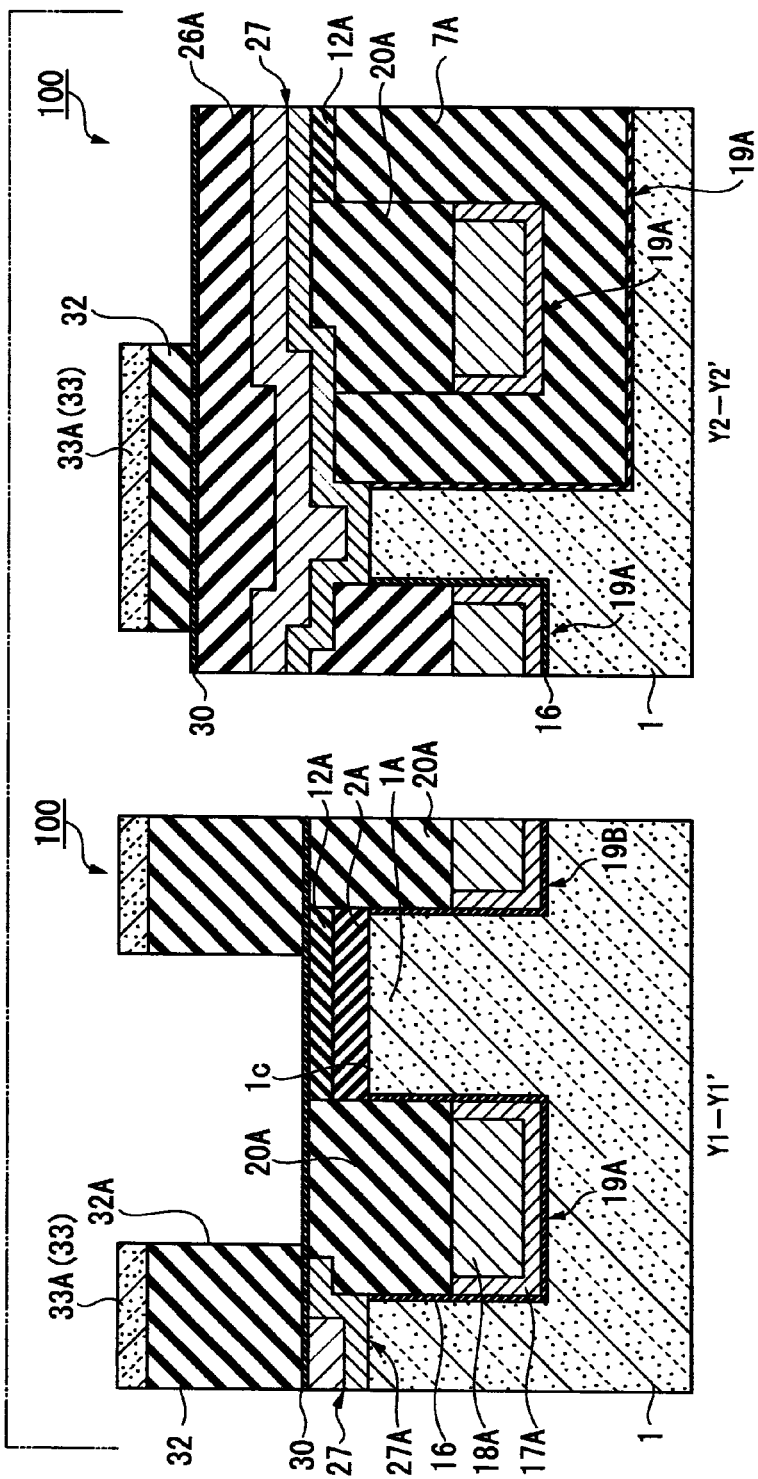
FIG. 28C is a fragmentary cross sectional elevation view of the same step as in FIGS. 28A and 28B, involved in the method of forming the semiconductor device of FIGS. 1 and 2, illustrating the memory cell area 100, taken along a Y1-Y1' line of FIG. 1 and taken along a Y2-Y2' line of FIG. 1.

The formation of the capacitor contact hole is done by first forming a through hole that passes through the insulating film 32. Specifically, as shown in FIG. 28A, FIG. 28B, and FIG. 28C, the silicon film 33 is first dry etched, using photoresist as a mask, and the aperture pattern 34 is transferred (silicon film pattern 33A). In this case, the aperture pattern 34 can use a linear pattern extending in a direction that is the same as the buried gate electrode 19A (the X direction in FIG. 1). Next, after removing the photoresist, the silicon film pattern 33A is used as a hard mask to selectively dry etch the first interlayer insulating film 32. By doing this, the linear pattern of the silicon film pattern 33A is transferred to the first interlayer insulating film 32. As the dry etching of the first interlayer insulating film 32 progresses, the bit line 27 is exposed, and a through hole 32A having a restricted width direction is formed with self-alignment in the bit line 27, at lower than the upper surface of the bit line 27. The first silicon nitride liner film 30 is caused to be exposed from the bottom surface of the through hole 32A.

Figure 29A:
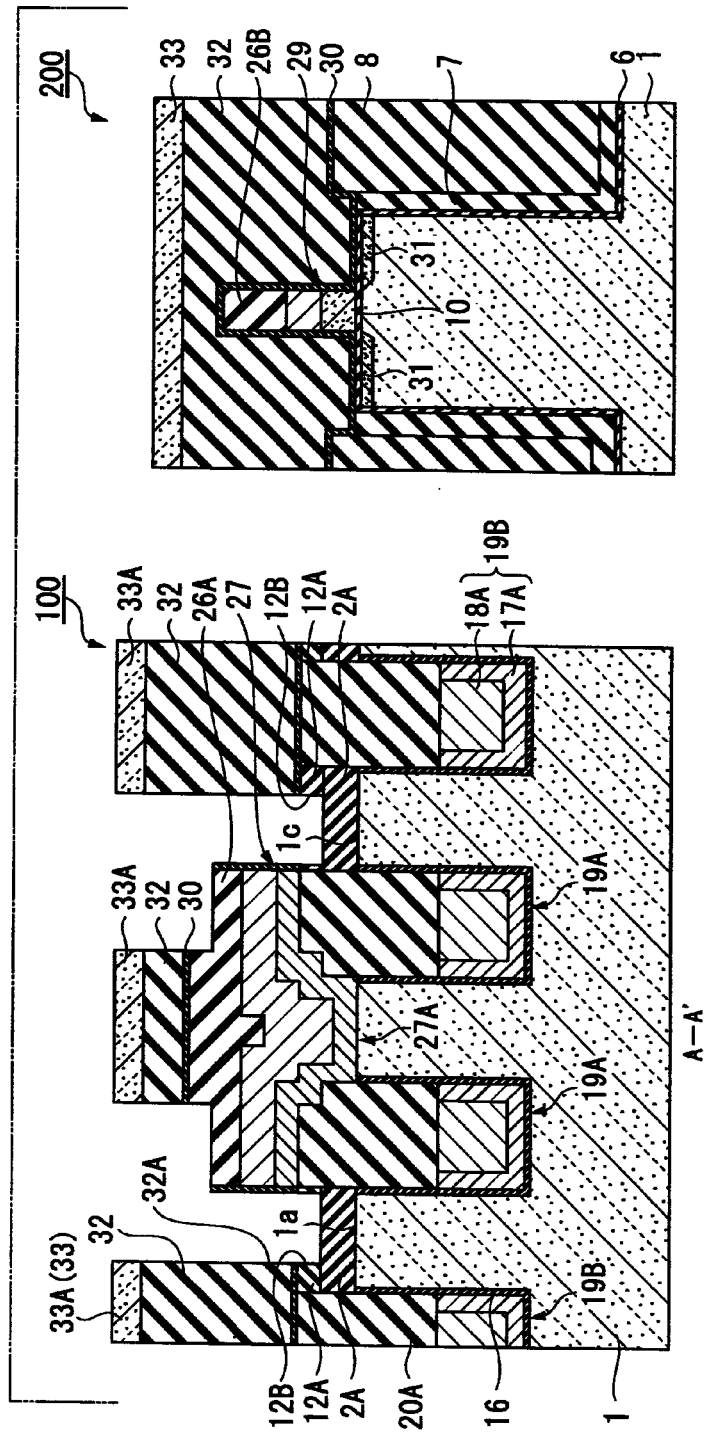
FIG. 29A is a fragmentary cross sectional elevation view of a step subsequent to the step of FIGS. 28A, 28B and 28C, involved in the method of forming the semiconductor device of FIGS. 1 and 2, illustrating the memory cell area 100, taken along an A-A' line of FIG. 1 and the peripheral area 200.
Figure 29C:
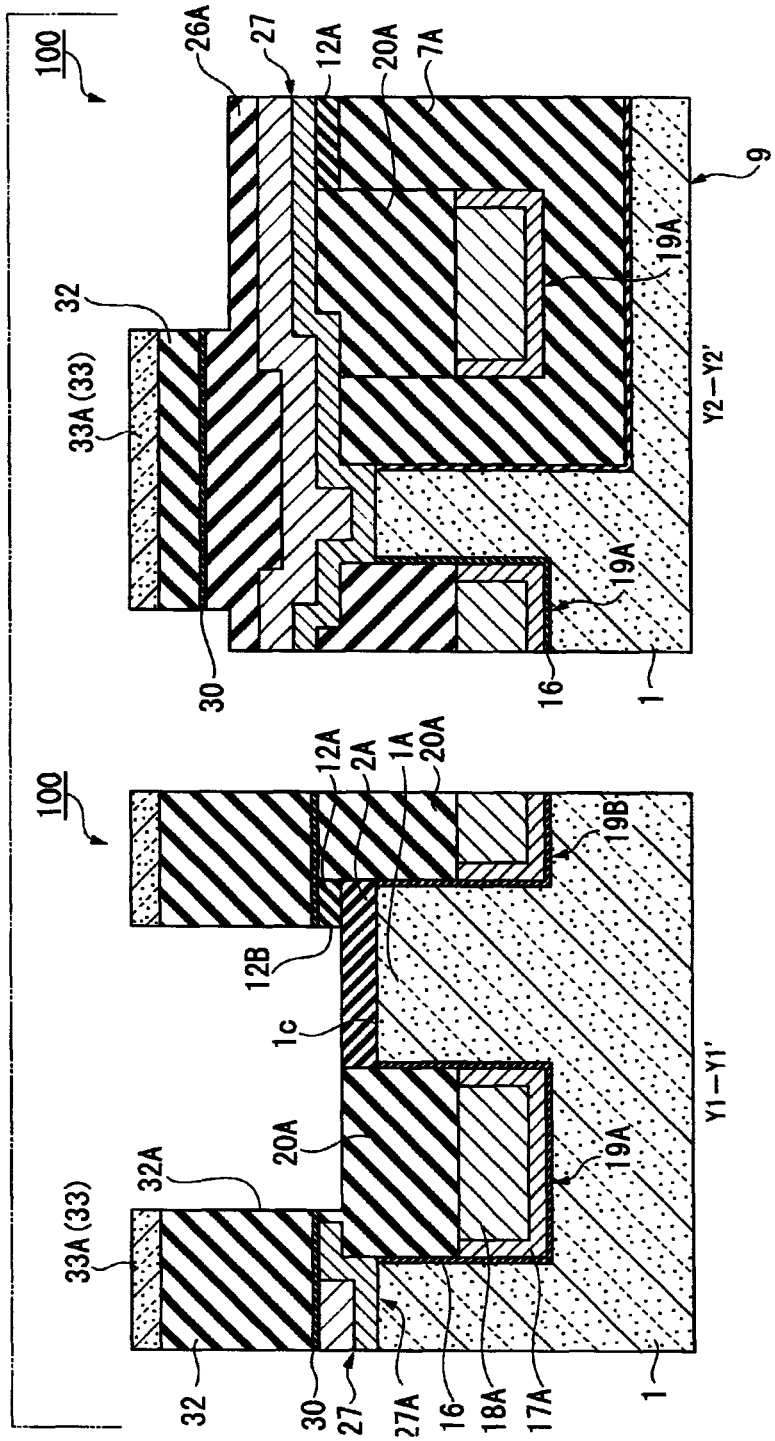
FIG. 29C is a fragmentary cross sectional elevation view of the same step as in FIGS. 29A and 29B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in the left-side drawing in FIG. 29A, the left-side drawing in FIG. 29B, and the left-side drawing in FIG. 29C, the laminated film of the upper surface of the first silicon nitride liner film 30 exposed for the bottom surface of the though hole 32A and the silicon nitride guard film (second insulating film) 12A (12) is dry etched to form the aperture part 12B in the silicon nitride guard film 12A (12). When performing this dry etching, a part of the cap insulating film 20A over the buried gate electrode 19A (refer to the right-side drawing in FIG. 29B and the left-side drawing in FIG. 29C) and a part of the silicon nitride cover film (cover insulating film) 26A over the bit line 27 (refer to the left-side drawing in FIG. 29A and the right-side drawing in FIG. 29C) are simultaneously etched.

A part of the upper surface of the sacrificial silicon oxide film 2A covering the upper surface of the capacitor contact contacting regions 1a, 1c, and 1d is exposed from the aperture part 12B.

Figure 30A:
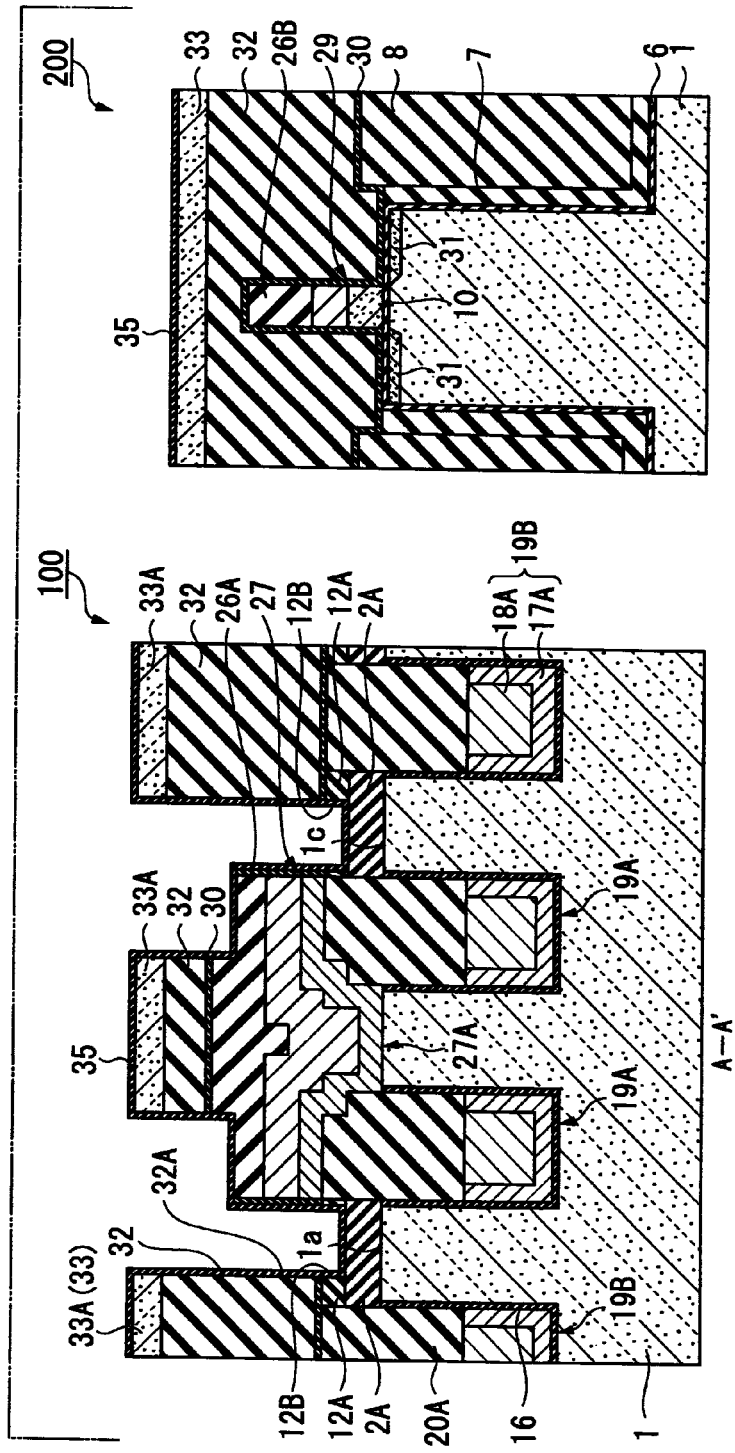
FIG. 30A is a fragmentary cross sectional elevation view of a step subsequent to the step of FIGS. 29A, 29B and 29C, involved in the method of forming the semiconductor device of FIGS. 1 and 2, illustrating the memory cell area 100, taken along an A-A' line of FIG. 1 and the peripheral area 200.
Figure 30B:
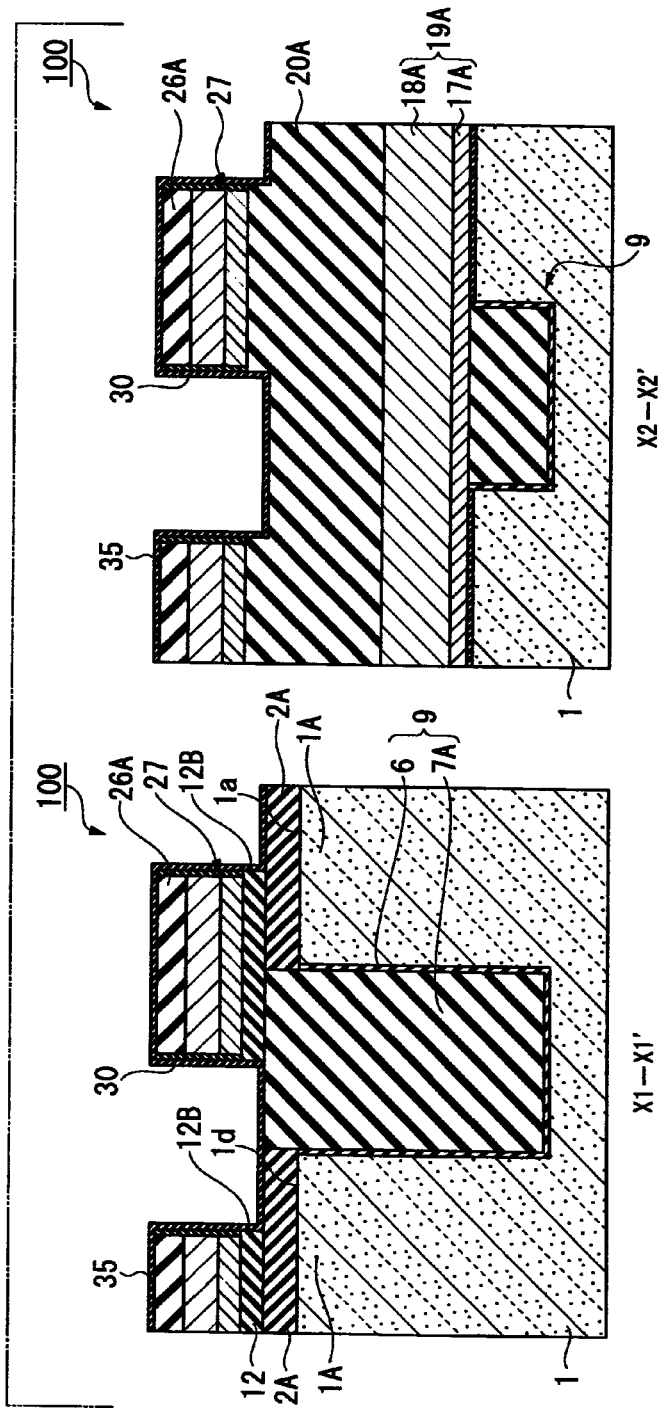
FIG. 30B is a fragmentary cross sectional elevation view of the same step as in FIG. 30A, involved in the method of forming the semiconductor device of FIGS. 1 and 2, illustrating the memory cell area 100, taken along an X1-X1' line of FIG. 1 and taken along an X2-X2' line of FIG. 1.
Figure 30C:
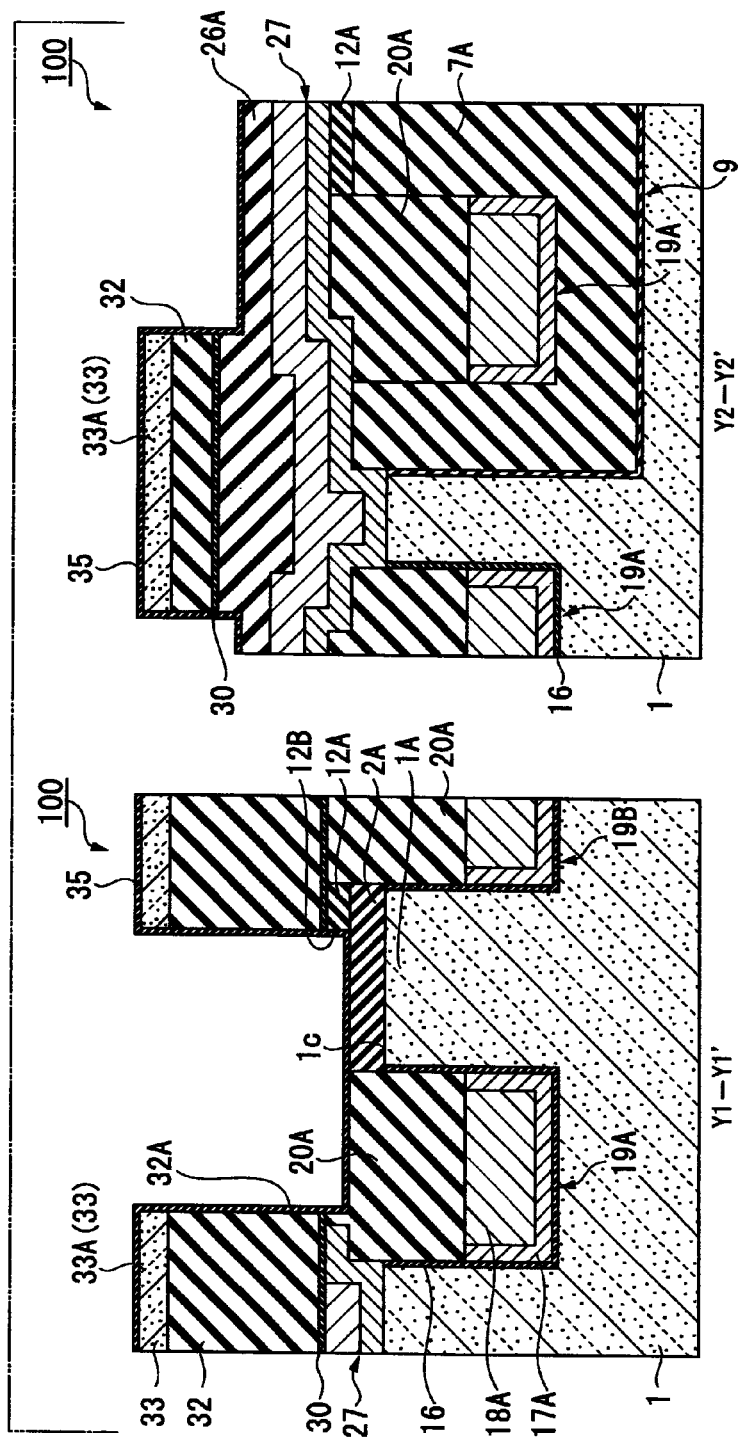
FIG. 30C is a fragmentary cross sectional elevation view of the same step as in FIGS. 30A and 30B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 30A, FIG. 30B, and FIG. 30C, a second silicon nitride liner film (covering film) 35 is formed over the entire surface across the memory cell region 100 and the peripheral circuit region 200. The formation of the second silicon nitride liner film 35 is done using ALD to form a silicon nitride film having a thickness of approximately 5 nm. By doing this, a covering film made of silicon nitride is formed across the side surface of the through hole 32A and the side surface and bottom surface of the aperture part 12B.

Figure 31A:
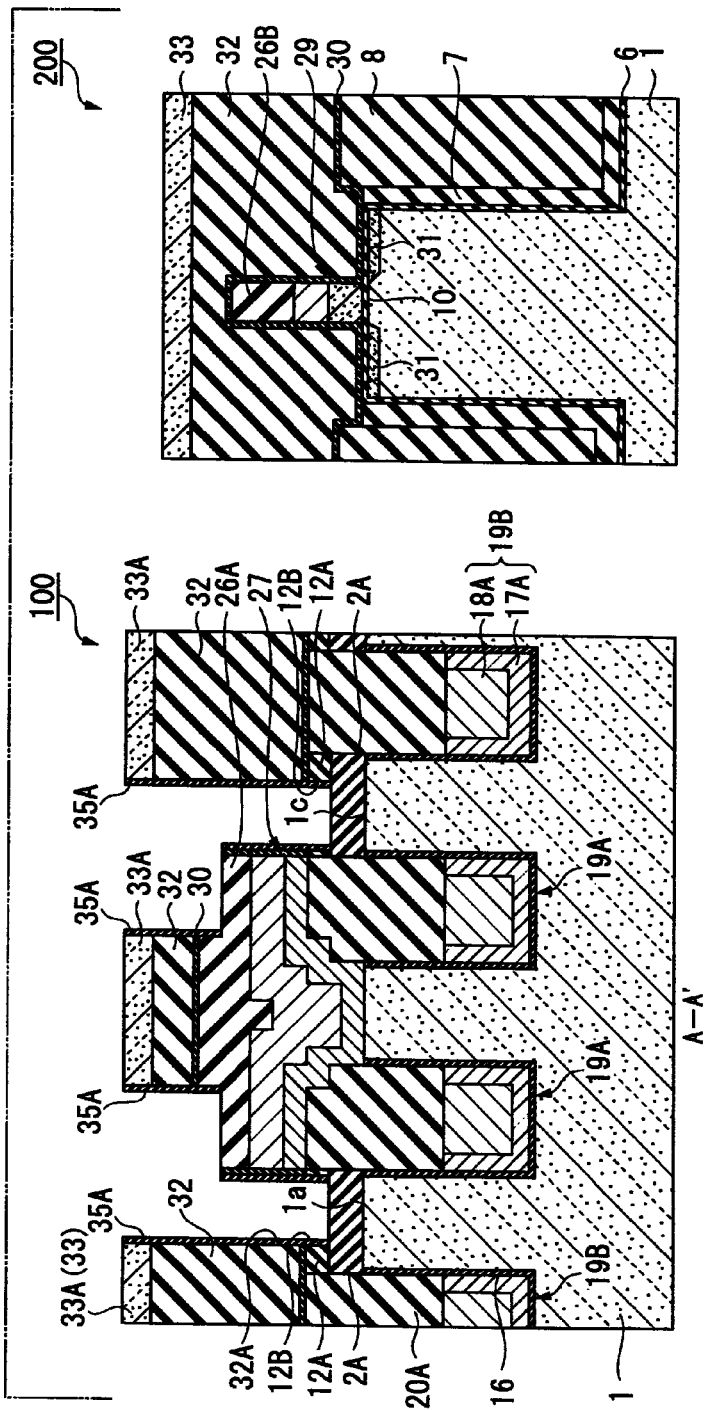
FIG. 31A is a fragmentary cross sectional elevation view of a step subsequent to the step of FIGS. 30A, 30B and 30C, involved in the method of forming the semiconductor device of FIGS. 1 and 2, illustrating the memory cell area 100, taken along an A-A' line of FIG. 1 and the peripheral area 200.
Figure 31B:
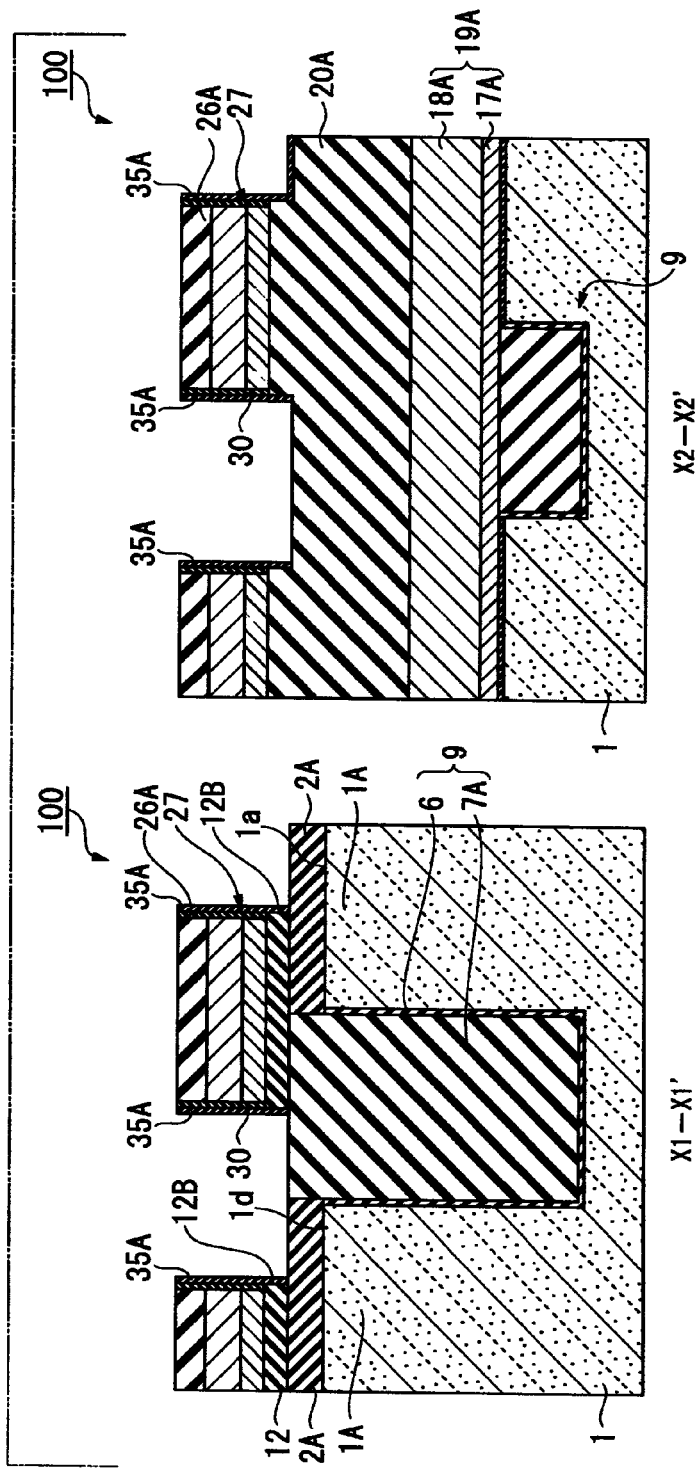
FIG. 31B is a fragmentary cross sectional elevation view of the same step as in FIG. 31A, involved in the method of forming the semiconductor device of FIGS. 1 and 2, illustrating the memory cell area 100, taken along an X1-X1' line of FIG. 1 and taken along an X2-X2' line of FIG. 1.

Next, as shown in FIG. 31A, FIGS. 31B, and 31C, dry etching is used to etch the second silicon nitride liner film 35. By doing this, a side wall 35A made of the second silicon nitride liner film 35 is formed across the side wall inside the through hole 32A of the first interlayer insulating film 32 and the side wall inside the aperture part 12B of the silicon nitride guard film 12A (12). By this etching, the second silicon nitride liner film 35 covering the bottom surface of the aperture part 12B of the silicon nitride guard film 12A (12) is removed, again exposing a part of the upper surface of the sacrificial silicon oxide film 2A.

Figure 32A:
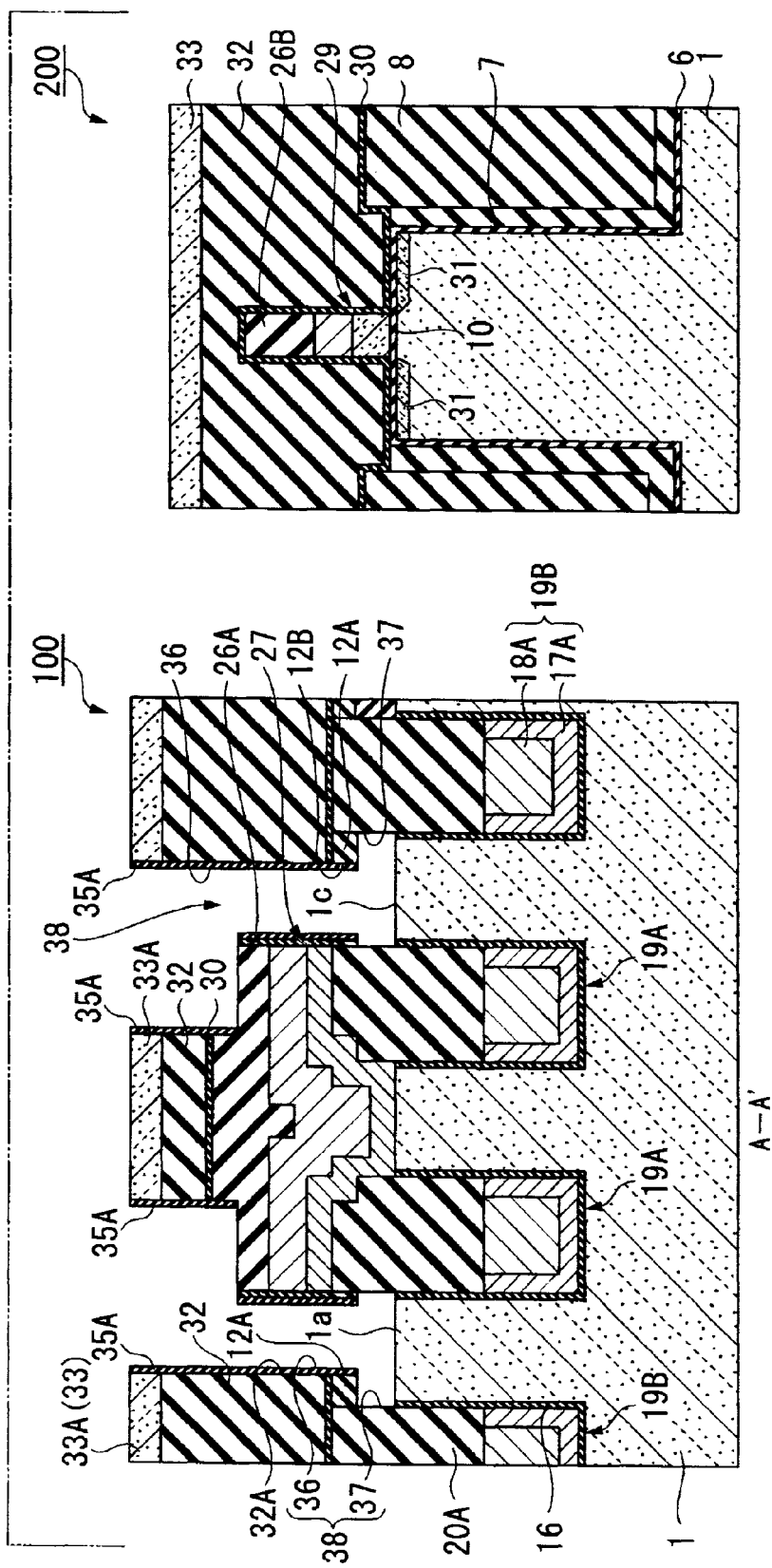
FIG. 32A is a fragmentary cross sectional elevation view of a step subsequent to the step of FIGS. 31A, 31B and 31C, involved in the method of forming the semiconductor device of FIGS. 1 and 2, illustrating the memory cell area 100, taken along an A-A' line of FIG. 1 and the peripheral area 200.
Figure 32C:
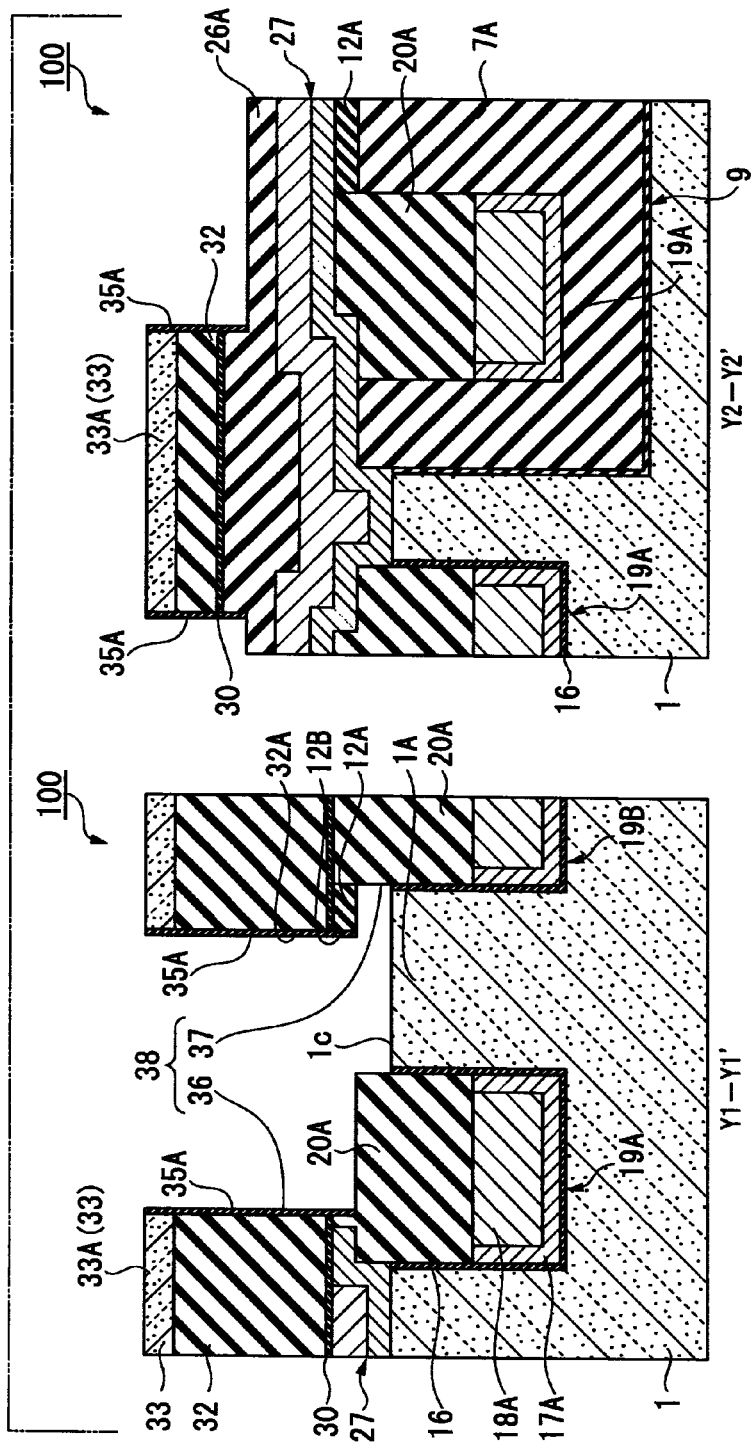
FIG. 32C is a fragmentary cross sectional elevation view of the same step as in FIGS. 32A and 32B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 32A, FIG. 32B, and FIG. 32C, the sacrificial silicon oxide film (first insulating film) 2A having its surface exposed from the aperture part 12B of the silicon nitride guard film 12A (12) is wet etched by DHF and selectively removed. In this case, because the wet etching is anisotropic etching, the entire sacrificial silicon oxide film 2A formed so as to cover the silicon substrate surface in the capacitor contact contacting regions 1a, 1c, and 1d can be removed. By doing this, the sacrificial silicon oxide film 2A is removed from above the capacitor contact contacting regions 1a, 1c, and 1d, and a space formed thereby appears.

In this manner, a capacitor contact hole 38 is formed by the upper-side region 36 that is the space within the side wall 35A formed across the side wall within the through hole 32A of the first interlayer insulating film 32 and the side wall within the through hole 12B of the silicon nitride guard film 12A (12) and the lower-side region 37 that is the space formed by the removal of the sacrificial silicon oxide film 2A.

In the method for manufacturing the DRAM 60 of the present embodiment, all of the sacrificial silicon oxide film 2A covering the silicon substrate surface in the capacitor contact contacting region 1a, 1c, and 1d (refer to FIG. 1) makes contact with the buried insulating film 7A made of a silicon nitride film, the two side surfaces of which opposed in the X direction constitute the STI element separation film 9, and the two side surfaces opposed in the Y direction make contact with the cap insulating film 20A made of a silicon nitride film that buries the WL trench 5. Also, in any sacrificial silicon oxide film 2A, the upper surface makes contact with a silicon nitride guard film and the lower surface makes contact with the silicon substrate. Therefore, the lower-side region 37 of the capacitor contact hole 38, which is the space formed by the removal of the sacrificial silicon oxide film 2A is in the condition of being surrounded at the upper surface and all side surfaces by a silicon nitride film and at the lower surface by the silicon substrate.

In the upper-side region 36 of the capacitor contact hole 38, the two side surfaces opposing in the X direction are in contact with the side wall 35A made of a silicon nitride film formed on the side surface of the bit line 27, and the two side surface opposing in the Y direction are in contact with the side wall 35A made of a silicon nitride film formed on the side wall within the through hole 32A of the first interlayer insulating film 32.

In this case, because the silicon nitride film is not etched by DHF, it is possible to selectively remove only the sacrificial silicon oxide film 2A. That is, it is possible to remove all of the sacrificial silicon oxide film 2A covering the upper surfaces of the capacitor contact contacting regions 1a, 1c, and 1d via the aperture part 12B of the silicon nitride guard film 12A (12) provided in a position at which the upper-side region 36 and the lower-side region 37 of the capacitor contact hole 38 overlap when seen in plan view.

Therefore, because it is possible to cause the capacitor contact formed in a subsequent process step to make contact with the entire upper surface of the capacitor contact contacting regions 1a, 1c, and 1d, it is possible to reduce the contact resistance.

Because the first interlayer insulating film 32 is covered by the side wall 35A, the side wall of which is made of a silicon nitride film and the upper surface thereof is covered by the silicon film 33A that was used as a hard mask, it is not etched at the time of wet etching of the sacrificial silicon oxide film 2A.

(Conductor Filling Process Step)

Figure 33A:
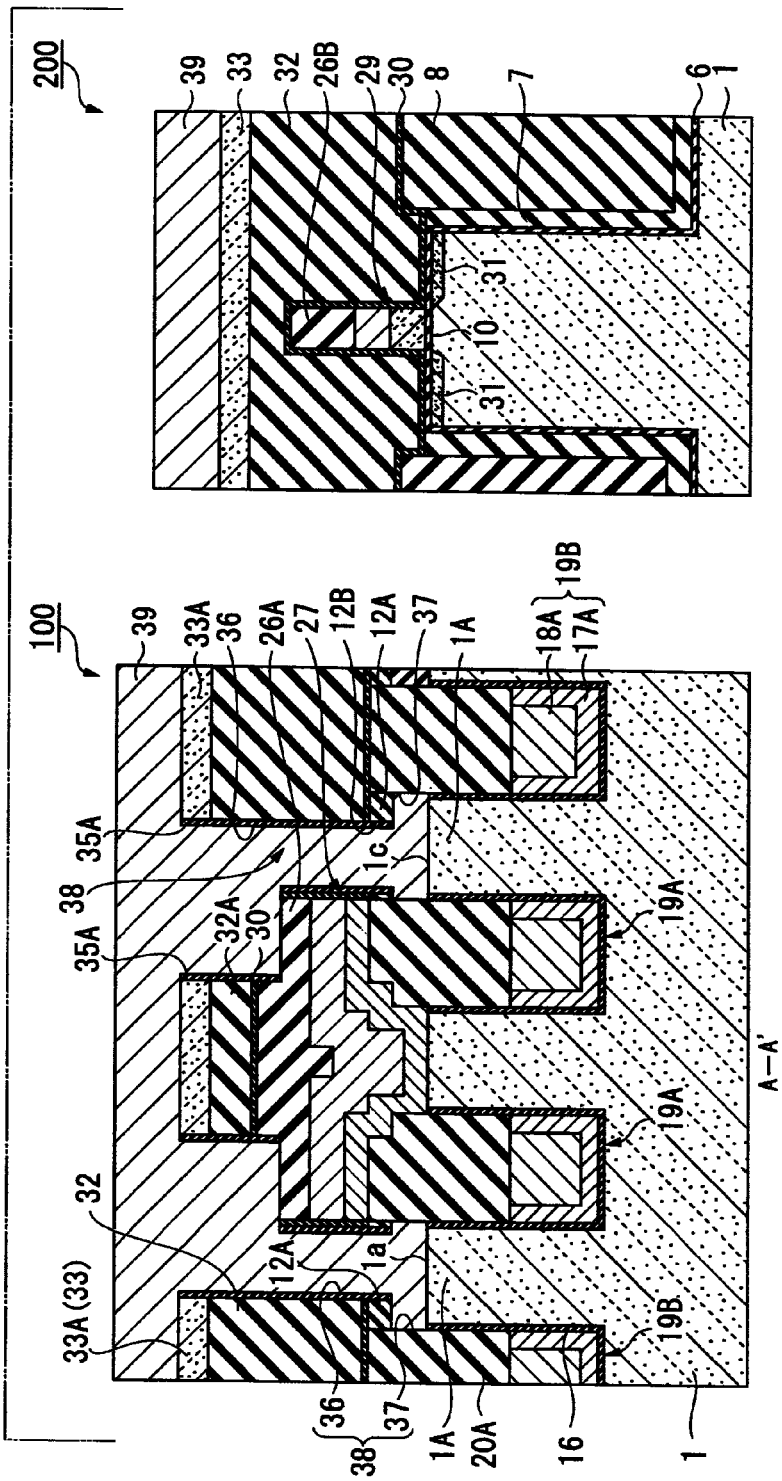
FIG. 33A is a fragmentary cross sectional elevation view of a step subsequent to the step of FIGS. 32A, 32B and 32C, involved in the method of forming the semiconductor device of FIGS. 1 and 2, illustrating the memory cell area 100, taken along an A-A' line of FIG. 1 and the peripheral area 200.
Figure 33B:
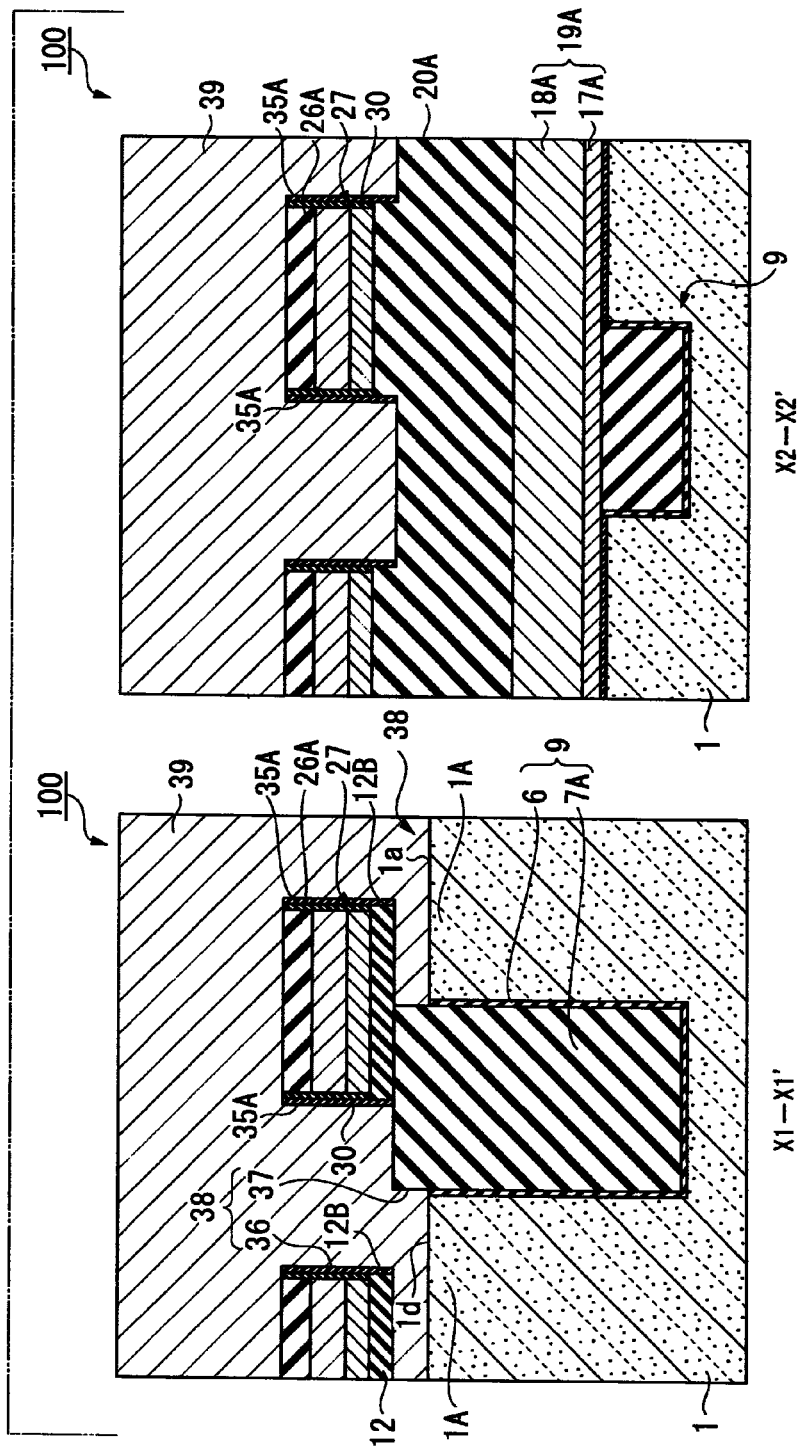
FIG. 33B is a fragmentary cross sectional elevation view of the same step as in FIG. 33A, involved in the method of forming the semiconductor device of FIGS. 1 and 2, illustrating the memory cell area 100, taken along an X1-X1' line of FIG. 1 and taken along an X2-X2' line of FIG. 1.

Next, a doped polysilicon (conductor) is filled into the capacitor contact hole 38 so as to form the first capacitor contact plug (capacitor contact). First, as shown in FIG. 33A, FIG. 33B and FIG. 33C, the doped silicon film 39 in which an impurity is doped across the memory cell region 100 and the peripheral circuit region 200 is formed over the entire surface. In this case, the doped polysilicon film 39 is filled into the capacitor contact hole 38 from the surface of the active region 1A (that is, the capacitor contact contacting regions 1a, 1c and 1d) via the aperture part 12B of the silicon nitride guard film 12A (12). A doped polysilicon is filled into the upper-side region 36 of the capacitor contact hole 38 so as to form the pillar-shaped part 39a and a doped polysilicon is filled into the lower-side region 37 so as to form the planar-shaped part 39b. CVD is used to form the doped silicon film 39 so as to have a thickness of approximately 70 nm. Phosphorous or arsenic may be used as the doped impurity.

Figure 34A:
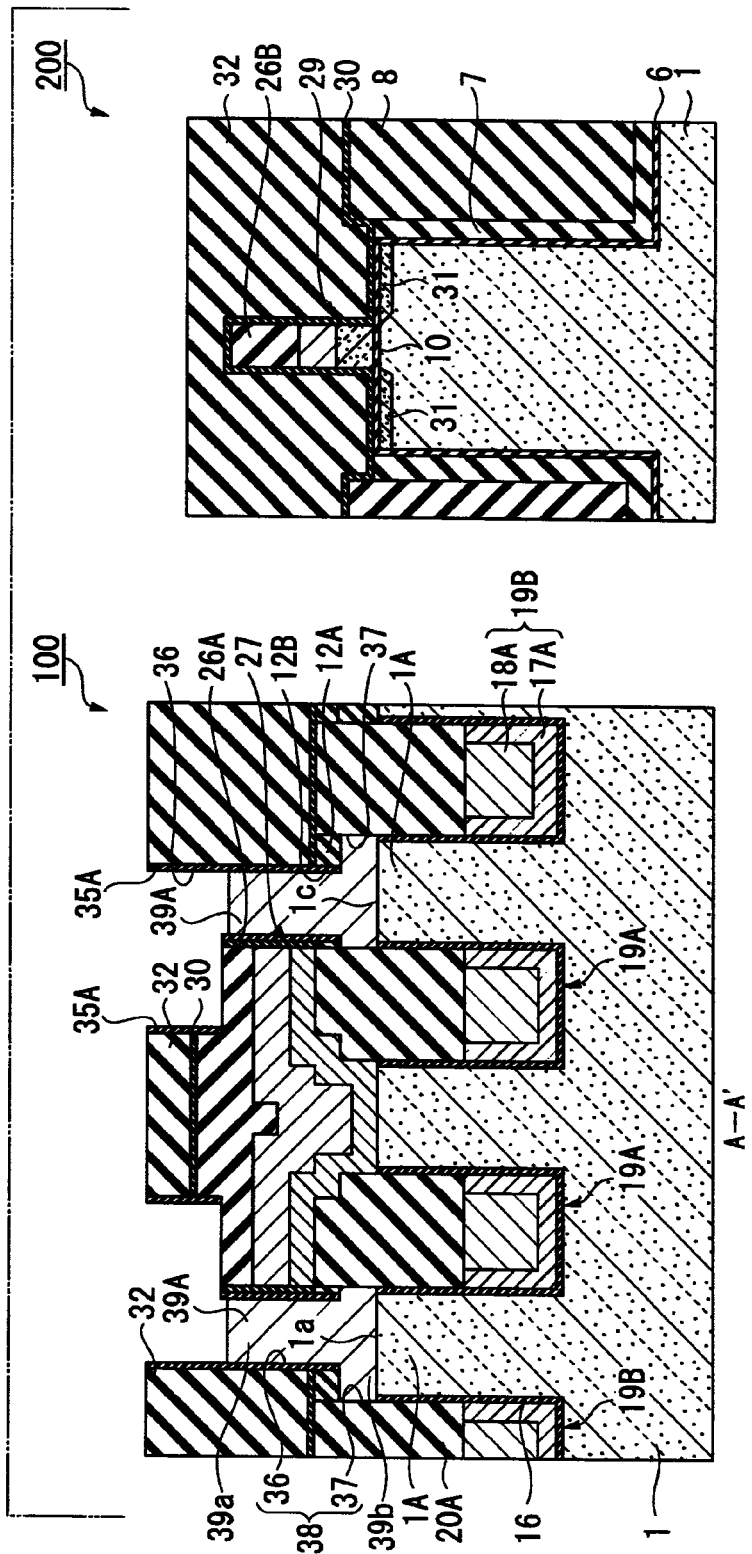
FIG. 34A is a fragmentary cross sectional elevation view of a step subsequent to the step of FIGS. 33A, 33B and 33C, involved in the method of forming the semiconductor device of FIGS. 1 and 2, illustrating the memory cell area 100, taken along an A-A' line of FIG. 1 and the peripheral area 200.
Figure 34B:
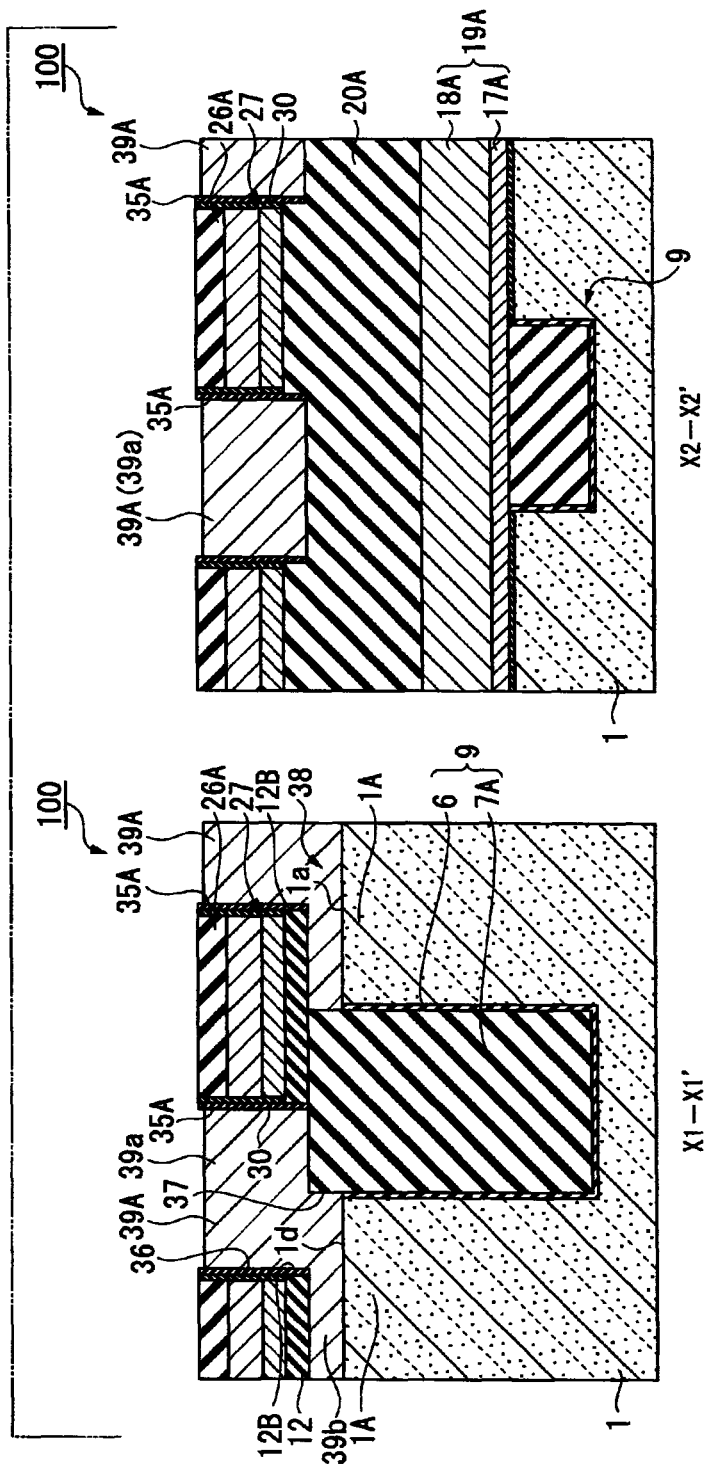
FIG. 34B is a fragmentary cross sectional elevation view of the same step as in FIG. 34A, involved in the method of forming the semiconductor device of FIGS. 1 and 2, illustrating the memory cell area 100, taken along an X1-X1' line of FIG. 1 and taken along an X2-X2' line of FIG. 1.
Figure 34C:
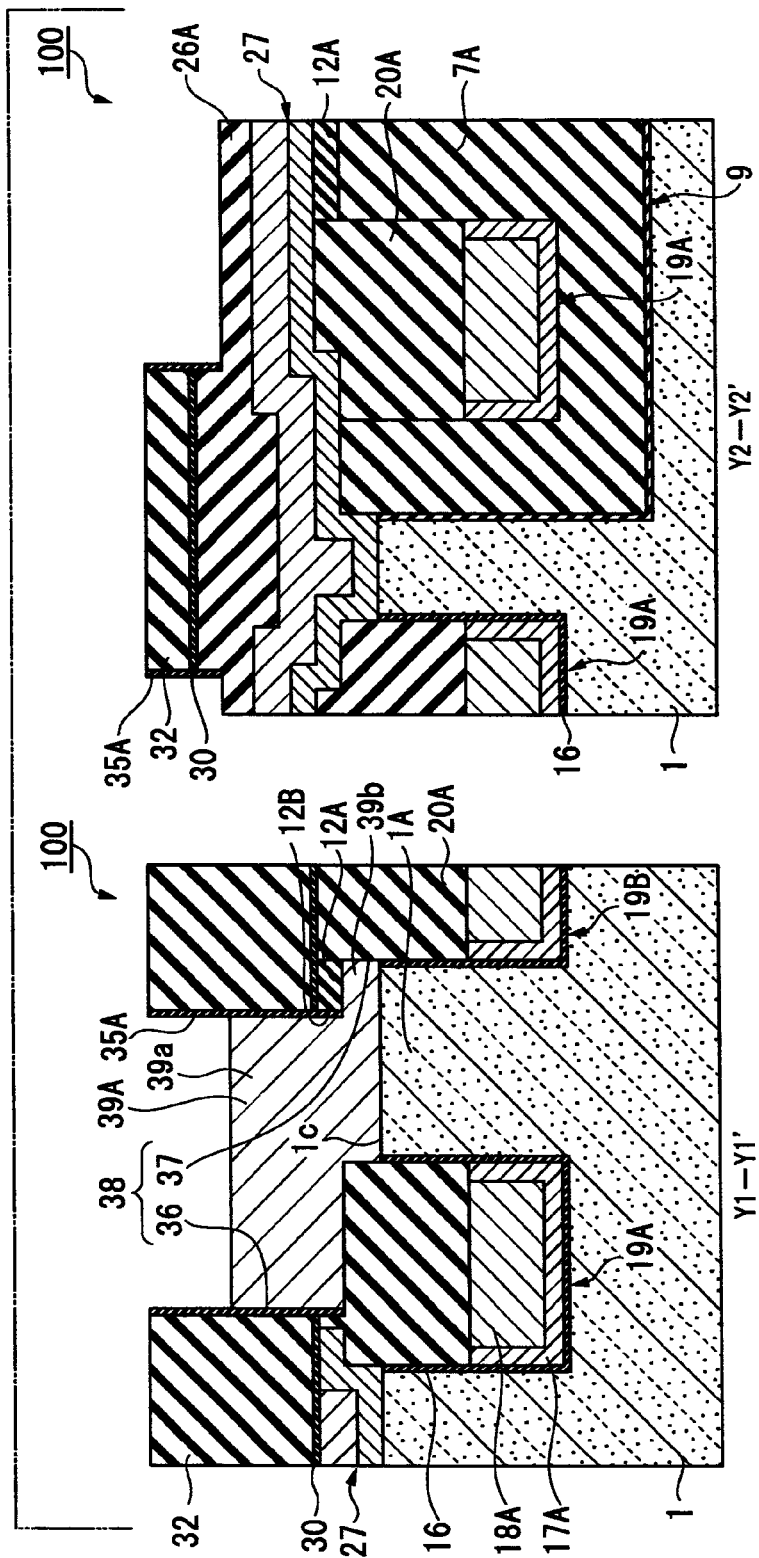
FIG. 34C is a fragmentary cross sectional elevation view of the same step as in FIGS. 34A and 34B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 34A, FIG. 34B and FIG. 34C, CMP is used to polish and remove the parts of the doped silicon film 39 and side wall 35A until the surface of the first interlayer insulating film 32 is exposed. Next, dry etching is used to etch back the doped silicon film 39 up until a position that is lower than the upper surface of a silicon nitride cover film 26A that of a part uncovered by the first interlayer insulating film. By doing this, the first capacitor contact plug 39A made of doped polysilicon is integrally formed.

Figure 35A:
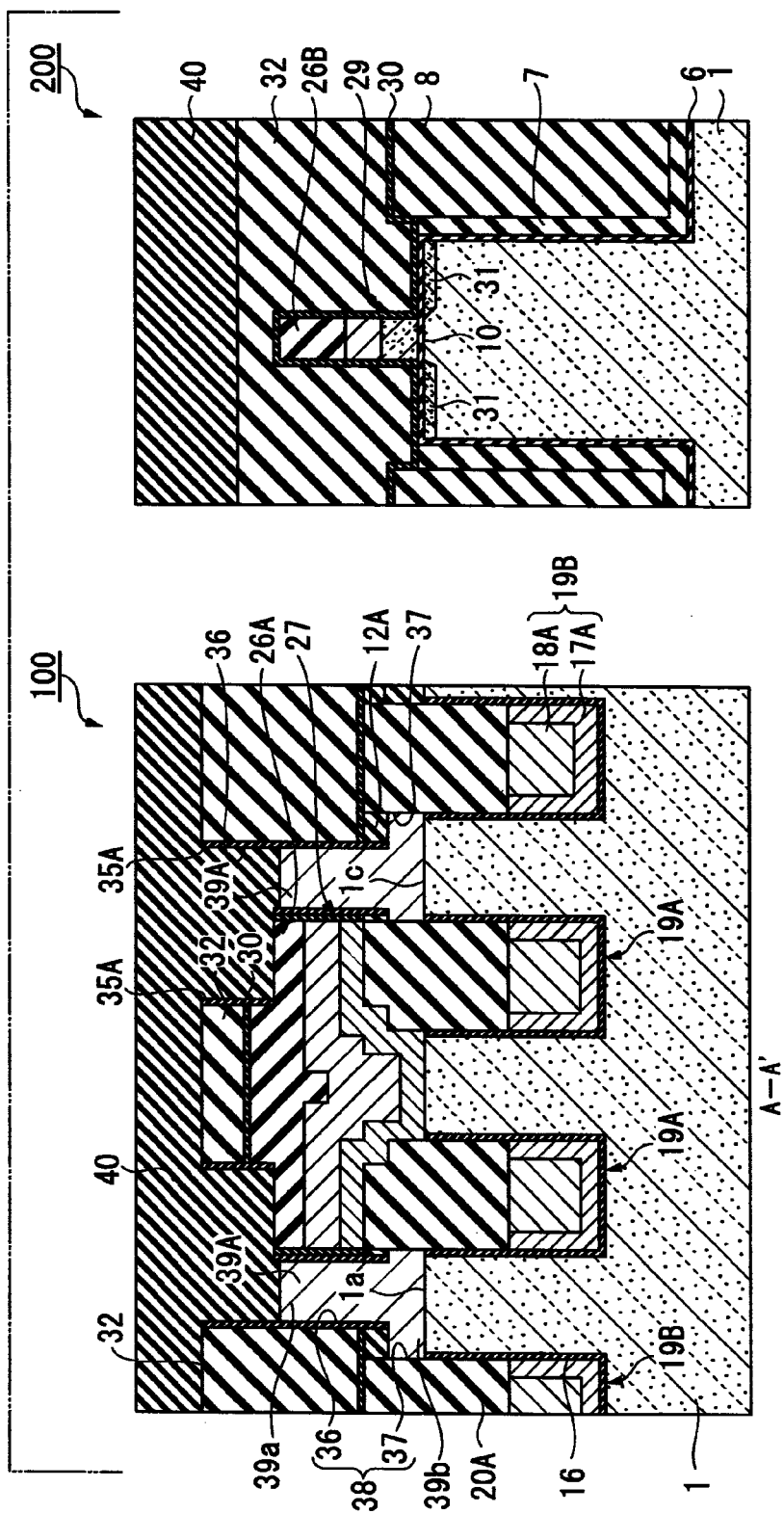
FIG. 35A is a fragmentary cross sectional elevation view of a step subsequent to the step of FIGS. 34A, 34B and 34C, involved in the method of forming the semiconductor device of FIGS. 1 and 2, illustrating the memory cell area 100, taken along an A-A' line of FIG. 1 and the peripheral area 200.
Figure 35B:
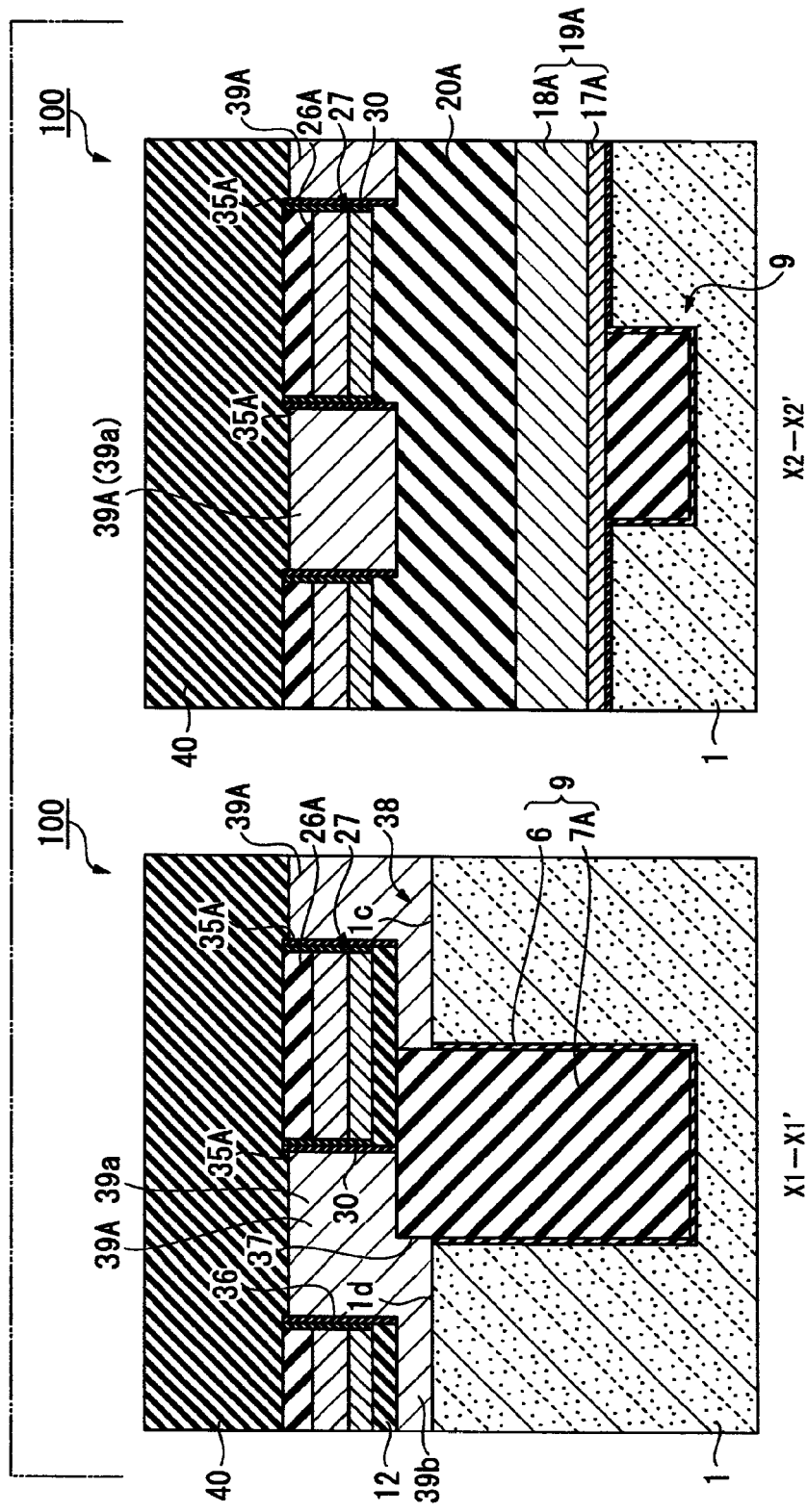
FIG. 35B is a fragmentary cross sectional elevation view of the same step as in FIG. 35A, involved in the method of forming the semiconductor device of FIGS. 1 and 2, illustrating the memory cell area 100, taken along an X1-X1' line of FIG. 1 and taken along an X2-X2' line of FIG. 1.
Figure 35C:
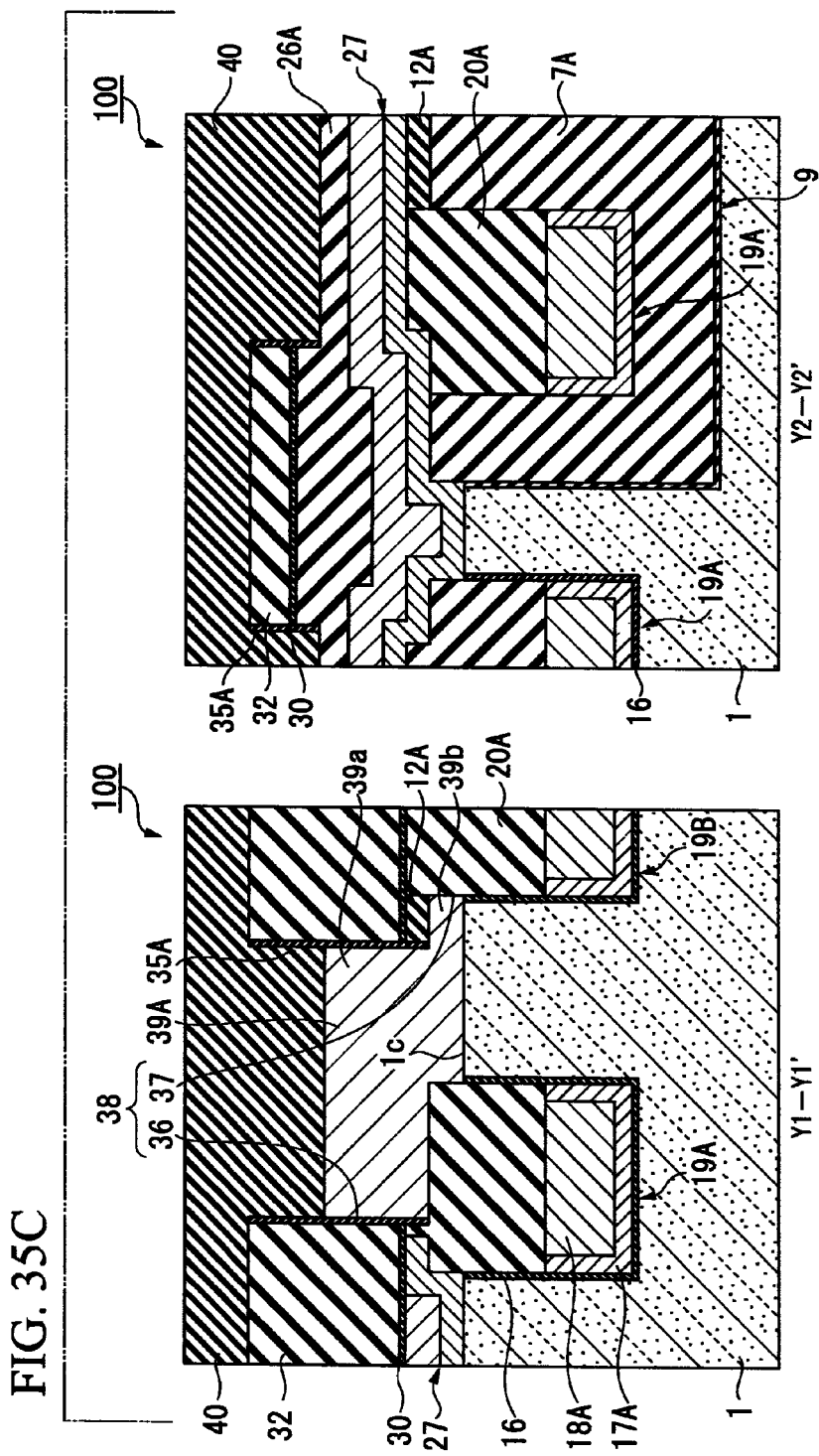
FIG. 35C is a fragmentary cross sectional elevation view of the same step as in FIGS. 35A and 35B, involved in the method of forming the semiconductor device of FIGS. 1 and 2, illustrating the memory cell area 100, taken along a Y1-Y1' line of FIG. 1 and taken along a Y2-Y2' line of FIG. 1.

Next, as shown in FIG. 35A, FIG. 35B and FIG. 35C, SOG or CVD is used to form the second interlayer insulating film 40 made of silicon oxide film across the entire surface of the memory cell region 100 and the peripheral circuit region 200 so as to cover the upper surface of the first capacitor contact plug 39A.

In the subsequent process steps, only the cross-section along the line A-A' shown in FIG. 1 and the peripheral circuit region 200 will be described, the cross-section in the other direction not being described herein.

Figure 36A:
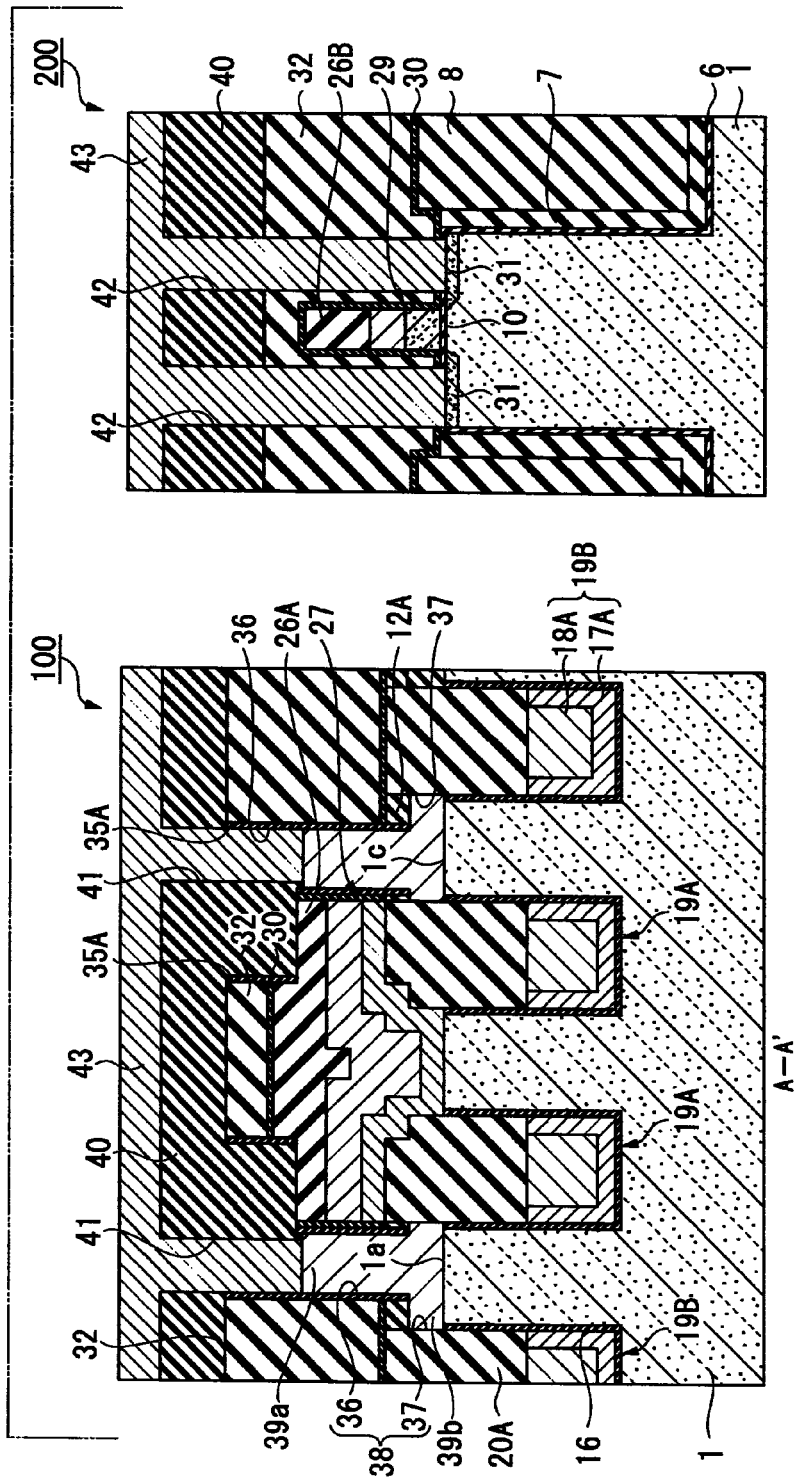
FIG. 36A is a fragmentary cross sectional elevation view of a step subsequent to the step of FIGS. 35A, 35B and 35C, involved in the method of forming the semiconductor device of FIGS. 1 and 2, illustrating the memory cell area 100, taken along an A-A' line of FIG. 1 and the peripheral area 200.

Next, as shown in the left-side drawing in FIG. 36A, the contact hole 41 is formed by lithography and dry etching in the second interlayer insulating film 40 in the memory cell region 100. As shown in the right-side drawing in FIG. 36A, the contact hole 42 is formed in the second interlayer insulating film 40 in the peripheral circuit region 200. Next, the metal film 43 is formed over the entire surface, so as to fill the inside of the contact holes 41, 42 across the memory cell region 100 and the peripheral circuit region 200. The metal film 43 is constituted by a laminated film made of, for example, cobalt silicide, tungsten nitride, and tungsten.

Next, as shown in the left-side drawing in FIG. 37A, the second capacitor contact plug 43A made of the metal film 43 is formed by lithography and dry etching in the memory cell region 100. In this manner, the capacitor contact plug 44 made of the first capacitor contact plug 39A and the second capacitor contact plug 43A is formed in the memory cell region 100.

As shown in the right-side drawing in FIG. 37A, the peripheral contact plug 43B and the peripheral metal interconnect 43C are formed in the peripheral circuit region 200.

(Capacitor and Interconnect Layer Formation Process Step)

Figure 38A:
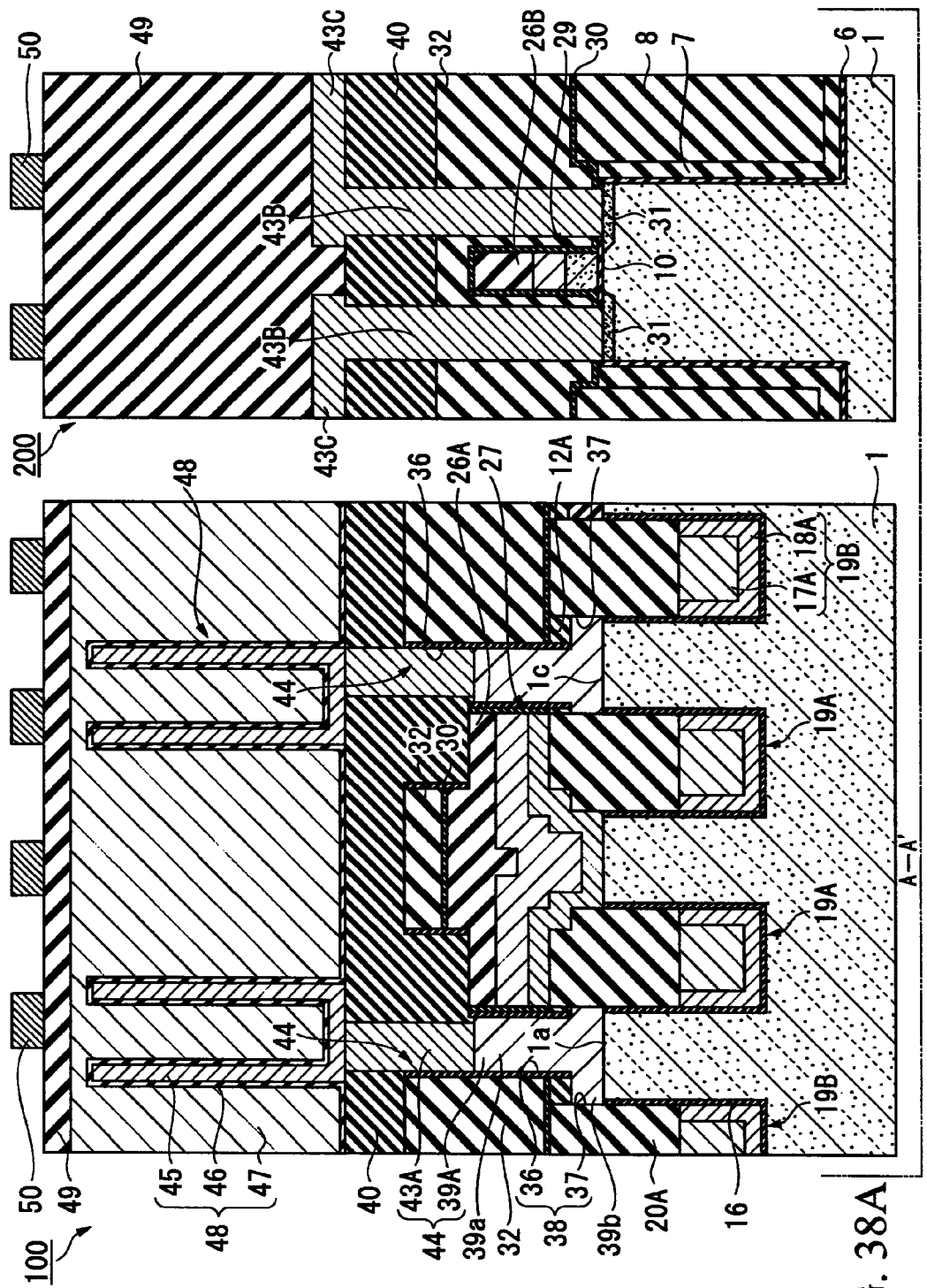
FIG. 38A is a fragmentary cross sectional elevation view of a step subsequent to the step of FIG. 37A, involved in the method of forming the semiconductor device of FIGS. 1 and 2, illustrating the memory cell area 100, taken along an A-A' line of FIG. 1 and the peripheral area 200.

Next, as shown in the left-side drawing in FIG. 38A, the capacitor lower electrode 45 over the second interlayer insulator film 40, the capacitor insulating film 46, and the upper layer electrode 47 are successively formed in the memory cell region 100, so as to form the capacitor 48. Next, the third interlayer insulating film 49 is formed over the entire surface across the memory cell region 100 and the peripheral circuit region 200 so as to cover the peripheral metal interconnect 43C of the capacitor 48 of the memory cell region 100 and peripheral metal interconnect 43C of the peripheral circuit region 200. The interconnect layer 50 is further formed over the third interlayer insulating film 49.

In this manner, the DRAM 60 in the present embodiment is completed.

As described above, according to the method for manufacturing the DRAM (semiconductor device) 60 of the present embodiment, all of the sacrificial silicon oxide films 2A covering the surface of the active region 1A (the capacitor contact contacting regions 1a, 1c and 1d) are in contact with a buried insulating film 7A all side surfaces of which are made of the nitride silicon film and a cap insulating film 20A made of the silicon nitride film, and also the constitution is such that the upper surface thereof makes contact with the silicon nitride guard film 12A, and that the lower surface thereof makes contact with the active region 1A. An etchant (for example, DHF) is used to be able to selectively etch only a silicon oxide film without etching the silicon nitride film, thereby enabling etching removal of only the sacrificial silicon oxide films 2A.

That is, it is possible to selectively remove all of the sacrificial silicon oxide film 2A covering the upper surfaces of the capacitor contact contacting regions 1a, 1c, and 1d via the aperture part 12B of the silicon nitride guard film 12A provided in a position at which the upper-side region 36 and the lower-side region 37 of the capacitor contact hole 38 overlap when seen in plan view. By burying doped polysilicon into the capacitor contact hole 38, a series of integral formations of the pillar-shaped part 39a in the upper-side region 36 and then the planar-shaped part 39b in the lower-side region 37 can be done. Because it is therefore possible to make contact between the entire surface of the bottom surface of the planar-shaped part 39b constituting the first capacitor contact plug 39A and the upper surfaces of the capacitor contact contacting regions 1a, 1c and 1d, the contact resistance can be reduced.

The lower-side region 37 of the capacitor contact hole 38, which is the space formed by the removal of the sacrificial silicon oxide film 2A can be in the condition of being surrounded at the upper surface and all side surfaces by a silicon nitride film and at the lower surface by the silicon substrate. The upper-side region 36 of the capacitor contact hole 38 can be in the condition of being in contact with the side wall 35A, which is made of a silicon nitride film. Because the lower-side region 37 and the upper-side region 36 of the capacitor contact hole 38 are caused to communicate via the aperture part 12B formed in a part or all of the upper surface of the silicon nitride guard film 12A, the first capacitor contact plug 39A made of a doped silicon can be integrally formed.

According to the method for manufacturing the DRAM 60 of the present embodiment, the STI trench 5 is formed using the sacrificial silicon oxide film 2 as a mask. By doing this, because the sacrificial silicon oxide film 2 on the region over which the STI element separation film 9 is formed is removed, a sacrificial silicon oxide film 2A can be formed only over the active region 1A.

The sacrificial silicon oxide film 2 (2A) and the silicon nitride film 12 are used as a mask to form a WL trench, thereby enabling partitioning of the active region 1A into the capacitor contact contacting regions 1a, 1c and 1d, and the bit contact contacting region 1b, and also enabling integral formation of the sacrificial silicon oxide film 2A covering the surface of these capacitor contact contacting regions 1a to 1d and the silicon nitride guard film 12A protecting the upper surface of this sacrificial silicon oxide film 2A.

According to the method for manufacturing the DRAM 60 of the present embodiment, the upper surface 7a of the buried silicon nitride film 7A and the upper surface 2a of the sacrificial silicon oxide film 2A are formed substantially at the same height, the upper surface 20a of the capacitor insulator film 20A and the upper surface 12a of the silicon nitride guard film 12A are formed substantially at the same height, and the buried silicon nitride film 7A and the capacitor insulator film 20A are formed by a nitride silicon film. By doing this, it is possible to cover the side and upper surfaces of the sacrificial silicon oxide film 2A with a silicon nitride film.

According to the method for manufacturing the DRAM 60 of the present embodiment, it is possible to form the bit contact 27A and the bit line 27 on the memory cell region 100, with the peripheral gate electrode 29 simultaneously formed on the peripheral circuit region 200, and the interconnect layer 50 integrally formed above the third interlayer insulating film 49 across the memory cell region 100 and the peripheral circuit region 200. By doing this, because a buried-gate transistor of the memory cell region 100 and a peripheral circuit transistor of the peripheral circuit region 200 can be formed simultaneously, the production cost can be reduced.

By forming a first silicon film 11 on the peripheral circuit region 200 before forming the gate buried gate electrode 19A and buried interconnect 19B, this first silicon film 11 can protect the peripheral circuit region 200 during the formation of the buried gate electrode 19A up until the formation of the bit line 27 in the memory cell region 100.

Because the same silicon film is used as the first silicon film 11 and the second silicon film 24, when the peripheral gate electrode 29 is formed on the peripheral circuit region 200 at the same time of formation of the bit contact 27A and the bit line 27 on the memory cell region 100, the laminated film (silicon film 28) of the first silicon film 11 and the second silicon film 24 can be used as a part of the peripheral gate electrode 29, without removing the first silicon film 11.

The technical scope of the present invention is not necessarily restricted to the above-noted embodiment, and may be possible to apply various changes, within the scope of the spirit of the present invention. In the example shown, although in the DRAM of the above-described present embodiment, when the buried-gate transistor of the memory cell region 100 and a peripheral circuit transistor in the peripheral circuit region 200 are formed simultaneously, the first silicon film 11 made of a silicon film is used as a protective film that protects the peripheral circuit region 200 during the formation of the buried gate electrode 19A up until the formation of the bit line 27, in the memory cell region 100, the present invention is not restricted in this manner, and it is possible to apply a protective film made of another material.

Specifically, an example of a constitution of the method for manufacturing the DRAM (semiconductor device) that can be cited is one which uses a metal film as a protective film protecting the peripheral circuit region 200. Other examples of the method for manufacturing the DRAM (semiconductor device), which has the above-noted constitution, will be described, with references made to FIG. 39A to FIG. 44A. In this case, FIG. 39A to FIG. 44A are drawings for the purpose of describing the method for manufacturing the DRAM of the other examples of the present invention, the left-side drawings thereof being cross-sections above the active region in the direction of extension of the active region in the memory cell region 100, and the right-side drawings thereof being cross-sections of the peripheral circuit region 200.

A DRAM (semiconductor device) that is manufactured by another example of the method for manufacturing the DRAM, similar to the DRAM 60 in the above-noted embodiment, has a laminated structure in which is formed a buried buried-gate transistor, in which the word line is completely buried inside the semiconductor substrate, a capacitor, and an interconnect layer, and, except for the constitutions of the bit line of the buried gate transistor and of the peripheral gate electrode on the peripheral circuit transistor, has the same constitution as the above-noted embodiment. That is, the other example of the method for manufacturing the DRAM has the same process steps as the method for manufacturing of the above-noted embodiment, except for the process steps for forming the protective film for the peripheral circuit region 200 and for forming the bit contact and bit line. In the description to follow, constituent elements that are the same as in the method for manufacturing the semiconductor device of the above-noted embodiment are therefore assigned reference numerals that are the same but with 100 added thereto, and the descriptions thereof will be omitted.

The method for manufacturing a DRAM (semiconductor device), which is another example applying the present invention, is the same as the above-noted embodiment up until the first insulating film formation process step (refer to FIG. 3A to FIG. 5A) and the element separation region formation process step (FIG. 6A to FIG. 10A).

(Protective Film for Peripheral Circuit Region 200 Formation Process Step)

Figure 39A:
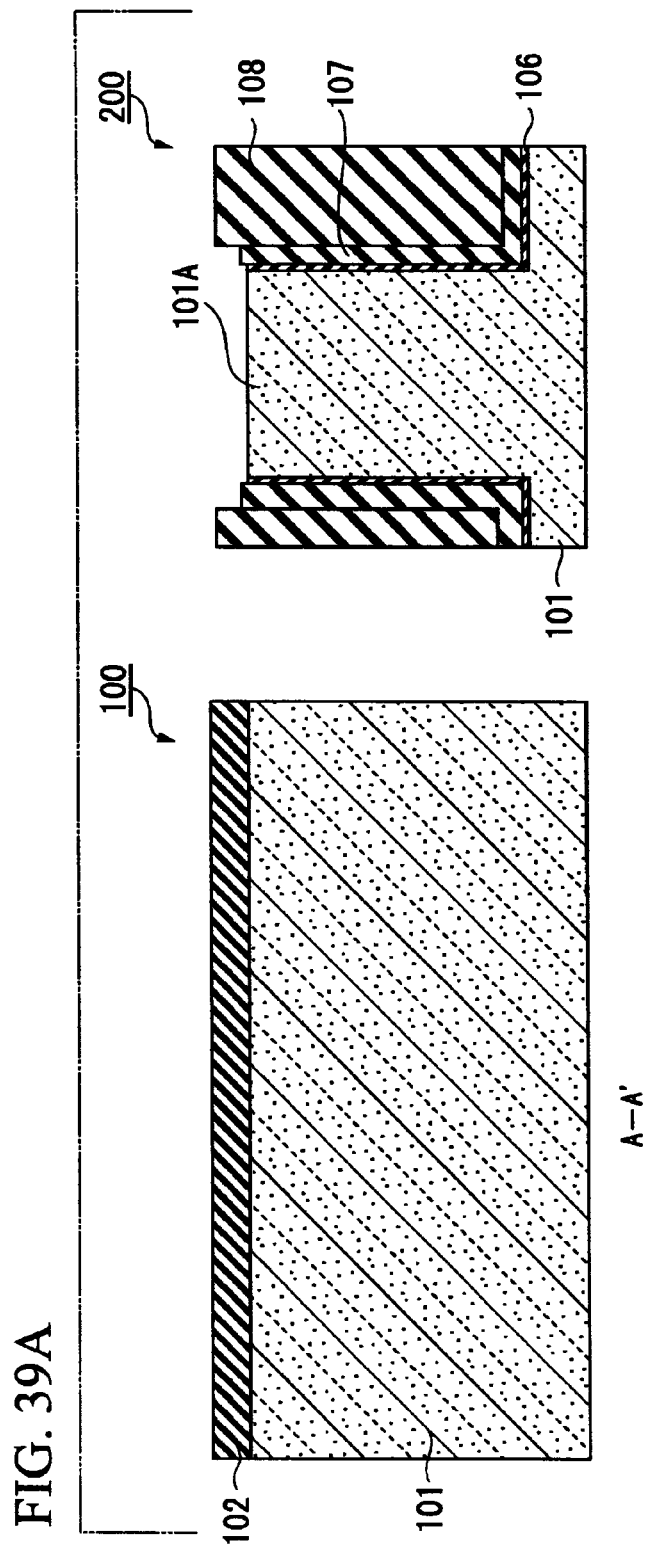
FIG. 39A is a fragmentary cross sectional elevation view of a step involved in another method of forming the semiconductor device of FIGS. 1 and 2, illustrating the memory cell area 100, taken along an A-A' line of FIG. 1 and the peripheral area 200.
Figure 40A:
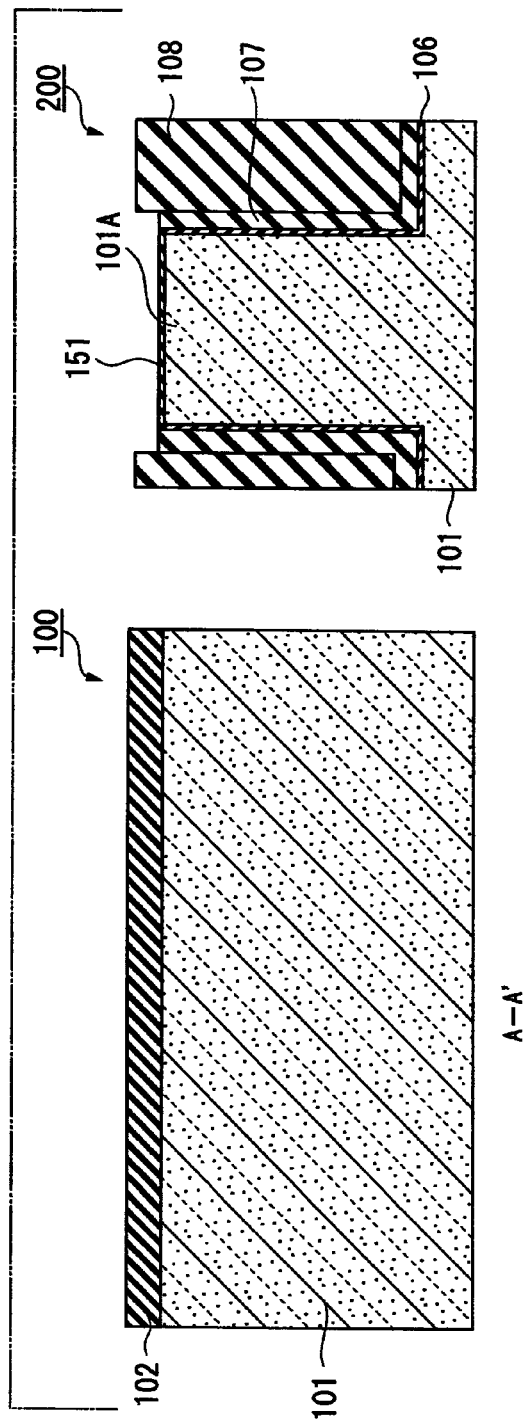
FIG. 40A is a fragmentary cross sectional elevation view of a step involved in still another method of forming the semiconductor device of FIGS. 1 and 2, illustrating the memory cell area 100, taken along an A-A' line of FIG. 1 and the peripheral area 200.

Next, as shown in the right-side drawing in FIG. 39A, the upper surface 106a of the silicon oxide film 106 exposed at the surface of the active region 101A in the peripheral circuit region 200 is removed. Next, as shown in FIG. 40A, a peripheral gate insulating film 151 is formed over the exposed active region 101A.

In this case, the peripheral gate insulating film 151 is formed as a high-dielectric film (high-K film) such as a silicon oxynitride film (SiON), a hafnium oxide film (HfO), a hafnium silicate film (HfSiO), or a hafnium aluminate nitride film (HfAlON) by a deposition method such as ALD.

Figure 41A:
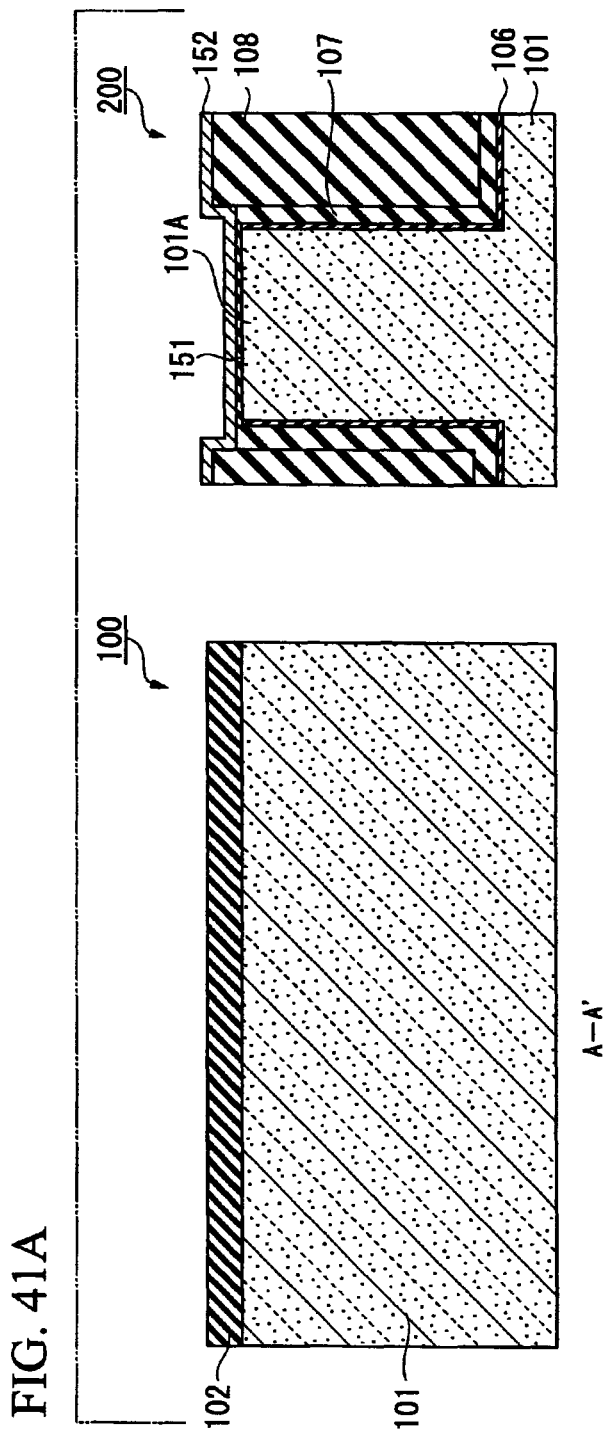
FIG. 41A is a fragmentary cross sectional elevation view of a step involved in yet another method of forming the semiconductor device of FIGS. 1 and 2, illustrating the memory cell area 100, taken along an A-A' line of FIG. 1 and the peripheral area 200.

Next, as shown in FIG. 41A, CVD is used to form a metal film 152 made of titanium nitride (TiN) having a thickness of approximately 20 nm over the entire surface of the memory cell region 100 and the peripheral circuit region 200. Next, lithography is used to form a photoresist pattern (not shown) covering only the peripheral circuit region 200, and the metal film 152 of the memory cell region 100 exposed from this photoresist pattern is removed by dry etching. After that, by removing the photoresist pattern provided on the peripheral circuit region 200, the metal film (protective film) 152 is provided only in the peripheral circuit region 200, as shown in the right-side drawing in FIG. 41A.

The subsequent process steps of forming the second insulating film (FIG. 14A to FIG. 17A) and the cap insulating film (FIG. 18A to FIG. 20A) are the same as in the above-noted embodiment.

(Bit Contact and Bit Line Formation Process Step)

Next, in the same manner as in the above-noted embodiment, in the memory cell region 100, the upper surface of the sacrificial silicon oxide film 102A over the bit contact contacting region 101b is caused to be exposed from the bit contact aperture pattern 123 (refer to FIG. 21A and FIG. 22A). Simultaneously with this, the surface of the metal film 152 is caused to be exposed in the peripheral circuit region 200. Next, the sacrificial silicon oxide film 102A that is exposed from the bit contact aperture pattern 123 is selectively removed, the bit contact contacting region 101b is exposed, and the bit contact aperture parts are formed (refer to FIG. 23A).

Figure 42A:
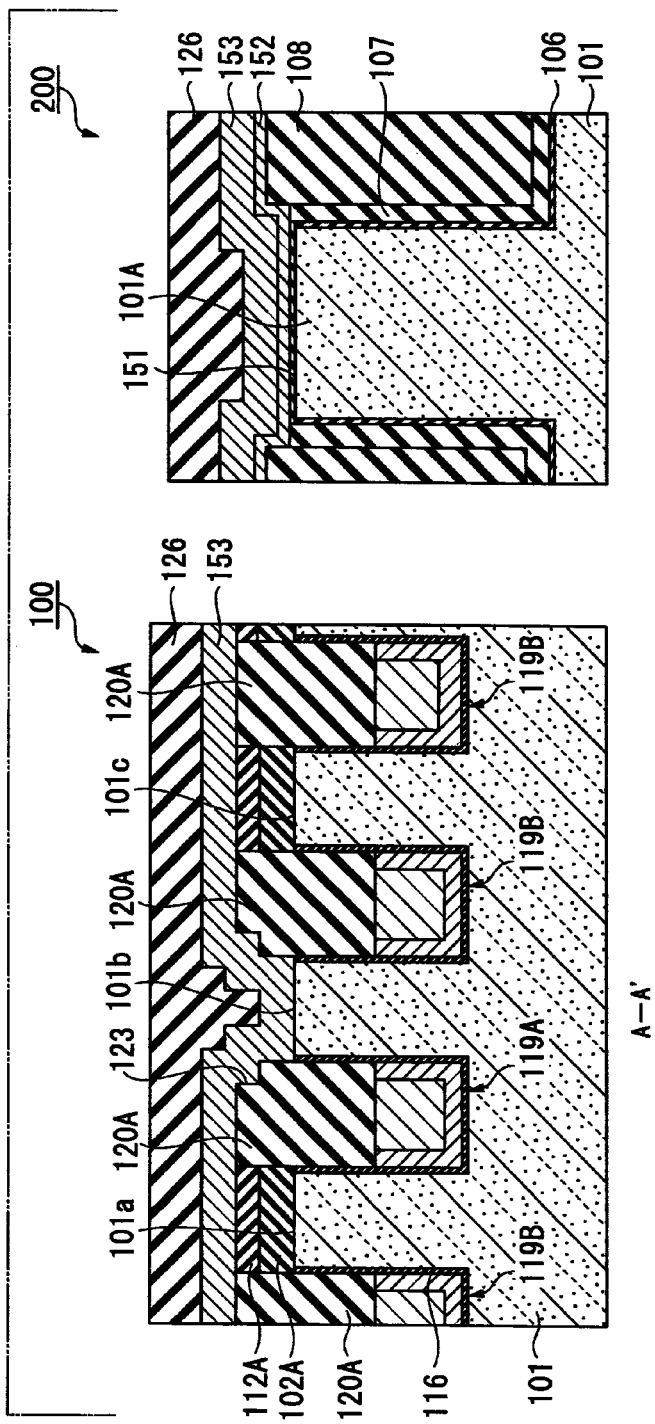
FIG. 42A is a fragmentary cross sectional elevation view of a step involved in still another method of forming the semiconductor device of FIGS. 1 and 2, illustrating the memory cell area 100, taken along an A-A' line of FIG. 1 and the peripheral area 200.

Next, as shown in FIG. 42A, a gate metal film 153 made of tungsten (W) having a thickness of 40 nm, and the silicon nitride cover film (cover insulating film) 126 made of a silicon nitride film having a thickness of 50 nm are successively formed using a CVD over the entire surface across the memory cell region 100 and the peripheral circuit region 200. The gate metal film 153 can be made from the laminated film forming silicide ($TiSi_2$, $WSi_2$ or the like) or a barrier metal (TiN, WN or the like) beneath tungsten. The silicon nitride cover film 126A buries the bit contact aperture part over the bit contact contacting region 101b.

Figure 43A:
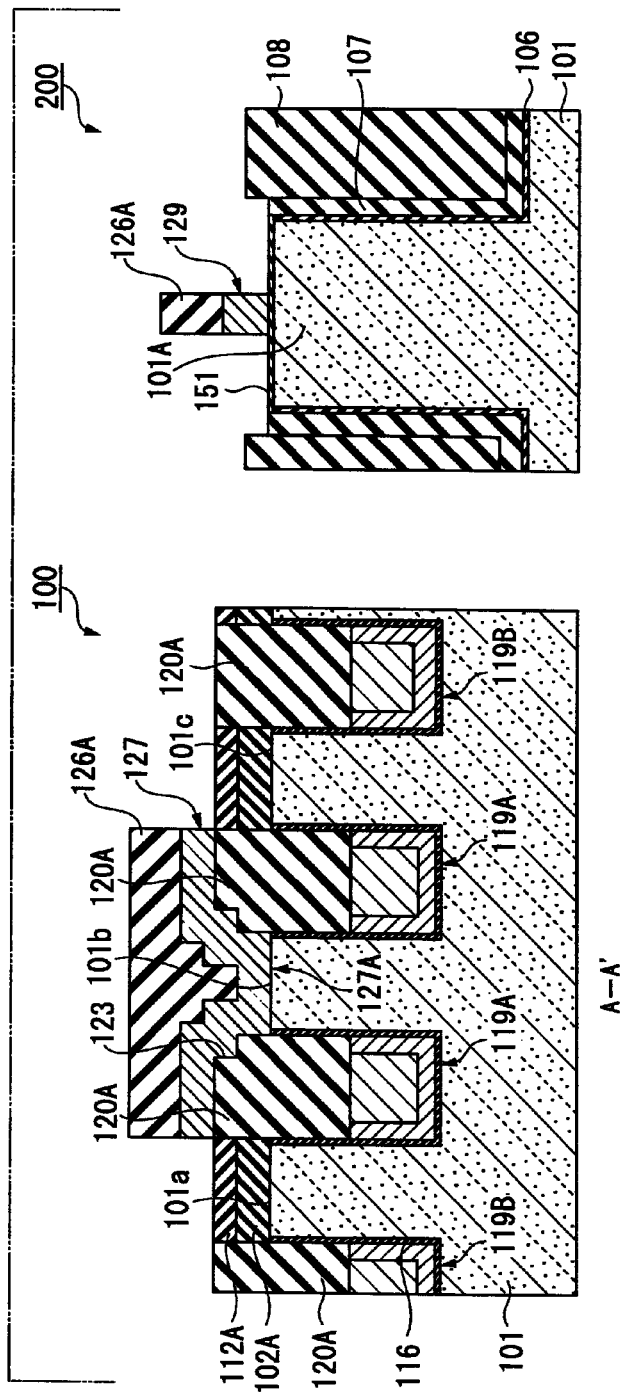
FIG. 43A is a fragmentary cross sectional elevation view of a step involved in still another method of forming the semiconductor device of FIGS. 1 and 2, illustrating the memory cell area 100, taken along an A-A' line of FIG. 1 and the peripheral area 200.

Next, as shown in FIG. 43A, lithography and dry etching are used to successively etch the silicon nitride cover film 126 and the gate metal film 153, to form simultaneously a bit line 127 in the memory cell region 100 and a peripheral gate electrode (gate electrode) 129 of a transistor for the peripheral circuit in the peripheral circuit region 200. The peripheral gate electrode 129 is constituted by a new metal film in which the metal film 152 that had been formed in the peripheral circuit region 200 and the gate metal film 153 are integrated. In this manner, the bit contact 127A and the bit line 127 in the memory cell region 100 and the peripheral gate electrode 129 on the peripheral circuit region 200 are formed simultaneously.

Figure 44A:
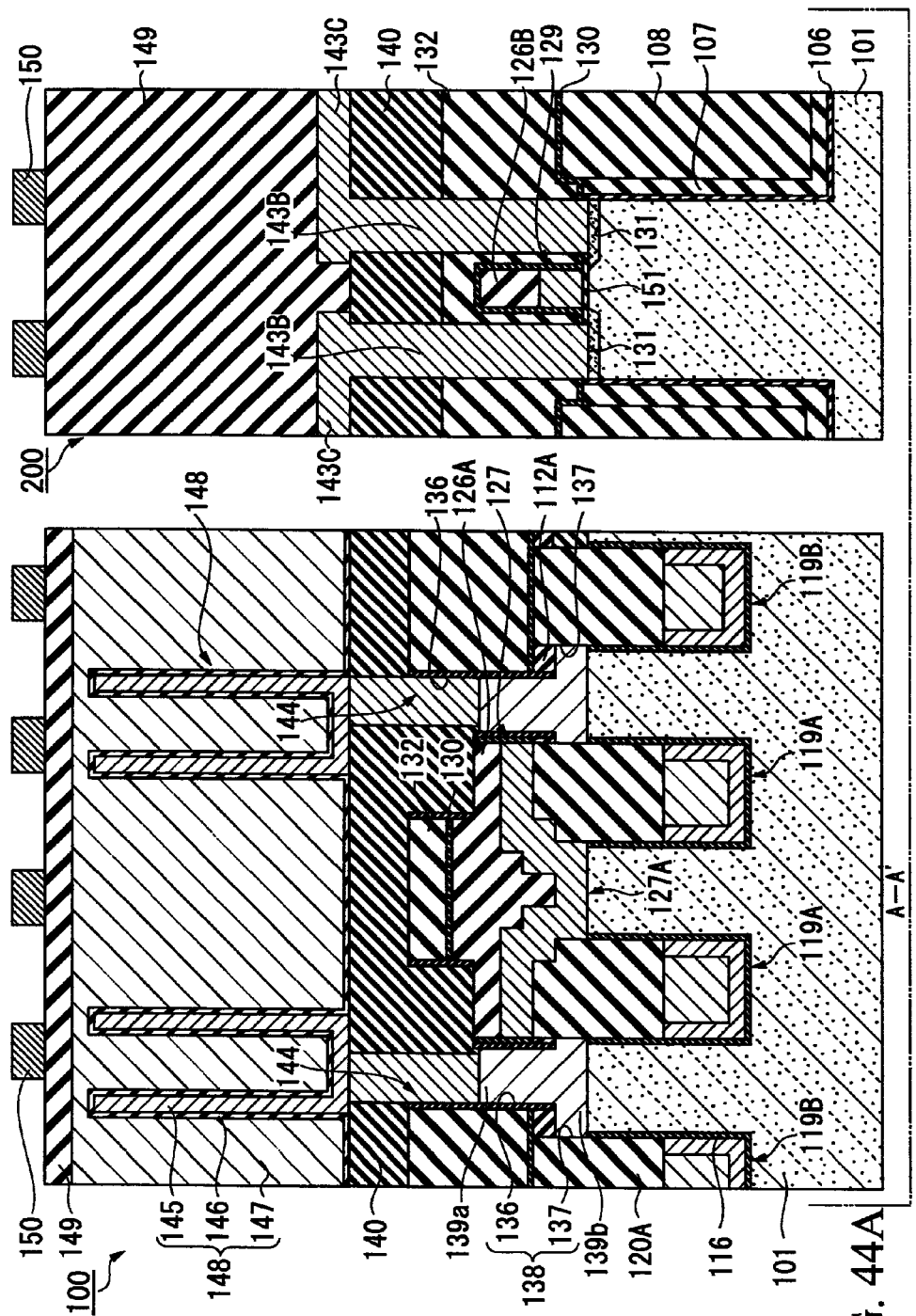
FIG. 44A is a fragmentary cross sectional elevation view of a step involved in still another method of forming the semiconductor device of FIGS. 1 and 2, illustrating the memory cell area 100, taken along an A-A' line of FIG. 1 and the peripheral area 200.

Subsequent process steps, performed in a manner similar to the above-noted embodiment, form the buried-gate transistor and a peripheral circuit transistor simultaneously, as shown in FIG. 44A.

In the process step for formation of the protective film for the peripheral circuit region 200 as described in the present examples, because the peripheral gate insulating film 151 made from the high-dielectric film (high-K film) is formed, the metal film 152 can be directly formed over the peripheral gate. By doing this, the peripheral circuit region 200 can be protected by a thinner film than the first silicon film in the above-described embodiment. The gap between the memory cell region 100 and the peripheral circuit region 200 can therefore be reduced, thereby facilitating processing in each of the subsequent process steps.

In the formation process step of the bit contact and bit line in the memory cell region 100, because a gate metal film 153 made of tungsten is directly formed without formation of a silicon film, it is possible to make the peripheral gate electrode 129 integrally with the gate metal film 153, without removing the metal film 152 which was used as a protective film in the peripheral circuit region 200.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate having a groove and an active region adjacent to the groove;
a gate electrode in the groove; and
a capacitor contact including a first portion and a second portion over the first portion, the second portion having a second central axis which is horizontally shifted from a first central axis of the first portion, the first portion and the second portion being made of an identically same conductive film so that the capacitor contact is free from an interface between the first and second portions the first portion having a bottom surface that is in contact with an upper surface of the active region.

2. The semiconductor device according to claim 1, wherein the bottom surface is in contact directly with the entire of the upper surface of the active region.

3. The semiconductor device according to claim 1, further comprising:
a cap insulator in the groove and over the gate electrode, the cap insulator being adjacent to the upper surface of the active region.

4. The semiconductor device according to claim 3, wherein the first portion comprises a horizontally expanded portion and the second portion comprises a pillar portion which extends vertically from the horizontally expanded portion.

5. The semiconductor device according to claim 3, further comprising:
an isolation region in the semiconductor substrate, the isolation region and the cap insulator defining the upper surface of the active region, and the groove extending over the isolation region and the active region.

6. The semiconductor device according to claim 1, further comprising:
a first insulator over the substrate; and
a first bit line over the first insulator.

7. The semiconductor device according to claim 4, wherein the pillar portion has a bottom portion which partially overlaps an upper portion of the horizontally expanded portion in plan view.

8. The semiconductor device according to claim 1, further comprising:
a first bit line over the substrate; and
a cover insulator which covers the first bit line;
wherein the capacitor contact has an upper surface which is lower than an upper surface of the cover insulator.

9. The semiconductor device according to claim 4, further comprising:

an insulating film of a same material, which covers all surfaces of the capacitor contact, except for the upper surface of the pillar portion and the bottom surface of the horizontally expanded portion.

10. The semiconductor device according to claim 1, further comprising:
    an isolation region in the semiconductor substrate, the isolation region defining the active region, and the groove extending over the isolation region and the active region;
    a first bit line over the substrate;
    a cover insulator which covers the first bit line; and
    a first insulating film which covers all surfaces of the capacitor contact, except for the upper surface of the pillar portion and the bottom surface of the horizontally expanded portion,
    wherein the isolation region, the cover insulator and the first insulating film are made of a same insulating material.

11. The semiconductor device according to claim 10, further comprising:
    a second insulating film of the same insulating material, which covers upper, side and bottom surfaces of the first bit line.

12. The semiconductor device according to claim 10, wherein the same insulating material is silicon nitride.

13. The semiconductor device according to claim 1, wherein the conductive film is doped polysilicon film.

14. The semiconductor device according to claim 4, wherein the pillar portion has a rectangle shape in horizontal cross section.

15. The semiconductor device according to claim 4, wherein the pillar portion has a lower portion which partially penetrates an insulator formed over the semiconductor substrate.

16. The semiconductor device according to claim 4, wherein the horizontally expanded portion is disposed between the active region and an insulator formed over the semiconductor substrate.

17. The semiconductor device according to claim 10, wherein the horizontally expanded portion has an upper surface that is substantially the same level as an upper surface of the isolation region.

18. The semiconductor device according to claim 4, wherein the horizontally expanded portion has a thickness that is substantially the same as a height of an upper surface of the isolation region from an upper surface of the semiconductor substrate.

19. A semiconductor device comprising:
    a semiconductor substrate having isolation regions and active regions defined by the isolation regions, the semiconductor substrate having grooves, each of the grooves extending over the isolation region and the active region adjacent to the isolation region;
    gate electrodes on bottoms of the grooves;
    cap insulators burying the grooves, the cap insulators being disposed over the gate electrodes;
    an insulator over the semiconductor substrate;
    bit lines over the insulator; and
    capacitor contacts which penetrate the insulator, each of the capacitor contacts comprising: a pillar portion extending vertically from a surface of the semiconductor substrate and a horizontally expanding portion which extends in a horizontal direction parallel to the surface of the semiconductor substrate, the horizontally expanding portion having a bottom surface that is in contact directly with the entire of an upper surface of the active region, the pillar portion having a second central axis which is horizontally shifted from a first central axis of the horizontally expanding portion, the pillar portion and the horizontally expanding portion being made of an identically same conductive film so that each of the capacitor contacts is free from an interface between the first and second portions, the upper surface of the active region being defined by the isolation region and the cap insulator.

20. A semiconductor device comprising:
    a semiconductor substrate having an isolation region, an active region and the groove, the groove extending over the isolation region and the active region;
    a buried gate electrode in the groove;
    a cap insulator in the groove and over the buried gate electrode; and
    a capacitor contact including a first portion and a second portion over the first portion, the second portion having a second central axis which is horizontally shifted from a first central axis of the first portion, the first portion and the second portion being made of an identically same conductive film so that the capacitor contact is free from an interface between the first and second portions, the first portion having a bottom surface that is in contact with an upper surface of the active region, and the upper surface of the active region being defined by the isolation region and the cap insulator.

* * * * *